(12) United States Patent
Bennett et al.

(10) Patent No.: US 9,793,954 B2
(45) Date of Patent: Oct. 17, 2017

(54) MAGNETIC COUPLING DEVICE AND METHODS FOR USE THEREWITH

(71) Applicant: AT&T Intellectual Property I, LP, Atlanta, GA (US)

(72) Inventors: Robert Bennett, Southold, NY (US); Paul Shala Henry, Holmdel, NJ (US); Irwin Gerszberg, Kendall Park, NJ (US); Farhad Barzegar, Branchburg, NJ (US); Donald J Barnickel, Flemington, NJ (US); Thomas M. Willis, III, Tinto Falls, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 86 days.

(21) Appl. No.: 14/697,723

(22) Filed: Apr. 28, 2015

(65) Prior Publication Data
US 2016/0322691 A1    Nov. 3, 2016

(51) Int. Cl.
*H04B 3/56* (2006.01)
*H04B 3/52* (2006.01)
*H01P 7/06* (2006.01)
*H01P 1/207* (2006.01)
*G01R 31/00* (2006.01)
(Continued)

(52) U.S. Cl.
CPC .............. *H04B 3/56* (2013.01); *H01P 1/207* (2013.01); *H01P 7/06* (2013.01); *H04B 3/52* (2013.01); *G01R 31/00* (2013.01); *H01P 5/103* (2013.01); *H01Q 1/46* (2013.01); *H02J 13/00* (2013.01)

(58) Field of Classification Search
CPC . H04B 3/56; H04B 1/707; H04B 3/50; H04B 3/54; H04B 3/52; H01P 5/08; H01P 1/207; H01P 5/103; H01P 7/06; G01R 31/00; H02J 13/00

USPC .............. 333/24 R, 227, 230, 248, 202, 203; 340/12.33, 12.38, 310.01
See application file for complete search history.

(56) References Cited

U.S. PATENT DOCUMENTS

| | | |
|---|---|---|
| 395,814 A | 1/1889 | Henry et al. |
| 529,290 A | 11/1894 | Harry et al. |

(Continued)

FOREIGN PATENT DOCUMENTS

| | | |
|---|---|---|
| AU | 565039 B2 | 9/1987 |
| AU | 582630 B2 | 4/1989 |

(Continued)

OTHER PUBLICATIONS

International Search Report and Written Opinion in PCT/US2016/028417, mailed Jul. 5, 2016, 13 pages, Authorized officer Brigitte Bettiol.

(Continued)

*Primary Examiner* — Benny Lee
*Assistant Examiner* — Jorge Salazar, Jr.
(74) *Attorney, Agent, or Firm* — Guntin & Gust, PLC; Ed Guntin

(57) ABSTRACT

Aspects of the subject disclosure may include, for example, a coupling device including a receiving portion that receives a radio frequency signal conveying data from a transmitting device. A magnetic coupler magnetically couples the radio frequency signal to a transmission medium as a guided electromagnetic wave that is bound by an outer surface of the transmission medium. Other embodiments are disclosed.

16 Claims, 21 Drawing Sheets

(51) Int. Cl.
*H01Q 1/46* (2006.01)
*H02J 13/00* (2006.01)
*H01P 5/103* (2006.01)

(56) References Cited

U.S. PATENT DOCUMENTS

| | | |
|---|---|---|
| 1,721,785 A | 7/1929 | Meyer |
| 1,798,613 A | 3/1931 | Manson et al. |
| 1,860,123 A | 5/1932 | Yagi |
| 2,058,611 A | 10/1936 | Merkle et al. |
| 2,106,770 A | 2/1938 | Southworth et al. |
| 2,129,711 A | 9/1938 | Southworth |
| 2,129,714 A | 9/1938 | Southworth et al. |
| 2,147,717 A | 2/1939 | Schelkunoff |
| 2,187,908 A | 1/1940 | McCreary |
| 2,199,083 A | 4/1940 | Schelkunoff |
| 2,232,179 A | 2/1941 | King |
| 2,283,935 A | 5/1942 | King |
| 2,398,095 A | 4/1946 | Katzin |
| 2,402,622 A | 6/1946 | Hansen |
| 2,405,242 A | 8/1946 | Southworth et al. |
| 2,407,068 A | 9/1946 | Fiske et al. |
| 2,407,069 A | 9/1946 | Fiske |
| 2,410,113 A | 10/1946 | Turner, Jr. |
| 2,411,338 A | 11/1946 | Roberts |
| 2,415,089 A | 2/1947 | Feldman et al. |
| 2,415,807 A | 2/1947 | Barrow et al. |
| 2,419,205 A | 4/1947 | Feldman et al. |
| 2,420,007 A | 5/1947 | Olden |
| 2,422,058 A | 6/1947 | Whinnery |
| 2,432,134 A | 12/1947 | Bagnall |
| 2,461,005 A | 2/1949 | Southworth |
| 2,471,021 A | 5/1949 | Bradley |
| 2,488,400 A | 11/1949 | Harder |
| 2,513,205 A | 6/1950 | Roberts et al. |
| 2,514,679 A | 7/1950 | Southworth |
| 2,519,603 A | 8/1950 | Reber |
| 2,540,839 A | 2/1951 | Southworth |
| 2,541,843 A | 2/1951 | Tiley et al. |
| 2,542,980 A | 2/1951 | Barrow |
| 2,557,110 A | 6/1951 | Jaynes |
| 2,562,281 A | 7/1951 | Mumford |
| 2,596,190 A | 5/1952 | Wiley |
| 2,599,864 A | 6/1952 | Robertson-Shersby-Ha et al. |
| 2,659,817 A | 11/1953 | Cutler et al. |
| 2,667,578 A | 1/1954 | Carlson et al. |
| 2,677,055 A | 4/1954 | Allen |
| 2,685,068 A | 7/1954 | Goubau |
| 2,688,732 A | 9/1954 | Kock |
| 2,691,766 A | 10/1954 | Clapp |
| 2,706,279 A | 4/1955 | Aron |
| 2,711,514 A | 6/1955 | Rines |
| 2,723,378 A | 11/1955 | Clavier et al. |
| 2,727,232 A | 12/1955 | Pryga |
| 2,735,092 A | 2/1956 | Brown |
| 2,737,632 A | 3/1956 | Grieg et al. |
| 2,740,826 A | 4/1956 | Bondon |
| 2,745,101 A | 5/1956 | Marie |
| 2,748,350 A | 5/1956 | Miller et al. |
| 2,749,545 A | 6/1956 | Kostriza |
| 2,754,513 A | 7/1956 | Goubau |
| 2,761,137 A | 8/1956 | Atta et al. |
| 2,769,147 A | 10/1956 | Black et al. |
| 2,769,148 A | 10/1956 | Clogston et al. |
| 2,770,783 A | 11/1956 | Thomas et al. |
| 2,794,959 A | 6/1957 | Fox |
| 2,805,415 A | 9/1957 | Berkowitz |
| 2,806,177 A | 9/1957 | Haeff et al. |
| 2,806,972 A | 9/1957 | Sensiper |
| 2,810,111 A | 10/1957 | Cohn |
| 2,819,451 A | 1/1958 | Sims et al. |
| 2,820,083 A | 1/1958 | Hendrix |
| 2,825,060 A | 2/1958 | Ruze et al. |
| 2,835,871 A | 5/1958 | Raabe |
| 2,851,686 A | 9/1958 | Hagaman et al. |
| 2,867,776 A | 1/1959 | Wilkinson, Jr. |
| 2,883,135 A | 4/1959 | Smalley et al. |
| 2,883,136 A | 4/1959 | Smalley et al. |
| 2,900,558 A | 8/1959 | Watkins et al. |
| 2,910,261 A | 10/1959 | Ward et al. |
| 2,912,695 A | 11/1959 | Cutler |
| 2,914,741 A | 11/1959 | Unger |
| 2,915,270 A | 12/1959 | Gladsden et al. |
| 2,921,277 A | 1/1960 | Goubau |
| 2,925,458 A | 2/1960 | Lester et al. |
| 2,933,701 A | 4/1960 | Lanctot et al. |
| 2,946,970 A | 7/1960 | Hafner et al. |
| 2,949,589 A | 8/1960 | Hafner |
| 2,960,670 A | 11/1960 | Marcatili et al. |
| 2,970,800 A | 2/1961 | Smalley et al. |
| 2,972,148 A | 2/1961 | Rupp et al. |
| 2,974,297 A | 3/1961 | Ros |
| 2,981,949 A | 4/1961 | Elliott et al. |
| 2,990,151 A | 6/1961 | Phillips et al. |
| 2,993,205 A | 7/1961 | Cooper et al. |
| 3,016,520 A | 1/1962 | Chaimowicz et al. |
| 3,025,478 A | 3/1962 | Marcatili et al. |
| 3,028,565 A | 4/1962 | Walker et al. |
| 3,040,278 A | 6/1962 | Griemsmann et al. |
| 3,045,238 A | 7/1962 | Cheston et al. |
| 3,046,550 A | 7/1962 | Schlaud et al. |
| 3,047,822 A | 7/1962 | Lakatos et al. |
| 3,065,945 A | 11/1962 | Newsome et al. |
| 3,072,870 A | 1/1963 | Walker |
| 3,077,569 A | 2/1963 | Ikrath et al. |
| 3,096,462 A | 7/1963 | Feinstein et al. |
| 3,101,472 A | 8/1963 | Goubau |
| 3,109,175 A | 10/1963 | Lloyd |
| 3,129,356 A | 4/1964 | Phillips |
| 3,134,951 A | 5/1964 | Huber et al. |
| 3,146,297 A | 8/1964 | Hahne |
| 3,146,453 A | 8/1964 | Hagaman |
| 3,201,724 A | 8/1965 | Hafner |
| 3,205,462 A | 9/1965 | Meinke |
| 3,218,384 A | 11/1965 | Shaw |
| 3,219,954 A | 11/1965 | Rutelli |
| 3,234,559 A | 2/1966 | Bartholoma et al. |
| 3,255,454 A | 6/1966 | Walter et al. |
| 3,296,364 A | 1/1967 | Jefferson et al. |
| 3,296,685 A | 1/1967 | Menahem et al. |
| 3,310,808 A | 3/1967 | Friis et al. |
| 3,316,344 A | 4/1967 | Toms et al. |
| 3,316,345 A | 4/1967 | Toms et al. |
| 3,318,561 A | 5/1967 | Robertson, Jr. et al. |
| 3,321,763 A | 5/1967 | Ikrath et al. |
| 3,329,958 A | 7/1967 | Anderson et al. |
| 3,351,947 A | 11/1967 | Hart et al. |
| 3,355,738 A | 11/1967 | Algeo et al. |
| 3,369,788 A | 2/1968 | Eisele |
| 3,389,394 A | 6/1968 | Lewis et al. |
| 3,392,388 A | 7/1968 | Tsuneo et al. |
| 3,392,395 A | 7/1968 | Hannan |
| 3,411,112 A | 11/1968 | Honig et al. |
| 3,413,637 A | 11/1968 | Goebels, Jr. et al. |
| 3,413,642 A | 11/1968 | Cook |
| 3,414,903 A | 12/1968 | Bartlett et al. |
| 3,420,596 A | 1/1969 | Osterberg |
| 3,427,573 A | 2/1969 | White et al. |
| 3,448,455 A | 6/1969 | Alfandari et al. |
| 3,453,617 A | 7/1969 | Brickey et al. |
| 3,459,873 A | 8/1969 | Harris et al. |
| 3,465,346 A | 9/1969 | Patterson et al. |
| 3,474,995 A | 10/1969 | Amidon et al. |
| 3,482,251 A | 12/1969 | Bowes |
| 3,487,158 A | 12/1969 | Killian |
| 3,495,262 A | 2/1970 | Robert et al. |
| 3,500,422 A | 3/1970 | Grady et al. |
| 3,509,463 A | 4/1970 | Woodward et al. |
| 3,522,560 A | 8/1970 | Hayany |
| 3,524,192 A | 8/1970 | Sakiotis et al. |
| 3,529,205 A | 9/1970 | Miller |
| 3,530,481 A | 9/1970 | Tanaka et al. |
| 3,531,803 A | 9/1970 | Hudspeth et al. |
| 3,536,800 A | 10/1970 | Hubbard |

(56) References Cited

U.S. PATENT DOCUMENTS

| | | |
|---|---|---|
| 3,555,553 A | 1/1971 | Boyns |
| 3,557,341 A | 1/1971 | Sochilin et al. |
| 3,566,317 A | 2/1971 | Hafner |
| 3,568,204 A | 3/1971 | Blaisdell |
| 3,569,979 A | 3/1971 | Munk et al. |
| 3,573,838 A | 4/1971 | Ajioka |
| 3,588,754 A | 6/1971 | Hafner |
| 3,588,755 A | 6/1971 | Kunio et al. |
| 3,589,121 A | 6/1971 | Mulvey |
| 3,594,494 A | 7/1971 | Ross et al. |
| 3,599,219 A | 8/1971 | Hansen et al. |
| 3,603,904 A | 9/1971 | Hafner |
| 3,603,951 A | 9/1971 | Bracken et al. |
| 3,609,247 A | 9/1971 | Halstead |
| 3,623,114 A | 11/1971 | Seaton |
| 3,624,655 A | 11/1971 | Yamada et al. |
| 3,638,224 A | 1/1972 | Bailey et al. |
| 3,653,622 A | 4/1972 | Farmer |
| 3,666,902 A | 5/1972 | Owen et al. |
| 3,668,459 A | 6/1972 | Symons et al. |
| 3,668,574 A | 6/1972 | Barlow |
| 3,672,202 A | 6/1972 | Barber et al. |
| 3,686,596 A | 8/1972 | Thomas |
| 3,693,922 A | 9/1972 | Gueguen |
| 3,699,574 A | 10/1972 | Plunk et al. |
| 3,703,690 A | 11/1972 | Ravenscroft et al. |
| 3,704,001 A | 11/1972 | Sloop |
| 3,725,937 A | 4/1973 | Schreiber |
| 3,753,086 A | 8/1973 | Shoemaker et al. |
| 3,760,127 A | 9/1973 | Grossi et al. |
| 3,765,021 A | 10/1973 | Chiron et al. |
| 3,772,528 A | 11/1973 | Anderson et al. |
| 3,775,769 A | 11/1973 | Heeren et al. |
| 3,787,872 A | 1/1974 | Kauffman |
| 3,796,970 A | 3/1974 | Snell |
| 3,806,931 A | 4/1974 | Wright |
| 3,833,909 A | 9/1974 | Schaufelberger |
| 3,835,407 A | 9/1974 | Yariv et al. |
| 3,845,426 A | 10/1974 | Barlow |
| 3,858,214 A | 12/1974 | Jones |
| 3,877,032 A | 4/1975 | Rosa |
| 3,888,446 A | 6/1975 | O'Brien et al. |
| 3,896,380 A | 7/1975 | Martin |
| 3,906,508 A | 9/1975 | Foldes |
| 3,911,415 A | 10/1975 | Whyte |
| 3,921,949 A | 11/1975 | Coon |
| 3,925,763 A | 12/1975 | Wadhwani |
| 3,935,577 A | 1/1976 | Hansen et al. |
| 3,936,836 A | 2/1976 | Wheeler et al. |
| 3,936,838 A | 2/1976 | Foldes et al. |
| 3,952,984 A | 4/1976 | Dimitry et al. |
| 3,956,751 A | 5/1976 | Herman |
| 3,959,794 A | 5/1976 | Chrepta et al. |
| 3,973,087 A | 8/1976 | Fong et al. |
| 3,973,240 A | 8/1976 | Fong et al. |
| 3,976,358 A | 8/1976 | Thompson et al. |
| 3,983,560 A | 9/1976 | MacDougall et al. |
| 4,010,799 A | 3/1977 | Kern et al. |
| 4,012,743 A | 3/1977 | Maciejewski et al. |
| 4,020,431 A | 4/1977 | Saunders et al. |
| 4,026,632 A | 5/1977 | Hill et al. |
| 4,030,048 A | 6/1977 | Foldes et al. |
| 4,030,953 A | 6/1977 | Rutschow et al. |
| 4,031,536 A | 6/1977 | Alford et al. |
| 4,035,054 A | 7/1977 | Lattanzi et al. |
| 4,047,180 A | 9/1977 | Kuo et al. |
| 4,079,361 A | 3/1978 | Woode et al. |
| 4,080,600 A | 3/1978 | Toman et al. |
| 4,099,184 A | 7/1978 | Rapshys et al. |
| 4,114,121 A | 9/1978 | Barlow et al. |
| 4,115,782 A | 9/1978 | Han et al. |
| 4,123,759 A | 10/1978 | Hines et al. |
| 4,125,768 A | 11/1978 | Jackson et al. |
| 4,129,872 A | 12/1978 | Toman et al. |
| 4,141,015 A | 2/1979 | Wong et al. |
| 4,149,170 A | 4/1979 | Campbell et al. |
| 4,155,108 A | 5/1979 | Tuttle et al. |
| 4,156,241 A | 5/1979 | Mobley et al. |
| 4,166,669 A | 9/1979 | Leonberger et al. |
| 4,175,257 A | 11/1979 | Smith et al. |
| 4,188,595 A | 2/1980 | Cronson et al. |
| 4,190,137 A | 2/1980 | Shimada et al. |
| 4,191,953 A | 3/1980 | Woode et al. |
| 4,195,302 A | 3/1980 | Leupelt et al. |
| 4,210,357 A | 7/1980 | Adachi et al. |
| 4,216,449 A | 8/1980 | Kach |
| 4,220,957 A | 9/1980 | Britt et al. |
| 4,231,042 A | 10/1980 | Turrin et al. |
| 4,234,753 A | 11/1980 | Clutter |
| 4,238,974 A | 12/1980 | Fawcett et al. |
| 4,246,584 A | 1/1981 | Noerpel et al. |
| 4,247,858 A | 1/1981 | Eichweber et al. |
| 4,250,489 A | 2/1981 | Dudash et al. |
| 4,268,804 A | 5/1981 | Spinner et al. |
| 4,274,097 A | 6/1981 | Krall et al. |
| 4,274,112 A | 6/1981 | Leysieffer et al. |
| 4,278,955 A | 7/1981 | Lunden et al. |
| 4,293,833 A | 10/1981 | Popa et al. |
| 4,298,877 A | 11/1981 | Sletten et al. |
| 4,300,242 A | 11/1981 | Nava et al. |
| 4,307,938 A | 12/1981 | Dyott et al. |
| 4,316,646 A | 2/1982 | Siebens et al. |
| 4,319,074 A | 3/1982 | Yaste et al. |
| 4,329,690 A | 5/1982 | Parker et al. |
| 4,333,082 A | 6/1982 | Susman et al. |
| 4,335,613 A | 6/1982 | Luukkala et al. |
| 4,336,719 A | 6/1982 | Lynnworth |
| 4,345,256 A | 8/1982 | Rainwater et al. |
| 4,366,565 A | 12/1982 | Herskowitz |
| 4,367,446 A | 1/1983 | Hall et al. |
| 4,378,143 A | 3/1983 | Winzer et al. |
| 4,384,289 A | 5/1983 | Fernandes et al. |
| 4,398,058 A | 8/1983 | Gerth et al. |
| 4,398,121 A | 8/1983 | Chodorow et al. |
| 4,413,263 A | 11/1983 | Amitay et al. |
| 4,447,811 A | 5/1984 | Hamid et al. |
| 4,458,250 A | 7/1984 | Bodnar et al. |
| 4,463,329 A | 7/1984 | Suzuki et al. |
| 4,468,672 A | 8/1984 | Dragone et al. |
| 4,475,209 A | 10/1984 | Udren |
| 4,477,814 A | 10/1984 | Brumbaugh et al. |
| 4,482,899 A | 11/1984 | Dragone et al. |
| 4,488,156 A | 12/1984 | DuFort et al. |
| 4,491,386 A | 1/1985 | Negishi et al. |
| 4,495,498 A | 1/1985 | Petrelis et al. |
| 4,516,130 A | 5/1985 | Dragone |
| 4,525,432 A | 6/1985 | Saito et al. |
| 4,525,693 A | 6/1985 | Suzuki et al. |
| 4,533,875 A | 8/1985 | Lau et al. |
| 4,541,303 A | 9/1985 | Kuzunishi et al. |
| 4,550,271 A | 10/1985 | Lau et al. |
| 4,553,112 A | 11/1985 | Saad et al. |
| 4,556,271 A | 12/1985 | Hubbard |
| 4,558,325 A | 12/1985 | Stroem et al. |
| 4,565,348 A | 1/1986 | Larsen |
| 4,566,012 A | 1/1986 | Choung et al. |
| 4,567,401 A | 1/1986 | Barnett et al. |
| 4,568,943 A | 2/1986 | Bowman |
| 4,573,215 A | 2/1986 | Oates et al. |
| 4,589,424 A | 5/1986 | Vaguine et al. |
| 4,598,262 A | 7/1986 | Chen et al. |
| 4,599,598 A | 7/1986 | Komoda et al. |
| 4,604,551 A | 8/1986 | Moeller et al. |
| 4,604,624 A | 8/1986 | Amitay et al. |
| 4,604,627 A | 8/1986 | Saad et al. |
| 4,618,867 A | 10/1986 | Gans et al. |
| 4,636,753 A | 1/1987 | Geller et al. |
| 4,638,322 A | 1/1987 | Lamberty et al. |
| 4,641,916 A | 2/1987 | Oestreich et al. |
| 4,642,651 A | 2/1987 | Kuhn et al. |
| 4,644,365 A | 2/1987 | Horning et al. |
| 4,647,329 A | 3/1987 | Oono et al. |
| 4,660,050 A | 4/1987 | Phillips et al. |
| 4,665,660 A | 5/1987 | Krall et al. |

(56) References Cited

U.S. PATENT DOCUMENTS

| | | |
|---|---|---|
| 4,672,384 A | 6/1987 | Roy et al. |
| 4,673,943 A | 6/1987 | Hannan |
| 4,680,558 A | 7/1987 | Ghosh et al. |
| 4,694,599 A | 9/1987 | Hart et al. |
| 4,704,611 A | 11/1987 | Edwards et al. |
| 4,715,695 A | 12/1987 | Nishimura et al. |
| 4,717,974 A | 1/1988 | Baumeister et al. |
| 4,728,910 A | 3/1988 | Owens et al. |
| 4,730,172 A | 3/1988 | Bengeult |
| 4,730,888 A | 3/1988 | Darcie et al. |
| 4,731,810 A | 3/1988 | Watkins |
| 4,735,097 A | 4/1988 | Lynnworth et al. |
| 4,743,915 A | 5/1988 | Rammos et al. |
| 4,743,916 A | 5/1988 | Bengeult |
| 4,745,377 A | 5/1988 | Stern et al. |
| 4,746,241 A | 5/1988 | Burbank, III et al. |
| 4,749,244 A | 6/1988 | Luh |
| 4,755,830 A | 7/1988 | Plunk et al. |
| 4,757,324 A | 7/1988 | Dhanjal et al. |
| 4,758,962 A | 7/1988 | Fernandes |
| 4,764,738 A | 8/1988 | Fried et al. |
| 4,772,891 A | 9/1988 | Svy |
| 4,777,457 A | 10/1988 | Ghosh et al. |
| 4,785,304 A | 11/1988 | Stern et al. |
| 4,786,913 A | 11/1988 | Barendregt et al. |
| 4,788,553 A | 11/1988 | Phillips et al. |
| 4,792,771 A | 12/1988 | Siu et al. |
| 4,792,812 A | 12/1988 | Rinehart et al. |
| 4,799,031 A | 1/1989 | Lang et al. |
| 4,800,350 A | 1/1989 | Bridges et al. |
| 4,801,937 A | 1/1989 | Fernandes |
| 4,818,963 A | 4/1989 | Green et al. |
| 4,818,990 A | 4/1989 | Fernandes |
| 4,821,006 A | 4/1989 | Ishikawa et al. |
| 4,825,221 A | 4/1989 | Suzuki et al. |
| 4,829,310 A | 5/1989 | Losee et al. |
| 4,829,314 A | 5/1989 | Barbier et al. |
| 4,831,346 A | 5/1989 | Brooker et al. |
| 4,832,148 A | 5/1989 | Becker et al. |
| 4,835,517 A | 5/1989 | van der Gracht et al. |
| 4,839,659 A | 6/1989 | Stern et al. |
| 4,845,508 A | 7/1989 | Krall et al. |
| 4,847,610 A | 7/1989 | Ozawa et al. |
| 4,849,611 A | 7/1989 | Whitney et al. |
| 4,851,788 A | 7/1989 | Ives et al. |
| 4,855,749 A | 8/1989 | DeFonzo et al. |
| 4,866,454 A | 9/1989 | Droessler et al. |
| 4,873,534 A | 10/1989 | Wohlleben et al. |
| 4,879,544 A | 11/1989 | Maki et al. |
| 4,881,028 A | 11/1989 | Bright et al. |
| 4,886,980 A | 12/1989 | Fernandes et al. |
| 4,897,663 A | 1/1990 | Kusano et al. |
| 4,904,996 A | 2/1990 | Fernandes |
| 4,915,468 A | 4/1990 | Kim et al. |
| 4,916,460 A | 4/1990 | Powell et al. |
| 4,922,180 A | 5/1990 | Saffer et al. |
| 4,929,962 A | 5/1990 | Begout et al. |
| 4,931,808 A | 6/1990 | Munson et al. |
| 4,932,620 A | 6/1990 | Foy |
| 4,946,202 A | 8/1990 | Perricone et al. |
| 4,956,620 A | 9/1990 | Moeller et al. |
| 4,965,856 A | 10/1990 | Swanic |
| 4,977,593 A | 12/1990 | Ballance |
| 4,977,618 A | 12/1990 | Allen |
| 4,989,011 A | 1/1991 | Rosen et al. |
| 4,998,095 A | 3/1991 | Shields |
| 5,003,318 A | 3/1991 | Hall et al. |
| 5,006,846 A | 4/1991 | Granville et al. |
| 5,006,859 A | 4/1991 | Wong et al. |
| 5,015,914 A | 5/1991 | Ives et al. |
| 5,017,936 A | 5/1991 | Massey et al. |
| 5,017,937 A | 5/1991 | Newham et al. |
| 5,018,180 A | 5/1991 | Shoulders |
| 5,019,832 A | 5/1991 | Ekdahl et al. |
| 5,036,335 A | 7/1991 | Jairam et al. |
| H956 H | 8/1991 | Reindel |
| 5,042,903 A | 8/1991 | Jakubowski et al. |
| 5,043,538 A | 8/1991 | Hughey et al. |
| 5,043,629 A | 8/1991 | Doane et al. |
| 5,044,722 A | 9/1991 | Voser et al. |
| 5,045,820 A | 9/1991 | Oehlerking et al. |
| 5,057,106 A | 10/1991 | Kasevich et al. |
| 5,065,760 A | 11/1991 | Krause et al. |
| 5,065,969 A | 11/1991 | McLean et al. |
| 5,072,228 A | 12/1991 | Kuwahara et al. |
| 5,082,349 A | 1/1992 | Cordova-Plaza et al. |
| 5,086,467 A | 2/1992 | Malek |
| 5,107,231 A | 4/1992 | Knox et al. |
| 5,109,232 A | 4/1992 | Monte et al. |
| 5,113,197 A | 5/1992 | Luh et al. |
| 5,117,237 A | 5/1992 | Legg |
| 5,121,129 A | 6/1992 | Lee et al. |
| 5,126,750 A | 6/1992 | Wang et al. |
| 5,132,968 A | 7/1992 | Cephus |
| 5,134,251 A | 7/1992 | Martin et al. |
| 5,134,423 A | 7/1992 | Haupt et al. |
| 5,134,965 A | 8/1992 | Tokuda et al. |
| 5,136,671 A | 8/1992 | Dragone et al. |
| 5,142,767 A | 9/1992 | Adams et al. |
| 5,148,509 A | 9/1992 | Kannabiran et al. |
| 5,152,861 A | 10/1992 | Hann |
| 5,153,676 A | 10/1992 | Bergh et al. |
| 5,166,698 A | 11/1992 | Ashbaugh et al. |
| 5,174,164 A | 12/1992 | Wilheim et al. |
| 5,175,560 A | 12/1992 | Lucas et al. |
| 5,182,427 A | 1/1993 | McGaffigan et al. |
| 5,187,409 A | 2/1993 | Ito et al. |
| 5,193,774 A | 3/1993 | Rogers et al. |
| 5,198,823 A | 3/1993 | Litchford et al. |
| 5,212,755 A | 5/1993 | Holmberg et al. |
| 5,214,394 A | 5/1993 | Wong et al. |
| 5,214,438 A | 5/1993 | Smith et al. |
| 5,216,616 A | 6/1993 | Masters |
| 5,218,657 A | 6/1993 | Tokudome et al. |
| 5,235,662 A | 8/1993 | Prince et al. |
| 5,239,537 A | 8/1993 | Sakauchi |
| 5,241,321 A | 8/1993 | Tsao et al. |
| 5,241,701 A | 8/1993 | Andoh et al. |
| 5,248,876 A | 9/1993 | Kerstens et al. |
| 5,254,809 A | 10/1993 | Martin |
| 5,265,266 A | 11/1993 | Trinh |
| 5,266,961 A | 11/1993 | Milroy et al. |
| 5,276,455 A | 1/1994 | Fitzsimmons et al. |
| 5,278,687 A | 1/1994 | Jannson et al. |
| 5,280,297 A | 1/1994 | Profera et al. |
| 5,291,211 A | 3/1994 | Tropper et al. |
| 5,298,911 A | 3/1994 | Li et al. |
| 5,299,773 A | 4/1994 | Bertrand et al. |
| 5,304,999 A | 4/1994 | Roberts et al. |
| 5,311,596 A | 5/1994 | Scott et al. |
| 5,327,149 A | 7/1994 | Kuffer et al. |
| 5,329,285 A | 7/1994 | McCandless et al. |
| 5,341,088 A | 8/1994 | Davis |
| 5,345,522 A | 9/1994 | Vali et al. |
| 5,347,287 A | 9/1994 | Speciale et al. |
| 5,352,984 A | 10/1994 | Piesinger et al. |
| 5,353,036 A | 10/1994 | Baldry |
| 5,359,338 A | 10/1994 | Hatcher et al. |
| 5,371,623 A | 12/1994 | Eastmond et al. |
| 5,379,455 A | 1/1995 | Koschek et al. |
| 5,380,224 A | 1/1995 | DiCicco |
| 5,381,160 A | 1/1995 | Landmeier |
| 5,389,442 A | 2/1995 | Kathiresan et al. |
| 5,400,040 A | 3/1995 | Lane et al. |
| 5,402,140 A | 3/1995 | Rodeffer et al. |
| 5,402,151 A | 3/1995 | Duwaer |
| 5,404,146 A | 4/1995 | Rutledge et al. |
| 5,410,318 A | 4/1995 | Wong et al. |
| 5,412,654 A | 5/1995 | Perkins |
| 5,428,364 A | 6/1995 | Lee et al. |
| 5,428,818 A | 6/1995 | Meidan et al. |
| 5,434,575 A | 7/1995 | Jelinek et al. |
| 5,440,660 A | 8/1995 | Dombrowski et al. |
| 5,451,969 A | 9/1995 | Toth et al. |

(56) References Cited

U.S. PATENT DOCUMENTS

| | | |
|---|---|---|
| 5,457,469 A | 10/1995 | Diamond et al. |
| 5,479,176 A | 12/1995 | Zavrel et al. |
| 5,481,268 A | 1/1996 | Higgins |
| 5,482,525 A | 1/1996 | Kajioka et al. |
| 5,486,839 A | 1/1996 | Rodeffer et al. |
| 5,488,380 A | 1/1996 | Harvey et al. |
| 5,495,546 A | 2/1996 | Bottoms et al. |
| 5,499,308 A | 3/1996 | Arai et al. |
| 5,499,311 A | 3/1996 | DeCusatis et al. |
| 5,502,392 A | 3/1996 | Arjavalingam et al. |
| 5,512,906 A | 4/1996 | Speciale et al. |
| 5,513,176 A | 4/1996 | Dean et al. |
| 5,514,965 A | 5/1996 | Westwood et al. |
| 5,515,059 A | 5/1996 | How et al. |
| 5,519,408 A | 5/1996 | Schnetzer et al. |
| 5,528,208 A | 6/1996 | Kobayashi et al. |
| 5,539,421 A | 7/1996 | Hong et al. |
| 5,543,000 A | 8/1996 | Lique |
| 5,557,283 A | 9/1996 | Sheen |
| 5,559,359 A | 9/1996 | Reyes |
| 5,566,022 A | 10/1996 | Segev |
| 5,566,196 A | 10/1996 | Scifres |
| 5,576,721 A | 11/1996 | Hwang et al. |
| 5,586,054 A | 12/1996 | Jensen et al. |
| 5,592,183 A | 1/1997 | Henf |
| 5,600,630 A | 2/1997 | Takahashi et al. |
| 5,603,089 A | 2/1997 | Searle et al. |
| 5,619,015 A | 4/1997 | Kirma |
| 5,621,421 A | 4/1997 | Kolz et al. |
| 5,627,879 A | 5/1997 | Russell et al. |
| 5,628,050 A | 5/1997 | McGraw et al. |
| 5,630,223 A | 5/1997 | Bahu et al. |
| 5,637,521 A | 6/1997 | Rhodes et al. |
| 5,640,168 A | 6/1997 | Heger et al. |
| 5,646,936 A | 7/1997 | Shah et al. |
| 5,650,788 A | 7/1997 | Jha |
| 5,652,554 A | 7/1997 | Krieg et al. |
| 5,663,693 A | 9/1997 | Doughty et al. |
| 5,671,304 A | 9/1997 | Duguay |
| 5,677,699 A | 10/1997 | Strickland |
| 5,677,909 A | 10/1997 | Heide |
| 5,680,139 A | 10/1997 | Huguenin et al. |
| 5,682,256 A | 10/1997 | Motley et al. |
| 5,684,495 A | 11/1997 | Dyott et al. |
| 5,686,930 A | 11/1997 | Brydon |
| 5,724,168 A | 3/1998 | Oschmann et al. |
| 5,726,980 A | 3/1998 | Rickard et al. |
| 5,748,153 A | 5/1998 | McKinzie et al. |
| 5,750,941 A | 5/1998 | Ishikawa et al. |
| 5,757,323 A | 5/1998 | Spencer et al. |
| 5,767,807 A | 6/1998 | Pritchett et al. |
| 5,768,689 A | 6/1998 | Borg |
| 5,769,879 A | 6/1998 | Levay et al. |
| 5,784,033 A | 7/1998 | Boldissar, Jr. et al. |
| 5,784,034 A | 7/1998 | Konishi et al. |
| 5,784,683 A | 7/1998 | Sistanizadeh et al. |
| 5,787,673 A | 8/1998 | Noble |
| 5,793,334 A | 8/1998 | Harrison et al. |
| 5,800,494 A | 9/1998 | Campbell et al. |
| 5,805,983 A | 9/1998 | Naidu et al. |
| 5,809,395 A | 9/1998 | Hamilton-Piercy et al. |
| 5,812,524 A | 9/1998 | Moran et al. |
| 5,818,390 A | 10/1998 | Hill |
| 5,818,396 A | 10/1998 | Harrison et al. |
| 5,818,512 A | 10/1998 | Fuller |
| 5,845,391 A | 12/1998 | Miklosko et al. |
| 5,848,054 A | 12/1998 | Mosebrook et al. |
| 5,850,199 A | 12/1998 | Wan et al. |
| 5,854,608 A | 12/1998 | Leisten |
| 5,859,618 A | 1/1999 | Miller, II et al. |
| 5,861,843 A | 1/1999 | Sorace et al. |
| 5,867,763 A | 2/1999 | Dean et al. |
| 5,870,060 A | 2/1999 | Chen et al. |
| 5,872,544 A | 2/1999 | Schay et al. |
| 5,872,547 A | 2/1999 | Martek |
| 5,873,324 A | 2/1999 | Kaddas et al. |
| 5,886,666 A | 3/1999 | Schellenberg et al. |
| 5,889,449 A | 3/1999 | Fiedziuszko |
| 5,890,055 A | 3/1999 | Chu et al. |
| 5,892,480 A | 4/1999 | Killen et al. |
| 5,898,133 A | 4/1999 | Bleich et al. |
| 5,898,830 A | 4/1999 | Wesinger, Jr. et al. |
| 5,900,847 A | 5/1999 | Ishikawa et al. |
| 5,903,373 A | 5/1999 | Welch et al. |
| 5,905,438 A | 5/1999 | Weiss et al. |
| 5,905,949 A | 5/1999 | Hawkes et al. |
| 5,910,790 A | 6/1999 | Ohmuro et al. |
| 5,917,977 A | 6/1999 | Barrett et al. |
| 5,922,081 A | 7/1999 | Seewig et al. |
| 5,926,128 A | 7/1999 | Brash et al. |
| 5,933,422 A | 8/1999 | Suzuki et al. |
| 5,936,589 A | 8/1999 | Kawahata |
| 5,948,044 A | 9/1999 | Varley et al. |
| 5,948,108 A | 9/1999 | Lu et al. |
| 5,952,964 A | 9/1999 | Chan et al. |
| 5,952,972 A | 9/1999 | Ittipiboon et al. |
| 5,952,984 A | 9/1999 | Kuramoto et al. |
| 5,955,992 A | 9/1999 | Shattil |
| 5,959,578 A | 9/1999 | Kreutel et al. |
| 5,959,590 A | 9/1999 | Sanford et al. |
| 5,973,641 A | 10/1999 | Smith et al. |
| 5,977,650 A | 11/1999 | Rickard et al. |
| 5,978,738 A | 11/1999 | Brown et al. |
| 5,982,276 A | 11/1999 | Stewart |
| 5,986,331 A | 11/1999 | Letavic et al. |
| 5,987,099 A | 11/1999 | O'Neill et al. |
| 5,990,848 A | 11/1999 | Annamaa et al. |
| 5,994,984 A | 11/1999 | Stancil et al. |
| 5,994,998 A | 11/1999 | Fisher et al. |
| 6,005,694 A | 12/1999 | Liu |
| 6,005,758 A | 12/1999 | Spencer et al. |
| 6,009,124 A | 12/1999 | Smith |
| 6,011,520 A | 1/2000 | Howell et al. |
| 6,011,524 A | 1/2000 | Jervis et al. |
| 6,014,110 A | 1/2000 | Bridges et al. |
| 6,018,659 A | 1/2000 | Ayyagari et al. |
| 6,023,619 A | 2/2000 | Kaminsky |
| 6,026,173 A | 2/2000 | Svenson et al. |
| 6,026,208 A | 2/2000 | Will et al. |
| 6,026,331 A | 2/2000 | Feldberg et al. |
| 6,031,455 A | 2/2000 | Grube et al. |
| 6,034,638 A | 3/2000 | Thiel et al. |
| 6,037,894 A | 3/2000 | Pfizenmaier et al. |
| 6,038,425 A | 3/2000 | Jeffrey et al. |
| 6,049,647 A | 4/2000 | Register et al. |
| 6,057,802 A | 5/2000 | Nealy |
| 6,061,035 A | 5/2000 | Kinasewitz et al. |
| 6,063,234 A | 5/2000 | Chen et al. |
| 6,075,451 A | 6/2000 | Lebowitz et al. |
| 6,075,493 A | 6/2000 | Sugawara et al. |
| 6,076,044 A | 6/2000 | Brown et al. |
| 6,078,297 A | 6/2000 | Kormanyos et al. |
| 6,088,001 A | 7/2000 | Burger et al. |
| 6,095,820 A | 8/2000 | Luxon et al. |
| 6,100,846 A | 8/2000 | Li et al. |
| 6,103,031 A | 8/2000 | Aeschbacher et al. |
| 6,107,897 A | 8/2000 | Hewett et al. |
| 6,111,553 A | 8/2000 | Steenbuck et al. |
| 6,114,998 A | 9/2000 | Schefte et al. |
| 6,121,885 A | 9/2000 | Masone et al. |
| 6,122,753 A | 9/2000 | Masuo et al. |
| 6,140,911 A | 10/2000 | Fisher et al. |
| 6,140,976 A | 10/2000 | Locke et al. |
| 6,142,434 A | 11/2000 | Brinkman et al. |
| 6,146,330 A | 11/2000 | Tujino et al. |
| 6,150,612 A | 11/2000 | Grandy et al. |
| 6,151,145 A | 11/2000 | Srivastava et al. |
| 6,154,488 A | 11/2000 | Hunt |
| 6,158,383 A | 12/2000 | Watanabe et al. |
| 6,163,296 A | 12/2000 | Lier et al. |
| 6,166,694 A | 12/2000 | Ying et al. |
| 6,167,055 A | 12/2000 | Ganek et al. |
| 6,175,917 B1 | 1/2001 | Arrow et al. |
| 6,177,801 B1 | 1/2001 | Chong et al. |

(56) References Cited

U.S. PATENT DOCUMENTS

| | | |
|---|---|---|
| 6,184,828 B1 | 2/2001 | Shoki et al. |
| 6,195,058 B1 | 2/2001 | Nakamura et al. |
| 6,195,395 B1 | 2/2001 | Frodsham et al. |
| 6,198,440 B1 | 3/2001 | Krylov et al. |
| 6,208,161 B1 | 3/2001 | Suda et al. |
| 6,208,308 B1 | 3/2001 | Lemons et al. |
| 6,208,903 B1 | 3/2001 | Richards et al. |
| 6,211,836 B1 | 4/2001 | Manasson et al. |
| 6,211,837 B1 | 4/2001 | Crouch et al. |
| 6,215,443 B1 | 4/2001 | Komatsu et al. |
| 6,219,006 B1 | 4/2001 | Rudish et al. |
| 6,222,503 B1 | 4/2001 | Gietema et al. |
| 6,225,960 B1 | 5/2001 | Collins et al. |
| 6,229,327 B1 | 5/2001 | Boll et al. |
| 6,236,365 B1 | 5/2001 | Karr et al. |
| 6,239,377 B1 | 5/2001 | Nishikawa et al. |
| 6,239,379 B1 | 5/2001 | Cotter et al. |
| 6,239,761 B1 | 5/2001 | Guo et al. |
| 6,241,045 B1 | 6/2001 | Reeve et al. |
| 6,243,049 B1 | 6/2001 | Chandler et al. |
| 6,246,821 B1 | 6/2001 | Hemken et al. |
| 6,252,553 B1 | 6/2001 | Solomon et al. |
| 6,259,337 B1 | 7/2001 | Wen et al. |
| 6,266,016 B1 | 7/2001 | Bergstedt et al. |
| 6,266,025 B1 | 7/2001 | Popa et al. |
| 6,268,835 B1 | 7/2001 | Toland et al. |
| 6,271,790 B2 | 8/2001 | Smith et al. |
| 6,271,799 B1 | 8/2001 | Rief et al. |
| 6,271,952 B1 | 8/2001 | Epworth et al. |
| 6,278,357 B1 | 8/2001 | Croushore et al. |
| 6,278,370 B1 | 8/2001 | Underwood et al. |
| 6,281,855 B1 | 8/2001 | Aoki et al. |
| 6,282,354 B1 | 8/2001 | Jones et al. |
| 6,283,425 B1 | 9/2001 | Liljevik |
| 6,285,325 B1 | 9/2001 | Nalbandian et al. |
| 6,292,139 B1 | 9/2001 | Yamamoto et al. |
| 6,292,143 B1 | 9/2001 | Romanofsky et al. |
| 6,292,153 B1 | 9/2001 | Aiello et al. |
| 6,300,898 B1 | 10/2001 | Schneider et al. |
| 6,300,906 B1 | 10/2001 | Rawnick et al. |
| 6,301,420 B1 | 10/2001 | Greenaway et al. |
| 6,308,085 B1 | 10/2001 | Shoki et al. |
| 6,311,288 B1 | 10/2001 | Heeren et al. |
| 6,317,028 B1 | 11/2001 | Valiulis et al. |
| 6,317,092 B1 | 11/2001 | de Schweinitz et al. |
| 6,320,509 B1 | 11/2001 | Brady et al. |
| 6,320,553 B1 | 11/2001 | Ergene et al. |
| 6,323,819 B1 | 11/2001 | Ergene et al. |
| 6,329,959 B1 | 12/2001 | Varadan et al. |
| 6,348,683 B1 | 2/2002 | Verghese et al. |
| 6,351,247 B1 | 2/2002 | Linstrom et al. |
| 6,357,709 B1 | 3/2002 | Parduhn et al. |
| 6,362,788 B1 | 3/2002 | Louzir |
| 6,362,789 B1 | 3/2002 | Trumbull et al. |
| 6,366,238 B1 | 4/2002 | DeMore et al. |
| 6,373,436 B1 | 4/2002 | Chen et al. |
| 6,373,441 B1 | 4/2002 | Porath et al. |
| 6,376,824 B1 | 4/2002 | Michenfelder et al. |
| 6,388,564 B1 | 5/2002 | Piercy et al. |
| 6,396,440 B1 | 5/2002 | Chen et al. |
| 6,404,773 B1 | 6/2002 | Williams et al. |
| 6,404,775 B1 | 6/2002 | Leslie |
| 6,421,021 B1 | 7/2002 | Rupp et al. |
| 6,433,736 B1 | 8/2002 | Timothy et al. |
| 6,433,741 B2 | 8/2002 | Tanizaki et al. |
| 6,436,536 B2 | 8/2002 | Peruzzotti et al. |
| 6,441,723 B1 | 8/2002 | Mansfield, Jr. et al. |
| 6,445,351 B1 | 9/2002 | Baker et al. |
| 6,445,774 B1 | 9/2002 | Kidder et al. |
| 6,452,467 B1 | 9/2002 | McEwan |
| 6,452,569 B1 | 9/2002 | Park et al. |
| 6,452,923 B1 | 9/2002 | Gerszberg et al. |
| 6,455,769 B1 | 9/2002 | Belli et al. |
| 6,456,251 B1 | 9/2002 | Rao et al. |
| 6,462,700 B1 | 10/2002 | Schmidt et al. |
| 6,463,295 B1 | 10/2002 | Yun et al. |
| 6,469,676 B1 | 10/2002 | Fehrenbach et al. |
| 6,473,049 B2 | 10/2002 | Takeuchi et al. |
| 6,480,168 B1 | 11/2002 | Lam et al. |
| 6,483,470 B1 | 11/2002 | Hohnstein et al. |
| 6,489,928 B2 | 12/2002 | Sakurada |
| 6,489,931 B2 | 12/2002 | Liu et al. |
| 6,492,957 B2 | 12/2002 | Carillo, Jr. et al. |
| 6,501,433 B2 | 12/2002 | Popa et al. |
| 6,507,573 B1 | 1/2003 | Brandt et al. |
| 6,510,152 B1 | 1/2003 | Gerszberg et al. |
| 6,515,635 B2 | 2/2003 | Chiang et al. |
| 6,522,305 B2 | 2/2003 | Sharman et al. |
| 6,531,991 B2 | 3/2003 | Adachi et al. |
| 6,532,215 B1 | 3/2003 | Muntz et al. |
| 6,534,996 B1 | 3/2003 | Amrany et al. |
| 6,535,169 B2 | 3/2003 | Fourdeux et al. |
| 6,542,739 B1 | 4/2003 | Garner |
| 6,549,106 B2 | 4/2003 | Martin et al. |
| 6,549,173 B1 | 4/2003 | King et al. |
| 6,552,693 B1 | 4/2003 | Leisten et al. |
| 6,559,811 B1 | 5/2003 | Cash et al. |
| 6,563,981 B2 | 5/2003 | Weisberg et al. |
| 6,567,573 B1 | 5/2003 | Domash et al. |
| 6,573,803 B1 | 6/2003 | Ziegner et al. |
| 6,573,813 B1 | 6/2003 | Joannopoulos et al. |
| 6,580,295 B2 | 6/2003 | Takekuma et al. |
| 6,584,084 B1 | 6/2003 | Barany et al. |
| 6,584,252 B1 | 6/2003 | Schier et al. |
| 6,587,077 B2 | 7/2003 | Vail et al. |
| 6,593,893 B2 | 7/2003 | Hou et al. |
| 6,594,238 B1 | 7/2003 | Wallentin et al. |
| 6,596,944 B1 | 7/2003 | Clark et al. |
| 6,600,456 B2 | 7/2003 | Gothard et al. |
| 6,606,057 B2 | 8/2003 | Chiang et al. |
| 6,606,066 B1 | 8/2003 | Fawcett et al. |
| 6,606,077 B2 | 8/2003 | Ebling et al. |
| 6,611,252 B1 | 8/2003 | DuFaux et al. |
| 6,614,237 B2 | 9/2003 | Ademian et al. |
| 6,628,859 B2 | 9/2003 | Huang et al. |
| 6,631,229 B1 | 10/2003 | Norris et al. |
| 6,634,225 B1 | 10/2003 | Reime et al. |
| 6,639,484 B2 | 10/2003 | Tzuang et al. |
| 6,639,566 B2 | 10/2003 | Knop et al. |
| 6,642,887 B2 | 11/2003 | Owechko et al. |
| 6,643,254 B1 | 11/2003 | Abe et al. |
| 6,650,296 B2 | 11/2003 | Wong et al. |
| 6,653,598 B2 | 11/2003 | Sullivan et al. |
| 6,653,848 B2 | 11/2003 | Adamian et al. |
| 6,657,437 B1 | 12/2003 | LeCroy et al. |
| 6,659,655 B2 | 12/2003 | Dair et al. |
| 6,661,391 B2 | 12/2003 | Ohara et al. |
| 6,668,104 B1 | 12/2003 | Mueller-Fiedler et al. |
| 6,670,921 B2 | 12/2003 | Sievenpiper et al. |
| 6,671,824 B1 | 12/2003 | Hyland et al. |
| 6,677,899 B1 | 1/2004 | Lee et al. |
| 6,680,903 B1 | 1/2004 | Moriguchi et al. |
| 6,683,580 B2 | 1/2004 | Kuramoto |
| 6,686,832 B2 | 2/2004 | Abraham et al. |
| 6,686,873 B2 | 2/2004 | Patel et al. |
| 6,686,875 B1 | 2/2004 | Wolfson et al. |
| 6,697,027 B2 | 2/2004 | Mahon et al. |
| 6,697,030 B2 | 2/2004 | Gleener |
| 6,703,981 B2 | 3/2004 | Meitzler et al. |
| 6,714,165 B2 | 3/2004 | Verstraeten |
| 6,720,935 B2 | 4/2004 | Lamensdorf et al. |
| 6,725,035 B2 | 4/2004 | Jochim et al. |
| 6,727,470 B2 | 4/2004 | Reichle et al. |
| 6,727,891 B2 | 4/2004 | Moriya et al. |
| 6,728,439 B2 | 4/2004 | Weisberg et al. |
| 6,728,552 B2 | 4/2004 | Chatain et al. |
| 6,731,210 B2 | 5/2004 | Swanson et al. |
| 6,731,649 B1 | 5/2004 | Silverman |
| 6,741,705 B1 | 5/2004 | Nelson et al. |
| 6,747,557 B1 | 6/2004 | Petite et al. |
| 6,750,827 B2 | 6/2004 | Manasson et al. |
| 6,754,470 B2 | 6/2004 | Hendrickson et al. |
| 6,755,312 B2 | 6/2004 | Dziedzic et al. |
| 6,756,538 B1 | 6/2004 | Murga-Gonzalez et al. |

(56) References Cited

U.S. PATENT DOCUMENTS

| | | |
|---|---|---|
| 6,765,479 B2 | 7/2004 | Stewart et al. |
| 6,768,454 B2 | 7/2004 | Kingsley et al. |
| 6,768,456 B1 | 7/2004 | Lalezari et al. |
| 6,768,471 B2 | 7/2004 | Bostwick et al. |
| 6,768,474 B2 | 7/2004 | Hunt et al. |
| 6,771,216 B2 | 8/2004 | Patel et al. |
| 6,771,225 B2 | 8/2004 | Tits et al. |
| 6,771,739 B1 | 8/2004 | Beamon et al. |
| 6,774,859 B2 | 8/2004 | Schantz et al. |
| 6,788,865 B2 | 9/2004 | Kawanishi et al. |
| 6,788,951 B2 | 9/2004 | Aoki et al. |
| 6,789,119 B1 | 9/2004 | Zhu et al. |
| 6,792,290 B2 | 9/2004 | Proctor, Jr. et al. |
| 6,798,223 B2 | 9/2004 | Huang et al. |
| 6,806,710 B1 | 10/2004 | Renz et al. |
| 6,809,633 B2 | 10/2004 | Cern et al. |
| 6,809,695 B2 | 10/2004 | Le Bayon et al. |
| 6,812,895 B2 | 11/2004 | Anderson et al. |
| 6,819,744 B1 | 11/2004 | Galli et al. |
| 6,822,615 B2 | 11/2004 | Quan et al. |
| 6,839,032 B2 | 1/2005 | Teshirogi et al. |
| 6,839,160 B2 | 1/2005 | Tsuda et al. |
| 6,839,846 B2 | 1/2005 | Mangold et al. |
| 6,842,157 B2 | 1/2005 | Phelan et al. |
| 6,842,430 B1 | 1/2005 | Melnik et al. |
| 6,850,128 B2 | 2/2005 | Park |
| 6,853,351 B1 | 2/2005 | Mohuchy et al. |
| 6,856,273 B1 | 2/2005 | Bognar et al. |
| 6,859,185 B2 | 2/2005 | Royalty et al. |
| 6,859,187 B2 | 2/2005 | Ohlsson et al. |
| 6,859,590 B1 | 2/2005 | Zaccone |
| 6,861,998 B2 | 3/2005 | Louzir |
| 6,864,851 B2 | 3/2005 | McGrath et al. |
| 6,864,853 B2 | 3/2005 | Judd et al. |
| 6,867,744 B2 | 3/2005 | Toncich et al. |
| 6,868,258 B2 | 3/2005 | Hayata et al. |
| 6,870,465 B1 | 3/2005 | Song et al. |
| 6,873,265 B2 | 3/2005 | Bleier et al. |
| 6,885,674 B2 | 4/2005 | Hunt et al. |
| 6,886,065 B2 | 4/2005 | Sides et al. |
| 6,888,623 B2 | 5/2005 | Clements |
| 6,901,064 B2 | 5/2005 | Billhartz et al. |
| 6,904,218 B2 | 6/2005 | Sun et al. |
| 6,906,676 B2 | 6/2005 | Killen et al. |
| 6,906,681 B2 | 6/2005 | Hoppenstein et al. |
| 6,909,893 B2 | 6/2005 | Aoki et al. |
| 6,917,974 B1 | 7/2005 | Stytz et al. |
| 6,920,289 B2 | 7/2005 | Zimmerman et al. |
| 6,920,315 B1 | 7/2005 | Wilcox et al. |
| 6,920,407 B2 | 7/2005 | Phillips et al. |
| 6,922,135 B2 | 7/2005 | Abraham et al. |
| 6,924,732 B2 | 8/2005 | Yokoo et al. |
| 6,924,776 B2 | 8/2005 | Le et al. |
| 6,928,194 B2 | 8/2005 | Mai et al. |
| 6,933,887 B2 | 8/2005 | Regnier et al. |
| 6,934,655 B2 | 8/2005 | Jones et al. |
| 6,937,595 B2 | 8/2005 | Barzegar et al. |
| 6,943,553 B2 | 9/2005 | Zimmermann et al. |
| 6,944,555 B2 | 9/2005 | Blackett et al. |
| 6,947,147 B2 | 9/2005 | Motamedi et al. |
| 6,947,376 B1 | 9/2005 | Deng et al. |
| 6,947,635 B2 | 9/2005 | Kohns et al. |
| 6,948,371 B2 | 9/2005 | Tanaka et al. |
| 6,950,567 B2 | 9/2005 | Kline et al. |
| 6,952,143 B2 | 10/2005 | Kinayman et al. |
| 6,952,183 B2 | 10/2005 | Yuanzhu et al. |
| 6,956,506 B2 | 10/2005 | Koivumaeki et al. |
| 6,958,729 B1 | 10/2005 | Metz et al. |
| 6,965,302 B2 | 11/2005 | Mollenkopf et al. |
| 6,965,355 B1 | 11/2005 | Durham et al. |
| 6,965,784 B2 | 11/2005 | Kanamaluru et al. |
| 6,967,627 B2 | 11/2005 | Roper et al. |
| 6,970,502 B2 | 11/2005 | Kim et al. |
| 6,970,682 B2 | 11/2005 | Crilly, Jr. et al. |
| 6,972,729 B2 | 12/2005 | Wang et al. |
| 6,980,091 B2 | 12/2005 | White, II et al. |
| 6,982,611 B2 | 1/2006 | Cope et al. |
| 6,982,679 B2 | 1/2006 | Kralovec et al. |
| 6,983,174 B2 | 1/2006 | Hoppenstein et al. |
| 6,985,118 B2 | 1/2006 | Killen et al. |
| 6,992,639 B1 | 1/2006 | Lier et al. |
| 6,999,667 B2 | 2/2006 | Jang et al. |
| 7,008,120 B2 | 3/2006 | Zaborsky et al. |
| 7,009,471 B2 | 3/2006 | Elmore |
| 7,012,489 B2 | 3/2006 | Fisher et al. |
| 7,012,572 B1 | 3/2006 | Schaffner et al. |
| 7,016,585 B2 | 3/2006 | Diggle, III et al. |
| 7,019,704 B2 | 3/2006 | Weiss et al. |
| 7,023,400 B2 | 4/2006 | Hill et al. |
| 7,026,917 B2 | 4/2006 | Berkman et al. |
| 7,027,003 B2 | 4/2006 | Sasaki et al. |
| 7,027,454 B2 | 4/2006 | Dent et al. |
| 7,032,016 B2 | 4/2006 | Cerami et al. |
| 7,038,636 B2 | 5/2006 | Larouche et al. |
| 7,039,048 B1 | 5/2006 | Monta et al. |
| 7,042,403 B2 | 5/2006 | Sievenpiper et al. |
| 7,042,416 B2 | 5/2006 | Kingsley et al. |
| 7,042,420 B2 | 5/2006 | Ebling et al. |
| 7,054,286 B2 | 5/2006 | Ertel et al. |
| 7,054,376 B1 | 5/2006 | Rubinstain et al. |
| 7,054,513 B2 | 5/2006 | Herz et al. |
| 7,055,148 B2 | 5/2006 | Marsh et al. |
| 7,057,558 B2 | 6/2006 | Yasuho et al. |
| 7,057,573 B2 | 6/2006 | Ohira et al. |
| 7,058,524 B2 | 6/2006 | Hayes et al. |
| 7,061,370 B2 | 6/2006 | Cern et al. |
| 7,061,891 B1 | 6/2006 | Kilfoyle et al. |
| 7,064,726 B2 | 6/2006 | Kitamori et al. |
| 7,068,998 B2 | 6/2006 | Zavidniak et al. |
| 7,069,163 B2 | 6/2006 | Gunther et al. |
| 7,075,414 B2 | 7/2006 | Giannini et al. |
| 7,075,485 B2 | 7/2006 | Song et al. |
| 7,075,496 B2 | 7/2006 | Hidai et al. |
| 7,082,321 B2 | 7/2006 | Kuwahara et al. |
| 7,084,742 B2 | 8/2006 | Haines et al. |
| 7,088,221 B2 | 8/2006 | Chan |
| 7,088,306 B2 | 8/2006 | Chiang et al. |
| 7,098,405 B2 | 8/2006 | Glew et al. |
| 7,098,773 B2 | 8/2006 | Berkman et al. |
| 7,102,581 B1 | 9/2006 | West et al. |
| 7,106,265 B2 | 9/2006 | Robertson et al. |
| 7,106,270 B2 | 9/2006 | Iigusa et al. |
| 7,106,273 B1 | 9/2006 | Brunson et al. |
| 7,109,939 B2 | 9/2006 | Lynch et al. |
| 7,113,002 B2 | 9/2006 | Otsuka et al. |
| 7,113,134 B1 | 9/2006 | Berkman et al. |
| 7,119,755 B2 | 10/2006 | Harvey et al. |
| 7,120,338 B2 | 10/2006 | Gunn, III et al. |
| 7,120,345 B2 | 10/2006 | Naitou et al. |
| 7,122,012 B2 | 10/2006 | Bouton et al. |
| 7,123,191 B2 | 10/2006 | Goldberg et al. |
| 7,123,801 B2 | 10/2006 | Fitz et al. |
| 7,125,512 B2 | 10/2006 | Crump et al. |
| 7,126,557 B2 | 10/2006 | Warnagiris et al. |
| 7,126,711 B2 | 10/2006 | Fruth et al. |
| 7,127,348 B2 | 10/2006 | Smitherman et al. |
| 7,130,516 B2 | 10/2006 | Wu et al. |
| 7,132,950 B2 | 11/2006 | Stewart et al. |
| 7,133,930 B2 | 11/2006 | Sabio et al. |
| 7,134,012 B2 | 11/2006 | Doyle et al. |
| 7,134,135 B2 | 11/2006 | Cerami et al. |
| 7,136,397 B2 | 11/2006 | Sharma et al. |
| 7,136,772 B2 | 11/2006 | Duchi et al. |
| 7,137,605 B1 | 11/2006 | Guertler et al. |
| 7,138,767 B2 | 11/2006 | Chen et al. |
| 7,138,958 B2 | 11/2006 | Syed et al. |
| 7,139,328 B2 | 11/2006 | Thomas et al. |
| 7,145,440 B2 | 12/2006 | Gerszberg et al. |
| 7,145,552 B2 | 12/2006 | Hollingsworth et al. |
| 7,151,497 B2 | 12/2006 | Crystal et al. |
| 7,151,508 B2 | 12/2006 | Schaffner et al. |
| 7,155,238 B2 | 12/2006 | Katz et al. |
| 7,161,934 B2 | 1/2007 | Buchsbaum et al. |
| 7,164,354 B1 | 1/2007 | Panzer et al. |

(56) References Cited

U.S. PATENT DOCUMENTS

| | | |
|---|---|---|
| 7,167,139 B2 | 1/2007 | Kim et al. |
| 7,171,087 B2 | 1/2007 | Takahashi et al. |
| 7,171,308 B2 | 1/2007 | Campbell et al. |
| 7,171,493 B2 | 1/2007 | Shu et al. |
| 7,176,589 B2 | 2/2007 | Rouquette et al. |
| 7,180,459 B2 | 2/2007 | Damini et al. |
| 7,180,467 B2 | 2/2007 | Fabrega-Sanchez |
| 7,183,922 B2 | 2/2007 | Mendolia et al. |
| 7,183,991 B2 | 2/2007 | Bhattacharyya et al. |
| 7,183,998 B2 | 2/2007 | Wilhelm et al. |
| 7,193,562 B2 | 3/2007 | Kish et al. |
| 7,194,528 B1 | 3/2007 | Davidow et al. |
| 7,199,680 B2 | 4/2007 | Fukunaga et al. |
| 7,200,391 B2 | 4/2007 | Chung et al. |
| 7,200,658 B2 | 4/2007 | Goeller et al. |
| 7,205,950 B2 | 4/2007 | Imai et al. |
| 7,212,163 B2 | 5/2007 | Huang et al. |
| 7,215,220 B1 | 5/2007 | Jia et al. |
| 7,215,928 B2 | 5/2007 | Gage et al. |
| 7,218,285 B2 | 5/2007 | Davis et al. |
| 7,224,170 B2 | 5/2007 | Graham et al. |
| 7,224,243 B2 | 5/2007 | Cope et al. |
| 7,224,272 B2 | 5/2007 | White, II et al. |
| 7,224,320 B2 | 5/2007 | Cook et al. |
| 7,224,985 B2 | 5/2007 | Caci et al. |
| 7,228,123 B2 | 6/2007 | Moursund et al. |
| 7,234,413 B2 | 6/2007 | Suzuki et al. |
| 7,234,895 B2 | 6/2007 | Richardson et al. |
| 7,239,284 B1 | 7/2007 | Staal et al. |
| 7,243,610 B2 | 7/2007 | Ishii et al. |
| 7,248,148 B2 | 7/2007 | Kline et al. |
| 7,250,772 B2 | 7/2007 | Furse et al. |
| 7,255,821 B2 | 8/2007 | Priedeman, Jr. et al. |
| 7,259,657 B2 | 8/2007 | Mollenkopf et al. |
| 7,260,424 B2 | 8/2007 | Schmidt et al. |
| 7,266,154 B2 | 9/2007 | Gundrum et al. |
| 7,266,275 B2 | 9/2007 | Hansen et al. |
| 7,272,281 B2 | 9/2007 | Stahulak et al. |
| 7,272,362 B2 | 9/2007 | Jeong et al. |
| 7,274,305 B1 | 9/2007 | Luttrell |
| 7,274,936 B2 | 9/2007 | Stern-Berkowitz et al. |
| 7,276,990 B2 | 10/2007 | Sievenpiper et al. |
| 7,280,033 B2 | 10/2007 | Berkman et al. |
| 7,280,803 B2 | 10/2007 | Nelson et al. |
| 7,282,922 B2 | 10/2007 | Lo et al. |
| 7,286,099 B1 | 10/2007 | Lier et al. |
| 7,289,449 B1 | 10/2007 | Rubinstein et al. |
| 7,289,704 B1 | 10/2007 | Wagman et al. |
| 7,289,828 B2 | 10/2007 | Cha et al. |
| 7,292,125 B2 | 11/2007 | Mansour et al. |
| 7,292,196 B2 | 11/2007 | Waterhouse et al. |
| 7,295,161 B2 | 11/2007 | Gaucher et al. |
| 7,297,869 B2 | 11/2007 | Hiller et al. |
| 7,301,440 B2 | 11/2007 | Mollenkopf |
| 7,301,508 B1 | 11/2007 | O'Loughlin et al. |
| 7,307,357 B2 | 12/2007 | Kopp et al. |
| 7,307,596 B1 | 12/2007 | West et al. |
| 7,308,264 B2 | 12/2007 | Stern-Berkowitz et al. |
| 7,308,370 B2 | 12/2007 | Mason, Jr. et al. |
| 7,309,873 B2 | 12/2007 | Ishikawa |
| 7,310,065 B2 | 12/2007 | Anguera Pros et al. |
| 7,310,335 B1 | 12/2007 | Garcia-Luna-Aceves et al. |
| 7,311,605 B2 | 12/2007 | Moser |
| 7,312,686 B2 | 12/2007 | Bruno |
| 7,313,087 B2 | 12/2007 | Patil et al. |
| 7,313,312 B2 | 12/2007 | Kimball et al. |
| 7,315,224 B2 | 1/2008 | Gurovich et al. |
| 7,315,678 B2 | 1/2008 | Siegel |
| 7,318,564 B1 | 1/2008 | Marshall et al. |
| 7,319,717 B2 | 1/2008 | Zitting et al. |
| 7,321,291 B2 | 1/2008 | Gidge et al. |
| 7,321,707 B2 | 1/2008 | Noda et al. |
| 7,324,046 B1 | 1/2008 | Wu et al. |
| 7,324,817 B2 | 1/2008 | Iacono et al. |
| 7,329,815 B2 | 2/2008 | Johnston et al. |
| 7,333,064 B1 | 2/2008 | Timothy et al. |
| 7,333,593 B2 | 2/2008 | Beamon et al. |
| 7,339,466 B2 | 3/2008 | Mansfield et al. |
| 7,339,897 B2 | 3/2008 | Larsson et al. |
| 7,340,768 B2 | 3/2008 | Rosenberger et al. |
| 7,345,623 B2 | 3/2008 | McEwan et al. |
| 7,346,244 B2 | 3/2008 | Gowan et al. |
| 7,346,359 B2 | 3/2008 | Damarla et al. |
| 7,353,293 B2 | 4/2008 | Hipfinger et al. |
| 7,355,560 B2 | 4/2008 | Nagai et al. |
| 7,358,808 B2 | 4/2008 | Berkman et al. |
| 7,358,921 B2 | 4/2008 | Snyder et al. |
| 7,369,085 B1 | 5/2008 | Jacomb-Hood et al. |
| 7,369,095 B2 | 5/2008 | Thudor et al. |
| 7,376,191 B2 | 5/2008 | Melick et al. |
| 7,380,272 B2 | 5/2008 | Sharp et al. |
| 7,381,089 B2 | 6/2008 | Hosler, Sr. |
| 7,382,232 B2 | 6/2008 | Gidge et al. |
| 7,383,577 B2 | 6/2008 | Hrastar et al. |
| 7,388,450 B2 | 6/2008 | Camiade et al. |
| 7,397,422 B2 | 7/2008 | Tekawy et al. |
| 7,398,946 B1 | 7/2008 | Marshall |
| 7,400,304 B2 | 7/2008 | Lewis et al. |
| 7,403,169 B2 | 7/2008 | Svensson et al. |
| 7,406,337 B2 | 7/2008 | Kim et al. |
| 7,408,426 B2 | 8/2008 | Broyde et al. |
| 7,408,507 B1 | 8/2008 | Paek et al. |
| 7,408,923 B1 | 8/2008 | Khan et al. |
| 7,410,606 B2 | 8/2008 | Atkinson et al. |
| 7,417,587 B2 | 8/2008 | Iskander et al. |
| 7,418,178 B2 | 8/2008 | Kudou et al. |
| 7,418,273 B2 | 8/2008 | Suyama et al. |
| 7,420,474 B1 | 9/2008 | Elks et al. |
| 7,420,525 B2 | 9/2008 | Colburn et al. |
| 7,423,604 B2 | 9/2008 | Nagai et al. |
| 7,426,554 B2 | 9/2008 | Kennedy et al. |
| 7,427,927 B2 | 9/2008 | Borleske et al. |
| 7,430,257 B1 | 9/2008 | Shattil et al. |
| 7,430,932 B2 | 10/2008 | Mekhanoshin et al. |
| 7,443,334 B2 | 10/2008 | Rees et al. |
| 7,444,404 B2 | 10/2008 | Wetherall et al. |
| 7,446,567 B2 | 11/2008 | Otsuka et al. |
| 7,450,000 B2 | 11/2008 | Gidge et al. |
| 7,450,001 B2 | 11/2008 | Berkman |
| 7,453,352 B2 | 11/2008 | Kline et al. |
| 7,453,393 B2 | 11/2008 | Duivenvoorden et al. |
| 7,456,650 B2 | 11/2008 | Lee et al. |
| 7,459,834 B2 | 12/2008 | Knowles et al. |
| 7,460,834 B2 | 12/2008 | Johnson et al. |
| 7,463,877 B2 | 12/2008 | Iwamura |
| 7,465,879 B2 | 12/2008 | Glew et al. |
| 7,466,225 B2 | 12/2008 | White, II et al. |
| 7,468,657 B2 | 12/2008 | Yaney |
| 7,477,285 B1 | 1/2009 | Johnson et al. |
| 7,479,776 B2 | 1/2009 | Renken et al. |
| 7,479,841 B2 | 1/2009 | Stenger et al. |
| 7,486,247 B2 | 2/2009 | Ridgway et al. |
| 7,490,275 B2 | 2/2009 | Zerbe et al. |
| 7,492,317 B2 | 2/2009 | Tinsley et al. |
| 7,496,674 B2 | 2/2009 | Jorgensen et al. |
| 7,498,822 B2 | 3/2009 | Lee et al. |
| 7,502,619 B1 | 3/2009 | Katz et al. |
| 7,504,938 B2 | 3/2009 | Eiza et al. |
| 7,508,834 B2 | 3/2009 | Berkman et al. |
| 7,509,009 B2 | 3/2009 | Suzuki et al. |
| 7,509,675 B2 | 3/2009 | Aaron et al. |
| 7,511,662 B2 | 3/2009 | Mathews et al. |
| 7,512,090 B2 | 3/2009 | Benitez Pelaez et al. |
| 7,515,041 B2 | 4/2009 | Eisold et al. |
| 7,516,487 B1 | 4/2009 | Szeto et al. |
| 7,518,529 B2 | 4/2009 | O'Sullivan et al. |
| 7,518,952 B2 | 4/2009 | Padden et al. |
| 7,519,323 B2 | 4/2009 | Mohebbi et al. |
| 7,522,115 B2 | 4/2009 | Waltman et al. |
| 7,522,812 B2 | 4/2009 | Zitting |
| 7,525,501 B2 | 4/2009 | Black et al. |
| 7,525,504 B1 | 4/2009 | Song et al. |
| 7,531,803 B2 | 5/2009 | Mittleman et al. |
| 7,532,792 B2 | 5/2009 | Skovgaard et al. |

(56) References Cited

U.S. PATENT DOCUMENTS

| | | |
|---|---|---|
| 7,535,867 B1 | 5/2009 | Kilfoyle et al. |
| 7,539,381 B2 | 5/2009 | Li et al. |
| 7,541,981 B2 | 6/2009 | Piskun et al. |
| 7,545,818 B2 | 6/2009 | Chen et al. |
| 7,546,214 B2 | 6/2009 | Rivers, Jr. et al. |
| 7,548,212 B2 | 6/2009 | Chekroun et al. |
| 7,551,921 B2 | 6/2009 | Petermann et al. |
| 7,554,998 B2 | 6/2009 | Simonsson et al. |
| 7,555,182 B2 | 6/2009 | Martin et al. |
| 7,555,186 B2 | 6/2009 | De Montmorillon et al. |
| 7,555,187 B2 | 6/2009 | Bickham et al. |
| 7,557,563 B2 | 7/2009 | Cowan et al. |
| 7,561,025 B2 | 7/2009 | Gerszberg et al. |
| 7,567,154 B2 | 7/2009 | Elmore |
| 7,567,740 B2 | 7/2009 | Bayindir et al. |
| 7,570,137 B2 | 8/2009 | Kintis et al. |
| 7,570,470 B2 | 8/2009 | Holley |
| 7,577,398 B2 | 8/2009 | Tennant et al. |
| 7,580,643 B2 | 8/2009 | Moore et al. |
| 7,581,702 B2 | 9/2009 | Wheeler et al. |
| 7,583,074 B1 | 9/2009 | Lynch et al. |
| 7,583,233 B2 | 9/2009 | Goldberg et al. |
| 7,584,470 B2 | 9/2009 | Barker et al. |
| 7,589,470 B2 | 9/2009 | Oksuz et al. |
| 7,589,630 B2 | 9/2009 | Drake et al. |
| 7,589,686 B2 | 9/2009 | Balzovsky et al. |
| 7,590,404 B1 | 9/2009 | Johnson et al. |
| 7,591,020 B2 | 9/2009 | Kammer et al. |
| 7,591,792 B2 | 9/2009 | Bouton et al. |
| 7,593,067 B2 | 9/2009 | Taguchi et al. |
| 7,596,222 B2 | 9/2009 | Jonas et al. |
| 7,598,844 B2 | 10/2009 | Corcoran et al. |
| 7,602,333 B2 | 10/2009 | Hiramatsu et al. |
| 7,602,815 B2 | 10/2009 | Houghton et al. |
| 7,605,768 B2 | 10/2009 | Ebling et al. |
| 7,620,370 B2 | 11/2009 | Barak et al. |
| 7,625,131 B2 | 12/2009 | Zienkewicz et al. |
| 7,626,489 B2 | 12/2009 | Berkman et al. |
| 7,626,542 B2 | 12/2009 | Kober et al. |
| 7,627,300 B2 | 12/2009 | Abramov et al. |
| 7,633,442 B2 | 12/2009 | Lynch et al. |
| 7,634,250 B1 | 12/2009 | Prasad et al. |
| 7,639,201 B2 | 12/2009 | Marklein et al. |
| 7,640,562 B2 | 12/2009 | Bouilloux-Lafont et al. |
| 7,640,581 B1 | 12/2009 | Brenton et al. |
| 7,653,363 B2 | 1/2010 | Karr et al. |
| RE41,147 E | 2/2010 | Pang et al. |
| 7,656,167 B1 | 2/2010 | McLean et al. |
| 7,656,358 B2 | 2/2010 | Haziza et al. |
| 7,660,244 B2 | 2/2010 | Kadaba et al. |
| 7,660,252 B1 | 2/2010 | Huang et al. |
| 7,660,328 B1 | 2/2010 | Oz et al. |
| 7,664,117 B2 | 2/2010 | Lou et al. |
| 7,669,049 B2 | 2/2010 | Wang et al. |
| 7,671,701 B2 | 3/2010 | Radtke |
| 7,671,820 B2 | 3/2010 | Tokoro et al. |
| 7,672,271 B2 | 3/2010 | Lee et al. |
| 7,676,679 B2 | 3/2010 | Weis et al. |
| 7,680,478 B2 | 3/2010 | Willars et al. |
| 7,680,516 B2 | 3/2010 | Lovberg et al. |
| 7,680,561 B2 | 3/2010 | Rodgers et al. |
| 7,683,848 B2 | 3/2010 | Musch et al. |
| 7,684,383 B1 | 3/2010 | Thompson et al. |
| 7,693,079 B2 | 4/2010 | Cerami et al. |
| 7,693,162 B2 | 4/2010 | McKenna et al. |
| 7,693,939 B2 | 4/2010 | Wu et al. |
| 7,697,417 B2 | 4/2010 | Chen et al. |
| 7,701,931 B2 | 4/2010 | Kajiwara |
| 7,705,747 B2 | 4/2010 | Twitchell, Jr. |
| 7,710,346 B2 | 5/2010 | Bloss et al. |
| 7,714,536 B1 | 5/2010 | Silberg et al. |
| 7,714,709 B1 | 5/2010 | Daniel et al. |
| 7,714,725 B2 | 5/2010 | Medve et al. |
| 7,715,672 B2 | 5/2010 | Dong et al. |
| 7,716,660 B2 | 5/2010 | Mackay et al. |
| 7,724,782 B2 | 5/2010 | Wang et al. |
| 7,728,772 B2 | 6/2010 | Mortazawi et al. |
| 7,729,285 B2 | 6/2010 | Yoon et al. |
| 7,733,094 B2 | 6/2010 | Bright et al. |
| 7,734,717 B2 | 6/2010 | Saarimäki et al. |
| 7,737,903 B1 | 6/2010 | Rao et al. |
| 7,739,402 B2 | 6/2010 | Graham et al. |
| 7,743,403 B2 | 6/2010 | McCarty et al. |
| 7,747,356 B2 | 6/2010 | Andarawis et al. |
| 7,747,774 B2 | 6/2010 | Aaron et al. |
| 7,750,244 B1 | 7/2010 | Melding et al. |
| 7,750,763 B2 | 7/2010 | Praßmayer et al. |
| 7,751,054 B2 | 7/2010 | Backes et al. |
| 7,760,978 B2 | 7/2010 | Fishteyn et al. |
| 7,761,079 B2 | 7/2010 | Mollenkopf et al. |
| 7,764,943 B2 | 7/2010 | Radtke et al. |
| 7,773,664 B2 | 8/2010 | Myers et al. |
| 7,782,156 B2 | 8/2010 | Woods et al. |
| 7,783,195 B2 | 8/2010 | Riggsby et al. |
| 7,786,894 B2 | 8/2010 | Polk et al. |
| 7,786,945 B2 | 8/2010 | Baldauf et al. |
| 7,786,946 B2 | 8/2010 | Diaz et al. |
| 7,791,549 B2 | 9/2010 | Clymer et al. |
| 7,792,016 B2 | 9/2010 | Arai et al. |
| 7,795,877 B2 | 9/2010 | Radtke et al. |
| 7,795,994 B2 | 9/2010 | Radtke et al. |
| 7,796,025 B2 | 9/2010 | Berkman et al. |
| 7,796,122 B2 | 9/2010 | Shih et al. |
| 7,796,890 B1 | 9/2010 | Johnson |
| 7,797,367 B1 | 9/2010 | Girod et al. |
| 7,805,029 B2 | 9/2010 | Bayindir et al. |
| 7,808,441 B2 | 10/2010 | Parsche et al. |
| 7,809,223 B2 | 10/2010 | Miyabe et al. |
| 7,812,686 B2 | 10/2010 | Woods et al. |
| 7,812,778 B2 | 10/2010 | Hasegawa et al. |
| 7,813,344 B2 | 10/2010 | Cheswick |
| 7,817,063 B2 | 10/2010 | Hawkins et al. |
| 7,825,793 B1 | 11/2010 | Spillman et al. |
| 7,825,867 B2 | 11/2010 | Tuttle et al. |
| 7,826,602 B1 | 11/2010 | Hunyady et al. |
| 7,827,610 B2 | 11/2010 | Wang et al. |
| 7,830,228 B2 | 11/2010 | Evans et al. |
| 7,835,128 B2 | 11/2010 | Divan et al. |
| 7,835,600 B1 | 11/2010 | Yap et al. |
| 7,843,375 B1 | 11/2010 | Rennie et al. |
| 7,844,081 B2 | 11/2010 | McMakin et al. |
| 7,848,517 B2 | 12/2010 | Britz et al. |
| 7,852,752 B2 | 12/2010 | Kano |
| 7,852,837 B1 | 12/2010 | Au et al. |
| 7,853,267 B2 | 12/2010 | Jensen et al. |
| 7,855,612 B2 | 12/2010 | Zienkewicz et al. |
| 7,856,007 B2 | 12/2010 | Corcoran |
| 7,869,391 B2 | 1/2011 | Lee et al. |
| 7,872,610 B2 | 1/2011 | Motzer et al. |
| 7,873,249 B2 | 1/2011 | Kachmar et al. |
| 7,876,174 B2 | 1/2011 | Radtke et al. |
| 7,884,285 B2 | 2/2011 | Spencer |
| 7,884,648 B2 | 2/2011 | Broyde et al. |
| 7,885,542 B2 | 2/2011 | Riggsby et al. |
| 7,889,129 B2 | 2/2011 | Fox et al. |
| 7,889,148 B2 | 2/2011 | Diaz et al. |
| 7,889,149 B2 | 2/2011 | Peebles et al. |
| 7,890,053 B2 | 2/2011 | Washiro |
| 7,893,789 B2 | 2/2011 | Paynter et al. |
| 7,894,770 B2 | 2/2011 | Washiro et al. |
| 7,898,480 B2 | 3/2011 | Rebeiz et al. |
| 7,899,403 B2 | 3/2011 | Aaron |
| 7,903,918 B1 | 3/2011 | Bickham et al. |
| 7,903,972 B2 | 3/2011 | Riggsby et al. |
| 7,906,973 B1 | 3/2011 | Orr et al. |
| 7,907,097 B2 | 3/2011 | Syed et al. |
| 7,915,980 B2 | 3/2011 | Hardacker et al. |
| 7,916,081 B2 | 3/2011 | Lakkis et al. |
| 7,928,750 B2 | 4/2011 | Miller et al. |
| 7,929,940 B1 | 4/2011 | Dianda et al. |
| 7,930,750 B1 | 4/2011 | Gauvin et al. |
| 7,937,699 B2 | 5/2011 | Schneider et al. |
| 7,940,207 B1 | 5/2011 | Kienzle et al. |
| 7,940,731 B2 | 5/2011 | Gao et al. |

(56) References Cited

U.S. PATENT DOCUMENTS

| | | |
|---|---|---|
| 7,956,818 B1 | 6/2011 | Hsu et al. |
| 7,958,120 B2 | 6/2011 | Muntz et al. |
| 7,961,710 B2 | 6/2011 | Lee et al. |
| 7,962,957 B2 | 6/2011 | Keohane et al. |
| 7,965,842 B2 | 6/2011 | Whelan et al. |
| 7,970,365 B2 | 6/2011 | Martin et al. |
| 7,970,937 B2 | 6/2011 | Shuster et al. |
| 7,971,053 B2 | 6/2011 | Gibson, Sr. et al. |
| 7,973,296 B2 | 7/2011 | Quick et al. |
| 7,974,387 B2 | 7/2011 | Lutz et al. |
| 7,983,740 B2 | 7/2011 | Culver et al. |
| 7,986,711 B2 | 7/2011 | Horvath et al. |
| 7,990,146 B2 | 8/2011 | Lazar et al. |
| 7,990,329 B2 | 8/2011 | Deng et al. |
| 7,991,877 B2 | 8/2011 | Keohane et al. |
| 7,992,014 B2 | 8/2011 | Langgood et al. |
| 7,994,996 B2 | 8/2011 | Rebeiz et al. |
| 7,994,999 B2 | 8/2011 | Maeda et al. |
| 7,997,546 B1 | 8/2011 | Andersen et al. |
| 8,010,116 B2 | 8/2011 | Scheinert |
| 8,013,694 B2 | 9/2011 | Sagala et al. |
| 8,019,288 B2 | 9/2011 | Yu et al. |
| 8,022,885 B2 | 9/2011 | Smoyer et al. |
| 8,022,887 B1 | 9/2011 | Zarnaghi et al. |
| 8,023,410 B2 | 9/2011 | O'Neill et al. |
| 8,027,391 B2 | 9/2011 | Matsubara et al. |
| 8,036,207 B2 | 10/2011 | Chen et al. |
| 8,049,576 B2 | 11/2011 | Broyde et al. |
| 8,054,199 B2 | 11/2011 | Addy et al. |
| 8,059,576 B2 | 11/2011 | Vavik et al. |
| 8,059,593 B2 | 11/2011 | Shih et al. |
| 8,060,308 B2 | 11/2011 | Breed et al. |
| 8,063,832 B1 | 11/2011 | Weller et al. |
| 8,064,744 B2 | 11/2011 | Atkins et al. |
| 8,064,944 B2 | 11/2011 | Yun et al. |
| 8,065,099 B2 | 11/2011 | Gibala et al. |
| 8,069,483 B1 | 11/2011 | Matlock et al. |
| 8,072,323 B2 | 12/2011 | Kodama et al. |
| 8,072,386 B2 | 12/2011 | Lier et al. |
| 8,073,810 B2 | 12/2011 | Maes |
| 8,077,049 B2 | 12/2011 | Yaney et al. |
| 8,077,113 B2 | 12/2011 | Renilson et al. |
| 8,081,854 B2 | 12/2011 | Yoon et al. |
| 8,089,356 B2 | 1/2012 | Moore et al. |
| 8,089,404 B2 | 1/2012 | Nichols et al. |
| 8,089,952 B2 | 1/2012 | Spade et al. |
| 8,090,258 B2 | 1/2012 | DeLew et al. |
| 8,090,379 B2 | 1/2012 | Lambert et al. |
| 8,094,081 B1 | 1/2012 | Boone et al. |
| 8,094,985 B2 | 1/2012 | Imamura et al. |
| 8,095,093 B2 | 1/2012 | Takinami et al. |
| 8,098,198 B2 | 1/2012 | Thiesen et al. |
| 8,102,324 B2 | 1/2012 | Tuau et al. |
| 8,102,779 B2 | 1/2012 | Kim et al. |
| 8,106,749 B2 | 1/2012 | Ina et al. |
| 8,106,849 B2 | 1/2012 | Suddath et al. |
| RE43,163 E | 2/2012 | Anderson |
| 8,111,148 B2 | 2/2012 | Parker et al. |
| 8,112,649 B2 | 2/2012 | Potkonjak et al. |
| 8,116,598 B2 | 2/2012 | Shutter et al. |
| 8,120,488 B2 | 2/2012 | Bloy et al. |
| 8,121,624 B2 | 2/2012 | Cai et al. |
| 8,125,282 B2 | 2/2012 | Bao et al. |
| 8,125,399 B2 | 2/2012 | McKinzie et al. |
| 8,126,393 B2 | 2/2012 | Wu et al. |
| 8,129,817 B2 | 3/2012 | Jou et al. |
| 8,131,125 B2 | 3/2012 | Molin et al. |
| 8,131,266 B2 | 3/2012 | Cai et al. |
| 8,132,239 B2 | 3/2012 | Wahl |
| 8,134,424 B2 | 3/2012 | Kato et al. |
| 8,134,458 B2 | 3/2012 | Lund |
| 8,135,050 B1 | 3/2012 | Stadler et al. |
| 8,140,113 B2 | 3/2012 | Rofougaran et al. |
| 8,150,311 B2 | 4/2012 | Hart et al. |
| 8,151,306 B2 | 4/2012 | Rakib |
| 8,156,520 B2 | 4/2012 | Casagrande et al. |
| 8,159,316 B2 | 4/2012 | Miyazato et al. |
| 8,159,342 B1 | 4/2012 | Medina, III et al. |
| 8,159,385 B2 | 4/2012 | Farneth et al. |
| 8,159,394 B2 | 4/2012 | Hayes et al. |
| 8,159,742 B2 | 4/2012 | McKay et al. |
| 8,159,933 B2 | 4/2012 | Henry |
| 8,159,955 B2 | 4/2012 | Larsson et al. |
| 8,160,064 B2 | 4/2012 | Kokernak et al. |
| 8,160,530 B2 | 4/2012 | Corman et al. |
| 8,160,825 B1 | 4/2012 | Roe, Jr. et al. |
| 8,164,531 B2 | 4/2012 | Lier et al. |
| 8,171,146 B2 | 5/2012 | Chen et al. |
| 8,172,173 B2 | 5/2012 | Carlson et al. |
| 8,173,943 B2 | 5/2012 | Vilo et al. |
| 8,175,535 B2 | 5/2012 | Mu et al. |
| 8,175,649 B2 | 5/2012 | Harel et al. |
| 8,179,787 B2 | 5/2012 | Knapp et al. |
| 8,180,917 B1 | 5/2012 | Yan et al. |
| 8,184,015 B2 | 5/2012 | Lilien et al. |
| 8,184,059 B2 | 5/2012 | Bunch et al. |
| 8,184,311 B2 | 5/2012 | Sakai et al. |
| 8,185,062 B2 | 5/2012 | Rofougaran et al. |
| 8,188,855 B2 | 5/2012 | Sharma et al. |
| 8,199,762 B2 | 6/2012 | Michelson et al. |
| 8,203,501 B2 | 6/2012 | Kim et al. |
| 8,212,635 B2 | 7/2012 | Miller, II et al. |
| 8,212,722 B2 | 7/2012 | Ngo et al. |
| 8,213,758 B2 | 7/2012 | Dong et al. |
| 8,218,929 B2 | 7/2012 | Bickham et al. |
| 8,222,919 B2 | 7/2012 | Broyde et al. |
| 8,222,977 B2 | 7/2012 | Oyama et al. |
| 8,225,379 B2 | 7/2012 | van de Groenendaal |
| 8,233,905 B2 | 7/2012 | Vaswani et al. |
| 8,237,617 B1 | 8/2012 | Johnson et al. |
| 8,238,824 B2 | 8/2012 | Washiro |
| 8,238,840 B2 | 8/2012 | Iio et al. |
| 8,242,358 B2 | 8/2012 | Park et al. |
| 8,243,603 B2 | 8/2012 | Gossain et al. |
| 8,249,028 B2 | 8/2012 | Porras et al. |
| 8,251,307 B2 | 8/2012 | Goossen et al. |
| 8,253,516 B2 | 8/2012 | Miller, II et al. |
| 8,255,952 B2 | 8/2012 | Boylan, III et al. |
| 8,258,743 B2 | 9/2012 | Tyler et al. |
| 8,259,028 B2 | 9/2012 | Hills et al. |
| 8,264,417 B2 | 9/2012 | Snow et al. |
| 8,269,583 B2 | 9/2012 | Miller, II et al. |
| 8,284,102 B2 | 10/2012 | Hayes et al. |
| 8,287,323 B2 | 10/2012 | Kiesow et al. |
| 8,295,301 B2 | 10/2012 | Yonge, III et al. |
| 8,300,538 B2 | 10/2012 | Kim et al. |
| 8,300,640 B2 | 10/2012 | Al-Banna et al. |
| 8,316,228 B2 | 11/2012 | Winslow et al. |
| 8,316,364 B2 | 11/2012 | Stein et al. |
| 8,324,990 B2 | 12/2012 | Vouloumanos |
| 8,325,034 B2 | 12/2012 | Moore et al. |
| 8,325,636 B2 | 12/2012 | Binder |
| 8,325,693 B2 | 12/2012 | Binder et al. |
| 8,330,259 B2 | 12/2012 | Soler Castany et al. |
| 8,335,596 B2 | 12/2012 | Raman et al. |
| 8,340,438 B2 | 12/2012 | Anderson et al. |
| 8,343,145 B2 | 1/2013 | Brannan et al. |
| 8,344,829 B2 | 1/2013 | Miller, II et al. |
| 8,354,970 B2 | 1/2013 | Armbrecht et al. |
| 8,359,124 B2 | 1/2013 | Zhou et al. |
| 8,362,775 B2 | 1/2013 | Speckner et al. |
| 8,363,313 B2 | 1/2013 | Nakaguma et al. |
| 8,369,667 B2 | 2/2013 | Rose et al. |
| 8,373,095 B2 | 2/2013 | Huynh et al. |
| 8,373,597 B2 | 2/2013 | Schadler et al. |
| 8,374,821 B2 | 2/2013 | Rousselle et al. |
| 8,384,600 B2 | 2/2013 | Huang et al. |
| 8,385,978 B2 | 2/2013 | Leung et al. |
| 8,386,198 B2 | 2/2013 | Lancaster |
| 8,390,307 B2 | 3/2013 | Slupsky et al. |
| 8,390,402 B2 | 3/2013 | Kunes et al. |
| 8,405,567 B2 | 3/2013 | Park et al. |
| 8,406,239 B2 | 3/2013 | Hurwitz et al. |
| 8,406,593 B2 | 3/2013 | Molin et al. |

(56) References Cited

U.S. PATENT DOCUMENTS

| | | |
|---|---|---|
| 8,407,687 B2 | 3/2013 | Moshir et al. |
| 8,412,130 B2 | 4/2013 | Suematsu et al. |
| 8,414,326 B2 | 4/2013 | Bowman |
| 8,415,884 B2 | 4/2013 | Chen et al. |
| 8,428,033 B2 | 4/2013 | Hettstedt et al. |
| 8,433,168 B2 | 4/2013 | Filippov et al. |
| 8,433,338 B1 | 4/2013 | Flynn et al. |
| 8,434,103 B2 | 4/2013 | Tsuchida et al. |
| 8,437,383 B2 | 5/2013 | Wiwel et al. |
| 8,452,101 B2 | 5/2013 | Ishikawa et al. |
| 8,452,555 B2 | 5/2013 | Hayward et al. |
| 8,457,027 B2 | 6/2013 | Dougherty et al. |
| 8,458,453 B1 | 6/2013 | Mahalingaiah et al. |
| 8,462,063 B2 | 6/2013 | Gummalla et al. |
| 8,467,363 B2 | 6/2013 | Lea et al. |
| 8,468,244 B2 | 6/2013 | Redlich et al. |
| 8,471,513 B2 | 6/2013 | Han |
| 8,472,327 B2 | 6/2013 | DelRegno et al. |
| 8,484,137 B2 | 7/2013 | Johnson et al. |
| 8,484,511 B2 | 7/2013 | Tidwell et al. |
| 8,495,718 B2 | 7/2013 | Han et al. |
| 8,497,749 B2 | 7/2013 | Elmore |
| 8,503,845 B2 | 8/2013 | Winzer et al. |
| 8,504,135 B2 | 8/2013 | Bourqui et al. |
| 8,505,057 B2 | 8/2013 | Rogers |
| 8,509,114 B1 | 8/2013 | Szajdecki |
| 8,514,980 B2 | 8/2013 | Kuhtz |
| 8,515,383 B2 | 8/2013 | Prince et al. |
| 8,516,129 B1 | 8/2013 | Skene et al. |
| 8,516,470 B1 | 8/2013 | Joshi et al. |
| 8,516,474 B2 | 8/2013 | Lamba et al. |
| 8,519,892 B2 | 8/2013 | Ding et al. |
| 8,520,578 B2 | 8/2013 | Rayment et al. |
| 8,520,636 B2 | 8/2013 | Xu |
| 8,520,931 B2 | 8/2013 | Tateno et al. |
| 8,528,059 B1 | 9/2013 | Saluzzo et al. |
| 8,532,023 B2 | 9/2013 | Buddhikot et al. |
| 8,532,046 B2 | 9/2013 | Hu et al. |
| 8,532,492 B2 | 9/2013 | Sadowski et al. |
| 8,536,857 B2 | 9/2013 | Nero, Jr. |
| 8,537,068 B2 | 9/2013 | Call et al. |
| 8,537,705 B2 | 9/2013 | Afkhamie et al. |
| 8,538,428 B2 | 9/2013 | Bartlett et al. |
| 8,539,540 B2 | 9/2013 | Zenoni |
| 8,539,569 B2 | 9/2013 | Mansour |
| 8,542,968 B2 | 9/2013 | Dong et al. |
| 8,545,322 B2 | 10/2013 | George et al. |
| 8,548,294 B2 | 10/2013 | Toge et al. |
| 8,553,646 B2 | 10/2013 | Kumar |
| 8,561,104 B1 | 10/2013 | Dow et al. |
| 8,561,181 B1 | 10/2013 | Sobel et al. |
| 8,565,568 B2 | 10/2013 | Bigot-Astruc et al. |
| 8,566,058 B2 | 10/2013 | Pupalaikis et al. |
| 8,572,247 B2 | 10/2013 | Larson et al. |
| 8,572,639 B2 | 10/2013 | Ficco |
| 8,572,661 B2 | 10/2013 | Strong et al. |
| 8,578,076 B2 | 11/2013 | van der Linden et al. |
| 8,578,486 B2 | 11/2013 | Lifliand et al. |
| 8,582,502 B2 | 11/2013 | Conte et al. |
| 8,584,195 B2 | 11/2013 | Sherlock et al. |
| 8,587,490 B2 | 11/2013 | Niver et al. |
| 8,587,492 B2 | 11/2013 | Runyon et al. |
| 8,588,567 B2 | 11/2013 | Kamps et al. |
| 8,588,840 B2 | 11/2013 | Truong et al. |
| 8,588,991 B1 | 11/2013 | Forbes, Jr. |
| 8,593,238 B2 | 11/2013 | Miller, II et al. |
| 8,594,956 B2 | 11/2013 | McBee et al. |
| 8,595,141 B2 | 11/2013 | Hao et al. |
| 8,599,150 B2 | 12/2013 | Philipp |
| 8,600,602 B1 | 12/2013 | Watson et al. |
| 8,604,982 B2 | 12/2013 | Gummalla et al. |
| 8,604,999 B2 | 12/2013 | Abumrad et al. |
| 8,605,361 B2 | 12/2013 | Batchko et al. |
| 8,605,579 B2 | 12/2013 | Abraham et al. |
| 8,612,550 B2 | 12/2013 | Yoo et al. |
| 8,613,020 B2 | 12/2013 | Knudson et al. |
| 8,615,190 B2 | 12/2013 | Lu |
| 8,625,547 B1 | 1/2014 | Miller et al. |
| 8,629,811 B2 | 1/2014 | Gaynor et al. |
| 8,639,260 B2 | 1/2014 | Fox et al. |
| 8,639,390 B2 | 1/2014 | Tamarkin et al. |
| 8,639,934 B2 | 1/2014 | Kruglick |
| 8,644,219 B2 | 2/2014 | Nishizaka et al. |
| 8,653,906 B2 | 2/2014 | Mahon et al. |
| 8,655,396 B2 | 2/2014 | Malladi et al. |
| 8,656,458 B2 | 2/2014 | Heffez et al. |
| 8,660,526 B1 | 2/2014 | Heiderscheit et al. |
| 8,660,698 B2 | 2/2014 | Phillips et al. |
| 8,665,102 B2 | 3/2014 | Salewske et al. |
| 8,666,553 B2 | 3/2014 | Phillips et al. |
| 8,670,946 B2 | 3/2014 | Salazar et al. |
| 8,674,630 B1 | 3/2014 | Cornelius et al. |
| 8,676,186 B2 | 3/2014 | Niu |
| 8,680,450 B2 | 3/2014 | Pritchard et al. |
| 8,680,706 B2 | 3/2014 | Zyren et al. |
| 8,681,463 B2 | 3/2014 | Franks et al. |
| 8,686,911 B2 | 4/2014 | Kim et al. |
| 8,687,650 B2 | 4/2014 | King |
| 8,688,153 B2 | 4/2014 | Komori et al. |
| 8,699,454 B2 | 4/2014 | Hapsari et al. |
| 8,699,461 B2 | 4/2014 | Qian et al. |
| 8,705,925 B2 | 4/2014 | Terada et al. |
| 8,706,026 B2 | 4/2014 | Truong et al. |
| 8,707,432 B1 | 4/2014 | Rathi et al. |
| 8,711,538 B2 | 4/2014 | Woodworth et al. |
| 8,711,732 B2 | 4/2014 | Johnson et al. |
| 8,711,806 B2 | 4/2014 | Lim et al. |
| 8,711,857 B2 | 4/2014 | Jackson et al. |
| 8,712,200 B1 | 4/2014 | Abernathy et al. |
| 8,719,938 B2 | 5/2014 | Demeter et al. |
| 8,723,730 B2 | 5/2014 | Lu et al. |
| 8,724,102 B2 | 5/2014 | Urban et al. |
| 8,729,857 B2 | 5/2014 | Stählin et al. |
| 8,731,358 B2 | 5/2014 | Pare et al. |
| 8,732,476 B1 | 5/2014 | Van et al. |
| 8,736,502 B1 | 5/2014 | Mehr et al. |
| 8,737,793 B2 | 5/2014 | Imamura et al. |
| 8,738,318 B2 | 5/2014 | Spillane |
| 8,742,997 B2 | 6/2014 | McPeak et al. |
| 8,743,004 B2 | 6/2014 | Haziza |
| 8,749,449 B2 | 6/2014 | Caldwell et al. |
| 8,750,097 B2 | 6/2014 | Maenpaa et al. |
| 8,750,664 B2 | 6/2014 | Huang et al. |
| 8,754,852 B2 | 6/2014 | Lee et al. |
| 8,755,659 B2 | 6/2014 | Imamura et al. |
| 8,760,354 B2 | 6/2014 | Flannery et al. |
| 8,761,792 B2 | 6/2014 | Sennett et al. |
| 8,763,097 B2 | 6/2014 | Bhatnagar et al. |
| 8,766,657 B2 | 7/2014 | DeJean et al. |
| 8,767,071 B1 | 7/2014 | Marshall |
| 8,769,622 B2 | 7/2014 | Chang et al. |
| 8,773,312 B1 | 7/2014 | Diaz et al. |
| 8,780,012 B2 | 7/2014 | Llombart Juan et al. |
| 8,782,195 B2 | 7/2014 | Foti |
| 8,786,284 B2 | 7/2014 | Sirigiri et al. |
| 8,786,514 B2 | 7/2014 | Dickie et al. |
| 8,789,091 B2 | 7/2014 | Eldering et al. |
| 8,792,760 B2 | 7/2014 | Choi et al. |
| 8,792,933 B2 | 7/2014 | Chen et al. |
| 8,793,363 B2 | 7/2014 | Sater et al. |
| 8,793,742 B2 | 7/2014 | Macrae et al. |
| 8,797,207 B2 | 8/2014 | Kienzle et al. |
| 8,804,667 B2 | 8/2014 | Wang |
| 8,806,202 B2 | 8/2014 | Shoemake et al. |
| 8,810,404 B2 | 8/2014 | Bertoncini et al. |
| 8,810,421 B2 | 8/2014 | Deaver, Sr. et al. |
| 8,810,468 B2 | 8/2014 | Cannon et al. |
| 8,811,278 B2 | 8/2014 | Hori et al. |
| 8,811,912 B2 | 8/2014 | Austin et al. |
| 8,812,050 B1 | 8/2014 | Bencheikh et al. |
| 8,812,154 B2 | 8/2014 | Vian et al. |
| 8,817,741 B2 | 8/2014 | Shaheen |
| 8,824,380 B2 | 9/2014 | Jetcheva et al. |
| 8,825,239 B2 | 9/2014 | Cooper et al. |

(56) References Cited

U.S. PATENT DOCUMENTS

| | | |
|---|---|---|
| 8,829,934 B2 | 9/2014 | Sellathamby et al. |
| 8,830,112 B1 | 9/2014 | Buehler et al. |
| 8,831,506 B2 | 9/2014 | Claret et al. |
| 8,836,503 B2 | 9/2014 | Girod et al. |
| 8,836,607 B2 | 9/2014 | Cook et al. |
| 8,839,350 B1 | 9/2014 | Shapcott et al. |
| 8,847,840 B1 | 9/2014 | Diaz et al. |
| 8,847,846 B1 | 9/2014 | Diaz et al. |
| 8,856,239 B1 | 10/2014 | Oliver et al. |
| 8,856,530 B2 | 10/2014 | Lamberg et al. |
| 8,863,245 B1 | 10/2014 | Abhyanker |
| 8,866,691 B2 | 10/2014 | Montgomery et al. |
| 8,866,695 B2 | 10/2014 | Jefferson et al. |
| 8,867,226 B2 | 10/2014 | Colomb et al. |
| 8,867,798 B2 | 10/2014 | Shuster |
| 8,872,032 B2 | 10/2014 | Su et al. |
| 8,875,224 B2 | 10/2014 | Gross et al. |
| 8,878,740 B2 | 11/2014 | Coupland et al. |
| 8,880,765 B2 | 11/2014 | Seal et al. |
| 8,881,588 B2 | 11/2014 | Baer et al. |
| 8,885,689 B2 | 11/2014 | Blasco Claret et al. |
| 8,886,229 B2 | 11/2014 | Agrawal et al. |
| 8,887,212 B2 | 11/2014 | Dua |
| 8,890,759 B2 | 11/2014 | Pantea et al. |
| 8,893,246 B2 | 11/2014 | El-Moussa et al. |
| 8,897,215 B2 | 11/2014 | Hazani et al. |
| 8,897,499 B2 | 11/2014 | Rekimoto |
| 8,897,695 B2 | 11/2014 | Becker et al. |
| 8,897,697 B1 | 11/2014 | Willis, III et al. |
| 8,901,916 B2 | 12/2014 | Rodriguez et al. |
| 8,903,214 B2 | 12/2014 | Alkeskjold |
| 8,907,222 B2 | 12/2014 | Stransky |
| 8,907,845 B2 | 12/2014 | Jones |
| 8,908,502 B2 | 12/2014 | Hayashitani |
| 8,908,573 B1 | 12/2014 | Wang et al. |
| 8,913,862 B1 | 12/2014 | Emmerich et al. |
| 8,917,210 B2 | 12/2014 | Shamim et al. |
| 8,917,215 B2 | 12/2014 | Pohl |
| 8,917,964 B2 | 12/2014 | Blew et al. |
| 8,918,108 B2 | 12/2014 | Van Heeswyk et al. |
| 8,918,135 B2 | 12/2014 | Kang et al. |
| 8,922,447 B2 | 12/2014 | Gao et al. |
| 8,925,079 B2 | 12/2014 | Miyake et al. |
| 8,929,841 B2 | 1/2015 | Rofougaran et al. |
| 8,934,747 B2 | 1/2015 | Smith et al. |
| 8,937,577 B2 | 1/2015 | Gerini et al. |
| 8,938,144 B2 | 1/2015 | Hennink et al. |
| 8,938,255 B2 | 1/2015 | Dalla Torre et al. |
| 8,941,912 B2 | 1/2015 | Ichii et al. |
| 8,947,258 B2 | 2/2015 | Reid et al. |
| 8,948,235 B2 | 2/2015 | Procter, Jr. et al. |
| 8,948,690 B2 | 2/2015 | Duerksen et al. |
| 8,952,678 B2 | 2/2015 | Giboney et al. |
| 8,955,051 B2 | 2/2015 | Marzii |
| 8,955,075 B2 | 2/2015 | Smith et al. |
| 8,957,818 B2 | 2/2015 | Chen et al. |
| 8,957,821 B1 | 2/2015 | Matyas et al. |
| 8,958,356 B2 | 2/2015 | Lu et al. |
| 8,958,665 B2 | 2/2015 | Ziari et al. |
| 8,958,812 B2 | 2/2015 | Weiguo |
| 8,958,980 B2 | 2/2015 | Hagan et al. |
| 8,963,424 B1 | 2/2015 | Neilson et al. |
| 8,963,790 B2 | 2/2015 | Brown et al. |
| 8,964,433 B2 | 2/2015 | Hai-Maharsi |
| 8,966,609 B2 | 2/2015 | Lee et al. |
| 8,968,287 B2 | 3/2015 | Shroff et al. |
| 8,970,438 B2 | 3/2015 | Hager et al. |
| 8,984,113 B2 | 3/2015 | Li et al. |
| 8,989,788 B2 | 3/2015 | Kim et al. |
| 8,994,473 B2 | 3/2015 | Levi et al. |
| 8,994,474 B2 | 3/2015 | Mahon et al. |
| 8,996,188 B2 | 3/2015 | Frader-thompson et al. |
| 8,996,728 B2 | 3/2015 | Cochinwala et al. |
| 9,000,353 B2 | 4/2015 | Seo et al. |
| 9,001,689 B1 | 4/2015 | Ponnampalam et al. |
| 9,001,717 B2 | 4/2015 | Chun et al. |
| 9,003,492 B2 | 4/2015 | Katar |
| 9,008,208 B2 | 4/2015 | Khandani |
| 9,008,513 B2 | 4/2015 | Kim et al. |
| 9,009,460 B2 | 4/2015 | Chen |
| 9,013,361 B1 | 4/2015 | Lam et al. |
| 9,014,621 B2 | 4/2015 | Mohebbi |
| 9,015,139 B2 | 4/2015 | Wong et al. |
| 9,015,467 B2 | 4/2015 | Buer |
| 9,019,164 B2 | 4/2015 | Syed et al. |
| 9,019,595 B2 | 4/2015 | Jain et al. |
| 9,019,846 B2 | 4/2015 | Shetty et al. |
| 9,019,892 B2 | 4/2015 | Zhou et al. |
| 9,020,555 B2 | 4/2015 | Sheikh et al. |
| 9,021,251 B2 | 4/2015 | Chawla |
| 9,021,575 B2 | 4/2015 | Martini |
| RE45,514 E | 5/2015 | Brown |
| 9,024,831 B2 | 5/2015 | Wang et al. |
| 9,031,725 B1 | 5/2015 | Diesposti et al. |
| 9,037,516 B2 | 5/2015 | Abhyanker |
| 9,042,245 B2 | 5/2015 | Tzannes et al. |
| 9,042,812 B1 | 5/2015 | Bennett et al. |
| 9,065,172 B2 | 6/2015 | Lewry et al. |
| 9,065,177 B2 | 6/2015 | Alexopoulos |
| 9,066,224 B2 | 6/2015 | Schwengler |
| 9,070,962 B2 | 6/2015 | Kobayashi |
| 9,070,964 B1 | 6/2015 | Schuss et al. |
| 9,079,349 B2 | 7/2015 | Slafer |
| 9,082,307 B2 | 7/2015 | Sharawi |
| 9,083,083 B2 | 7/2015 | Hills et al. |
| 9,083,425 B1 | 7/2015 | Moussouris et al. |
| 9,083,581 B1 | 7/2015 | Addepalli et al. |
| 9,084,124 B2 | 7/2015 | Nickel et al. |
| 9,092,962 B1 | 7/2015 | Merrill et al. |
| 9,092,963 B2 | 7/2015 | Fetzer et al. |
| 9,094,407 B1 | 7/2015 | Matthieu |
| 9,094,840 B2 | 7/2015 | Liu et al. |
| 9,098,325 B2 | 8/2015 | Reddin |
| 9,099,787 B2 | 8/2015 | Blech |
| 9,103,864 B2 | 8/2015 | Ali |
| 9,105,981 B2 | 8/2015 | Syed |
| 9,106,617 B2 | 8/2015 | Kshirsagar et al. |
| 9,112,281 B2 | 8/2015 | Bresciani et al. |
| 9,113,347 B2 | 8/2015 | Henry |
| 9,119,127 B1 | 8/2015 | Henry |
| 9,119,179 B1 | 8/2015 | Firoiu et al. |
| 9,128,941 B2 | 9/2015 | Shulman |
| 9,130,641 B2 | 9/2015 | Mohebbi |
| 9,134,945 B2 | 9/2015 | Husain |
| 9,137,485 B2 | 9/2015 | Bar-Niv et al. |
| 9,142,334 B2 | 9/2015 | Muto et al. |
| 9,143,084 B2 | 9/2015 | Siles Perez et al. |
| 9,143,196 B2 | 9/2015 | Schwengler |
| 9,148,186 B1 | 9/2015 | Murphy et al. |
| 9,154,641 B2 | 10/2015 | Shaw |
| 9,157,954 B2 | 10/2015 | Nickel |
| 9,158,418 B2 | 10/2015 | Oda et al. |
| 9,158,427 B1 | 10/2015 | Wang |
| 9,167,535 B2 | 10/2015 | Christoffersson et al. |
| 9,171,458 B2 | 10/2015 | Salter |
| 9,173,217 B2 | 10/2015 | Teng et al. |
| 9,178,282 B2 | 11/2015 | Mittleman et al. |
| 9,194,930 B2 | 11/2015 | Pupalaikis |
| 9,201,556 B2 | 12/2015 | Free et al. |
| 9,202,371 B2 | 12/2015 | Jain |
| 9,203,149 B2 | 12/2015 | Henderson et al. |
| 9,204,112 B2 | 12/2015 | Pasteris et al. |
| 9,204,418 B2 | 12/2015 | Siomina et al. |
| 9,207,168 B2 | 12/2015 | Lovely et al. |
| 9,209,902 B2 | 12/2015 | Willis, III et al. |
| 9,210,192 B1 | 12/2015 | Pathuri et al. |
| 9,210,586 B2 | 12/2015 | Catovic et al. |
| 9,213,905 B2 | 12/2015 | Lange et al. |
| 9,219,307 B2 | 12/2015 | Takahashi et al. |
| 9,219,594 B2 | 12/2015 | Khlat |
| 9,225,396 B2 | 12/2015 | Maltsev et al. |
| 9,229,956 B2 | 1/2016 | Ke et al. |
| 9,235,763 B2 | 1/2016 | Brown et al. |
| 9,240,835 B2 | 1/2016 | Cune et al. |

(56) References Cited

U.S. PATENT DOCUMENTS

| | | |
|---|---|---|
| 9,244,117 B2 | 1/2016 | Khan et al. |
| 9,246,231 B2 | 1/2016 | Ju |
| 9,246,334 B2 | 1/2016 | Lo et al. |
| 9,253,588 B2 | 2/2016 | Schmidt et al. |
| 9,260,244 B1 | 2/2016 | Cohn |
| 9,264,204 B2 | 2/2016 | Seo et al. |
| 9,265,078 B2 | 2/2016 | Lim et al. |
| 9,270,013 B2 | 2/2016 | Ley |
| 9,271,185 B2 | 2/2016 | Abdelmonem et al. |
| 9,276,303 B2 | 3/2016 | Chang et al. |
| 9,276,304 B2 | 3/2016 | Behan |
| 9,277,331 B2 | 3/2016 | Chao et al. |
| 9,281,564 B2 | 3/2016 | Vincent |
| 9,282,144 B2 | 3/2016 | Tebay et al. |
| 9,285,461 B2 | 3/2016 | Townley et al. |
| 9,287,605 B2 | 3/2016 | Daughenbaugh et al. |
| 9,288,844 B1 | 3/2016 | Akhavan-saraf et al. |
| 9,289,177 B2 | 3/2016 | Samsudin et al. |
| 9,293,798 B2 | 3/2016 | Ye |
| 9,293,801 B2 | 3/2016 | Courtney et al. |
| 9,302,770 B2 | 4/2016 | Cohen et al. |
| 9,306,682 B2 | 4/2016 | Singh |
| 9,312,919 B1 | 4/2016 | Barzegar et al. |
| 9,312,929 B2 | 4/2016 | Forenza et al. |
| 9,315,663 B2 | 4/2016 | Appleby |
| 9,319,311 B2 | 4/2016 | Wang et al. |
| 9,324,003 B2 | 4/2016 | France et al. |
| 9,324,020 B2 | 4/2016 | Nazarov |
| 9,325,067 B2 | 4/2016 | Ali et al. |
| 9,325,516 B2 | 4/2016 | Frei et al. |
| 9,326,316 B2 | 4/2016 | Yonge et al. |
| 9,334,052 B2 | 5/2016 | Ubhi et al. |
| 9,338,823 B2 | 5/2016 | Saban et al. |
| 9,346,560 B2 | 5/2016 | Wang |
| 9,350,063 B2 | 5/2016 | Herbsommer et al. |
| 9,351,182 B2 | 5/2016 | Elliott et al. |
| 9,356,358 B2 | 5/2016 | Hu et al. |
| 9,362,629 B2 | 6/2016 | Miller et al. |
| 9,363,333 B2 | 6/2016 | Basso et al. |
| 9,363,690 B1 | 6/2016 | Suthar et al. |
| 9,363,761 B2 | 6/2016 | Venkatraman |
| 9,366,743 B2 | 6/2016 | Doshi et al. |
| 9,368,275 B2 | 6/2016 | McBee et al. |
| 9,369,177 B2 | 6/2016 | Hui et al. |
| 9,372,228 B2 | 6/2016 | Gavin et al. |
| 9,379,527 B2 | 6/2016 | Jean et al. |
| 9,379,556 B2 | 6/2016 | Haensgen et al. |
| 9,380,857 B2 | 7/2016 | Davis et al. |
| 9,391,874 B2 | 7/2016 | Corti et al. |
| 9,393,683 B2 | 7/2016 | Kimberlin et al. |
| 9,394,716 B2 | 7/2016 | Butler et al. |
| 9,397,380 B2 | 7/2016 | Kudela et al. |
| 9,400,941 B2 | 7/2016 | Meier et al. |
| 9,401,863 B2 | 7/2016 | Hui et al. |
| 9,404,750 B2 | 8/2016 | Rios et al. |
| 9,413,519 B2 | 8/2016 | Khoshnood et al. |
| 9,414,126 B1 | 8/2016 | Zinevich |
| 9,417,731 B2 | 8/2016 | Premont et al. |
| 9,419,712 B2 | 8/2016 | Heidler |
| 9,421,869 B1 | 8/2016 | Ananthanarayanan et al. |
| 9,422,139 B1 | 8/2016 | Bialkowski et al. |
| 9,432,478 B2 | 8/2016 | Gibbon et al. |
| 9,432,865 B1 | 8/2016 | Jadunandan et al. |
| 9,439,092 B1 | 9/2016 | Chukka et al. |
| 9,443,417 B2 | 9/2016 | Wang |
| 9,458,974 B2 | 10/2016 | Townsend, Jr. et al. |
| 9,459,746 B2 | 10/2016 | Zarraga et al. |
| 9,461,706 B1 | 10/2016 | Bennett et al. |
| 9,465,397 B2 | 10/2016 | Forbes, Jr. et al. |
| 9,467,219 B2 | 10/2016 | Vilhar |
| 9,467,870 B2 | 10/2016 | Bennett |
| 9,476,932 B2 | 10/2016 | Furse et al. |
| 9,478,865 B1 | 10/2016 | Willis et al. |
| 9,479,241 B2 | 10/2016 | Pabla |
| 9,479,266 B2 | 10/2016 | Henry et al. |
| 9,479,299 B2 | 10/2016 | Kim et al. |
| 9,479,392 B2 | 10/2016 | Anderson et al. |
| 9,479,535 B2 | 10/2016 | Cohen et al. |
| 9,490,869 B1 | 11/2016 | Henry |
| 9,490,913 B2 | 11/2016 | Berlin |
| 9,495,037 B2 | 11/2016 | King-Smith |
| 9,496,921 B1 | 11/2016 | Corum |
| 9,497,572 B2 | 11/2016 | Britt et al. |
| 9,503,170 B2 | 11/2016 | Vu |
| 9,503,189 B2 | 11/2016 | Henry et al. |
| 9,509,415 B1 | 11/2016 | Henry et al. |
| 9,510,203 B2 | 11/2016 | Jactat et al. |
| 9,515,367 B2 | 12/2016 | Herbsommer et al. |
| 9,544,006 B2 | 1/2017 | Henry et al. |
| 2001/0030789 A1 | 10/2001 | Jiang et al. |
| 2002/0002040 A1 | 1/2002 | Kline et al. |
| 2002/0008672 A1 | 1/2002 | Gothard et al. |
| 2002/0011960 A1 | 1/2002 | Yuanzhu et al. |
| 2002/0021716 A1 | 2/2002 | Terk et al. |
| 2002/0024424 A1 | 2/2002 | Burns et al. |
| 2002/0027481 A1 | 3/2002 | Fiedziuszko et al. |
| 2002/0040439 A1 | 4/2002 | Kellum et al. |
| 2002/0057223 A1 | 5/2002 | Hook |
| 2002/0061217 A1 | 5/2002 | Hillman et al. |
| 2002/0069417 A1 | 6/2002 | Kliger et al. |
| 2002/0083194 A1 | 6/2002 | Bak et al. |
| 2002/0091807 A1 | 7/2002 | Goodman et al. |
| 2002/0099949 A1 | 7/2002 | Fries et al. |
| 2002/0101852 A1 | 8/2002 | Say et al. |
| 2002/0111997 A1 | 8/2002 | Herlihy et al. |
| 2002/0156917 A1 | 10/2002 | Nye et al. |
| 2002/0186694 A1 | 12/2002 | Mahajan et al. |
| 2002/0197979 A1 | 12/2002 | Vanderveen et al. |
| 2003/0002125 A1 | 1/2003 | Fuse et al. |
| 2003/0002476 A1 | 1/2003 | Chung et al. |
| 2003/0010528 A1 | 1/2003 | Niles |
| 2003/0022694 A1 | 1/2003 | Olsen et al. |
| 2003/0038753 A1 | 2/2003 | Mahon et al. |
| 2003/0049003 A1 | 3/2003 | Ahmad et al. |
| 2003/0054793 A1 | 3/2003 | Manis et al. |
| 2003/0054811 A1 | 3/2003 | Han et al. |
| 2003/0061346 A1 | 3/2003 | Pekary et al. |
| 2003/0094976 A1 | 5/2003 | Miyashita et al. |
| 2003/0095208 A1 | 5/2003 | Chouraqui et al. |
| 2003/0137464 A1 | 7/2003 | Foti et al. |
| 2003/0151548 A1 | 8/2003 | Kingsley et al. |
| 2003/0152331 A1 | 8/2003 | Dair et al. |
| 2003/0164794 A1 | 9/2003 | Haynes et al. |
| 2003/0188308 A1 | 10/2003 | Kizuka |
| 2003/0190110 A1 | 10/2003 | Kline et al. |
| 2003/0202756 A1 | 10/2003 | Hurley et al. |
| 2003/0210197 A1 | 11/2003 | Cencich et al. |
| 2003/0224784 A1 | 12/2003 | Hunt et al. |
| 2004/0015725 A1 | 1/2004 | Boneh et al. |
| 2004/0023640 A1 | 2/2004 | Ballai et al. |
| 2004/0024913 A1 | 2/2004 | Ikeda et al. |
| 2004/0048596 A1 | 3/2004 | Wyrzykowska et al. |
| 2004/0054425 A1 | 3/2004 | Elmore |
| 2004/0084582 A1 | 5/2004 | Kralic et al. |
| 2004/0085153 A1 | 5/2004 | Fukunaga et al. |
| 2004/0090312 A1 | 5/2004 | Manis et al. |
| 2004/0091032 A1 | 5/2004 | Duchi et al. |
| 2004/0100343 A1 | 5/2004 | Tsu et al. |
| 2004/0104410 A1 | 6/2004 | Gilbert et al. |
| 2004/0109608 A1 | 6/2004 | Love et al. |
| 2004/0113756 A1 | 6/2004 | Mollenkopf et al. |
| 2004/0113757 A1 | 6/2004 | White, II et al. |
| 2004/0119564 A1 | 6/2004 | Itoh et al. |
| 2004/0131310 A1 | 7/2004 | Walker et al. |
| 2004/0163135 A1 | 8/2004 | Giaccherini et al. |
| 2004/0165669 A1 | 8/2004 | Otsuka et al. |
| 2004/0169572 A1 | 9/2004 | Elmore et al. |
| 2004/0196784 A1 | 10/2004 | Larsson et al. |
| 2004/0198228 A1 | 10/2004 | Raghothaman et al. |
| 2004/0212481 A1 | 10/2004 | Abraham et al. |
| 2004/0213147 A1 | 10/2004 | Wiese et al. |
| 2004/0213189 A1 | 10/2004 | Alspaugh et al. |
| 2004/0213294 A1 | 10/2004 | Hughes et al. |
| 2004/0242185 A1 | 12/2004 | Lee et al. |

(56) References Cited

U.S. PATENT DOCUMENTS

| | | |
|---|---|---|
| 2004/0250069 A1 | 12/2004 | Kosamo et al. |
| 2005/0002408 A1 | 1/2005 | Lee et al. |
| 2005/0005854 A1 | 1/2005 | Suzuki et al. |
| 2005/0017825 A1* | 1/2005 | Hansen .................. H04B 3/54 333/242 |
| 2005/0031267 A1 | 2/2005 | Sumimoto et al. |
| 2005/0063422 A1 | 3/2005 | Lazar et al. |
| 2005/0068223 A1 | 3/2005 | Vavik et al. |
| 2005/0069321 A1 | 3/2005 | Sullivan et al. |
| 2005/0074208 A1 | 4/2005 | Badcock et al. |
| 2005/0097396 A1 | 5/2005 | Wood |
| 2005/0102185 A1 | 5/2005 | Barker et al. |
| 2005/0111533 A1 | 5/2005 | Berkman et al. |
| 2005/0141808 A1 | 6/2005 | Cheben et al. |
| 2005/0143868 A1 | 6/2005 | Whelan et al. |
| 2005/0151659 A1 | 7/2005 | Donovan et al. |
| 2005/0159187 A1 | 7/2005 | Mendolia et al. |
| 2005/0164666 A1 | 7/2005 | Lang et al. |
| 2005/0168326 A1 | 8/2005 | White et al. |
| 2005/0169056 A1 | 8/2005 | Berkman et al. |
| 2005/0169401 A1 | 8/2005 | Abraham et al. |
| 2005/0177463 A1 | 8/2005 | Crutchfield et al. |
| 2005/0190101 A1 | 9/2005 | Hiramatsu et al. |
| 2005/0208949 A1 | 9/2005 | Chiueh et al. |
| 2005/0212626 A1 | 9/2005 | Takamatsu et al. |
| 2005/0219126 A1 | 10/2005 | Rebeiz et al. |
| 2005/0219135 A1 | 10/2005 | Lee et al. |
| 2005/0220180 A1 | 10/2005 | Barlev |
| 2005/0226353 A1 | 10/2005 | Gebara et al. |
| 2005/0249245 A1 | 11/2005 | Hazani et al. |
| 2005/0258920 A1 | 11/2005 | Elmore |
| 2006/0034724 A1 | 2/2006 | Hamano et al. |
| 2006/0038660 A1 | 2/2006 | Doumuki et al. |
| 2006/0053486 A1 | 3/2006 | Wesinger et al. |
| 2006/0071776 A1 | 4/2006 | White et al. |
| 2006/0077906 A1 | 4/2006 | Maegawa et al. |
| 2006/0082516 A1 | 4/2006 | Strickland et al. |
| 2006/0085813 A1 | 4/2006 | Giraldin et al. |
| 2006/0094439 A1 | 5/2006 | Christian et al. |
| 2006/0106741 A1 | 5/2006 | Janarthanan et al. |
| 2006/0111047 A1 | 5/2006 | Louberg et al. |
| 2006/0113425 A1 | 6/2006 | Rader et al. |
| 2006/0114925 A1 | 6/2006 | Gerszberg et al. |
| 2006/0119528 A1 | 6/2006 | Bhattacharyya et al. |
| 2006/0120399 A1 | 6/2006 | Claret et al. |
| 2006/0128322 A1 | 6/2006 | Igarashi et al. |
| 2006/0132380 A1 | 6/2006 | Imai et al. |
| 2006/0153878 A1 | 7/2006 | Savarino et al. |
| 2006/0172781 A1 | 8/2006 | Mohebbi et al. |
| 2006/0176124 A1 | 8/2006 | Mansour et al. |
| 2006/0181394 A1 | 8/2006 | Clarke et al. |
| 2006/0187023 A1 | 8/2006 | Iwamura et al. |
| 2006/0192672 A1 | 8/2006 | Gidge et al. |
| 2006/0220833 A1 | 10/2006 | Berkman et al. |
| 2006/0221995 A1 | 10/2006 | Berkman et al. |
| 2006/0232493 A1 | 10/2006 | Huang et al. |
| 2006/0238347 A1 | 10/2006 | Parkinson et al. |
| 2006/0239501 A1 | 10/2006 | Petrovic et al. |
| 2006/0244672 A1 | 11/2006 | Avakian et al. |
| 2006/0249622 A1 | 11/2006 | Steele et al. |
| 2006/0255930 A1 | 11/2006 | Berkman et al. |
| 2006/0286927 A1 | 12/2006 | Berkman et al. |
| 2007/0002771 A1 | 1/2007 | Berkman et al. |
| 2007/0022475 A1 | 1/2007 | Rossi et al. |
| 2007/0025265 A1 | 2/2007 | Marcotullio et al. |
| 2007/0025386 A1 | 2/2007 | Riedel et al. |
| 2007/0040628 A1 | 2/2007 | Kanno et al. |
| 2007/0041464 A1 | 2/2007 | Kim et al. |
| 2007/0041554 A1 | 2/2007 | Newman |
| 2007/0054622 A1 | 3/2007 | Berkman |
| 2007/0063914 A1 | 3/2007 | Becker et al. |
| 2007/0090185 A1 | 4/2007 | Lewkowitz et al. |
| 2007/0105508 A1 | 5/2007 | Tong et al. |
| 2007/0135044 A1 | 6/2007 | Rhodes et al. |
| 2007/0144779 A1 | 6/2007 | Vicente et al. |
| 2007/0164908 A1 | 7/2007 | Turchinetz et al. |
| 2007/0189182 A1 | 8/2007 | Berkman et al. |
| 2007/0201540 A1 | 8/2007 | Berkman et al. |
| 2007/0202913 A1 | 8/2007 | Ban et al. |
| 2007/0211689 A1 | 9/2007 | Campero et al. |
| 2007/0211786 A1 | 9/2007 | Shattil et al. |
| 2007/0216596 A1 | 9/2007 | Lewis et al. |
| 2007/0223381 A1 | 9/2007 | Radtke et al. |
| 2007/0226779 A1 | 9/2007 | Yokomitsu et al. |
| 2007/0229184 A1 | 10/2007 | Liu et al. |
| 2007/0229231 A1 | 10/2007 | Hurwitz et al. |
| 2007/0252998 A1 | 11/2007 | Berthold et al. |
| 2007/0257858 A1 | 11/2007 | Liu et al. |
| 2007/0258484 A1 | 11/2007 | Tolaio et al. |
| 2007/0268124 A1 | 11/2007 | Berkman et al. |
| 2007/0268846 A1 | 11/2007 | Proctor et al. |
| 2007/0300280 A1 | 12/2007 | Turner et al. |
| 2008/0002652 A1 | 1/2008 | Gupta et al. |
| 2008/0003872 A1 | 1/2008 | Chen et al. |
| 2008/0007416 A1 | 1/2008 | Cern et al. |
| 2008/0008116 A1 | 1/2008 | Buga et al. |
| 2008/0043655 A1 | 2/2008 | Lee et al. |
| 2008/0055149 A1 | 3/2008 | Rees et al. |
| 2008/0060832 A1 | 3/2008 | Razavi et al. |
| 2008/0064331 A1 | 3/2008 | Washiro et al. |
| 2008/0077336 A1 | 3/2008 | Fernandes et al. |
| 2008/0080389 A1 | 4/2008 | Hart et al. |
| 2008/0084937 A1 | 4/2008 | Barthold et al. |
| 2008/0094298 A1 | 4/2008 | Kralovec et al. |
| 2008/0120667 A1 | 5/2008 | Zaltsman |
| 2008/0122723 A1 | 5/2008 | Rofougaran et al. |
| 2008/0130639 A1 | 6/2008 | Costa-Requena et al. |
| 2008/0143491 A1 | 6/2008 | Deaver et al. |
| 2008/0150790 A1 | 6/2008 | Voigtlaender et al. |
| 2008/0153416 A1 | 6/2008 | Washiro et al. |
| 2008/0177678 A1 | 7/2008 | Di Martini et al. |
| 2008/0191851 A1 | 8/2008 | Koga et al. |
| 2008/0211727 A1 | 9/2008 | Elmore |
| 2008/0247716 A1 | 10/2008 | Thomas et al. |
| 2008/0252522 A1 | 10/2008 | Asbridge et al. |
| 2008/0253723 A1 | 10/2008 | Stokes et al. |
| 2008/0255782 A1 | 10/2008 | Bilac et al. |
| 2008/0258993 A1 | 10/2008 | Gummalla et al. |
| 2008/0266060 A1 | 10/2008 | Takei et al. |
| 2008/0267076 A1 | 10/2008 | Laperi et al. |
| 2008/0279199 A1 | 11/2008 | Park et al. |
| 2008/0280574 A1 | 11/2008 | Rofougaran et al. |
| 2008/0313691 A1 | 12/2008 | Cholas |
| 2009/0002137 A1 | 1/2009 | Radtke et al. |
| 2009/0007189 A1 | 1/2009 | Gutknecht |
| 2009/0007190 A1 | 1/2009 | Weber et al. |
| 2009/0007194 A1 | 1/2009 | Brady, Jr. et al. |
| 2009/0009408 A1 | 1/2009 | Rofougaran et al. |
| 2009/0015239 A1 | 1/2009 | Georgiou et al. |
| 2009/0054056 A1 | 2/2009 | Gil et al. |
| 2009/0054737 A1 | 2/2009 | Magar et al. |
| 2009/0061940 A1 | 3/2009 | Scheinert et al. |
| 2009/0067441 A1 | 3/2009 | Ansari et al. |
| 2009/0079660 A1 | 3/2009 | Elmore |
| 2009/0085726 A1 | 4/2009 | Radtke et al. |
| 2009/0088907 A1 | 4/2009 | Lewis et al. |
| 2009/0093267 A1 | 4/2009 | Ariyur et al. |
| 2009/0109981 A1 | 4/2009 | Keselman |
| 2009/0125351 A1 | 5/2009 | Davis, Jr. et al. |
| 2009/0129301 A1 | 5/2009 | Belimpasakis et al. |
| 2009/0135848 A1 | 5/2009 | Chan et al. |
| 2009/0138931 A1 | 5/2009 | Lin et al. |
| 2009/0140852 A1 | 6/2009 | Stolarczyk et al. |
| 2009/0144417 A1 | 6/2009 | Kisel et al. |
| 2009/0171780 A1 | 7/2009 | Aldrey et al. |
| 2009/0175195 A1 | 7/2009 | Macauley et al. |
| 2009/0181664 A1 | 7/2009 | Kuruvilla et al. |
| 2009/0201133 A1 | 8/2009 | Bruns et al. |
| 2009/0202020 A1 | 8/2009 | Hafeez et al. |
| 2009/0210901 A1 | 8/2009 | Hawkins et al. |
| 2009/0212938 A1 | 8/2009 | Swaim et al. |
| 2009/0250449 A1 | 10/2009 | Petrenko et al. |
| 2009/0254971 A1 | 10/2009 | Herz et al. |
| 2009/0258652 A1 | 10/2009 | Lambert et al. |

(56) References Cited

U.S. PATENT DOCUMENTS

| | | |
|---|---|---|
| 2009/0284435 A1 | 11/2009 | Elmore et al. |
| 2009/0286482 A1 | 11/2009 | Gorokhov et al. |
| 2009/0289863 A1 | 11/2009 | Lier et al. |
| 2009/0304124 A1 | 12/2009 | Graef et al. |
| 2009/0311960 A1 | 12/2009 | Farahani et al. |
| 2009/0315668 A1 | 12/2009 | Leete, III et al. |
| 2009/0320058 A1 | 12/2009 | Wehmeyer et al. |
| 2009/0325479 A1 | 12/2009 | Chakrabarti et al. |
| 2009/0325628 A1 | 12/2009 | Becker et al. |
| 2010/0002618 A1 | 1/2010 | Eichinger et al. |
| 2010/0002731 A1 | 1/2010 | Kimura et al. |
| 2010/0013696 A1 | 1/2010 | Schmitt et al. |
| 2010/0026607 A1 | 2/2010 | Imai et al. |
| 2010/0039339 A1 | 2/2010 | Kuroda et al. |
| 2010/0045447 A1 | 2/2010 | Mollenkopf et al. |
| 2010/0052799 A1 | 3/2010 | Watanabe et al. |
| 2010/0053019 A1 | 3/2010 | Ikawa et al. |
| 2010/0057894 A1 | 3/2010 | Glasser |
| 2010/0080203 A1 | 4/2010 | Reynolds et al. |
| 2010/0085036 A1 | 4/2010 | Banting et al. |
| 2010/0090887 A1 | 4/2010 | Cooper et al. |
| 2010/0091712 A1 | 4/2010 | Lu et al. |
| 2010/0100918 A1 | 4/2010 | Egan, Jr. et al. |
| 2010/0111521 A1 | 5/2010 | Kim et al. |
| 2010/0119234 A1 | 5/2010 | Suematsu et al. |
| 2010/0121945 A1 | 5/2010 | Gerber et al. |
| 2010/0127848 A1 | 5/2010 | Mustapha et al. |
| 2010/0141527 A1 | 6/2010 | Lalezari |
| 2010/0142435 A1 | 6/2010 | Kim et al. |
| 2010/0150215 A1 | 6/2010 | Black et al. |
| 2010/0153990 A1 | 6/2010 | Ress et al. |
| 2010/0169937 A1 | 7/2010 | Atwal et al. |
| 2010/0175080 A1 | 7/2010 | Yuen et al. |
| 2010/0176894 A1 | 7/2010 | Tahara et al. |
| 2010/0177894 A1 | 7/2010 | Yasuma et al. |
| 2010/0185614 A1 | 7/2010 | O'Brien et al. |
| 2010/0201313 A1 | 8/2010 | Vorenkamp et al. |
| 2010/0214183 A1 | 8/2010 | Stoneback et al. |
| 2010/0214185 A1 | 8/2010 | Sammoura et al. |
| 2010/0220024 A1 | 9/2010 | Snow et al. |
| 2010/0224732 A1 | 9/2010 | Olson et al. |
| 2010/0225426 A1 | 9/2010 | Unger et al. |
| 2010/0232539 A1 | 9/2010 | Han et al. |
| 2010/0243633 A1 | 9/2010 | Huynh et al. |
| 2010/0253450 A1 | 10/2010 | Kim et al. |
| 2010/0256955 A1 | 10/2010 | Pupalaikis et al. |
| 2010/0265877 A1 | 10/2010 | Foxworthy et al. |
| 2010/0266063 A1 | 10/2010 | Harel et al. |
| 2010/0283693 A1 | 11/2010 | Xie et al. |
| 2010/0284446 A1 | 11/2010 | Mu et al. |
| 2010/0319068 A1 | 12/2010 | Abbadessa et al. |
| 2010/0327880 A1 | 12/2010 | Stein et al. |
| 2011/0018704 A1 | 1/2011 | Burrows et al. |
| 2011/0040861 A1 | 2/2011 | Van der Merwe et al. |
| 2011/0042120 A1 | 2/2011 | Otsuka et al. |
| 2011/0043051 A1 | 2/2011 | Meskens et al. |
| 2011/0053498 A1 | 3/2011 | Nogueira-Nine |
| 2011/0068893 A1 | 3/2011 | Lahiri et al. |
| 2011/0068988 A1 | 3/2011 | Monte et al. |
| 2011/0080301 A1 | 4/2011 | Chang et al. |
| 2011/0083399 A1 | 4/2011 | Lettkeman et al. |
| 2011/0103274 A1 | 5/2011 | Vavik et al. |
| 2011/0107364 A1 | 5/2011 | Lajoie et al. |
| 2011/0109936 A1 | 5/2011 | Coffee et al. |
| 2011/0110404 A1 | 5/2011 | Washiro |
| 2011/0118888 A1 | 5/2011 | White et al. |
| 2011/0132658 A1 | 6/2011 | Miller, II et al. |
| 2011/0133865 A1 | 6/2011 | Miller, II et al. |
| 2011/0133867 A1 | 6/2011 | Miller, II et al. |
| 2011/0136432 A1 | 6/2011 | Miller, II et al. |
| 2011/0140911 A1 | 6/2011 | Pant et al. |
| 2011/0141555 A1 | 6/2011 | Fermann et al. |
| 2011/0143673 A1 | 6/2011 | Landesman et al. |
| 2011/0148578 A1 | 6/2011 | Aloi et al. |
| 2011/0148687 A1 | 6/2011 | Wright et al. |
| 2011/0164514 A1 | 7/2011 | Afkhamie et al. |
| 2011/0165847 A1 | 7/2011 | Kawasaki et al. |
| 2011/0169336 A1 | 7/2011 | Yerazunis et al. |
| 2011/0172000 A1 | 7/2011 | Quigley et al. |
| 2011/0173447 A1 | 7/2011 | Zhang et al. |
| 2011/0187578 A1 | 8/2011 | Farneth et al. |
| 2011/0199265 A1 | 8/2011 | Lin et al. |
| 2011/0201269 A1 | 8/2011 | Hobbs et al. |
| 2011/0208450 A1 | 8/2011 | Salka et al. |
| 2011/0214176 A1 | 9/2011 | Burch et al. |
| 2011/0219402 A1 | 9/2011 | Candelore et al. |
| 2011/0220394 A1 | 9/2011 | Szylakowski et al. |
| 2011/0225046 A1 | 9/2011 | Eldering et al. |
| 2011/0228814 A1 | 9/2011 | Washiro et al. |
| 2011/0235536 A1 | 9/2011 | Nishizaka et al. |
| 2011/0268085 A1 | 11/2011 | Barany et al. |
| 2011/0274396 A1 | 11/2011 | Nakajima et al. |
| 2011/0286506 A1 | 11/2011 | Libby et al. |
| 2011/0291878 A1 | 12/2011 | McLaughlin et al. |
| 2011/0294509 A1 | 12/2011 | Kim et al. |
| 2011/0311231 A1 | 12/2011 | Ridgway et al. |
| 2011/0316645 A1 | 12/2011 | Takeuchi et al. |
| 2012/0002973 A1 | 1/2012 | Bruzzi et al. |
| 2012/0015382 A1 | 1/2012 | Weitz et al. |
| 2012/0015654 A1 | 1/2012 | Palanki et al. |
| 2012/0019420 A1 | 1/2012 | Caimi et al. |
| 2012/0019427 A1 | 1/2012 | Ishikawa et al. |
| 2012/0038520 A1 | 2/2012 | Cornwell et al. |
| 2012/0039366 A1 | 2/2012 | Wood et al. |
| 2012/0046891 A1 | 2/2012 | Yaney et al. |
| 2012/0054571 A1 | 3/2012 | Howard et al. |
| 2012/0068903 A1 | 3/2012 | Thevenard et al. |
| 2012/0077485 A1 | 3/2012 | Shin et al. |
| 2012/0078452 A1 | 3/2012 | Daum et al. |
| 2012/0084807 A1 | 4/2012 | Thompson et al. |
| 2012/0091820 A1 | 4/2012 | Campanella et al. |
| 2012/0092161 A1 | 4/2012 | West et al. |
| 2012/0093078 A1 | 4/2012 | Perlman et al. |
| 2012/0102568 A1 | 4/2012 | Tarbotton et al. |
| 2012/0105246 A1 | 5/2012 | Sexton et al. |
| 2012/0105637 A1 | 5/2012 | Yousefi et al. |
| 2012/0109545 A1 | 5/2012 | Meynardi et al. |
| 2012/0109566 A1 | 5/2012 | Adamian et al. |
| 2012/0117584 A1 | 5/2012 | Gordon |
| 2012/0129566 A1 | 5/2012 | Lee et al. |
| 2012/0133373 A1 | 5/2012 | Ali et al. |
| 2012/0137332 A1 | 5/2012 | Kumar et al. |
| 2012/0144420 A1 | 6/2012 | Del Sordo et al. |
| 2012/0146861 A1 | 6/2012 | Armbrecht et al. |
| 2012/0153087 A1 | 6/2012 | Collette et al. |
| 2012/0154239 A1 | 6/2012 | Bar-Sade et al. |
| 2012/0161543 A1 | 6/2012 | Reuven et al. |
| 2012/0176906 A1 | 7/2012 | Hartenstein et al. |
| 2012/0181258 A1 | 7/2012 | Shan et al. |
| 2012/0190386 A1 | 7/2012 | Anderson |
| 2012/0197558 A1 | 8/2012 | Henig et al. |
| 2012/0201145 A1 | 8/2012 | Ree et al. |
| 2012/0214538 A1 | 8/2012 | Kim et al. |
| 2012/0224807 A1 | 9/2012 | Winzer et al. |
| 2012/0226394 A1 | 9/2012 | Marcus et al. |
| 2012/0235864 A1 | 9/2012 | Lu et al. |
| 2012/0235881 A1 | 9/2012 | Pan et al. |
| 2012/0250534 A1 | 10/2012 | Langer et al. |
| 2012/0250752 A1 | 10/2012 | McHann et al. |
| 2012/0263152 A1 | 10/2012 | Fischer et al. |
| 2012/0267863 A1 | 10/2012 | Kiest et al. |
| 2012/0268340 A1 | 10/2012 | Capozzoli et al. |
| 2012/0270507 A1 | 10/2012 | Qin et al. |
| 2012/0272741 A1 | 11/2012 | Xiao et al. |
| 2012/0274528 A1 | 11/2012 | McMahon et al. |
| 2012/0287922 A1 | 11/2012 | Heck et al. |
| 2012/0299671 A1 | 11/2012 | Ikeda et al. |
| 2012/0304294 A1 | 11/2012 | Fujiwara et al. |
| 2012/0306587 A1 | 12/2012 | Strid et al. |
| 2012/0306708 A1 | 12/2012 | Henderson et al. |
| 2012/0313895 A1 | 12/2012 | Haroun et al. |
| 2012/0319903 A1 | 12/2012 | Huseth et al. |
| 2012/0322380 A1 | 12/2012 | Nannarone et al. |
| 2012/0322492 A1 | 12/2012 | Koo et al. |

(56) References Cited

U.S. PATENT DOCUMENTS

| | | |
|---|---|---|
| 2012/0324018 A1 | 12/2012 | Metcalf et al. |
| 2012/0327908 A1 | 12/2012 | Gupta et al. |
| 2012/0329523 A1 | 12/2012 | Stewart et al. |
| 2012/0330756 A1 | 12/2012 | Morris et al. |
| 2013/0002409 A1 | 1/2013 | Molina et al. |
| 2013/0003876 A1 | 1/2013 | Bennett |
| 2013/0010679 A1 | 1/2013 | Ma et al. |
| 2013/0015922 A1 | 1/2013 | Liu et al. |
| 2013/0016022 A1 | 1/2013 | Heiks et al. |
| 2013/0023302 A1 | 1/2013 | Sivanesan et al. |
| 2013/0039624 A1 | 2/2013 | Scherer et al. |
| 2013/0064178 A1 | 3/2013 | Cs et al. |
| 2013/0064311 A1 | 3/2013 | Turner et al. |
| 2013/0070621 A1 | 3/2013 | Marzetta et al. |
| 2013/0077612 A1 | 3/2013 | Khorami et al. |
| 2013/0077664 A1 | 3/2013 | Lee et al. |
| 2013/0080290 A1 | 3/2013 | Kamm |
| 2013/0086639 A1 | 4/2013 | Sondhi et al. |
| 2013/0093638 A1 | 4/2013 | Shoemaker et al. |
| 2013/0095875 A1 | 4/2013 | Reuven et al. |
| 2013/0108206 A1 | 5/2013 | Sasaoka et al. |
| 2013/0109317 A1 | 5/2013 | Kikuchi et al. |
| 2013/0117852 A1 | 5/2013 | Stute et al. |
| 2013/0120548 A1 | 5/2013 | Li et al. |
| 2013/0122828 A1 | 5/2013 | Choi et al. |
| 2013/0124365 A1 | 5/2013 | Pradeep |
| 2013/0127678 A1 | 5/2013 | Chandler et al. |
| 2013/0136410 A1 | 5/2013 | Sasaoka et al. |
| 2013/0144750 A1 | 6/2013 | Brown |
| 2013/0148194 A1 | 6/2013 | Altug et al. |
| 2013/0159153 A1 | 6/2013 | Lau et al. |
| 2013/0159856 A1 | 6/2013 | Ferren |
| 2013/0160122 A1 | 6/2013 | Choi et al. |
| 2013/0162490 A1 | 6/2013 | Blech et al. |
| 2013/0166690 A1 | 6/2013 | Shatzkamer et al. |
| 2013/0169499 A1 | 7/2013 | Lin et al. |
| 2013/0173807 A1 | 7/2013 | De Groot et al. |
| 2013/0178998 A1 | 7/2013 | Gadiraju et al. |
| 2013/0182804 A1 | 7/2013 | Yutaka et al. |
| 2013/0185552 A1 | 7/2013 | Steer et al. |
| 2013/0187636 A1 | 7/2013 | Kast et al. |
| 2013/0191052 A1 | 7/2013 | Fernandez et al. |
| 2013/0201006 A1 | 8/2013 | Kummetz et al. |
| 2013/0201904 A1 | 8/2013 | Toskala et al. |
| 2013/0205370 A1 | 8/2013 | Kalgi et al. |
| 2013/0207681 A1 | 8/2013 | Slupsky et al. |
| 2013/0207859 A1 | 8/2013 | Legay et al. |
| 2013/0219308 A1 | 8/2013 | Britton et al. |
| 2013/0230235 A1 | 9/2013 | Tateno et al. |
| 2013/0234904 A1 | 9/2013 | Blech et al. |
| 2013/0234961 A1 | 9/2013 | Garfinkel et al. |
| 2013/0235845 A1 | 9/2013 | Kovvali et al. |
| 2013/0235871 A1 | 9/2013 | Brzozowski et al. |
| 2013/0262656 A1 | 10/2013 | Cao et al. |
| 2013/0262857 A1 | 10/2013 | Neuman et al. |
| 2013/0263263 A1 | 10/2013 | Narkolayev et al. |
| 2013/0265732 A1 | 10/2013 | Herbsommer et al. |
| 2013/0268414 A1 | 10/2013 | Lehtiniemi et al. |
| 2013/0271349 A1 | 10/2013 | Wright et al. |
| 2013/0278464 A1 | 10/2013 | Xia et al. |
| 2013/0279523 A1 | 10/2013 | Denney et al. |
| 2013/0279561 A1 | 10/2013 | Jin et al. |
| 2013/0279868 A1 | 10/2013 | Zhang et al. |
| 2013/0285864 A1 | 10/2013 | Clymer et al. |
| 2013/0303089 A1 | 11/2013 | Wang et al. |
| 2013/0305369 A1 | 11/2013 | Karta et al. |
| 2013/0306351 A1 | 11/2013 | Lambert et al. |
| 2013/0307645 A1 | 11/2013 | Mita et al. |
| 2013/0311661 A1 | 11/2013 | McPhee |
| 2013/0314182 A1 | 11/2013 | Takeda et al. |
| 2013/0321225 A1 | 12/2013 | Pettus et al. |
| 2013/0326063 A1 | 12/2013 | Burch et al. |
| 2013/0326494 A1 | 12/2013 | Nunez et al. |
| 2013/0330050 A1 | 12/2013 | Yang et al. |
| 2013/0335165 A1 | 12/2013 | Arnold et al. |
| 2013/0336370 A1 | 12/2013 | Jovanovic et al. |
| 2013/0336418 A1 | 12/2013 | Tomeba et al. |
| 2013/0341094 A1 | 12/2013 | Taherian et al. |
| 2013/0342287 A1 | 12/2013 | Randall et al. |
| 2013/0343213 A1 | 12/2013 | Reynolds et al. |
| 2013/0343351 A1 | 12/2013 | Sambhwani et al. |
| 2014/0003394 A1 | 1/2014 | Rubin et al. |
| 2014/0003775 A1 | 1/2014 | Ko et al. |
| 2014/0007076 A1 | 1/2014 | Kim et al. |
| 2014/0009270 A1 | 1/2014 | Yamazaki et al. |
| 2014/0009822 A1 | 1/2014 | Dong et al. |
| 2014/0015705 A1 | 1/2014 | Ebihara et al. |
| 2014/0019576 A1 | 1/2014 | Lobo et al. |
| 2014/0026170 A1 | 1/2014 | Francisco et al. |
| 2014/0028184 A1 | 1/2014 | Voronin et al. |
| 2014/0028190 A1 | 1/2014 | Voronin et al. |
| 2014/0028532 A1 | 1/2014 | Ehrenberg et al. |
| 2014/0032005 A1 | 1/2014 | Iwamura |
| 2014/0036694 A1 | 2/2014 | Courtice et al. |
| 2014/0041925 A1 | 2/2014 | Siripurapu et al. |
| 2014/0043189 A1 | 2/2014 | Lee et al. |
| 2014/0043977 A1 | 2/2014 | Wiley et al. |
| 2014/0044139 A1 | 2/2014 | Dong et al. |
| 2014/0050212 A1 | 2/2014 | Braz et al. |
| 2014/0052810 A1 | 2/2014 | Osorio et al. |
| 2014/0056130 A1 | 2/2014 | Grayson et al. |
| 2014/0057576 A1 | 2/2014 | Liu et al. |
| 2014/0062784 A1 | 3/2014 | Rison et al. |
| 2014/0071818 A1 | 3/2014 | Wang et al. |
| 2014/0072064 A1 | 3/2014 | Lemson et al. |
| 2014/0072299 A1 | 3/2014 | Stapleton et al. |
| 2014/0077995 A1 | 3/2014 | Artemenko et al. |
| 2014/0086080 A1 | 3/2014 | Hui et al. |
| 2014/0086152 A1 | 3/2014 | Bontu et al. |
| 2014/0112184 A1 | 4/2014 | Chai |
| 2014/0124236 A1 | 5/2014 | Vu et al. |
| 2014/0126914 A1 | 5/2014 | Berlin et al. |
| 2014/0130111 A1 | 5/2014 | Nulty et al. |
| 2014/0132728 A1 | 5/2014 | Verano et al. |
| 2014/0139375 A1 | 5/2014 | Faragher et al. |
| 2014/0143055 A1 | 5/2014 | Johnson |
| 2014/0146902 A1 | 5/2014 | Liu et al. |
| 2014/0148107 A1 | 5/2014 | Maltsev et al. |
| 2014/0155054 A1 | 6/2014 | Henry et al. |
| 2014/0165145 A1 | 6/2014 | Baentsch et al. |
| 2014/0169186 A1 | 6/2014 | Zhu et al. |
| 2014/0177692 A1 | 6/2014 | Yu et al. |
| 2014/0179302 A1 | 6/2014 | Polehn et al. |
| 2014/0189677 A1 | 7/2014 | Curzi et al. |
| 2014/0189732 A1 | 7/2014 | Shkedi et al. |
| 2014/0191913 A1 | 7/2014 | Ge et al. |
| 2014/0204000 A1 | 7/2014 | Sato et al. |
| 2014/0204754 A1 | 7/2014 | Jeong et al. |
| 2014/0207844 A1 | 7/2014 | Mayo et al. |
| 2014/0208272 A1 | 7/2014 | Vats et al. |
| 2014/0222997 A1 | 8/2014 | Mermoud et al. |
| 2014/0223527 A1 | 8/2014 | Bortz et al. |
| 2014/0225129 A1 | 8/2014 | Inoue et al. |
| 2014/0227905 A1 | 8/2014 | Knott et al. |
| 2014/0227966 A1 | 8/2014 | Artemenko et al. |
| 2014/0233900 A1 | 8/2014 | Hugonnot et al. |
| 2014/0241718 A1 | 8/2014 | Jiang et al. |
| 2014/0254516 A1 | 9/2014 | Lee et al. |
| 2014/0254896 A1 | 9/2014 | Zhou et al. |
| 2014/0254979 A1 | 9/2014 | Zhang et al. |
| 2014/0266946 A1 | 9/2014 | Stevenson et al. |
| 2014/0266953 A1 | 9/2014 | Yen et al. |
| 2014/0267700 A1 | 9/2014 | Wang et al. |
| 2014/0269260 A1 | 9/2014 | Xue et al. |
| 2014/0269691 A1 | 9/2014 | Xue et al. |
| 2014/0269972 A1 | 9/2014 | Rada et al. |
| 2014/0273873 A1 | 9/2014 | Huynh et al. |
| 2014/0285277 A1 | 9/2014 | Herbsommer et al. |
| 2014/0285293 A1 | 9/2014 | Schuppener et al. |
| 2014/0285373 A1 | 9/2014 | Kuwahara et al. |
| 2014/0285389 A1 | 9/2014 | Fakharzadeh et al. |
| 2014/0286189 A1 | 9/2014 | Kang et al. |
| 2014/0286235 A1 | 9/2014 | Chang et al. |
| 2014/0286284 A1 | 9/2014 | Lim et al. |

(56) References Cited

U.S. PATENT DOCUMENTS

| | | |
|---|---|---|
| 2014/0287702 A1 | 9/2014 | Schuppener et al. |
| 2014/0299349 A1 | 10/2014 | Yamaguchi et al. |
| 2014/0304498 A1 | 10/2014 | Gonuguntla et al. |
| 2014/0317229 A1 | 10/2014 | Hughes et al. |
| 2014/0320364 A1 | 10/2014 | Gu et al. |
| 2014/0321273 A1 | 10/2014 | Morrill et al. |
| 2014/0325594 A1 | 10/2014 | Klein et al. |
| 2014/0334773 A1 | 11/2014 | Mathai et al. |
| 2014/0334789 A1 | 11/2014 | Matsuo et al. |
| 2014/0340271 A1 | 11/2014 | Petkov et al. |
| 2014/0343883 A1 | 11/2014 | Libby et al. |
| 2014/0349696 A1 | 11/2014 | Hyde et al. |
| 2014/0351571 A1 | 11/2014 | Jacobs |
| 2014/0355525 A1 | 12/2014 | Willis, III et al. |
| 2014/0355989 A1 | 12/2014 | Finckelstein |
| 2014/0357269 A1 | 12/2014 | Zhou et al. |
| 2014/0359275 A1 | 12/2014 | Murugesan et al. |
| 2014/0362374 A1 | 12/2014 | Santori |
| 2014/0362694 A1 | 12/2014 | Rodriques |
| 2014/0368301 A1 | 12/2014 | Herbsommer et al. |
| 2014/0369430 A1 | 12/2014 | Parnell et al. |
| 2014/0372068 A1 | 12/2014 | Seto et al. |
| 2014/0373053 A1 | 12/2014 | Leley et al. |
| 2014/0376655 A1 | 12/2014 | Ruan et al. |
| 2015/0008996 A1 | 1/2015 | Jessup et al. |
| 2015/0009089 A1 | 1/2015 | Pesa |
| 2015/0016260 A1 | 1/2015 | Chow et al. |
| 2015/0017473 A1 | 1/2015 | Verhoeven et al. |
| 2015/0022399 A1 | 1/2015 | Flannery et al. |
| 2015/0026460 A1 | 1/2015 | Walton |
| 2015/0029065 A1 | 1/2015 | Cheng |
| 2015/0036610 A1 | 2/2015 | Kim et al. |
| 2015/0042526 A1 | 2/2015 | Zeine |
| 2015/0048238 A1 | 2/2015 | Kawai |
| 2015/0049998 A1 | 2/2015 | Dumais |
| 2015/0061859 A1 | 3/2015 | Matsuoka et al. |
| 2015/0065166 A1 | 3/2015 | Ward et al. |
| 2015/0070231 A1 | 3/2015 | Park et al. |
| 2015/0071594 A1 | 3/2015 | Register |
| 2015/0073594 A1 | 3/2015 | Trujillo et al. |
| 2015/0077740 A1 | 3/2015 | Fuse |
| 2015/0078756 A1 | 3/2015 | Soto |
| 2015/0084660 A1 | 3/2015 | Knierim et al. |
| 2015/0084703 A1 | 3/2015 | Sanduleanu |
| 2015/0084814 A1 | 3/2015 | Rojanski et al. |
| 2015/0091650 A1 | 4/2015 | Nobbe |
| 2015/0094104 A1 | 4/2015 | Wilmhoff et al. |
| 2015/0098387 A1 | 4/2015 | Garg et al. |
| 2015/0099555 A1 | 4/2015 | Krishnaswamy et al. |
| 2015/0102972 A1 | 4/2015 | Scire-Scappuzzo et al. |
| 2015/0103685 A1 | 4/2015 | Butchko et al. |
| 2015/0104005 A1 | 4/2015 | Holman |
| 2015/0105115 A1 | 4/2015 | Hata et al. |
| 2015/0109178 A1 | 4/2015 | Hyde et al. |
| 2015/0116154 A1 | 4/2015 | Artemenko |
| 2015/0122886 A1 | 5/2015 | Michael |
| 2015/0126107 A1 | 5/2015 | Bennett et al. |
| 2015/0130675 A1 | 5/2015 | Parsche |
| 2015/0138022 A1 | 5/2015 | Takahashi |
| 2015/0138144 A1 | 5/2015 | Tanabe |
| 2015/0153248 A1 | 6/2015 | Hayward et al. |
| 2015/0156266 A1 | 6/2015 | Gupta |
| 2015/0162988 A1 | 6/2015 | Henry et al. |
| 2015/0171522 A1 | 6/2015 | Liu et al. |
| 2015/0172036 A1 | 6/2015 | Katar et al. |
| 2015/0181449 A1 | 6/2015 | Didenko et al. |
| 2015/0185425 A1 | 7/2015 | Gundel et al. |
| 2015/0195349 A1 | 7/2015 | Cardamore |
| 2015/0195719 A1 | 7/2015 | Rahman |
| 2015/0201228 A1 | 7/2015 | Hasek |
| 2015/0207527 A1 | 7/2015 | Eliaz et al. |
| 2015/0214615 A1 | 7/2015 | Patel et al. |
| 2015/0215268 A1 | 7/2015 | Dinha |
| 2015/0223078 A1 | 8/2015 | Bennett et al. |
| 2015/0223113 A1 | 8/2015 | Matsunaga |
| 2015/0223160 A1 | 8/2015 | Ho et al. |
| 2015/0230109 A1 | 8/2015 | Turner et al. |
| 2015/0236778 A1 | 8/2015 | Jalali |
| 2015/0236779 A1 | 8/2015 | Jalali |
| 2015/0237519 A1 | 8/2015 | Ghai |
| 2015/0249965 A1 | 9/2015 | Dussmann et al. |
| 2015/0263424 A1 | 9/2015 | Sanford |
| 2015/0271830 A1 | 9/2015 | Shin et al. |
| 2015/0276577 A1 | 10/2015 | Ruege et al. |
| 2015/0277569 A1 | 10/2015 | Sprenger |
| 2015/0280328 A1 | 10/2015 | Sanford et al. |
| 2015/0284079 A1 | 10/2015 | Matsuda |
| 2015/0288532 A1 | 10/2015 | Veyseh et al. |
| 2015/0289247 A1 | 10/2015 | Liu et al. |
| 2015/0303892 A1 | 10/2015 | Desclos |
| 2015/0304045 A1 | 10/2015 | Henry et al. |
| 2015/0304869 A1 | 10/2015 | Johnson et al. |
| 2015/0311951 A1 | 10/2015 | Hariz |
| 2015/0312774 A1 | 10/2015 | Lau |
| 2015/0318610 A1 | 11/2015 | Lee et al. |
| 2015/0323948 A1 | 11/2015 | Jeong |
| 2015/0325913 A1 | 11/2015 | Vagman |
| 2015/0326274 A1 | 11/2015 | Flood |
| 2015/0326287 A1 | 11/2015 | Kazmi et al. |
| 2015/0333386 A1* | 11/2015 | Kaneda ............... H01P 1/208 333/17.1 |
| 2015/0333804 A1 | 11/2015 | Yang et al. |
| 2015/0334769 A1 | 11/2015 | Kim et al. |
| 2015/0339912 A1 | 11/2015 | Farrand et al. |
| 2015/0344136 A1 | 12/2015 | Dahlstrom |
| 2015/0349415 A1 | 12/2015 | Iwanaka |
| 2015/0356482 A1 | 12/2015 | Whipple et al. |
| 2015/0356848 A1 | 12/2015 | Hatch |
| 2015/0369660 A1 | 12/2015 | Yu |
| 2015/0370251 A1 | 12/2015 | Siegel et al. |
| 2015/0373557 A1 | 12/2015 | Bennett et al. |
| 2015/0380814 A1 | 12/2015 | Boutayeb et al. |
| 2015/0382208 A1 | 12/2015 | Elliott et al. |
| 2015/0382363 A1 | 12/2015 | Wang et al. |
| 2016/0006129 A1 | 1/2016 | Haziza |
| 2016/0012460 A1 | 1/2016 | Kruglick |
| 2016/0014749 A1 | 1/2016 | Kang et al. |
| 2016/0021545 A1 | 1/2016 | Shaw |
| 2016/0026301 A1 | 1/2016 | Zhou et al. |
| 2016/0029009 A1 | 1/2016 | Lu et al. |
| 2016/0038074 A1 | 2/2016 | Brown et al. |
| 2016/0043478 A1 | 2/2016 | Hartenstein |
| 2016/0044705 A1 | 2/2016 | Gao |
| 2016/0050028 A1 | 2/2016 | Henry et al. |
| 2016/0056543 A1 | 2/2016 | Kwiatkowski |
| 2016/0063642 A1 | 3/2016 | Luciani et al. |
| 2016/0064794 A1 | 3/2016 | Henry et al. |
| 2016/0065252 A1 | 3/2016 | Preschutti |
| 2016/0065335 A1 | 3/2016 | Koo et al. |
| 2016/0066191 A1 | 3/2016 | Li |
| 2016/0068265 A1 | 3/2016 | Hoareau et al. |
| 2016/0068277 A1 | 3/2016 | Manitta |
| 2016/0069934 A1 | 3/2016 | Saxby et al. |
| 2016/0069935 A1 | 3/2016 | Kreikebaum et al. |
| 2016/0070265 A1 | 3/2016 | Liu et al. |
| 2016/0072173 A1 | 3/2016 | Herbsommer et al. |
| 2016/0072191 A1 | 3/2016 | Iwai |
| 2016/0072287 A1 | 3/2016 | Jia |
| 2016/0079769 A1 | 3/2016 | Corum et al. |
| 2016/0079771 A1 | 3/2016 | Corum |
| 2016/0079809 A1 | 3/2016 | Corum et al. |
| 2016/0080035 A1 | 3/2016 | Fuchs et al. |
| 2016/0080839 A1 | 3/2016 | Fuchs et al. |
| 2016/0082460 A1 | 3/2016 | McMaster et al. |
| 2016/0087344 A1 | 3/2016 | Artemenko et al. |
| 2016/0088498 A1 | 3/2016 | Sharawi |
| 2016/0094420 A1 | 3/2016 | Clemm et al. |
| 2016/0094879 A1 | 3/2016 | Gerszberg et al. |
| 2016/0099749 A1 | 4/2016 | Bennett et al. |
| 2016/0100324 A1 | 4/2016 | Henry et al. |
| 2016/0103199 A1 | 4/2016 | Rappaport |
| 2016/0105218 A1 | 4/2016 | Henry et al. |
| 2016/0105233 A1 | 4/2016 | Jalali |
| 2016/0105239 A1 | 4/2016 | Henry et al. |

(56) References Cited

U.S. PATENT DOCUMENTS

| | | |
|---|---|---|
| 2016/0105255 A1 | 4/2016 | Henry et al. |
| 2016/0111890 A1 | 4/2016 | Corum et al. |
| 2016/0112092 A1 | 4/2016 | Henry et al. |
| 2016/0112093 A1 | 4/2016 | Barzegar et al. |
| 2016/0112094 A1 | 4/2016 | Stuckman et al. |
| 2016/0112115 A1 | 4/2016 | Henry et al. |
| 2016/0112132 A1 | 4/2016 | Henry et al. |
| 2016/0112133 A1 | 4/2016 | Henry et al. |
| 2016/0112135 A1 | 4/2016 | Henry et al. |
| 2016/0112263 A1 | 4/2016 | Henry et al. |
| 2016/0116914 A1 | 4/2016 | Mucci |
| 2016/0118717 A1 | 4/2016 | Britz et al. |
| 2016/0124071 A1 | 5/2016 | Baxley et al. |
| 2016/0127931 A1 | 5/2016 | Baxley et al. |
| 2016/0131347 A1 | 5/2016 | Hill et al. |
| 2016/0134006 A1 | 5/2016 | Ness et al. |
| 2016/0135132 A1 | 5/2016 | Donepudi et al. |
| 2016/0135184 A1 | 5/2016 | Zavadsky et al. |
| 2016/0137311 A1 | 5/2016 | Peverill et al. |
| 2016/0139731 A1 | 5/2016 | Kim |
| 2016/0149312 A1 | 5/2016 | Henry et al. |
| 2016/0149614 A1 | 5/2016 | Barzegar |
| 2016/0149636 A1 | 5/2016 | Gerszberg et al. |
| 2016/0149665 A1 | 5/2016 | Henry et al. |
| 2016/0149731 A1 | 5/2016 | Henry et al. |
| 2016/0149753 A1 | 5/2016 | Gerszberg et al. |
| 2016/0150427 A1 | 5/2016 | Ramanath |
| 2016/0153938 A1 | 6/2016 | Balasubramaniam et al. |
| 2016/0164571 A1 | 6/2016 | Bennett et al. |
| 2016/0164573 A1 | 6/2016 | Birk et al. |
| 2016/0165472 A1 | 6/2016 | Gopalakrishnan et al. |
| 2016/0165478 A1 | 6/2016 | Yao et al. |
| 2016/0174040 A1 | 6/2016 | Roberts et al. |
| 2016/0179134 A1 | 6/2016 | Ryu |
| 2016/0181701 A1 | 6/2016 | Sangaran et al. |
| 2016/0182161 A1 | 6/2016 | Barzegar |
| 2016/0182981 A1 | 6/2016 | Minarik et al. |
| 2016/0188291 A1 | 6/2016 | Vilermo et al. |
| 2016/0189101 A1 | 6/2016 | Kantor et al. |
| 2016/0197392 A1 | 7/2016 | Henry et al. |
| 2016/0197409 A1 | 7/2016 | Henry et al. |
| 2016/0197630 A1 | 7/2016 | Kawasaki |
| 2016/0197642 A1 | 7/2016 | Henry et al. |
| 2016/0207627 A1 | 7/2016 | Hoareau et al. |
| 2016/0212065 A1 | 7/2016 | To et al. |
| 2016/0212641 A1 | 7/2016 | Kong et al. |
| 2016/0214717 A1 | 7/2016 | De Silva |
| 2016/0218407 A1 | 7/2016 | Henry et al. |
| 2016/0218437 A1 | 7/2016 | Guntupalli |
| 2016/0221039 A1 | 8/2016 | Fuchs et al. |
| 2016/0224235 A1 | 8/2016 | Forsstrom |
| 2016/0226681 A1 | 8/2016 | Henry et al. |
| 2016/0244165 A1 | 8/2016 | Patrick et al. |
| 2016/0248149 A1 | 8/2016 | Kim et al. |
| 2016/0248165 A1 | 8/2016 | Henry |
| 2016/0248509 A1 | 8/2016 | Henry |
| 2016/0249233 A1 | 8/2016 | Murray |
| 2016/0252970 A1 | 9/2016 | Dahl |
| 2016/0261309 A1 | 9/2016 | Henry |
| 2016/0261310 A1 | 9/2016 | Fuchs et al. |
| 2016/0269156 A1 | 9/2016 | Barzegar et al. |
| 2016/0276725 A1 | 9/2016 | Barnickel et al. |
| 2016/0277939 A1 | 9/2016 | Olcott et al. |
| 2016/0285508 A1 | 9/2016 | Bennett et al. |
| 2016/0285512 A1 | 9/2016 | Henry et al. |
| 2016/0294444 A1 | 10/2016 | Gerszberg et al. |
| 2016/0294517 A1 | 10/2016 | Barzegar et al. |
| 2016/0295431 A1 | 10/2016 | Henry et al. |
| 2016/0306361 A1 | 10/2016 | Ben Shalom et al. |
| 2016/0315659 A1 | 10/2016 | Henry |
| 2016/0315660 A1 | 10/2016 | Henry |
| 2016/0315661 A1 | 10/2016 | Henry |
| 2016/0315662 A1 | 10/2016 | Henry |
| 2016/0329957 A1 | 11/2016 | Schmid et al. |
| 2016/0336091 A1 | 11/2016 | Henry et al. |
| 2016/0336092 A1 | 11/2016 | Henry et al. |
| 2016/0336636 A1 | 11/2016 | Henry et al. |
| 2016/0336996 A1 | 11/2016 | Henry |
| 2016/0336997 A1 | 11/2016 | Henry |
| 2016/0351987 A1 | 12/2016 | Henry |
| 2016/0359523 A1 | 12/2016 | Bennett |
| 2016/0359524 A1 | 12/2016 | Bennett et al. |
| 2016/0359529 A1 | 12/2016 | Bennett et al. |
| 2016/0359530 A1 | 12/2016 | Bennett |
| 2016/0359541 A1 | 12/2016 | Bennett |
| 2016/0359542 A1 | 12/2016 | Bennett |
| 2016/0359543 A1 | 12/2016 | Bennett et al. |
| 2016/0359544 A1 | 12/2016 | Bennett |
| 2016/0359546 A1 | 12/2016 | Bennett |
| 2016/0359547 A1 | 12/2016 | Bennett et al. |
| 2016/0359649 A1 | 12/2016 | Bennett et al. |
| 2016/0360511 A1 | 12/2016 | Barzegar |
| 2016/0360533 A1 | 12/2016 | Bennett et al. |
| 2016/0365175 A1 | 12/2016 | Bennett et al. |
| 2016/0365893 A1 | 12/2016 | Bennett et al. |
| 2016/0365894 A1 | 12/2016 | Bennett et al. |
| 2016/0365897 A1 | 12/2016 | Gross |
| 2016/0365916 A1 | 12/2016 | Bennett et al. |
| 2016/0365943 A1 | 12/2016 | Henry et al. |
| 2016/0365966 A1 | 12/2016 | Bennett et al. |
| 2016/0366586 A1 | 12/2016 | Gross et al. |
| 2016/0366587 A1 | 12/2016 | Gross |
| 2016/0373937 A1 | 12/2016 | Bennett et al. |
| 2016/0380327 A1 | 12/2016 | Henry |
| 2016/0380328 A1 | 12/2016 | Henry |
| 2016/0380358 A1 | 12/2016 | Henry |
| 2016/0380701 A1 | 12/2016 | Henry et al. |
| 2016/0380702 A1 | 12/2016 | Henry et al. |
| 2017/0012667 A1 | 1/2017 | Bennett |
| 2017/0018174 A1 | 1/2017 | Gerszberg |
| 2017/0018332 A1 | 1/2017 | Barzegar et al. |
| 2017/0018830 A1 | 1/2017 | Henry et al. |
| 2017/0018831 A1 | 1/2017 | Henry et al. |
| 2017/0018832 A1 | 1/2017 | Henry et al. |
| 2017/0018833 A1 | 1/2017 | Henry et al. |
| 2017/0018851 A1 | 1/2017 | Henry et al. |
| 2017/0018852 A1 | 1/2017 | Adriazola et al. |
| 2017/0018856 A1 | 1/2017 | Henry et al. |
| 2017/0019130 A1 | 1/2017 | Henry et al. |
| 2017/0019131 A1 | 1/2017 | Henry et al. |
| 2017/0019150 A1 | 1/2017 | Henry |
| 2017/0019189 A1 | 1/2017 | Henry et al. |
| 2017/0025728 A1 | 1/2017 | Henry et al. |
| 2017/0025732 A1 | 1/2017 | Henry et al. |
| 2017/0025734 A1 | 1/2017 | Henry et al. |
| 2017/0025839 A1 | 1/2017 | Henry et al. |
| 2017/0026063 A1 | 1/2017 | Henry |
| 2017/0026082 A1 | 1/2017 | Henry et al. |
| 2017/0026084 A1 | 1/2017 | Henry et al. |
| 2017/0026129 A1 | 1/2017 | Henry |
| 2017/0033464 A1 | 2/2017 | Henry et al. |
| 2017/0033465 A1 | 2/2017 | Henry et al. |
| 2017/0033466 A1 | 2/2017 | Henry et al. |
| 2017/0033834 A1 | 2/2017 | Gross |
| 2017/0033835 A1 | 2/2017 | Bennett et al. |
| 2017/0033953 A1 | 2/2017 | Henry et al. |
| 2017/0033954 A1 | 2/2017 | Henry et al. |
| 2017/0034042 A1 | 2/2017 | Gross et al. |
| 2017/0041081 A1 | 2/2017 | Henry et al. |
| 2017/0047662 A1 | 2/2017 | Henry et al. |

FOREIGN PATENT DOCUMENTS

| | | |
|---|---|---|
| AU | 606303 B2 | 1/1991 |
| AU | 7261000 A | 4/2001 |
| AU | 760272 B2 | 5/2003 |
| AU | 2005227368 B2 | 2/2009 |
| AU | 2010101079 A4 | 11/2010 |
| AU | 2007215252 B2 | 1/2011 |
| AU | 201400748 | 3/2014 |
| AU | 2014200748 A1 | 3/2014 |
| CA | 1136267 A1 | 11/1982 |
| CA | 1211813 A1 | 9/1986 |
| CA | 1328009 C | 3/1994 |

(56) References Cited

FOREIGN PATENT DOCUMENTS

| | | | |
|---|---|---|---|
| CA | 2260380 C | | 12/2000 |
| CA | 2348614 A1 | | 3/2001 |
| CA | 2449596 A1 | | 6/2005 |
| CA | 2515560 A1 | | 2/2007 |
| CA | 2664573 A1 | | 4/2008 |
| CA | 2467988 C | | 11/2010 |
| CA | 2777147 A1 | | 4/2011 |
| CA | 2814529 A1 | | 4/2012 |
| CA | 2787580 A1 | | 2/2013 |
| CA | 2927054 A1 | | 5/2015 |
| CA | 2940976 | | 9/2015 |
| CN | 2116969 U | | 9/1992 |
| CN | 1155354 C | | 7/1997 |
| CN | 1411563 A | | 4/2003 |
| CN | 1126425 C | | 10/2003 |
| CN | 2730033 Y | | 9/2005 |
| CN | 1833397 A | | 9/2006 |
| CN | 1885736 A | | 12/2006 |
| CN | 201048157 Y | | 4/2008 |
| CN | 201146495 Y | | 11/2008 |
| CN | 201207179 Y | | 3/2009 |
| CN | 100502181 C | | 6/2009 |
| CN | 201282193 Y | | 7/2009 |
| CN | 101834011 U | | 4/2010 |
| CN | 1823275 B | | 5/2010 |
| CN | 101785201 A | | 7/2010 |
| CN | 1820482 B | | 12/2010 |
| CN | 101075702 B | | 2/2011 |
| CN | 101978613 A | | 2/2011 |
| CN | 102130698 A | | 7/2011 |
| CN | 102136634 A | | 7/2011 |
| CN | 201985870 U | | 9/2011 |
| CN | 102208716 A | | 10/2011 |
| CN | 102280704 A | | 12/2011 |
| CN | 102280709 A | | 12/2011 |
| CN | 202093126 U | | 12/2011 |
| CN | 102351415 A | | 2/2012 |
| CN | 102396111 A | | 3/2012 |
| CN | 202253536 U | | 5/2012 |
| CN | 102544736 A | | 7/2012 |
| CN | 102590893 A | | 7/2012 |
| CN | 102694351 A | | 9/2012 |
| CN | 202424729 U | | 9/2012 |
| CN | 101662076 B | | 11/2012 |
| CN | 102780058 A | | 11/2012 |
| CN | 102017692 B | | 4/2013 |
| CN | 103078673 A | | 5/2013 |
| CN | 103117118 A | | 5/2013 |
| CN | 103163881 A | | 6/2013 |
| CN | 203204743 U | | 9/2013 |
| CN | 1863244 B | | 10/2013 |
| CN | 101958461 B | | 11/2013 |
| CN | 103700442 A | | 4/2014 |
| CN | 103943925 A | | 7/2014 |
| CN | 104052742 A | | 9/2014 |
| CN | 104064844 A | | 9/2014 |
| CN | 203813973 U | | 9/2014 |
| CN | 104091987 A | | 10/2014 |
| CN | 104092028 A | | 10/2014 |
| CN | 203931626 U | | 11/2014 |
| CN | 203950607 U | | 11/2014 |
| CN | 104181552 A | | 12/2014 |
| CN | 204538183 | | 8/2015 |
| CN | 102412442 B | | 10/2015 |
| CN | 204760545 U | | 11/2015 |
| CN | 105262551 A | | 1/2016 |
| CN | 205265924 | | 1/2016 |
| CN | 105359572 A | | 2/2016 |
| CN | 105453340 | | 3/2016 |
| CN | 105594138 A | | 5/2016 |
| CN | 104162995 B | | 6/2016 |
| CN | 105813193 A | | 7/2016 |
| DE | 3504546 A1 | | 8/1986 |
| DE | 3533204 A1 | | 3/1987 |
| DE | 3533211 A1 | | 3/1987 |
| DE | 3827956 A1 | | 3/1989 |
| DE | 4027367 C1 | | 7/1991 |
| DE | 4225595 C1 | | 9/1993 |
| DE | 19501448 A1 | | 7/1996 |
| DE | 19939832 A1 | | 2/2001 |
| DE | 10043761 C2 | | 11/2002 |
| DE | 102004024356 A1 | | 9/2005 |
| DE | 69732676 T2 | | 4/2006 |
| DE | 4337835 B4 | | 5/2008 |
| DE | 102007049914 A1 | | 4/2009 |
| DE | 102012004998 A1 | | 7/2013 |
| DE | 102012203816 A1 | | 9/2013 |
| EP | 0102846 | | 3/1984 |
| EP | 0110478 | | 6/1984 |
| EP | 0136818 | | 4/1985 |
| EP | 0280379 | | 8/1988 |
| EP | 0330303 | | 8/1989 |
| EP | 0331248 | | 9/1989 |
| EP | 0342149 | | 11/1989 |
| EP | 0391719 | | 4/1990 |
| EP | 425979 A2 | | 5/1991 |
| EP | 0485467 | | 5/1992 |
| EP | 272785 B1 | | 2/1994 |
| EP | 0651487 | | 10/1994 |
| EP | 0371660 | | 4/1996 |
| EP | 0756392 | | 1/1997 |
| EP | 834722 A2 | | 4/1998 |
| EP | 0840464 | | 5/1998 |
| EP | 0871241 B1 | | 10/1998 |
| EP | 0890132 | | 1/1999 |
| EP | 755092 A3 | | 4/1999 |
| EP | 0896380 | | 10/1999 |
| EP | 676648 B1 | | 5/2000 |
| EP | 1085599 A2 | | 3/2001 |
| EP | 0907983 B1 | | 6/2001 |
| EP | 0756786 | | 8/2001 |
| EP | 1127283 A1 | | 8/2001 |
| EP | 1129550 A1 | | 9/2001 |
| EP | 1184930 A1 | | 3/2002 |
| EP | 1195847 A2 | | 4/2002 |
| EP | 1237303 A2 | | 9/2002 |
| EP | 1296146 A1 | | 3/2003 |
| EP | 0772061 | | 7/2003 |
| EP | 1346431 A1 | | 9/2003 |
| EP | 1249056 B1 | | 1/2004 |
| EP | 1376755 A1 | | 1/2004 |
| EP | 1401048 A1 | | 3/2004 |
| EP | 1454422 A1 | | 9/2004 |
| EP | 1488397 A1 | | 12/2004 |
| EP | 1509970 | | 3/2005 |
| EP | 1371108 B1 | | 6/2005 |
| EP | 1550327 A2 | | 7/2005 |
| EP | 1341255 B8 | | 8/2005 |
| EP | 1577687 A1 | | 9/2005 |
| EP | 1312135 B1 | | 11/2005 |
| EP | 1608110 A1 | | 12/2005 |
| EP | 1624685 A2 | | 2/2006 |
| EP | 1642468 A2 | | 4/2006 |
| EP | 1647072 A1 | | 4/2006 |
| EP | 1608110 B1 | | 10/2006 |
| EP | 1793508 A1 | | 6/2007 |
| EP | 1842265 A1 | | 10/2007 |
| EP | 1898532 A2 | | 3/2008 |
| EP | 1930982 A1 | | 6/2008 |
| EP | 1953940 A1 | | 8/2008 |
| EP | 1696509 B1 | | 10/2009 |
| EP | 2159749 A1 | | 3/2010 |
| EP | 2165550 A1 | | 3/2010 |
| EP | 1166599 B1 | | 5/2010 |
| EP | 1807950 A4 | | 1/2011 |
| EP | 2404347 A2 | | 1/2012 |
| EP | 2472671 A1 | | 7/2012 |
| EP | 1817855 B1 | | 1/2013 |
| EP | 2568528 A2 | | 3/2013 |
| EP | 2302735 B1 | | 9/2013 |
| EP | 2472737 B1 | | 9/2013 |
| EP | 2640115 A1 | | 9/2013 |
| EP | 2016643 B1 | | 7/2014 |
| EP | 2760081 A1 | | 7/2014 |

(56) References Cited

FOREIGN PATENT DOCUMENTS

| | | |
|---|---|---|
| EP | 2804259 A1 | 11/2014 |
| EP | 2507939 B1 | 12/2014 |
| EP | 2680452 B1 | 1/2015 |
| EP | 2838155 A1 | 2/2015 |
| EP | 2846480 A1 | 3/2015 |
| EP | 2849524 A1 | 3/2015 |
| EP | 2850695 A1 | 3/2015 |
| EP | 2853902 A1 | 4/2015 |
| EP | 2854361 A1 | 4/2015 |
| EP | 2870802 A1 | 5/2015 |
| EP | 2710400 A4 | 6/2015 |
| EP | 3076482 A1 | 10/2016 |
| ES | 2120893 A1 | 11/1998 |
| FR | 2119804 A1 | 8/1972 |
| FR | 2214161 A1 | 8/1974 |
| FR | 2416562 A1 | 8/1979 |
| FR | 2583226 A1 | 12/1986 |
| FR | 2691602 A1 | 11/1993 |
| FR | 2849728 A1 | 7/2004 |
| FR | 2841387 B1 | 4/2006 |
| FR | 2893717 A1 | 5/2007 |
| FR | 2946466 B1 | 3/2012 |
| FR | 2986376 B1 | 10/2014 |
| FR | 3034203 | 9/2016 |
| GB | 175489 A | 2/1922 |
| GB | 462804 A | 3/1937 |
| GB | 529290 A | 11/1940 |
| GB | 603119 A | 10/1945 |
| GB | 589603 A | 6/1947 |
| GB | 640181 A | 7/1950 |
| GB | 663166 A | 12/1951 |
| GB | 667290 A | 2/1952 |
| GB | 668827 A | 3/1952 |
| GB | 682115 A | 11/1952 |
| GB | 682817 A | 11/1952 |
| GB | 731473 A | 6/1955 |
| GB | 746111 A | 3/1956 |
| GB | 751153 A | 6/1956 |
| GB | 767506 A | 2/1957 |
| GB | 835976 A | 6/1960 |
| GB | 845492 A | 8/1960 |
| GB | 859951 A | 1/1961 |
| GB | 889856 A | 2/1962 |
| GB | 905417 A | 9/1962 |
| GB | 926958 A | 5/1963 |
| GB | 993561 A | 5/1965 |
| GB | 1004318 A | 9/1965 |
| GB | 1076772 A | 7/1967 |
| GB | 1141390 A | 1/1969 |
| GB | 1298387 A | 11/1972 |
| GB | 1383549 A | 2/1974 |
| GB | 1370669 A | 10/1974 |
| GB | 1422956 A | 1/1976 |
| GB | 1424351 A | 2/1976 |
| GB | 1468310 A | 3/1977 |
| GB | 1469840 A | 4/1977 |
| GB | 1527228 A | 10/1978 |
| GB | 2010528 A | 6/1979 |
| GB | 2045055 A | 10/1980 |
| GB | 1580627 A | 12/1980 |
| GB | 1584193 A | 2/1981 |
| GB | 2227369 A | 7/1990 |
| GB | 2247990 A | 3/1992 |
| GB | 2368468 A | 5/2002 |
| GB | 2362472 B | 10/2003 |
| GB | 2393370 A | 3/2004 |
| GB | 2394364 B | 6/2005 |
| GB | 2414862 A | 12/2005 |
| GB | 2411554 B | 1/2006 |
| GB | 705192 | 4/2007 |
| GB | 714974 | 9/2007 |
| GB | 718597 | 10/2007 |
| GB | 2474037 A | 4/2011 |
| GB | 2476787 A | 7/2011 |
| GB | 2474605 B | 9/2011 |
| GB | 2485355 A | 5/2012 |
| GB | 2481715 B | 1/2014 |
| GB | 2507269 A | 4/2014 |
| GB | 2476149 B | 7/2014 |
| GB | 2532207 A | 5/2016 |
| IN | 261253 A1 | 6/2014 |
| IN | 201647015348 A | 8/2016 |
| JP | S50109642 | 9/1975 |
| JP | 55124303 U | 9/1980 |
| JP | 55138902 U | 10/1980 |
| JP | 574601 | 1/1982 |
| JP | 61178682 U | 11/1986 |
| JP | 61260702 A | 11/1986 |
| JP | 62110303 U | 7/1987 |
| JP | 62190903 U | 8/1987 |
| JP | 02214307 A | 8/1990 |
| JP | 03167906 A | 7/1991 |
| JP | 0653894 | 8/1991 |
| JP | 04369905 A | 12/1992 |
| JP | 3001844 U | 9/1994 |
| JP | 077769 | 1/1995 |
| JP | 7212126 | 11/1995 |
| JP | 0829545 | 2/1996 |
| JP | 08167810 A | 6/1996 |
| JP | 08196022 A | 7/1996 |
| JP | 08316918 A | 11/1996 |
| JP | 2595339 B2 | 4/1997 |
| JP | 2639531 B2 | 8/1997 |
| JP | 10206183 A | 8/1998 |
| JP | 10271071 A | 10/1998 |
| JP | 116928 A | 1/1999 |
| JP | 1114749 A | 1/1999 |
| JP | 11239085 A | 8/1999 |
| JP | 11313022 A | 11/1999 |
| JP | 2000077889 A | 3/2000 |
| JP | 2000216623 A | 8/2000 |
| JP | 2000244238 A | 9/2000 |
| JP | 2001217634 A | 8/2001 |
| JP | 2002029247 A | 1/2002 |
| JP | 2002236174 A | 8/2002 |
| JP | 200328219 A | 1/2003 |
| JP | 2003008336 A | 1/2003 |
| JP | 2003057464 A | 2/2003 |
| JP | 2003511677 A | 3/2003 |
| JP | 3411428 B2 | 6/2003 |
| JP | 2003324309 A | 11/2003 |
| JP | 3480153 B2 | 12/2003 |
| JP | 2003344883 A | 12/2003 |
| JP | 2004521379 A | 7/2004 |
| JP | 2004253853 A | 9/2004 |
| JP | 2004274656 A | 9/2004 |
| JP | 2004297107 A | 10/2004 |
| JP | 2004304659 A | 10/2004 |
| JP | 2005110231 A | 4/2005 |
| JP | 2005182469 A | 7/2005 |
| JP | 3734975 B2 | 1/2006 |
| JP | 2006153878 A | 6/2006 |
| JP | 2006163886 A | 6/2006 |
| JP | 2006166399 A | 6/2006 |
| JP | 2007042009 A | 2/2007 |
| JP | 2007072945 A | 3/2007 |
| JP | 3938315 B2 | 6/2007 |
| JP | 2007174017 A | 7/2007 |
| JP | 2007259001 A | 10/2007 |
| JP | 4025674 B2 | 12/2007 |
| JP | 2008017263 A | 1/2008 |
| JP | 2008021483 A | 1/2008 |
| JP | 4072280 B2 | 4/2008 |
| JP | 4142062 B2 | 8/2008 |
| JP | 2008209965 A | 9/2008 |
| JP | 2008218362 A | 9/2008 |
| JP | 2009004986 A | 1/2009 |
| JP | 4252573 B2 | 4/2009 |
| JP | 4259760 B2 | 4/2009 |
| JP | 2009124229 A | 6/2009 |
| JP | 2010045471 A | 2/2010 |
| JP | 2010192992 A | 9/2010 |
| JP | 2010541468 A | 12/2010 |
| JP | 2011160446 A | 8/2011 |

(56) References Cited

FOREIGN PATENT DOCUMENTS

| | | |
|---|---|---|
| JP | 2012058162 A | 3/2012 |
| JP | 2012090242 A | 5/2012 |
| JP | 2012175680 A | 9/2012 |
| JP | 2012205104 A | 10/2012 |
| JP | 2012248035 A | 12/2012 |
| JP | 2013046412 A | 3/2013 |
| JP | 2013110503 A | 6/2013 |
| JP | 5230779 B2 | 7/2013 |
| JP | 2014045237 A | 3/2014 |
| JP | 5475475 B2 | 4/2014 |
| JP | 5497348 B2 | 5/2014 |
| JP | 5618072 B2 | 11/2014 |
| JP | 2015095520 A | 5/2015 |
| JP | 2015188174 | 10/2015 |
| KR | 20000074034 | 12/2000 |
| KR | 20020091917 | 12/2002 |
| KR | 100624049 B1 | 9/2006 |
| KR | 200425873 Y1 | 9/2006 |
| KR | 100636388 B1 | 10/2006 |
| KR | 100725002 B1 | 6/2007 |
| KR | 100849702 B1 | 7/2008 |
| KR | 100916077 B1 | 8/2009 |
| KR | 100952976 B1 | 4/2010 |
| KR | 100989064 B1 | 10/2010 |
| KR | 101060584 B1 | 8/2011 |
| KR | 101070364 B1 | 9/2011 |
| KR | 101212354 B1 | 12/2012 |
| KR | 101259715 B1 | 4/2013 |
| KR | 101288770 B1 | 7/2013 |
| KR | 20140104097 A | 8/2014 |
| KR | 101435538 B1 | 9/2014 |
| KR | 101447809 B1 | 10/2014 |
| KR | 20150087455 | 7/2015 |
| KR | 101549622 | 9/2015 |
| KR | 200479199 Y1 | 12/2015 |
| KR | 101586236 B1 | 1/2016 |
| KR | 101606803 | 1/2016 |
| KR | 101607420 B1 | 3/2016 |
| NL | 69072 | 1/1945 |
| RU | 2129746 C1 | 4/1999 |
| RU | 2432647 C1 | 10/2011 |
| TW | 201537432 | 10/2015 |
| WO | 8301711 A1 | 5/1983 |
| WO | 9116770 A1 | 10/1991 |
| WO | 9210014 | 6/1992 |
| WO | 9323928 | 11/1993 |
| WO | 9424467 A1 | 10/1994 |
| WO | 9523440 A1 | 8/1995 |
| WO | 9529537 | 11/1995 |
| WO | 9529537 A1 | 11/1995 |
| WO | 9603801 A1 | 2/1996 |
| WO | 9619089 | 6/1996 |
| WO | 9639729 A1 | 12/1996 |
| WO | 9641157 | 12/1996 |
| WO | 9735387 A1 | 9/1997 |
| WO | 9739445 A1 | 10/1997 |
| WO | 9829853 A1 | 7/1998 |
| WO | 9857207 | 12/1998 |
| WO | 9859254 A1 | 12/1998 |
| WO | 9923848 A2 | 5/1999 |
| WO | 9945310 | 9/1999 |
| WO | 9948230 A1 | 9/1999 |
| WO | 9967903 A1 | 12/1999 |
| WO | 0070891 A1 | 11/2000 |
| WO | 00/74428 A1 | 12/2000 |
| WO | WO0114985 A1 | 3/2001 |
| WO | 0128159 A2 | 4/2001 |
| WO | 0131746 A1 | 5/2001 |
| WO | 0145206 A1 | 6/2001 |
| WO | 0192910 A2 | 12/2001 |
| WO | 02061467 A2 | 8/2002 |
| WO | 02061971 A1 | 8/2002 |
| WO | 03/005629 | 1/2003 |
| WO | 03009083 | 1/2003 |
| WO | 03012614 A1 | 2/2003 |
| WO | 03026166 | 3/2003 |
| WO | 03026462 A1 | 4/2003 |
| WO | 03044981 A1 | 5/2003 |
| WO | 03088418 | 10/2003 |
| WO | 03099740 A1 | 12/2003 |
| WO | 2004011995 A1 | 2/2004 |
| WO | 2004038891 A2 | 5/2004 |
| WO | 2004/051804 | 6/2004 |
| WO | 2004051804 A1 | 6/2004 |
| WO | 2004054159 A2 | 6/2004 |
| WO | 2004077746 A1 | 9/2004 |
| WO | 2005015686 A1 | 2/2005 |
| WO | 2005072469 A2 | 8/2005 |
| WO | 2006012610 A2 | 2/2006 |
| WO | 2006061865 A1 | 6/2006 |
| WO | 2006085804 A1 | 8/2006 |
| WO | 2006102419 A2 | 9/2006 |
| WO | 2006111809 A1 | 10/2006 |
| WO | 2006116396 A2 | 11/2006 |
| WO | 2006122041 A2 | 11/2006 |
| WO | 2006125279 A1 | 11/2006 |
| WO | 2007000777 B1 | 2/2007 |
| WO | 2006050331 A3 | 3/2007 |
| WO | 2007031435 A1 | 3/2007 |
| WO | 2007071797 A1 | 6/2007 |
| WO | 2007148097 A2 | 12/2007 |
| WO | 2008003939 A1 | 1/2008 |
| WO | 2007094944 A3 | 3/2008 |
| WO | 2007149746 A3 | 4/2008 |
| WO | 2008044062 A1 | 4/2008 |
| WO | 2008055084 A2 | 5/2008 |
| WO | 2008061107 A2 | 5/2008 |
| WO | 2008069358 A1 | 6/2008 |
| WO | 2008070957 A1 | 6/2008 |
| WO | 2008102987 A1 | 8/2008 |
| WO | 2008117973 A1 | 10/2008 |
| WO | 2008155769 A2 | 12/2008 |
| WO | 2009014704 A1 | 1/2009 |
| WO | 2007098061 A3 | 2/2009 |
| WO | 2009031794 A1 | 3/2009 |
| WO | 2009035285 A2 | 3/2009 |
| WO | 2009090602 A1 | 7/2009 |
| WO | 2009131316 A2 | 10/2009 |
| WO | 2010017549 A1 | 2/2010 |
| WO | 2010050892 A1 | 5/2010 |
| WO | 2010147806 A1 | 12/2010 |
| WO | 2011006210 A1 | 1/2011 |
| WO | 2011032605 A1 | 3/2011 |
| WO | 2011085650 A1 | 7/2011 |
| WO | 2011137793 A1 | 11/2011 |
| WO | 2012/007831 | 1/2012 |
| WO | 2012038816 A1 | 3/2012 |
| WO | 2012050069 A1 | 4/2012 |
| WO | 2012064333 A1 | 5/2012 |
| WO | 2012113219 A1 | 8/2012 |
| WO | 2012171205 A1 | 12/2012 |
| WO | 2012172565 A1 | 12/2012 |
| WO | 2013013162 A2 | 1/2013 |
| WO | 2013013465 A1 | 1/2013 |
| WO | 2013017822 | 2/2013 |
| WO | 2013023226 A1 | 2/2013 |
| WO | 2013028197 A1 | 2/2013 |
| WO | 2013035110 A2 | 3/2013 |
| WO | 2013/073548 | 5/2013 |
| WO | 2013073548 A1 | 5/2013 |
| WO | 2013100912 A1 | 7/2013 |
| WO | 2013112353 A1 | 8/2013 |
| WO | 2013115802 A1 | 8/2013 |
| WO | 2013121682 A1 | 8/2013 |
| WO | 2013123445 A1 | 8/2013 |
| WO | 2013/138627 | 9/2013 |
| WO | 2013136213 A1 | 9/2013 |
| WO | 2013138627 A1 | 9/2013 |
| WO | 2013157978 A1 | 10/2013 |
| WO | 2013172502 A1 | 11/2013 |
| WO | 2014/018434 | 1/2014 |
| WO | 2014011438 A1 | 1/2014 |
| WO | 2014018434 A2 | 1/2014 |
| WO | 2014/045236 | 3/2014 |

(56) References Cited

FOREIGN PATENT DOCUMENTS

| | | |
|---|---|---|
| WO | 2014065952 A1 | 5/2014 |
| WO | 2014069941 A1 | 5/2014 |
| WO | 2014083500 A1 | 6/2014 |
| WO | 2014092644 A1 | 6/2014 |
| WO | 2014094559 A1 | 6/2014 |
| WO | 2014096868 A1 | 6/2014 |
| WO | 2014099340 A2 | 6/2014 |
| WO | 2013076499 A3 | 7/2014 |
| WO | 2014112994 A1 | 7/2014 |
| WO | 2014128253 A1 | 8/2014 |
| WO | 2014137546 A1 | 9/2014 |
| WO | 2014145862 A2 | 9/2014 |
| WO | 2014147002 A1 | 9/2014 |
| WO | 2014197926 A1 | 12/2014 |
| WO | 2015002658 A1 | 1/2015 |
| WO | 2015006636 A1 | 1/2015 |
| WO | 2015008442 A1 | 1/2015 |
| WO | 2015024006 A1 | 2/2015 |
| WO | 2015027033 A1 | 2/2015 |
| WO | 2015035463 A1 | 3/2015 |
| WO | 2015/055230 | 4/2015 |
| WO | 2015052478 | 4/2015 |
| WO | 2015052480 | 4/2015 |
| WO | 2015069090 A1 | 5/2015 |
| WO | 2015069431 A2 | 5/2015 |
| WO | 2015077644 | 5/2015 |
| WO | 2015088650 A1 | 6/2015 |
| WO | 2015090382 | 6/2015 |
| WO | 2015120626 | 8/2015 |
| WO | 2015123623 A1 | 8/2015 |
| WO | 2015132618 A1 | 9/2015 |
| WO | 2015167566 A1 | 11/2015 |
| WO | 2015175054 A2 | 11/2015 |
| WO | 2015197580 A1 | 12/2015 |
| WO | 2016003291 A1 | 1/2016 |
| WO | 2016004003 | 1/2016 |
| WO | 2016009402 A2 | 1/2016 |
| WO | 2016012889 | 1/2016 |
| WO | 2016027007 A1 | 2/2016 |
| WO | 2016028767 | 2/2016 |
| WO | 2016/043949 | 3/2016 |
| WO | 2016032592 A1 | 3/2016 |
| WO | 2016036951 A1 | 3/2016 |
| WO | 2016043949 A1 | 3/2016 |
| WO | 2016048214 A1 | 3/2016 |
| WO | 2016048257 A1 | 3/2016 |
| WO | 2016/064502 | 4/2016 |
| WO | 2016053572 A1 | 4/2016 |
| WO | 2016053573 A1 | 4/2016 |
| WO | 2016060761 A1 | 4/2016 |
| WO | 2016060762 A1 | 4/2016 |
| WO | 2016061021 A1 | 4/2016 |
| WO | 2016064505 A1 | 4/2016 |
| WO | 2016064516 A1 | 4/2016 |
| WO | 2016064700 A2 | 4/2016 |
| WO | 2016073072 A1 | 5/2016 |
| WO | 2016081125 | 5/2016 |
| WO | 2016081128 | 5/2016 |
| WO | 2016081129 A1 | 5/2016 |
| WO | 2016081134 | 5/2016 |
| WO | 2016081136 | 5/2016 |
| WO | 2016086306 A1 | 6/2016 |
| WO | 2016089491 | 6/2016 |
| WO | 2016089492 A1 | 6/2016 |
| WO | 2016096029 A1 | 6/2016 |
| WO | 2016/125161 | 8/2016 |
| WO | 2016/133509 | 8/2016 |
| WO | 2016122409 A1 | 8/2016 |
| WO | 2016133672 A1 | 8/2016 |
| WO | 2016/137982 | 9/2016 |
| WO | 2016145411 | 9/2016 |
| WO | 2016161637 A1 | 10/2016 |
| WO | 2016169058 A1 | 10/2016 |
| WO | 2016171907 | 10/2016 |
| WO | 2016176030 | 11/2016 |
| WO | 2016200492 | 12/2016 |
| WO | 2016200579 | 12/2016 |
| WO | 2017/011099 | 1/2017 |
| WO | 2017011100 | 1/2017 |
| WO | 2017011101 | 1/2017 |
| WO | 2017011102 | 1/2017 |
| WO | 2017011103 | 1/2017 |
| WO | 2017011227 | 1/2017 |
| WO | 2017014840 | 1/2017 |
| WO | 2017014842 | 1/2017 |
| WO | 2017023412 | 2/2017 |
| WO | 2017023413 | 2/2017 |
| WO | 2017023417 | 2/2017 |

OTHER PUBLICATIONS

PCT/US16/027397 International Search Report & Written Opinion mailed Jun. 24, 2016.
PCT/US16/027398 International Search Report and Written Opinion mailed Jun. 24, 2016.
PCT/US16/027403 Internatioanl Search Report & Written Opinion mailed Jun. 22, 2016.
PCT/US16/028395 International Search Report and Written Opinion mailed Jun. 29, 2016.
"IEEE Standard for Information technology—Local and metropolitan area networks—Specific requirements, Part 15.4: Wireless Medium Access Control (MAC) and Physical Layer (PHY) Specifications for Low Rate Wireless Personal Area Networks (WPANs)," in IEEE Std 802.15.4, (Revision of IEEE Std 802.15.4-2003), Sep. 7, 2006, 1-320.
"International Preliminary Report on Patentability", PCT/US2014/039746, Dec. 10, 2015.
"International Preliminary Report on Patentability", PCT/US2014/060841, May 19, 2016, 8 pages.
"International Preliminary Report on Patentability & Written Opinion", PCT/US2014/061445, Jun. 23, 2016, 9 pages.
"International Search Report & Written Opinion", PCT/US2015/034827, Sep. 30, 2015.
"International Search Report & Written Opinion", PCT/US2015/056316, Jan. 21, 2016.
"International Search Report & Written Opinion", PCT/US2015/056320, Jan. 29, 2016.
"International Search Report & Written Opinion", PCT/US2015/056365, Jan. 22, 2016.
"International Search Report & Written Opinion", PCT/US2015/056368, Jan. 25, 2016.
"International Search Report & Written Opinion", PCT/US2015/056598, Jan. 28, 2016.
"International Search Report & Written Opinion", PCT/US2015/056615, Jan. 21, 2016.
"International Search Report & Written Opinion", PCT/US2015/056626, Jan. 21, 2016.
"International Search Report & Written Opinion", PCT/US2015/056632, Jan. 26, 2016.
"International Search Report & Written Opinion", PCT/US2016/013988, Apr. 8, 2016.
"International Search Report & Written Opinion", PCT/US2016/020001, May 23, 2016.
"International Search Report & Written Opinion", PCT/US2016/026860, Jun. 1, 2016.
"International Search Report & Written Opinion", PCT/US2016/026318, Jun. 15, 2016.
"International Search Report & Written Opinion", PCT/US2016/028412, Jun. 27, 2016.
"International Search Report & Written Opinion", PCT/US2016/028206, Jun. 29, 2016.
"International Search Report & Written Opinion", PCT/US2014/039746, Jan. 12, 2015.
"International Search Report & Written Opinion", PCT/US2014/060841, Jan. 7, 2015.
"International Search Report & Written Opinion", PCT/US2015/039848, Oct. 20, 2015.

(56) References Cited

OTHER PUBLICATIONS

"International Search Report & Written Opinion", PCT/US2015/047315, Oct. 30, 2015.
"International Search Report & Written Opinion", PCT/US2015/048454, Nov. 11, 2015.
"International Search Report & Written Opinion", PCT/US2015/049928, Nov. 16, 2015.
"International Search Report & Written Opinion", PCT/US2015/049932, Nov. 16, 2015.
"International Search Report & Written Opinion", PCT/US2015/049927, Nov. 24, 2015.
"International Search Report & Written Opinion", PCT/US2015/051193, Nov. 27, 2015.
"International Search Report & Written Opinion", PCT/US2015/051146, Dec. 15, 2015.
"International Search Report & Written Opinion", PCT/US2015/051183, Dec. 15, 2015.
"International Search Report & Written Opinion", PCT/US2015/051194, Dec. 15, 2015.
"International Search Report & Written Opinion", PCT/US2015/051578, Dec. 17, 2015.
"International Search Report & Written Opinion", PCT/US2015/051583, Dec. 21, 2015.
"International Search Report & Written Opinion", PCT/US2015/048458, Dec. 23, 2015.
"International Search Report & Written Opinion", PCT/US2015/051213, Dec. 4, 2015.
"International Search Report & Written Opinion", PCT/US2015/051163, Dec. 7, 2015.
"International Search Report & Written Opinion", PCT/US2014/061445, Feb. 10, 2015.
"International Search Report & Written Opinion", PCT/US16/28207, Jun. 15, 2016.
"International Search Report & Written Opinion", PCT/US2016/015501, Apr. 29, 2016, 11 pages.
"International Search Report & Written Opinion", PCT/US2015/047225, mailed Nov. 6, 2015, Nov. 6, 2015.
"International Search Report and Written Opinion", PCT/US2016/028197, Jun. 24, 2016.
"Invitation to Pay Additional Fees & Partial Search Report", PCT/US2016/028205, Jun. 22, 2016.
"Invitation to Pay Additional Fees & Partial Search Report", PCT/US2016/032430, Jun. 22, 2016.
"PCT International Search Report & Written Opinion", PCT/US2016/026193, Jun. 1, 2016.
"Transducer", IEEE Std 100-2000, Sep. 21, 2015, 1154.
Bing, Benny, "Ubiquitous Broadband Access Networks with Peer-to-Peer Application Support", Evolving the Access Network: 27-36, 2006.
Friedman, M et al., "Low-loss RF transport over long distances," IEEE Transactions on Microwave Theory and Techniques, Jan. 1, 2001, pp. 341-348.
Friedman, M et al., "Low-Loss RF Transport Over Long Distances", IEEE Transactions on Microwave Theory and Techniques, vol. 49, No. 2, Feb. 2001, 8 pages.
Goldsmith, P.F., "Quasi-optical techniques", Proceedings of the IEEE., vol . 80, No. 11, Nov. 1, 1992.
Laforte, J.L. et al., "State-of-the-art on power line de-icing", Atmospheric Research 46, 143-158, 1998.
Ponchak, George E. et al., "A New Model for Broadband Waveguide to Microstrip Transition Design", NASA TM-88905, Dec. 1, 1986, 18 pgs.
"24 Volt D.C Flashing Light With Built-in Antenna 433Mhz, DEA+ Product Guide" Meteor electrical, meteorelectrical.com, Code: LUMY/24A, Jul. 28, 2010.
"An Improved Solid Dielectric Lens Impulse Radiating Antenna," SBIR/STTR, DoD, sbir.gov, 2004.

"Boost: The world's first WI-FI extending led bulb," Sengled, sengled.com, Dec. 2014 http://www.sengled.com/sites/default/files/field/product/downloads/manual/a01-a60_na_user_manual_20141223.pdf.
"Cband & L/Sband Telemetry Horn Antennas," mWAVE, mwavellc.com, Jul. 6, 2012, http://www.mwavellc.com/custom-Band-LS--BandTelemetryHornAntennas.php.
"Dielectric Antenna," Microwave Technologies, Ind., microwavetechnologiesinc.co.in http://www.microwavetechnologiesinc.co.in/microwavecommunicationlabproducts.html#dielectricantenna, May 21, 2015.
"Examples of Cell Antennas," RF Check®, rfcheck.com, Feb. 1, 2010 https://web.archive.org/web/20100201214318/http://www.rfcheck.com/Examplesof-Cell-Antennas.php.
"Flashing Light : IR.lamp," Beninca®, beninca.com, Feb. 23, 2015 http://www.beninca.com/en/news/2015/02/23/lampeggiante-irlamp.html.
"Horn Antennas," Steatite QPar Antennas, steatiteqparantennas.co.uk, http://www.steatiteqparantennas.co.uk/products_hornantennas.html? http://www.steatiteqparantennas.co.uk/consultancy/customhornantennas/, May 21, 2015.
"How is ELine Different?," ELine Corridor Systems, corridor.biz http://www.corridor.biz/ELine_is_different.html, Apr. 23, 2015.
"Identity Management," Tuomas Aura CSE-C3400 Information Security, Aalto University, Autumn 2014, 33 pgs.
"Integrated Radio Masts Fully camouflaged Outdoor-Wi-Fi APs in GRP-lamp poles," Brown-iposs, brown-iposs.com, Mar. 21, 2014.
"New Wi-Fi antenna enhances wireless coverage," ScienceDaily®, sciencedaily.com, May 29, 2015.
"Power Communication," Communication Power Solutions, Inc., cpspower.biz, http://www.cpspower.biz/services/powercommunications/, Oct. 2013.
"Power Line Communications," Atmel®, atmel.com http://www.atmel.com/products/smartenergy/powerlinecommunications/default.aspx, 2015.
"Power line communications: An overview Part I." King Fand University of Petroleum and Minerals, Dhahran, KSA, 2008.
"Powerline Communication," Cypress Perform, cypress.com http://www.cypress.com/?id=2330, Apr. 23, 2015.
"Products: GSM Mircro Repeater." L-TEL: Quanzhou L-TEL Communication Equipment Co., Ltd., l-tel.com, Apr. 24, 2015.
"Waveguide-fed Conical Horn," Antenna Magus, antennamagus.com, © 2015, accessed: Aug. 2015.
"Product Abstract—Program on Technology Innovation: Study on the Integration of High Temperature Superconducting DC Cables Within the Eastern and West urn North American Power Grids." EPRI—Electronic Power Research Institute, epri.com, Product ID:10203, Nov. 25, 2009.
"A Dielectric Lens Antenna with Enhanced Aperture Efficiency for Industrial Radar Applications", Computer Simulation Technology, cst.com, May 10, 2011.
"A New Approach to Outdoor DAS Network Physical Layer Using E-Line Technology", Corridor Systems, Mar. 2011, 5 pages.
"About Firelight Media Group", http://www. insu ra ncetechnologies.com/Products/Prod ucts_firelight_overview .shtml, Firelight®. Insurance Technologies, LLC,, Apr. 19, 2015.
"Asahi Multi-Core Fiber Cable", Industrial Fiber optics, i-fiberoptics.com http://i-fiberoptics.com/m u lti-core-fi ber-ca ble.ph p, Apr. 26, 2015.
"Bi-Axial PA Horn with Gimbal Mount", Atlas Sound, MCM Electronics, mcmelectronics.com, MCM Part #555-13580, 2011.
"Broadband Negligible Loss Metamaterials", Computer Electmagnetics and Antennas Research Laboratory, cearl.ee.psu.edu, May 15, 2012.
"Cisco IP VSAT Satellite WAN Network Module for Cisco Integrated Services Routers", http://www.cisco.com/c/en/us/products/collateral/interfaces-modules/ip-vsatsatellite-wan-module/product_data_sheet0900aecd804bbf6f.html, Jul. 23, 2014.
"Cloud Management", Cisco Meraki, cisco.com, Sep. 11, 2015.
"Decryption: Identify & Control Encrypted Traffic", Palo Alto Networks, paloaltonetworks.com, Mar. 7, 2011.
"Denso", Winn & Coales (Denso) Ltd. UK, denso.net, http://www.denso.net/voidfiller/voidpump.htm, 2015, 1 page.

(56) References Cited

OTHER PUBLICATIONS

"Detecting and Preventing MAC Spoofing", Detecting and Preventing MAC Spoofing | Network Access Control Solutions, infoexpress, 2014.
"Electronic Business Fulfillment FireLight ®", Firelight Media Group LLC, firelightmedia.net http://www.firelightmedia.net/fmg/index.php/home, Apr. 19, 2015, 2 pages.
"Elliptical Polarization", "Elliptical Polarization" Wikipedia, <http://en.wikipedia.org/wiki/Elliptical_polarization>, Apr. 21, 2015, 3 pgs.
"Exacter Outage-Avoidance System", http://www.epri.com/abstracts/Pages/ProductAbstract.aspx?ProductId=000000000001020393, Nov. 30, 2009.
"GM-12 Gimbal Mount", Newmark System, Inc, newmarksystems.com, 2015.
"HiveManager Network Management System", Aerohive® Networks, aerohive.com, accessed: Sep. 2015.
"Home", Darktrace, darktrace.com, Jul. 10, 2014.
"How to Use STUF", STUF Page Link Info, crossdevices.com, http://www.crossdevices.com/cross_devices_010.htm, 2015, 1 page.
"Installing Satellite Accessories", ACE®, acehardware.com, Aug. 5, 2006.
"Ipitek All-Optical Sensors", http://www.ipitek.com/solutions-by-industry/all-optical-sensors; Jun. 2, 2014.
"mmWave Axial Choke Horn Antenna with Lens", Feko, Sep. 24, 2013.
"Network technology", nbnTM, nbnco.com.au, Jun. 27, 2014.
"Norse Appliance™: Block attacks before they target your network, and dramatically improve the ROI on your entire security infrastructure", norsecorp.com, 2015.
"Out-of-Band Mgmt", Cradle Point, cradlepoint.com, accessed: Sep. 2015.
"Out-of-Band Security Solution", Gigamon®, gigamon.com, Aug. 3, 2014.
"Powerline—Juice Up Your Network With Powerline", Netgear®, netgear.com http://www.netgear.com/home/products/networking/powerline/, Apr. 21, 2015, 3 pages.
"Pro 600 Sirius XM Radio Amplified Outdoor Antenna", Pixel Technologies, Oct. 3, 2014.
"Product Overview: Introducing SilentDefense", Security Matters, secmatters.com, Nov. 9, 2013.
"Quickly identify malicious traffics: Detect", Lancope®, lancope.com, Mar. 15, 2015.
"Radar at st Andrews", mmwaves.epr, st-andrews.ac.uk, Feb. 4, 2011.
"Resilience to Smart Meter Disconnect Attacks", ADSC Illinois at Singapore PTE, LTD., publish.illinois.edu http://publish.illinois.edu/integrativesecurityassessment/resiliencetosmartmeterdisconnectattacks/, 2015.
"RF Sensor Node Development Platform for 6LoWPAN and 2.4 GHz Applications", http://www.ti.com/tool/TIDM-RF-SENSORNODE, Jun. 2, 2014.
"Smart Out-of-Band Management", Open Gear, opengear.com, accessed: Sep. 2015.
"Tapered waveguide", Lumerical Solutions, Inc., docs.lumerical.com, 2010.
"Tapered Waveguides Improve Fiber Light Coupling Efficiency", Tech Briefs, techbriefs.com, Jan. 1, 2006, Molex Inc., Downers Grove, Illinois and KiloLambda Technologies Ltd., Tel Aviv, Israel.
"Wireless powerline sensor", wikipedia.org, http://en.wikipedia.org/wiki/Wireless_powerline_sensor, 2014, 3 pages.
Akiba, Shigeyuki et al., "Photonic Architecture for Beam Forming of RF Phased Array Antenna", Optical Fiber Communication Conference. Optical Society of America, 2014.
Alam, M N et al., "Novel surface wave exciters for power line fault detection and communications", Antennas and Propagation (APSURSI), 2011 IEEE International Symposium on, IEEE, Jul. 3, 2011 (Jul. 3, 2011). pp. 1139-1142.
Alam, M.N. et al., "Novel surface wave exciters for power line fault detection and communications." Antennas and Propagation (APSURSI), 2011 IEEE International Symposium on. IEEE, 2011.
Ali, Muhammad Q. et al., "Randomizing AMI configuration for proactive defense in smart grid", Smart Grid Communications (SmartGridComm), 2013 IEEE International Conference on. IEEE, http://ieeexplore.ieee.org/xpl/login.jsp?tp=&arnumber=6688027, 2013.
Angove, Alex, "Direct Bury Duct Assemblies, MPB 302 3+—Ribbonet Microducts", Ericsson, archive.ericsson.net, Jul. 30, 2014.
Angove, Alex, "How the NBN Differs from ADSL2+, Cable and Wireless", Whistle Out, whistleout.com.au, Jul. 30, 2014.
Arage, Alebel et al., "Measurement of wet antenna effects on millimetre wave propagation", Radar, 2006 IEEE Conference on IEEE, 2006.
Arthur, Joseph Kweku, "Improving QoS in UMTS Network in ACCRA Business District Using Tower-Less Towers", IPASJ International Journal of Electrical Engineering (IIJEE), vol. 2, Issue 11, Nov. 2014.
Asadallahi, Sina et al., "Performance comparison of CSMA/CA Advanced Infrared (AIr) and a new pointtomultipoint optical MAC protocol." Wireless Communications and Mobile Computing Conference (IWCMC), 2012 8th International. IEEE, 2012.
Atwater, Harry A. , "The promise of plasmonics." Scientific American 296.4 (2007): 56-62.
Bach, Christian, "Current Sensor—Power Line Monitoring for Energy Demand Control", Application Note 308, http://www.enocean.com/fileadmin/redaktion/pdf/app_notes/AN308_CURRENT_SENSOR_Jan09.pdf, Jan. 2009, 4 pages.
Barron, Ashleigh L. , "Integrated Multicore Fibre Devices for Optical Trapping", Diss. Heriot-Watt University, 2014, 11-15.
Beal, J.C. et al., "Coaxial-slot surface-wave launcher", Electronics Letters 4.25 (1968): 557559.
Bhushan, Naga , "Network densification: the dominant theme for wireless evolution into 5G", Communications Magazine, IEEE 52.2 (2014): 82-89.
Bing, Benny , "Ubiquitous Broadband Access Networks with Peer-to-Peer Application Support", Evolving the Access Network, 2006, 27-36.
Bock, James et al., "Optical coupling." Journal of Physics: Conference Series. vol. 155. No. 1. IOP Publishing, 2009.
Bowen, Leland H. et al., "A Solid Dielectric Lens Impulse Radiating Antenna with High Dielectric Constant Surrounded by a Cylindrical Shroud," Sensor and Simulation Note 498, Apr. 2005.
Bridges, Greg E. et al., "Plane wave coupling to multiple conductor transmission lines above a lossy earth", Compatibility, IEEE Transactions on 31.1, 1989, 21-33.
Brooke, Gary H. , Properties of surface waveguides with discontinuities and perturbations in cross-section. Diss. University of British Columbia, 1977.
Brown, J. et al., "The launching of radial cylindrical surface waves by a circumferential slot", Proceedings of the IEE Part B: Radio and Electronic Engineering 106.26 (1959): 123128.
Bruno, Joseph, "Interference Reduction in Wireless Networks", Computing Research Topics, Computing Sciences Department, Villanova University, Nov. 14, 2007, 8 pages.
Burkhart, Martin et al., "Does Topology Control Reduce Interference?", Department of Computer Science, ETH Zurich, Proceedings of the 5th ACM international symposium on Mobile ad hoc networking and computing, ACM, 2004, 11 pages.
Callis, et al., "An In-Line Power Monitor for HE11 Low Loss Transmission Lines", Proceedings of the 29th International Conference on Infrared and Millimeter Waves (IRMMW), Karlsruhe, Germany, 2004.
Carroll, John M. et al., "Developing the Blacksburg electronic village", Communications of the ACM 39.12 (1996): 69-74.
Chen, Dong et al., "A trust management model based on fuzzy reputation for internet of things", Computer Science and Information Systems 8.4 (2011): 12071228.
Chen, Yingying, "Detecting and Localizing Wireless Spoofing Attacks", Sensor, Mesh and Ad Hoc Communications and Networks, 2007, SECON'07. 4th Annual IEEE Communications Society Conference on IEEE, 2007, 10 pages.

(56) References Cited

OTHER PUBLICATIONS

Chiba, Jiro, "Experimental Studies of the Losses and Radiations Due to Bends in the Goubau Line", IEEE Transactions on Microwave Theory and Techniques, Feb. 1977, 94-100.
Chiba, Jiro, "On the Equivalent Circuit for the G-Line Above Ground", International Wroclaw Symposium on Electromagnetic Compatibility, 1998, 78-82.
Cimini, Carlos Alberto et al., "Temperature profile of progressive damaged overhead electrical conductors", Journal of Electrical Power & Energy Systems 49 (2013): 280-286.
Costantine, Joseph et al., "The analysis of a reconfigurable antenna with a rotating feed using graph models", Antennas and Wireless Propagation Letters 8 (2009): 943-946.
Covington, Michael J. et al., "Threat implications of the internet of things", Cyber Conflict (CyCon), 2013 5th International Conference on. IEEE, 2013.
Crane, Robert K., "Analysis of the effects of water on the ACTS propagation terminal antenna", Antennas and Propagation, IEEE Transactions on 50.7 (2002): 954965.
De Sabata, Aldo et al., "Universitatea Politehnica", din Timișoara Facultatea de Electronică și Telecomunicații, 2012.
Dini, Gianluca et al., "MADAM: A Multilevel Anomaly Detector for Android Malware", MMMACNS. vol. 12, 2012.
Doane, J.L. et al., "Oversized rectangular waveguides with modefree bends and twists for broadband applications", Microwave Journal 32(3), 1989, 153-160.
Doelitzscher, et al., "ViteraaS: Virtual cluster as a service." Cloud Computing Technology and Science (CloudCom), 2011 IEEE Third International Conference on. IEEE, 2011.
Dooley, Kevin, "Out-of-Band Management", auvik, auvik.com, May 12, 2014.
Dostert, Klaus, "Frequency-hopping spread-spectrum modulation for digital communications over electrical power lines." Selected Areas in Communications, IEEE Journal on 8.4 (1990): 700-710.
Dragoo, R.E. et al., "Fiber Optic Data Bus for the AN/GYQ21(V)." Harris Corp, U.S. Communications Syst. Div. Chart, Microcopy Resolution Test, 1980.
Dutton, Harry Jr., "Understanding Optical Communications", International Technical Support Organization, SG24-5230-00, Sep. 1998.
Ehyaie, Danial, "Novel Approaches to the Design of Phased Array Antennas," Diss. The University of Michigan, 2011.
Elmore, Glenn, "Introduction to the Propagating Wave on a Single Conductor", www.corridor.biz, Jul. 27, 2009, 30 pages.
Erickson, Katherine, "Conductive cylindrical surface waveguides." (2012). https://www.ideals.illinois.edu/bitstream/handle/2142/30914/Erickson_Katherine.pdf?sequence=1.
Erickson, Katherine, "Conductive cylindrical surface waveguides", 2012.
Eskelinen, Harri, "DFM (A)-aspects for a horn antenna design," Lappeenranta University of Technology, 2004.
Eskelinen, P., "A low-cost microwave rotary joint," International Radar Conference, Oct. 13-17, 2014, p. 1-4.
Feng, Taiming et al., "Design of a survivable hybrid wireless-optical broadband-access network", Journal of Optical Communications and Networking 3.5, 2011, 458-464.
Fenye, Bao et al., "Dynamic trust management for internet of things applications", Proceedings of the 2012 international workshop on Selfaware internet of things. ACM, 2012.
Freyer, Dan, "Combating the Challenges of Ka-Band Signal Degradation", SatMagazine, satmagzine.com, Sep. 2014.
Friedman, M. et al., "Low-Loss RF Transport Over Long Distances", IEEE Transactions on Microwave Theory an Techniques, vol. 49, No. 2, Feb. 2001, 341-348.
Fromm, W. et al., "A new microwave rotary joint," 1958 IRE International Convention Record, Mar. 21-25, 1966, 6:78-82.
Garcia-Etxarri, Aitzol et al., "A combination of concave/convex surfaces for fieldenhancement optimization: the indented nanocone", Optics express 20.23, 2012, 2520125212.

Ghazisaidi, Navid et al., "Survivability analysis of next-generation passive optical networks and fiber-wireless access networks", Reliability, IEEE Transactions on 60.2, 2011, 479-492.
Golrezaei, Negin et al., "FemtoCaching: Wireless Video Content Delivery through Distributed Caching Helpers", INFOCOM, 2012 Proceedings IEEE.
Gomes, Nathan J. et al., "Radio-over-fiber transport for the support of wireless broadband services", Journal of Optical Networking 8.2 (2009): 156-178.
Gonthier, François et al., "Mode coupling in nonuniform fibers: comparison between coupled-mode theory and finite-difference beam-propagation method simulations", JOSA B 8.2 (1991): 416421.
Gritzalis, Dimitris et al., "The Sphinx enigma in critical VoIP infrastructures: Human or botnet?." Information, Intelligence, Systems and Applications (IISA), 2013 Fourth International Conference, IEEE, 2013.
Han, Chong et al., "Crosslayer communication module for the Internet of Things", Computer Networks 57.3 (2013): 622633.
Haroun, Ibrahim et al., "WLANs meet fiber optics—Evaluating 802.11 a WLANs over fiber optics links", RF Des. Mag (2003): 36-39.
Hassan, Karim, "Fabrication and characterization of thermoplasmonic routers for telecom applications", Diss. Univ. de Bourgogne, 2014.
Hassan, Maaly A., "Interference reduction in mobile ad hoc and sensor networks", Journal of Engineering and Computer Innovations vol. 2(7), Sep. 2011, 138-154.
Hassani, Alireza et al., "Porous polymer fibers for low-loss Terahertz guiding." Optics express 16.9 (2008): 6340-6351.
Hautakorpi, Jani et al., "Requirements from Session Initiation Protocol (SIP) Session Border Control (SBC) Deployments." RFC5853, IETF (2010).
Hawrylyshen, A. et al., "SIPPING Working Group J. Hautakorpi, Ed. Internet-Draft G. Camarillo Intended status: Informational Ericsson Expires: Dec. 18, 2008 R. Penfield Acme Packet." (2008).
Hoss, R.J. et al., "Manufacturing Methods and Technology Program for Ruggedized Tactical Fiber Optic Cable", No. ITT-80-03-078. ITT Electrooptical Products Div Roanoke VA, 1980.
Ippolito, Louis J., "Propagation effects handbook for satellite systems design. A summary of propagation impairments on 10 to 100 GHz satellite links with techniques for system design", 1989.
Izumiyama, Hidetaka et al., "Multicast over satellite", Applications and the Internet, 2002.(SAINT 2002). Proceedings. 2002 Symposium on. IEEE, 2002.
Jackson, Mark, "Timico CTO Hit by Slow FTTC Broadband Speeds After Copper Corrosion", ISP review, ispreview.co.uk, Mar. 5, 2013.
Jaeger, Raymond et al., "Radiation Performance of Germanium Phosphosilicate Optical Fibers." RADC-TR-81-69: Final Technical Report, Galileo Electro-Optical Corp, (May 1981).
James, J.R. et al., "Investigations and Comparisons of New Types of Millimetre-Wave Planar Arrays Using Microstrip and Dielectric Structures", Royal Military Coll of Science Shrivenham (England), 1985.
Jang, Hung-Chin, "Applications of Geometric Algorithms to Reduce Interference in Wireless Mesh Network", Journal on Applications of Graph Theory in Wireless Ad hoc Networks and Sensor Networks (JGRAPH-HOC) vol. 2, No. 1, Mar. 2010.
Jawhar, Imad et al., "A hierarchical and topological classification of linear sensor networks", Wireless Telecommunications Symposium, WTS, IEEE, http://faculty.uaeu.ac.ae/Nader_M/papers/WTS2009.pdf, 2009, 8 pages.
Jee, George et al., "Demonstration of the Technical Viability of PLC Systems on Medium- and Low-Voltage Lines in the United States", Broadband is Power: Internet Access Via Power Line Networks, IEEE Communication Magazine, May 2003, 5 pages.
Jeong, et al., "Study of elliptical polarization requirement of KSTAR 84-GHz ECH system", Journal—Korean Physical Society 49, 2006.
Jin, , "Quasi-optical mode converter for a coaxial cavity gyrotron", Forschungszentrum, 2007.

(56) References Cited

OTHER PUBLICATIONS

Jin, Yu et al., "Nevermind, the Problem Is Already Fixed: Proactively Detecting and Troubleshooting Customer DSL Problems", ACM CoNEXT, Philadelphia, USA, Nov.-Dec. 2010, 12 pages.
Kamilaris, et al., "Exploring the Use of DNS as a Search Engine for the Web of Things." Internet of Things (WF-IoT), 2014 IEEE World Forum on. IEEE, 2014.
Kang, , "Chapter 6: Array Antennas," IHS Engineering360, globalspec.com, http://www.globalspec.com/reference/75109/203279/chapter-6-array-antennas, Apr. 22, 2015.
Katkovnik, Vladimir et al., "High-resolution signal processing for a switch antenna array FMCW radar with a single channel receiver", Sensor Array and Multichannel Signal Processing Workshop Proceedings, 2002. IEEE, 2002.
Khan, "Dual polarized dielectric resonator antennas", Chalmers University of Technology, 2010.
Kikuchi, H. et al., "Hybrid transmission mode of Goubau lines",J. Inst.Electr.Comm.Engrs., Japan,vol. 43, pp. 39-45, 1960.
Kirkham, H. et al., "Power system applications of fiber optics (Jet Propulsion Lab." JPL Publication 84-28, Electric Energy Systems Division, U.S. DoE, p. 180, (1984).
Koshiba, Masanori et al., "Analytical expression of average power-coupling coefficients for estimating intercore crosstalk in multicore fibers", Photonics Journal, IEEE 4.5, 2012, 1987-1995.
Kroon, Barnard et al., "Steady state RF fingerprinting for identity verification: one class classifier versus customized ensemble." Artificial Intelligence and Cognitive Science. Springer Berlin Heidelberg, 2010. 198206.
Kroyer, Thomas , "A Waveguide High Order Mode Reflectometer for the Large Hadron Collider Beam-pipe", Diss. TU Wien, 2003.
Kuhn, Marc et al., "Power Line Enhanced Cooperative Wireless Communications", IEEE Journal on Selected Areas in Communications, vol. 24, No. 7, Jul. 2006, 10 pages.
Kumar, Sailesh , "Survey of Current Network Intrusion Detection Techniques", Washington Univ. in St. Louis, Dec. 2007.
Lappgroupusa, "Selection of Number of Cable Cores With Emphasis on Sizing Parameters", Industrial Cable & Connector Technology News, lappconnect.blogspot.com, http://lappconnect.blogspot.com/2014_10_01_archive.html, Oct. 30, 2014.
Leech, Jamie et al., "Experimental investigation of a low-cost, high performance focal-plane horn array." Terahertz Science and Technology, IEEE Transactions on 2.1 (2012): 61-70.
Li, Xiang-Yang et al., "Interference-Aware Topology Control for Wireless Sensor Networks", SECON. vol. 5, 2005.
Li, Xiaowei et al., "Integrated plasmonic semi-circular launcher for dielectric-loaded surface plasmonpolariton waveguide", Optics express 19.7 (2011): 65416548.
Li, Xu et al., "Smart community: an internet of things application", Communications Magazine, IEEE 49.11 (2011): 68-75.
Lier, E. et al., "Simple hybrid mode horn feed loaded with a dielectric cone," Electronics Letters 21.13 (1985): 563564.
Lim, Christina et al., "Fiber-wireless networks and subsystem technologies", Lightwave Technology, Journal of 28.4 (2010): 390-405.
Lou, Tiancheng , "Minimizing Average Interference through Topology Control", Algorithms for Sensor Systems, Springer Berlin Heidelberg, 2012, 115-129.
Lucyszyn, S. et al., "Novel RF MEMS Switches", Microwave Conference, 2007. APMC 2007. Asia-Pacific. IEEE, 2007.
Lucyszyn, Stepan et al., "RF MEMS for antenna applications", Antennas and Propagation (EuCAP), 2013 7th European Conference on. IEEE, 2013.
Luo, Qi et al., "Circularly polarized antennas", John Wiley & Sons, 2013.
Mahato, Suvranshu Sekhar , Studies on an Infrared Sensor Based Wireless Mesh Network. Diss. 2010.
Maier, Martin et al., "The audacity of fiberwireless (FiWi) networks", AccessNets. Springer Berlin Heidelberg, 2009. 16-35.

Marcatili, E.A. et al., "Hollow Metallic and Dielectric Waveguides for Long Distance Optical Transmission and Lasers", Bell System Technical Journal 43(4), 1964, 1783-1809.
McAllister, M.W. et al., "Resonant hemispherical dielectric antenna," Electronics Letters 20.16 (1984): 657659.
Meng, H. et al., "A transmission line model for high-frequency power line communication channel", Power System Technology, PowerCon 2002. International Conference on. vol. 2. IEEE, 2002. http://infocom. uniroma 1.it/ ""enzobac/MengChen02. pdf, 2002.
Menon, S.S. et al., "Propagation characteristics of guided modes in a solid dielectric pyramidal horn," Proceedings of the 2012 International Conference on Communication Systems and Network Technologies. IEEE Computer Society, 2012.
Mitchell, John E. , "Integrated Wireless Backhaul Over Optical Access Networks", Journal of Lightwave Technology 32.20, 2014, 3373-3382.
Miyagi, M. , "Bending losses in hollow and dielectric tube leaky waveguides", Applied Optics 20(7), 1981, 1221-1229.
Moaveni-Nejad, Kousha et al., "Low-Interference Topology Control for Wireless Ad Hoc Networks", Department of Computer Science, Illinois Institute of Technology, Ad Hoc & Sensor Wireless Networks 1.1-2, 2005, 41-64.
Moisan, M. et al., "Plasma sources based on the propagation of electromagnetic surface waves", Journal of Physics D: Applied Physics 24.7 (1991): 1025.
Mokhtarian, Kianoosh et al., "Caching in Video CDNs: Building Strong Lines of Defense", EuroSys 2014, Apr. 13-16, 2014, Amsterdam, Netherlands.
Morse, T.F. , "Research Support for the Laboratory for Lightwave Technology." Brown Univ Providence RI Div of Engineering, 1992.
Mruk, Joseph Rene , "Wideband monolithically integrated frontend subsystems and components", Diss. University of Colorado, 2011.
Nachiketh, P. et al., "Optimizing public-key encryption for wireless clients", Proceedings of the IEEE International Conference on Communications (ICC 2002). No. 1. 2002.
Narayanan, Arvind , "Fingerprinting of RFID Tags and HighTech Stalking." 33 Bits of Entropy, 33bits.org, Oct. 4, 2011.
Nassa, Vinay Kumar , "Wireless Communications: Past, Present and Future", Dronacharya Research Journal: 50. vol. III, Issue-II, Jul.-Dec. 2011.
Nibarger, John P. , "An 84 pixel all-silicon corrugated feedhorn for CMB measurements." Journal of Low Temperature Physics 167.3-4 (2012): 522-527.
Nicholson, Basil J. , "Microwave Rotary Joints for X-, C-, and S-band", Battelle Memorial Inst Columbus OH, 1965.
Nuvotronics, "PolyStrata—Phased Arrays & Antennas", Nuvotronics, nuvotronics.com http://www.nuvotronics.com/antennas.php, Apr. 26, 2015.
Olver, A. D. , "Microwave horns and feeds," vol. 39. IET, 1994.
Olver, A.D. et al., "Dielectric cone loaded horn antennas," Microwaves, Antennas and Propagation, IEE Proceedings H. vol. 135. No. 3. IET, 1988.
Orfanidis, Sophocles J. , "Electromagnetic waves and antennas," Rutgers University, 2002.
Pahlavan, Kaveh et al., "Wireless data communications", Proceedings of the IEEE 82.9 (1994): 1398-1430.
Patel, Shwetak N. et al., "The Design and Evaluation of an End-User-Deployable, Whole House, Contactless Power Consumption Sensor", CHI 2010: Domestic Life, Apr. 2010, 10 pages.
Paul, Sanjoy et al., "The Cache-And-Forward Network Architecture for Efficient Mobile Content Delivery Services in the Future Internet", Innovations in NGN: Future Network and Services, 2008. K-INGN 2008. First ITU-T Kaleidoscope Academic Conference.
Perkons, Alfred R. et al., "TM surface-wave power combining by a planar active-lens amplifier", Microwave Theory and Techniques, IEEE Transactions on 46.6 (1998): 775783.
Péter, Zsolt et al., "Assessment of the current intensity for preventing ice accretion on overhead conductors", Power Delivery, IEEE Transactions on 22.1 (2007): 565-574.
Petrovsky, Oleg , "The Internet of Things: A Security Overview", w.druva.com, Mar. 31, 2015.

(56) References Cited

OTHER PUBLICATIONS

Pham, Tien-Thang et al., "A WDM-PON-compatible system for simultaneous distribution of gigabit baseband and wireless ultrawideband services with flexible bandwidth allocation", Photonics Journal, IEEE 3.1, 2011, 13-19.
Piksa, Petr et al., "Elliptic and hyperbolic dielectric lens antennas in mmwaves", Radioengineering 20.1, 2011, 271.
Plagemann, Thomas et al., "Infrastructures for community networks", Content Delivery Networks. Springer Berlin Heidelberg, 2008. 367-388.
Pohl, , "A dielectric lens-based antenna concept for high-precision industrial radar measurements at 24GHz," Radar Conference (EuRAD), 2012 9th European, IEEE, 2012.
Pranonsatit, S. et al., "Sectorised horn antenna array using an RF MEMS rotary switch", Asia-Pacific Microwave Conf., APMC. 2010.
Pranonsatit, Suneat et al., "Single-pole eight-throw RF MEMS rotary switch", Microelectromechanical Systems, Journal of 15.6 (2006): 1735-1744.
Prashant, R.R. et al., "Detecting and Identifying the Location of Multiple Spoofing Adversaries in Wireless Network", International Journal of Computer Science and Mobile Applications, vol. 2 Issue. 5, May 2014, 1-6.
Rahim, S. K. A. et al., "Measurement of wet antenna losses on 26 GHz terrestrial microwave link in Malaysia", Wireless Personal Communications 64.2 (2012): 225231.
Rambabu, K. et al., "Compact single-channel rotary joint using ridged waveguide sections for phase adjustment," IEEE Transactions on Microwave Theory and Techniques (Aug. 2003) 51(8):1982-1986.
Rappaport, Theodore S. et al., "Mobile's Millimeter-Wave Makeover", Spectrum.IEEE.Org; Sep. 2014.
Raychaudhuri, Dipankar et al., "Emerging Wireless Technologies and the Future Mobile Internet", Cambridge University Press, Mar. 2011.
Raychem, "Wire and Cable", Dimensions 2 (1996): 1.
Reynet, Olivier et al., "Effect of the magnetic properties of the inclusions on the high-frequency dielectric response of diluted composites." Physical Review B66.9 (2002): 094412.
Rouse, Margaret , "Transport Layer Security (TLS)", TechTarget, searchsecurity.techtarget.com, Jul. 2006.
Roze, Mathieu et al., "Suspended core subwavelength fibers: towards practical designs for low-loss terahertz guidance." Optics express 19.10 (2011): 9127-9138.
Sagar, Nishant , "Powerline Communications Systems: Overview and Analysis", Thesis, May 2011, 80 pages.
Sagues, Mikel et al., "Multi-tap complex-coefficient incoherent microwave photonic filters based on optical single-sideband modulation and narrow band optical filtering." Optics express 16.1 (2008): 295-303.
Saied, Yosra Ben et al., "Trust management system design for the internet of things: a contextaware and multiservice approach", Computers & Security 39 (2013): 351365.
Salema, Carlos et al., "Solid dielectric horn antennas," Artech House Publishers, 1998, Amazon.
Salema, Carlos et al., "Solid dielectric horn antennas," Artech House Publishers, 1998.
Sarafi, A. et al., "Hybrid wireless-broadband over power lines: A promising broadband solution in rural areas." Communications Magazine, IEEE 47.11 (2009): 140-147.
Sarafi, Angeliki M. et al., "Hybrid Wireless-Broadband over Power Lines: A Promising Broadband Solution in Rural Areas", IEEE Communications Magazine, Nov. 2009, 8 pages.
Sarnecki, Joseph et al., "Microcell design principles", Communications Magazine, IEEE 31.4 (1993): 76-82.
Saruhan, Ibrahim Halil , "Detecting and Preventing Rogue Devices on the Network", SANS Institute InfoSec Reading Room, sans.org, Aug. 8, 2007.
Scarfone, Karen et al., "Technical Guide to Information Security Testing and Assessment", National Institute of Standards and Technology, csrc.nist.gov, Special Publication, Sep. 2008, 800-115.
Shafai, Lotfollah , "Dielectric Loaded Antennas", John Wiley & Sons, Inc., http://www.researchgate.net/publication/227998803_Dielectric_Loaded_Antennas, Apr. 15, 2005.
Shafi, Mansoor et al., "Advances in Propagation Modeling for Wireless Systems", EURASIP Journal on Wireless Communications and Networking. Hindawi Publishing Corp, 2009, p. 5.
Shimabukuko, F.I. et al., "Attenuation measurement of very low-loss dielectric waveguides by the cavity resonator method in the millimeter/submillimeter wavelength range." No. TR-0086A (2925-06)-1. Aerospace Corp El Segundo CA Electronics Research Lab, 1989.
Shindo, Shuichi et al., "Attenuation measurement of cylindrical dielectric-rod waveguide." Electronics Letters 12.5 (1976): 117-118.
Shumate, Paul W. et al., "Evolution of fiber in the residential loop plant." IEEE Communications Magazine 29.3 (1991): 68-74.
Sievenpiper, D.F. et al., "Two-dimensional beam steering using an electrically tunable impedance surface," in Antennas and Propagation, IEEE Transactions on , vol. 51, No. 10, pp. 2713-2722, Oct. 2003.
Sommerfeld, A. , "On the propagation of electrodynamic waves along a wire", Annals of Physics and Chemistry New Edition, vol. 67, No. 2, 1899, 72 pages.
Strahler, Olivier , "Network Based VPNs", SANS Institute InfoSec Reading Room, sans.org, Aug. 2002.
Strieby, M.E. et al., "Television transmission over wire lines." American Institute of Electrical Engineers, Transactions of the 60.12.(1941): 1090-1096.
Szabó, Csaba A. , "European Broadband Initiatives with Public Participation", Broadband Services (2005): 255.
Taboada, John M. et al., "Thermo-optically tuned cascaded polymer waveguide taps." Applied physics letters 75.2 (1999): 163-165.
Templeton, Steven J. et al., "Detecting Spoofed Packets", DARPA Information Survivability Conference and Exposition, vol. 1, IEEE, 2003.
Theoleyr, Fabrice , "Internet of Things and M2M Communications", books.google.com, ISBN13: 9788792982483, Apr. 17, 2013.
Thornton, John et al., "Modern lens antennas for communications engineering", vol. 39, 2013.
Valladares, Cindy , "20 Critical Security Controls: Control 7—Wireless Device Control", Tripwire—The State of Security, tripwire.com, Mar. 21, 2013.
Vogelgesang, Ralf et al., "Plasmonic nanostructures in aperture-less scanning near-field optical microscopy (aSNOM)", physica status solidi (b) 245.10 (2008): 22552260.
Volat, C. et al., "De-icing/anti-icing techniques for power lines: current methods and future direction", Proceedings of the 11th International Workshop on Atmospheric Icing of Structures, Montreal, Canada. 2005.
Wagter, Herman , "Fiber-to-the-X: the economics of last-mile fiber", ARS Technica, arstechnica.com Mar. 31, 2010.
Wake, David et al., "Radio over fiber link design for next generation wireless systems", Lightwave Technology, Journal of28.16 (2010): 2456-2464.
Wang, Jing et al., "The influence of optical fiber bundle parameters on the transmission of laser speckle patterns", Optics express 22.8, 2014, 8908-8918.
Wilkins, George A. , "Fiber Optic Telemetry in Ocean Cable Systems", Chapter in new edition of Handbook of Oceanographic Winch, Wire and Cable Technology, Alan H. Driscoll, Ed.,(to be published by University of Rhode Island) (1986).
Wolff, Christian , "Phased Array Antenna" Radar Tutorial, web.archive.org, radartutorial.eu, Oct. 21, 2014.
Wu, Xidong et al., "Design and characterization of singleand multiplebeam mmwave circularly polarized substrate lens antennas for wireless communications", Microwave Theory and Techniques, IEEE.Transactions on 49.3, 2001, 431-441.
Xi, Liu Xiao , "Security services in SoftLayer", Sep. 21, 2015.
Xia, Cen et al., "Supermodes for optical transmission", Optics express 19.17, 2011, 16653-16664.

(56) References Cited

OTHER PUBLICATIONS

Yang, , "Power Line Sensor Networks for Enhancing Power Line Reliability and Utilization", Georgia Institute of Technology, https://smartech.gatech.edu/bitstream/handle/1853/41087/Yang_Yi_201108_phd.pdf, Apr. 26, 2011, 264 pages.
Yang, et al., "Power line sensornet—a new concept for power grid monitoring", IEEE Power Engineering Society General Meeting, 2006, pp. 8.
Yen, C. et al., "Ceramic Waveguides." Interplanetary Network Progress Report141.26 (2000): 1.
Yu, Shui et al., "Predicted packet padding for anonymous web browsing against traffic analysis attacks", Information Forensics and Security, IEEE Transactions on 7.4, http://nsp.org.au/syu/papers/tifs12.pdf, 2012, 1381-1393.
Zelby, Leon W. , "Propagation Modes on a Dielectric Coated Wire", J. The Franklin Institute, vol. 274(2), pp. 85-97, Aug. 1962.
Zhao, et al., "Energy harvesting for a wireless-monitoring system of overhead high-voltage power lines", IET Generation, Transmission & Distribution 7, IEEE Xplore Abstract, 2013, 2 pages.
Zheng, Zhu et al., "Efficient coupling of propagating broadband terahertz radial beams to metal wires", Optics express 21.9 (2013): 1064210650.
Zucker, , "Surface-wave antennas", Antenna engineering handbook 4, 2007.
"AirCheck G2 Wireless Tester", NetScout®, enterprise.netscout.com, Dec. 6, 2016, 10 pages.
"Brackets, Conduit Standoff", Hubbell Power Systems, Inc., hubbellpowersystems.com, Dec. 2, 2010, 2 pages.
"Broadband Over Power Lines (BPL): Developments and Policy Issues", Organisation for Economic Co-operation and Development, Directorate for Science, Technology and Industry, Committee for Information, Computer and Communications Policy, Jun. 2, 2009, 35 pages.
"Broadband: Bringing Home the Bits: Chapter 4 Technology Options and Economic Factors", The National Academies Press, nap.edu, 2002, 61 pages.
"Cisco Aironet 1500 Series Access Point Large Pole Mounting Kit Instructions", www.cisco.com/c/en/us/td/docs/wireless/antenna/installation/guide/18098.html, 2008, 9 pages.
"Delivering broadband over existing wiring", Cabling Installation & Maintenance, cablinginstall.com, May 1, 2002, 6 pages.
"Directional Couplers—Coaxial and Waveguide", Connecticut Microwave Corporation, http://connecticutmicrowave.com, Accessed Aug. 2016, 21 pages.
"Doubly-fed Cage-cone Combined Broadband Antennas for Marine Applications", http://www.edatop.com/down/paper/antenna/%E5%A4%A9%E7%BA%BF%E8%AE%BE%E8%AE%A1-890w5nebp5ilpq.pdf, 2007, 7 pages.
"Dual Band Switched-Parasitic Wire Antennas for Communications and Direction Finding", www.researchgate.net/profile/David_Thiel2/publication/3898574_Dual_band_switched-parasitic_wire_antennas_for_communications_and_direction_finding/links/0fcfd5091b4273ce54000000.pdf, 2000, 5 pages.
"Electronic Countermeasure (ECM) Antennas", vol. 8, No. 2, Apr. 2000, 2 pages.
"Harvest energy from powerline", www.physicsforums.com/threads/harvest-energy-from-powerline.685148/, Discussion thread about harvesting power from powerlines that includes the suggestion of clamping a device to the power line., 2013, 8 pages.
"International Search Report & Written Opinion", PCT/US2016/035384, mailed Oct. 31, 2016.
"International Search Report & Written Opinion", PCT/US16/033182, Jul. 12, 2016.
"International Search Report & Written Opinion", PCT/US2016/036290, Aug. 11, 2016.
"International Search Report & Written Opinion", PCT/US2016/036551, Aug. 11, 2016.
"International Search Report & Written Opinion", PCT/US2016/036798, Aug. 11, 2016.
"International Search Report & Written Opinion", PCT/US2016/028205, Aug. 16, 2016.
"International Search Report & Written Opinion", PCT/US2016/032460, Aug. 17, 2016.
"International Search Report & Written Opinion", PCT/US2016/036303, Aug. 24, 2016.
"International Search Report & Written Opinion", PCT/US2016/036288, Sep. 1, 2016.
"International Search Report & Written Opinion", PCT/2016/035383, Sep. 2, 2016.
"International Search Report & Written Opinion", PCT/US16/036284, Sep. 8, 2016.
"International Search Report & Written Opinion", PCT/US2016/036286, Sep. 13, 2016.
"International Search Report & Written Opinion", PCT/US2016/036293, Sep. 15, 2016.
"International Search Report & Written Opinion", PCT/US2016/040992, Oct. 17, 2006.
"International Search Report & Written Opinion", PCT/US16/050488, Nov. 11, 2016.
"International Search Report & Written Opinion", PCT/US16/50345, Nov. 15, 2016.
"International Search Report & Written Opinion", PCT/US2016/050346, Nov. 17, 2016.
"International Search Report & Written Opinion", PCT/US2016/050860, Nov. 17, 2016, 11 pages.
"International Search Report & Written Opinion", PCT/US2016/050344, Nov. 25, 2016, 16 pages.
"International Search Report and Written Opinion", PCT/US16/032441, Jul. 29, 2016.
"International Search Report and Written Opinion", PCT/US2016/036285, Aug. 23, 2016.
"International Search Report and Written Opinion", PCT/US16/036388, Aug. 30, 2016.
"International Search Report and Written Opinion", PCT/US2016/036297, Sep. 5, 2016.
"International Search Report and Written Opinion", PCT/US2016/036292, Sep. 13, 2016.
"International Search Report and Written Opinion", PCT/US2016/046315, Nov. 3, 2016.
"International Search Report and Written Opinion", PCT/US2016/050039, Nov. 14, 2016.
"International Search Report and Written Opinion", PCT/US2016/050347, Nov. 15, 2016.
"International Search Report and Written Opinion", PCT/US2016/051217, Nov. 29, 2016.
"International Search Report and Written Opinion", PCT/US2016/036289, Aug. 11, 2016.
"International Search Report and Written Opinion", PCT/US2016/036295, Aug. 30, 2016.
"International Search Report and Written Opinion", PCT/US2016/030964, Aug. 4, 2016.
"International Search Report and Written Opinion", PCT/US2016/036553, mailed Aug. 30, 2016, 1-14.
"International Search Report and Written opinion", PCT/US2016/036556, mailed Sep. 22, 2016.
"International Searching Authority", International Search Report and Written Opinion, Sep. 28, 2016, 1-12.
"Invitation to Pay Additional Fees and, Where Applicable, Protest Fee", PCT/US2016/035384, Aug. 31, 2016, 7 pages.
"Micromem Demonstrates UAV Installation of Power Line Monitoring Mounting System", MicroMem, micromem.com, Mar. 4, 2015, 1-3.
"Newsletter 4.4—Antenna Magus version 4.4 released!", antennamagus.com, Aug. 10, 2013, 8 pages.
"PCT International Search Report, PCT/US2016/057161, PCT International Search Report and Written Opinion", Jan. 12, 2017, 1-13, Jan. 12, 2017, 1-13.
"PCT/US2016/041561, PCT International Search Report and Written Opinion", Oct. 10, 2016, 1-15.
"PCT/US2016/046323, PCT International Search Report", Oct. 24, 2016, 1-13.

(56) References Cited

OTHER PUBLICATIONS

"Technology Brief 13: Touchscreens and Active Digitizers", https://web.archive.org/web/20100701004625/http://web.engr.oregonstate.edu/~moon/engr203/read/read4.pdf, 2010, 289-311.

"The world's first achievement of microwave electric-field measurement utilizing an optical electric-field sensor mounted on an optical fiber, within a microwave discharge ion engine boarded on asteroid explorers etc.", Investigation of internal phenomena and performance improvement in microwave discharge ion engines, Japan Aerospace Exploration Agency (JAXA), Nippon Telegraph and Telephone Corporation, Aug. 7, 2013, 4 pages.

Adabo, Geraldo J., "Long Range Unmanned Aircraft System for Power Line Inspection of Brazilian Electrical System", Journal of Energy and Power Engineering 8 (2014), Feb. 28, 2014, 394-398.

Al-Ali, A.R. et al., "Mobile RFID Tracking System", Information and Communication Technologies: From Theory to Applications, ICTTA 2008, 3rd International Conference on IEEE, 2008, 4 pages.

University of South Carolina, Antennas and Propagation (APSURSI), 2011 IEEE International Symposium, IEEE, 2011, 1-4.

Alaridhee, T. et al., "Transmission properties of slanted annular aperture arrays. Giant energy deviation over sub-wavelength distance", Optics express 23.9, 2015, 11687-11701.

Ali, Tariq et al., "Diagonal and Vertical Routing Protocol for Underwater Wireless Sensor Network", Procedia-Social and Behavioral Sciences 129, 2014, 372-379.

Allen, Jeffrey et al., "New Concepts in Electromagnetic Materials and Antennas", Air Force Research Laboratory, Jan. 2015, 80 pages.

Amirshahi, P. et al., "Transmission channel model and capacity of overhead multiconductor mediumvoltage powerlines for broadband communications", Consumer Communications and Networking Conference, 2005, 5 pages.

Amt, John H. et al., "Flight Testing of a Pseudolite Navigation System on a UAV", Air Force Institute of Technology: ION Conference, Jan. 2007, 9 pages.

Antennamagus, , "Parabolic focus pattern fed reflector with shroud", antennamagus.com, Jul. 4, 2014, 2 pages.

Ares-Pena, Francisco J. et al., "A simple alternative for beam reconfiguration of array antennas", Progress in Electromagnetics Research 88, 2008, 227-240.

Ascom, , "TEMS Pocket—a Complete Measurement Smartphone System in your Hand", http://www.ascom.us/us-en/tems_pocket_14.0_feature_specific_datasheet.pdf, 2014, 2 pages.

A-Tech Fabrication, "Dual Antenna Boom Assembly", http://web.archive.org/web/20090126192215/http://atechfabrication.com/products/dual_antenna_boom.htm, 2009, 2 pages.

Baanto, , "Surface Acoustic Wave (SAW) Touch Screen", http://baanto.com/surface-acoustic-wave-saw-touch-screen, 2016, 4 pages.

Babakhani, Aydin , "Direct antenna modulation (DAM) for on-chip mm-wave transceivers", Diss. California Institute of Technology, 2008, 2 pages.

Barlow, H. M. et al., "Surface Waves", 621.396.11 : 538.566, Paper No. 1482 Radio Section, 1953, pp. 329-341.

Barnes, Heidi et al., "DeMystifying the 28 Gb/s PCB Channel: Design to Measurement", Design Con. 2014, Feb. 28, 2014, 54 pages.

Benevent, Evangéline , "Transmission lines in MMIC technology", Universitá Mediterranea di Reggio Calabria, Jan. 28, 2010, 63 pages.

Benkhelifa, Elhadj , "User Profiling for Energy Optimisation in Mobile Cloud Computing", 2015, 1159-1165.

Berweger, Samuel et al., "Light on the Tip of a Needle: Plasmonic Nanofocusing for Spectroscopy on the Nanoscale", The Journal of Physical Chemistry Letters; pubs.acs.org/JPCL, 2012, 945-952.

Blanco-Redondo, Andrea et al., "Coupling midinfrared light from a photonic crystal waveguide to metallic transmission lines", Applied Physics Letters 104.1, 2014, 6 pages.

Blattenberger, Kirt , "DroneBased Field Measurement System (dBFMS)", RF Cafe, rfcafe.com, Jul. 29, 2014, 3 pages.

Brambilla, Gilberto et al., "Ultra-low-loss optical fiber nanotapers", Optoelectronics Research Centre, University of Southampton; http://www.orc.soton.ac.uk, vol. 12, No. 10, May 7, 2004, 2258-2263.

Bridges, William B. , "Low-Loss Flexible Dielectric Waveguide for Millimeter-Wave Transmission and Its Application to Devices", California Institute of Technology, Office of Naval Research, Mar. 1981, 91 pages.

Briso-Rodriguez, , "Measurements and Modeling of Distributed Antenna Systems in Railway Tunnels", IEEE Transactions on Vehicular Technology, vol. 56, No. 5, Sep. 2007, 2870-2879.

Budde, Matthias , "Using a 2DST Waveguide for Usable, Physically Constrained Out-of-Band Wi-Fi Authentication", https://pdfs.semanticscholar.org/282e/826938ab7170c198057f9236799e92e21219.pdf, 2013, 8 pages.

Campista, Miguel E. et al., "Improving the Data Transmission Throughput Over the Home Electrical Wiring", The IEEE Conference on Local Computer Networks 30th Anniversary, 2005, 1-8.

Capece, P. et al., "FDTD Analysis of a Circular Coaxial Feeder for Reflector Antenna", Antennas and Propagation Society International Symposium, IEEE Digest, vol. 3, 1997, pp. 1570-1573.

Chaimae, Elmakfalji et al., "New Way of Passive RFID Deployment for Smart Grid", Journal of Theoretical and Applied Information Technology 82.1, Dec. 10, 2015, 81-84.

Chen, Ke et al., "Geometric phase coded metasurface: from polarization dependent directive electromagnetic wave scattering to diffusionlike scattering", Scientific Reports 6, 2016, 1-10.

Choudhury, Romit R. , "Utilizing Beamforming Antennas for Wireless Mult-hop Networks", www.slideserve.com, Sep. 20, 2012, 4 pages.

Chu, Eunmi et al., "Self-organizing and self-healing mechanisms in cooperative small cell networks", PIMRC, 2013, 6 pages.

Cisco, , "Troubleshooting Problems Affecting Radio Frequency Communication", cisco.com, Oct. 19, 2009, 5 pages.

Cliff, Oliver M. et al., "Online localization of radio-tagged wildlife with an autonomous aerial robot system", Proceedings of Robotics Science and Systems XI, 2015, 1317.

Collins, D.D. et al., "Final Report on Advanced Antenna Design Techniques", GER 11246, Report No. 4, Sep. 6, 1963, 1-70.

Comsol, , "Fast Numerical Modeling of a Conical Horns Lens Antenna", comsol.com, Application ID: 18695, Sep. 16, 2016, 3 pages.

Crisp, , "Uplink and Downlink Coverage Improvements of 802.11g Signals Using a Distributed Antenna Network", Journal of Lightwave Technology ( vol. 25, Issue: 11), Dec. 6, 2007, 1-4.

Crosswell, , "Aperture excited dielectric antennas", http://ntrs.nasa.gov/archive/nasa/casi.ntrs.nasa.gov/19740017567.pdf, 1974, 128 pages.

Curry, James M. , "A Web of Drones: A 2040 Strategy to Reduce the United States Dependance on Space Based Capabilities", Air War College, Feb. 17, 2015, 34 pages.

Daniel, Kai et al., "Using Public Network Infrastructures for UAV Remote Sensing in Civilian Security Operations", Homeland Security Affairs, Supplement 3, Mar. 2011, 11 pages.

De Freitas, Carvalho et al., "Unmanned Air Vehicle Based Localization and Range Estimation of WiFi Nodes", 2014, 109 pages.

Debord, Benoit et al., "Generation and confinement of microwave gas-plasma in photonic dielectric microstructure", Optics express 21.21, 2013, 25509-25516.

Deilmann, Michael , "Silicon oxide permeation barrier coating and sterilization of PET bottles by pulsed low-pressure microwave plasmas", Dissertation, 2008, 142 pages.

Deng, Chuang et al., "Unmanned Aerial Vehicles for Power Line Inspection: A Cooperative Way in Platforms and Communications", Journal of Communicatinos vol. 9, No. 9, Sep. 2014, 687-692.

Doshi, D.A. et al., "Real Time Fault Failure Detection in Power Distribution Line using Power Line Communication", International Journal of Engineering Science, vol. 6, Issue No. 5, May 2016, 4834-4837.

Dyson, John D. , "The Equiangular Spiral Antenna", IRE Transactions on Antennas and Propagation, 1959, 181-187.

Earth Data, , "Remote Sensors", NASA, earthdata.nasa.gov, Oct. 17, 2016, 36 pages.

(56) References Cited

OTHER PUBLICATIONS

Eizo, , "How can a screen sense touch? A basic understanding of touch panels", www.eizo.com/library/basics/basic_understanding_of_touch_panel, Sep. 27, 2010, 8 pages.
Elmore, Glenn et al., "A Surface Wave Transmission Line", QEX, May/Jun. 2012, pp. 3-9.
Emerson, , "About Rosemount 5300 Level Transmitter", www.emerson.com, Nov. 2016, 6 pages.
Eom, Seung-Hyun et al., "Pattern switchable antenna system using inkjet-printed directional bow-tie for bi-direction sensing applications", Sensors 15.12, 2015, 31171-31179.
Faggiani, Adriano , "Smartphone-based crowdsourcing for network monitoring: opportunities, challenges, and a case study", http://vecchio.iet.unipi.it/vecchio/files/2010/02/article.pdf, 2014, 8 pages.
Farzaneh, Masoud et al., "Systems for Prediction and Monitoring of Ice Shedding, Anti-Cicing and De-Icing for Power Line Conductors and Ground Wires", Dec. 1, 2010, 1-100.
Fattah, E. Abdel et al., "Numerical 3D simulation of surface wave excitation in planar-type plasma processing device with a corrugated dielectric plate", Elsevier, Vacuum 86, 2011, 330-334.
Feko, , "Lens Antennas", Altair, feko.info, Jun. 30, 2014, 2 pages.
Feng, Wei et al., "Downlink power allocation for distributed antenna systems in a multi-cell environment", 2009 5th International Conference on Wireless Communications, Networking and Mobile Computing, 2009, 2 pages.
Fenn, Alan J. et al., "A Terrestrial Air Link for Evaluating Dual-Polarization Techniques in Satellite Communications", vol. 9, No. 1, The Lincoln Laboratory Journal, 1996, 3-18.
Fiorelli, Riccardo et al., "ST7580 power line communication systemonchip design guide", Doc ID 022923 Rev 2, Jul. 2012, 63 pages.
Fitzgerald, William D. , "A 35-GHz Beam Waveguide System for the Millimeter-Wave Radar", The Lincoln Laboratory Journal, vol. 5, No. 2, 1992, 245-272.
Ford, Steven , "AT&T's new antenna system will boost cellular coverage at Walt Disney World", Orlando Sentinel, orlandosentinel.com, Mar. 9, 2014, 4 pages.
Galli, , "For the Grid and Through the Grid: The Role of Power Line Communications in the Smart Grid", Proceedings of the IEEE 99.6, Jun. 2011, 1-26.
Gerini, Giampiero , "Multilayer array antennas with integrated frequency selective surfaces conformal to a circular cylindrical surface", http://alexandria.tue.nl/openaccess/Metis248614.pdf, 2005, 2020-2030.
Geterud, Erik G. , "Design and Optimization of Wideband Hat-Fed Reflector Antenna with Radome for Satellite Earth Station", http://publications.lib.chalmers.se/records/fulltext/163718.pdf, Discloses Frequency Selective Surfaces for antenna coverings for weather protection (table of materials on p. 29-30; pp. 37-46), 2012, 70 pages.
Gilbert, Barrie et al., "The Gears of Genius", IEEE SolidState Circuits Newsletter 4.12, 2007, 10-28.
Glockler, Roman , "Phased Array for Millimeter Wave Frequencies", International Journal of Infrared and Millimeter Waves, Springer, vol. 11, No. 2, Feb. 1, 1990, 10 pages.
Godara, , "Applications of Antenna Arrays to Mobile Communications, Part I: Performance Improvement, Feasibility, and System Considerations", Proceedings of the IEEE, vol. 85, No. 7, Jul. 1997, 1031-1060.
Greco, R., "Soil water content inverse profiling from single TDR waveforms", Journal of hydrology 317.3, 2006, 325-339.
Gunduz, Deniz et al., "The multiway relay channel", IEEE Transactions on Information Theory 59.1, 2013, 5163.
Guo, Shuo et al., "Detecting Faulty Nodes with Data Errors for Wireless Sensor Networks", 2014, 25 pages.
Hadi, Ghozali S. et al., "Autonomous UAV System Development for Payload Dropping Mission", The Journal of Instrumentation, Automation and Systems, vol. 1, No. 2, 2014, pp. 72-22.
Hafeez, , "Smart Home Area Networks Protocols within the Smart Grid Context", Journal of Communications vol. 9, No. 9, Sep. 2014, 665-671.
Haider, Muhammad Kumail et al., "Mobility resilience and overhead constrained adaptation in directional 60 GHz WLANs: protocol design and system implementation", Proceedings of the 17th ACM International Symposium on Mobile Ad Hoc Networking and Computing, 2016, 10 pages.
Halder, Achintya et al., "Low-cost alternate EVM test for wireless receiver systems", 23rd IEEE VLSI Test Symposium (VTS'05), 2005, 6 pages.
Hale, Paul et al., "A statistical study of deembedding applied to eye diagram analysis", IEEE Transactions on Instrumentation and Measurement 61.2, 2012, 475-488.
Halligan, Matthew S., "Maximum crosstalk estimation and modeling of electromagnetic radiation from PCB/highdensity connector interfaces", http://scholarsmine.mst.edu/cgi/viewcontent.cgiarticle=3326&context=doctoral_dissertations, 2014, 251 pages.
Hanashi, Abdalla M. et al., "Effect of the Dish Angle on the Wet Antenna Attenuation", IEEE, 2014, 1-4.
Hays, Phillip, "SPG-49 Tracking Radar", www.okieboat.com/SPG-49%20description.html, 2015, 15 pages.
Heo, Joon et al., "Identity-Based Mutual Device Authentication Schemes for PLC Systems", IEEE International Symposium on Power Line Communications and Its Applications, 2008, pp. 47-51.
Howard, Courtney, "UAV command, control & communications", Military & Aerospace Electronics, militaryaerospace.com, Jul. 11, 2013, 15 pages.
Hussain, Mohamed T. et al., "Closely Packed Millimeter-Wave MIMO Antenna Arrays with Dielectric Resonator Elements", Antennas and Propagation (EuCAP) 2016 10th European Conference, Apr. 2016, 1-5.
Huth, G. K., "Integrated source and channel encoded digital communication system design study", http://ntrs.nasa.gov/archive/nasa/casi.ntrs.nasa.gov/19750003064.pdf, 1974, 65 pages.
Ikrath, K. et al., "Antenna Innovation Glass-Fiber Tube Focuses Microwave Beam", Electronics, vol. 35, No. 38, Sep. 21, 1962, 44-47.
Illinois Historic Archive, "Antennas on the Web", Photo Archive of Antennas, ece.illinois.ed, 1-18, Dec. 2016.
Islam, M. T., "Coplanar Waveguide Fed Microstrip Patch Antenna", Information Technology Journal 9.2 (2010): 367-370., 2010, 367-370.
James, Graeme L. et al., "Diplexing Feed Assemblies for Application to Dual-Reflector Antennas", IEEE Transactions on Antennas and Propagation, vol. 51, No. 5, May 2003, 1024-1029.
James, J. R. et al., "Investigations and Comparisons of New Types of Millimetre-Wave Planar Arrays Using Microstrip and Dielectric Structures", Royal Military College of Science, Apr. 1985, 122 pages.
Jensen, Michael, "Data-Dependent Fingerprints for Wireless Device Authentication", www.dtic.mil/cgi-bin/GetTRDoc?AD=ADA626320, 2014, 15 pages.
Jiang, Peng, "A New Method for Node Fault Detection in Wireless Sensor Networks", 2009, 1282-1294.
Jiang, Y.S. et al., "Electromagnetic orbital angular momentum in remote sensing", PIERS Proceedings, Moscow, Russia, Aug. 18-21, 2009, 1330-1337.
Jones, Jr., Howard S., "Conformal and Small Antenna Designs", U.S. Army Electronics Research and Development Command, Harry Diamond Laboratories, Apr. 1981, 32 pages.
Kado, Yuichi et al., "Exploring SubTHz Waves for Communications, Imaging, and Gas Sensing", Fog 2: 02, PIERS Proceedings, Beijing, China, Mar. 23-27, 2009, 42-47.
Karbowiak, A. E. et al., "Characteristics of Waveguides for Long-Distance Transmission", Journal of Research of the National Bureau of Standards, vol. 65D, No. 1, Jan.-Feb. 1961, May 23, 1960, 75-88.
Katrasnik, Jaka, "New Robot for Power Line Inspection", 2008 IEEE Conference on Robotics, Automation and Mechatronics, 2008, 1-6.
Kedar, "Wide Beam Tapered Slot Antenna for Wide Angle Scanning Phased Array Antenna", Progress in Electromagnetics Research B, vol. 27, 2011, 235-251.

(56) References Cited

OTHER PUBLICATIONS

Khan, Kaleemullah, "Authentication in Multi-Hop Wireless Mesh Networks", World Academy of Science, Engineering and Technology, International Journal of Electrical, Computer, Energetic, Electronic and Communication Engineering vol. 2, No. 10, 2008, 2406-2411.
Khan, Mohammed R., "A beam steering technique using dielectric wedges", Diss. University of London, Dec. 1985, 3 pages.
Kim, Jong-Hyuk et al., "Real-time Navigation, Guidance, and Control of a UAV using Low-cost Sensors", Australian Centre for Field Robotics, Mar. 5, 2011, 6 pages.
Kim, Myungsik et al., "Automated RFID-based identification system for steel coils", Progress in Electromagnetics Research 131, 2012, 1-17.
Kima, Yi-Gon et al., "Generating and detecting torsional guided waves using magnetostrictive sensors of crossed coils", Chonnam National University, Republic of Korea, Elsevier Ltd,, 2010, 145-151.
Kleinrock, Leonard et al., "On measured behavior of the ARPA network", National Computer Conference, 1974, 767-780.
Kliros, George S., "Dielectric-EBG covered conical antenna for UWB applications", www.researchgate.net/profile/George_Kliros/publication/235322849_Dielectric-EBG_covered_conical_antenna_for_UWB_applications/links/54329e410cf225bddcc7c037.pdf, 2010, 10 pages.
Koga, Hisao et al., "High-Speed Power Line Communication System Based on Wavelet OFDM", 7th International Symposium on Power-Line Communications and Its Applications, Mar. 26-28, 2003, 226-231.
Kolpakov, Stanislav A. et al., "Toward a new generation of photonic humidity sensors", Sensors 14.3, 2014, 3986-4013.
Kuehn, E, "Self-configuration and self-optimization of 4G Radio Access Networks", http://wirelessman.org/tgm/contrib/S80216m-07_169.pdf, 2007, 13 pages.
Kumar, Sumeet et al., "Urban street lighting infrastructure monitoring using a mobile sensor platform", IEEE Sensors Journal, 16.12, 2016, 4981-4994.
Kune, Denis F. et al., "Ghost Talk: Mitigating EMI Signal Injection Attacks against Analog Sensors", IEEE Symposium on Security and Privacy, 2013, 145-159.
Lairdtech, "Allpurpose Mount Kit", www.lairdtech.com, Mar. 29, 2015, 2 pages.
Lazaropoulos, Athanasios, "TowardsModal Integration of Overhead and Underground Low-Voltage and Medium-Voltage Power Line Communication Channels in the Smart Grid Landscape:Model Expansion, Broadband Signal Transmission Characteristics, and Statistical Performance Metrics", International Scholarly Research Network, ISRN Signal Processing, vol. 2012, Article ID 121628, 17 pages, Mar. 26, 2012, 18 pages.
Lazaropoulos, Athanasios G., "Wireless sensor network design for transmission line monitoring, metering, and controlling: introducing broadband over power lines-enhanced network model (BPLeNM)", ISRN Power Engineering, 2014, 23 pages.
Lee, Joseph C., "A Compact Q-/K-Band Dual Frequency Feed Horn", No. TR-645, Massachusetts Institute of Technology, Lincoln Laboratory, May 3, 1983, 40 pages.
Lee, Sung-Woo, "Mutual Coupling Considerations in the Development of Multi-feed Antenna Systems", http://ntrs.nasa.gov/archive/nasa/casi.ntrs.nasa.gov/19750003064.pdf, 2008, 127 pages.
Li, Mo et al., "Underground structure monitoring with wireless sensor networks", Proceedings of the 6th international conference on Information processing in sensor networks, ACM, 2007, 69-78.
Li, Xi et al., "A FCM-Based peer grouping scheme for node failure recovery in wireless P2P file sharing", 2009 IEEE International Conference on Communications, 2009, 2 pages.
Liang, Bin, "Cylindrical Slot FSS Configuration for Beam-Switching Applications", IEEE Transactions on Antennas and Propagation, vol. 63, No. 1, Jan. 2015, 166-173.
Lier, Erik, "A Dielectric Hybrid Mode Antenna Feed: A Simple Alternative to the Corrugated Horn", IEEE Transactions on Antennas and Propagation, vol. AP-34, No. 1, Jan. 1986, 21-30.
Liu, et al.,"A 25 Gb/s (/km 2) urban wireless network beyond IMTadvanced", IEEE Communications Magazine 49.2, 2011, 122-129.
Lumerical Solutions, Inc., "Waveguide Bragg Microcavity", www.lumerical.com, Sep. 2016, 6 pages.
Luo, Hailu et al., "Reversed propagation dynamics of Laguerre-Gaussian beams in left-handed materials", Physical Review A 77.2, 023812., Feb. 20, 2008, 1-7.
Makwana, G. D. et al., "Wideband Stacked Rectangular Dielectric Resonator Antenna at 5.2 GHz", International Journal of Electromagnetics and Applications 2012, 2(3), 2012, 41-45.
Marin, Leandro, "Optimized ECC Implementation for Secure Communication between Heterogeneous IoT Devices", www.mdpi.com/1424-8220/15/9/21478/pdf, 2015, 21478-21499.
Marrucci, Lorenzo, "Rotating light with light: Generation of helical modes of light by spin-to-orbital angular momentum conversion in inhomogeneous liquid crystals", International Congress on Optics and Optoelectronics. International Society for Optics and Photonics, 2007, 12 pages.
Marzetta, "Noncooperative Cellular Wireless with Unlimited Numbers of Base Station Antennas", IEEE Transactions on Wireless Communications, vol. 9, No. 11, Nov. 2010, 3590-3600.
Matikainen, Leena et al., "Remote sensing methods for power line corridor surveys", ISPRS Journal of Photogrammetry and Remote Sensing, 119, 2016, 10-31.
Matsukawa, et al., "A dynamic channel assignment scheme for distributed antenna networks", Vehicular Technology Conference (VTC Spring), 2012 IEEE 75th, 2012, 5 pages.
McKeown, David M. et al., "Rulebased interpretation of aerial imagery", IEEE Transactions on Pattern Analysis and Machine Intelligence 5, 1985, 570-585.
Meessen, A., "Production of EM Surface Waves by Superconducting Spheres: A New Type of Harmonic Oscillators", Progress in Electromagnetics Research Symposium Proceedings, Moscow, Russia, Aug. 19-23, 2012, pp. 529-533.
Mehta, "Advance Featuring Smart Energy Meter With Bi-Directional Communication", Electronics & Communication MEFGI, Feb. 9, 2014, 169-174.
Mena, F.P. et al., "Design and Performance of a 600720GHz SidebandSeparating Receiver Using and AIN SIS Junctions", IEEE Transactions on Microwave Theory and Techniques 59.1, 2011, 166-177.
Miller, Ashley et al., "Pathway to Ubiquitous Broadband: Environments, Policies, and Technologies to Implementation", Oct. 2016, 20 pages.
Miller, David A., "Establishing Optimal Wave Communication Channels Automatically", Journal of Lightwave Technology, vol. 31, No. 24, Dec. 15, 2013, 3987-3994.
Mishra, Sumita et al., "Load Balancing Optimization in LTE/LTEA Cellular Networks: A Review", arXiv preprint arXiv:1412.7273 (2014), 2014, 1-7.
Mori, A. et al., "The Power Line Transmission Characteristics for an OFDM Signal", Progress in Electromagnetics Research, PIER 61, Musashi Institute of Technology, 2006, 279-290.
Mueller, G.E. et al., "Polyrod Antennas", Bell System Technical Journal, vol. 26., No. 4, Oct. 29, 1947, 837-851.
Mushref, Muhammad, "Matrix solution to electromagnetic scattering by a conducting cylinder with an eccentric metamaterial coating", www.sciencedirect.com/science/article/pii/S0022247X06011450/pdf?md5=4823be0348a3771b5cec9ffb7f326c2c&pid=1-s2.0-S0022247X06011450-main.pdf, Discloses controlling antenna radiation pattern with coatings, 2007, 356-366.
Nakano, Hisamatsu, "A Low-Profile Conical Beam Loop Antenna with an Electromagnetically Coupled Feed System", http://repo.lib.hosei.ac.jp/bitstream/10114/3835/1/31_TAP(Low-Profile).pdf, Dec. 2000, 1864-1866.
Nakano, Hisamatsu et al., "A Spiral Antenna Backed by a Conducting Plane Reflector", IEEE Transactions on Antennas and Propagation, vol. AP-34 No. 6, Jun. 1986, 791-796.

(56) References Cited

OTHER PUBLICATIONS

Nandi, Somen et al., "Computing for rural empowerment: enabled by last-mile telecommunications", IEEE Communications Magazine 54.6, 2016, 102-109.

Nassar, "Local Utility Powerline Communications in the 3-500 kHz Band: Channel Impairments, Noise, and Standards", IEEE Signal Processing Magazine, 2012, 1-22.

Niedermayer, Uwe et al., "Analytic modeling, simulation and interpretation of broadband beam coupling impedance bench measurements", Nuclear Instruments and Methods in Physics Research Section A: Accelerators, Spectrometers, Detectors and Associated Equipment 776, 2015, 129-143.

Nikitin, A. Y. et al., "Efficient Coupling of Light to Graphene Plasmons by Compressing Surface Polaritons with Tapered Bulk Materials", Nano Letters; pubs.acs.org/NanoLett, Apr. 28, 2014, 2896-2901.

Nikitin, Pavel V. et al., "Propagation Model for the HVAC Duct as a Communication Channel", IEEE Transactions on Antennas and Propagation 51.5, 2003, 7 pages.

NWClimate, "Weather Instruments and Equipment Explained", nwclimate.org, May 7, 2015, 22 pages.

OECD, "Alternative Local Loop Technologies: A Review", Organisation for Economic Co-Operation and Development, Paris, https://www.oecd.org/sti/2090965.pdf, 1996, 25 pages.

Ohliger, Michael, "An introduction to coil array design for parallel MRI", http://mriquestions.com/uploads/3/4/5/7/34572113/intro_to_coil_design_parallel_.pdf, 2006, 16 pages.

Paruchuri, et al., "Securing Powerline Communication", IEEE, 2008, 64-69.

Patel, Pinak S. et al., "Sensor Fault Detection in Wireless Sensor Networks and Avoiding the Path Failure Nodes", International Journal of Industrial Electronics and Electrical Engineering, vol. 2, Issue—3, Mar. 2014, 2347-6982.

Pato, Silvia et al., "On building a distributed antenna system with joint signal processing for next generation wireless access networks: The FUTON approach", 7th Conference on Telecommunications, Portugal, 2008, 4 pages.

Pike, Kevin J. et al., "A spectrometer designed for 6.7 and 14.1 T DNP-enhanced solid-state MAS NMR using quasi-optical microwave transmission", Journal of Magnetic Resonance, 2012, 9 pages.

Qi, Xue et al., "Ad hoc QoS ondemand routing (AQOR) in mobile ad hoc networks", Journal of parallel and distributed computing 63.2, 2003, 154-165.

Qiu, Lili et al., "Fault Detection, Isolation, and Diagnosis in Multihop Wireless Networks", Dec. 2003, 16 pages.

Quan, Xulin, "Analysis and Design of a Compact Dual-Band Directional Antenna", IEEE Antennas and Wireless Propagation Letters, vol. 11, 2012, 547-550.

Quinstar Technology, Inc., "Prime Focus Antenna (QRP series)", quinstar.com, Aug. 19, 2016, 2 pages.

Ranga, Yogesh et al., "An ultra-wideband quasi-planar antenna with enhanced gain", Progress in Electromagnetics Research C 49, 2014, 59-65.

Rangan, Sundeep et al., "Millimeter-Wave Cellular Wireless Networks: Potentials and Challenges", Proceedings of the IEEE, vol. 102, No. 3, Mar. 2014, 366-385.

Rangel, Rodrigo K. et al., "Sistema de Inspecao de Linhas de Transmissao de Energia Electrica Utilizando Veiculos Aereos Nao-Tripulados", Sep. 14-16, 2009, 1-9.

Rekimoto, Jun, "SmartSkin: An Infrastructure for Freehand Manipulation on Interactive Surfaces", https://vs.inf.ethz.ch/edu/SS2005/DS/papers/surfaces/rekimoto-smartskin.pdf, 2002, 8 pages.

Ren-Bin, Zhong et al., "Surface plasmon wave propagation along single metal wire", Chin. Phys. B, vol. 21, No. 11, May 2, 2012, 9 pages.

Ricardi, L. J., "Some Characteristics of a Communication Satellite Multiple-Beam Antenna", Massachusetts Institute of Technology, Lincoln Laboratory, Technical Note 1975-3, Jan. 28, 1975, 62 pages.

Rieke, M. et al., "High-Precision Positioning and Real-Time Data Processing of UAV Systems", International Archives of the Photogrammetry, Remote Sensing and Spatial Information Sciences, vol. XXXVIII-1/C22, 2011, 119-124.

Robinson, D.A. et al., "Advancing processbased watershed hydrological research using nearsurface geophysics: A vision for, and review of, electrical and magnetic geophysical methods", Hydrological Processes 22.18, Mar. 11, 2008, 3604-3635.

Robles, Rosslin John et al., "A Review on Security in Smart Home Development", International Journal of Advanced Science and Technology 15, Feb. 2010, 13-22.

Rosenberg, Uwe et al., "A novel frequency-selective power combiner/divider in single-layer substrate integrated waveguide technology", IEEE Microwave and Wireless Components Letters, vol. 23, No. 8, Aug. 2013, 406-408.

Rousstia, M. W., "Switched-beam antenna array design for millimeter-wave applications", https://pure.tue.nl/ws/files/4418145/599448877400424.pdf, Jan. 1, 2011, 148 pages.

Sahoo, Srikanta, "Faulty Node Detection in Wireless Sensor Networks Using Cluster", Apr. 2013, 212-223.

Scerri, Paul et al., "Geolocation of RF emitters by many UAVs", AIAA Infotech, Aerospace 2007 Conference and Exhibit, 2007, 1-13.

Schoning, Johannes et al., "Multi-Touch Surfaces: A Technical Guide", Johannes Schöning, Institute for Geoinformatics University of Münster, Technical Report TUM-I0833, 2008, 19 pages.

Sembiring, Krisantus, "Dynamic Resource Allocation for Cloud-based Media Processing", http://www.chinacloud.cn/upload/2013-04/13042109511919.pdf, 2013, 49-54.

Shankland, Steven, "Lowly DSL poised for gigabit speed boost", www.cnet.com, Oct. 21, 2014, 5 pages.

Sharma, Archana et al., "Dielectric Resonator Antenna for X band Microwave Application", Research & Reviews, International Journal of Advanced Research in Electrical, Electronics and Instrumentation Engineering, Oct. 2016, 9 pages.

Shekar, Chandra P., "Transmission Line Fault Detection & Indication through GSM", IRD India, ISSN (Online): 2347-2812, vol. 2, Issue 5, 2014, 28-30.

Shila, Devu M., "Load-Aware Traffic Engineering for Mesh Networks", Computer Communications 31.7, 2008, 1460-1469.

Shin, Donghoon et al., "10 Gbps Millimeter-Wave OFDM Experimental System with Iterative Phase Noise Compensation", Tokyo Institute of Technology, IEEE, 2013, 184-186.

Silver, Ralph U., "Local Loop Overview", National Communications System (NCS), BellSouth Network Training, newnetworks.com, Aug. 2016, 100 pages.

Silvonen, Kimmo, "Calibration and DeEmbedding of Microwave Measurements Using Any Combination of Oneor TwoPort Standards", Publication of the Circuit Theory Laboratory, CT4, 1987, 1-28.

Simionovici, Ana-Maria et al., "Predictive Modeling in a VoIP System", 2013, 32-40.

Simons, Rainee N., "Coplanar Waveguide Feeds for Phased Array Antennas", Solid State Technology Branch of NASA Lewis Research Center Fourth Annual Digest, Conference on Advanced Space Exploration Initiative Technologies cosponsored by AIAA, NASA and OAI, 1992, 1-9.

Singh, Sapana et al., "Key Concepts and Network Architecture for 5G Mobile Technology", International Journal of Scientific Research Engineering & Technology (IJSRET), IIMT Engineering College, Meerut, India, vol. 1, Issue 5, Aug. 2012, 165-170.

Singh, Seema M. et al., "Broadband Over Power Lines A White Paper", State of New Jersey, Division of the Ratepayer Advocate, NJ, Oct. 2016, 67 pages.

Song, Kaijun et al., "Broadband radial waveguide power amplifier using a spatial power combining technique", www.mtech.edu/academics/mines/geophysical/xzhou/publications/songfanzhou_2009b_impa.pdf, 2009, 7 pages.

Sospedra, Joaquim et al., "Badalona Oil PierBased Met-Ocean Monitoring Station", Campbell Scientific, www.campbellsci.com, Nov. 2016, 2 pages.

(56) References Cited

OTHER PUBLICATIONS

Souryal, Michael R. et al., "Rapidly Deployable Mesh Network Testbed", https://pdfs.semanticscholar.org/f914/1ce6999c4095eab3bdea645745761ebe5141.pdf, 2009, 6 pages.

Sowmya, Arcot et al., "Modelling and representation issues in automated feature extraction from aerial and satellite images", ISPRS journal of photogrammetry and remote sensing, 55.1, 2000, 34-47.

Spencer, D G., "Novel Millimeter ACC Antenna Feed", IEEE Colloquium on Antennas for Automotives, Mar. 10, 2000, 10 pages.

Stancil, Daniel D. et al., "High-speed internet access via HVAC ducts: a new approach", Global Telecommunications Conference, IEEE vol. 6, 2001, 4 pages.

Sun, Zhi et al., "Magnetic Induction Communications for Wireless Underground Sensor Networks", IEEE Transactions on Antennas and Propagation, vol. 58, No. 7, Jul. 2010, 2426-2435.

Sundqvist, Lassi, "Cellular Controlled Drone Experiment: Evaluation of Network Requirements", 2015, 71 pages.

Szczys, Mike, "Cameras Perch on Power Lines, Steal Electricity", http://hackaday.com/2010/06/28/cameras-perch-on-power-lines-steal-electricity/, Discloses cameras that clamp on to power lines and use induction as a power source., 2010, 1 page.

Talbot, David, "Adapting Old-Style Phone Wires for Superfast Internet", Jul. 30, 2013, 3 pages.

Tantawi, Sami G. et al., "High-power multimode X-band rf pulse compression system for future linear colliders", Physical Review Special Topics-Accelerators and Beams, 1098-4402/05/8(4)/042002, 2005, 19 pages.

Teng, Ervin et al., "Aerial Sensing and Characterization of ThreeDimensional RF Fields", Univ. at Buffalo, cse.buffalo.edu, Sep. 2016, 6 pages.

Tesoriero, Ricardo et al., "Tracking autonomous entities using RFID technology", IEEE Transactions on Consumer Electronics 55.2, 2009, 650-655.

Thota, Saigopal et al., "Computing for Rural Empowerment: Enabled by Last-Mile Telecommunications (Extended Version)", Technical Report, 2013, 14 pages.

Thottapan, M., "Design and simulation of metal PBG waveguide mode launcher", www.researchgate.net/profile/Dr_M_Thottapan/publication/262415753_Design_and_Simulation_of_Metal_PBG_Waveguide_Mode_Launcher/links/0f317537ad93a5e2a4000000.pdf, 2014, 383-387.

Tillack, M. S. et al., "Configuration and engineering design of the ARIES-RS tokamak power plant", https://www.researchgate.net/publication/222496003_Configuration_and_engineering_design_of_the_ARIES-RS_tokamak_power_plant, 1997, 87-113.

Tucson Electric Power, "Energy-Harvesting Power Supply", http://sdpm.arizona.edu/projects/project-publi/upid/38a8cf3b42f35576de25de1f6dcc20f3, Discloses a project to harvest energy from a power line and that a device was built that clamps onto a power line., 2016, 1 page.

UK Essays, "Beam Adaptive Algorithms for Smart Antennas Computer Science Essay", www.ukessays.com, Mar. 23, 2015, 21 pages.

International Preliminary Report on Patentability, PCT/US16/20001, dated Feb. 17, 2017, pp. 1-14.

Van Atta, L.C., "Contributions to the antenna field during World War II", www.nonstopsystems.com/radio/pdf-hell/article-IRE-5-1962.pdf, 1962, 692-697.

Wade, Paul, "Multiple Reflector Dish Antennas", www.w1ghz.org/antbook/conf/Multiple_reflector_antennas.pdf, 2004, 45 pages.

Wang, Hao et al., "Dielectric Loaded Substrate Integrated Waveguide (SIW)—Plan Horn Antennas", IEEE Transactions on Antennas and Propagation, IEEE Service Center, Piscataway, NJ, US, vol. 56, No. 3, Mar. 1, 2010, 640-647.

https://pdfs.semanticscholar.org/3941/601af7a21d55e8b57ab0c50d5f1d9f9f6868.pdf, Discloses an induction based energy harvesting device that takes energy from overhead powerlines (Figure 4)., 2016, 16 pages.

Wang, Xingfu et al., "Zigzag coverage scheme algorithm & analysis for wireless sensor networks", Network Protocols and Algorithms 5.4, 2013, 19-38.

Washiro, Takanori, "Applications of RFID over power line for Smart Grid", Power Line Communications and Its Applications (ISPLC), 2012 16th IEEE International Symposium on. IEEE, 2012, 83-87.

Wenger, N., "The launching of surface waves on an axial-cylindrical reactive surface", IEEE Transactions on Antennas and Propagation 13.1, 1965, 126-134.

Werner, Louis B. et al., "Operation Greenhouse", Scientific Director's Report of Atomic Weapon Tests at Eniwetok, Annex 6.7 Contimation-Decontamination Studies Naval Radiological Defense Lab, 1951, 209 pages.

Wikipedia, , "Angular Momentum of Light", https://en.wikipedia.org/wiki/Angular_momentum_of_light, Nov. 10, 2016, 1-7.

Wilkes, Gilbert , "Wave Length Lenses", Dec. 5, 1946, 49 pages.

Wolfe, Victor et al., "Feasibility Study of Utilizing 4G LTE Signals in Combination With Unmanned Aerial Vehicles for the Purpose of Search and Rescue of Avalanche Victims (Increment 1)", University of Colorado at Boulder, Research Report, 2014, 26 pages.

Won Jung, Chang et al., "Reconfigurable Scan-Beam Single-Arm Spiral Antenna Integrated With RF-MEMS Switches", IEEE Transactions on Antennas and Propagation, vol. 54, No. 2, Feb. 2006, 455-463.

Woodford, Chris , "How do touchscreens work?", www.explainthatstuff.com/touchscreens.html, Aug. 23, 2016, 8 pages.

Xiao, Shiyi et al., "Spin-dependent optics with metasurfaces", Nanophotonics 6.1, 215-234., 2016, 215-234.

Yeh, C. et al., "Thin-Ribbon Tapered Coupler for Dielectric Waveguides", 42-48, May 15, 1994.

Yilmaz, et al., "Self-optimization of coverage and capacity in LTE using adaptive antenna systems", Aalto University, Feb. 2010, 72 pages.

Zhang, , "Modified Tapered Slot-line Antennas for Special Applications", REV Journal on Electronics and Communications, vol. 2, Jul.-Dec. 2012, 106-112.

Zhang, Ming et al., "PlanetSeer: Internet Path Failure Monitoring and Characterization in Wide Area Services", OSDI, vol. 4, 2004, 33 pages.

Zucker, Francis J. , "Surface-Wave Antennas", Antenna Engineering Handbook, Chapter 10, 2007, 32 pages.

\* cited by examiner

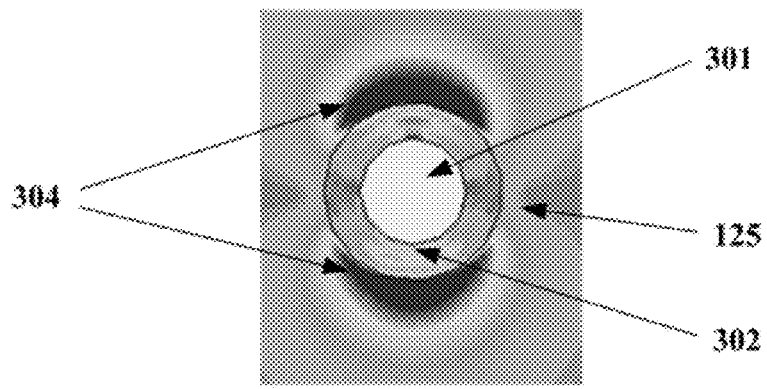
300
FIG. 3
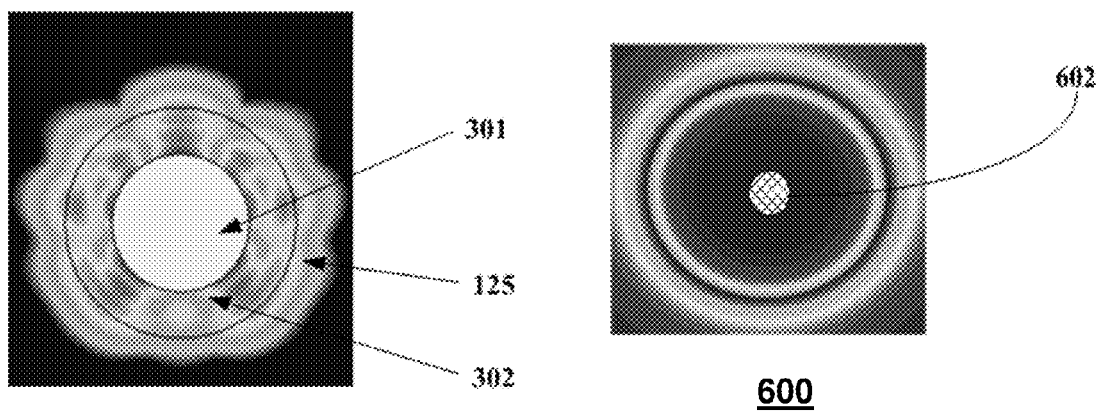
400
FIG. 4
600
FIG. 6

500

550

700

800

1100

1200

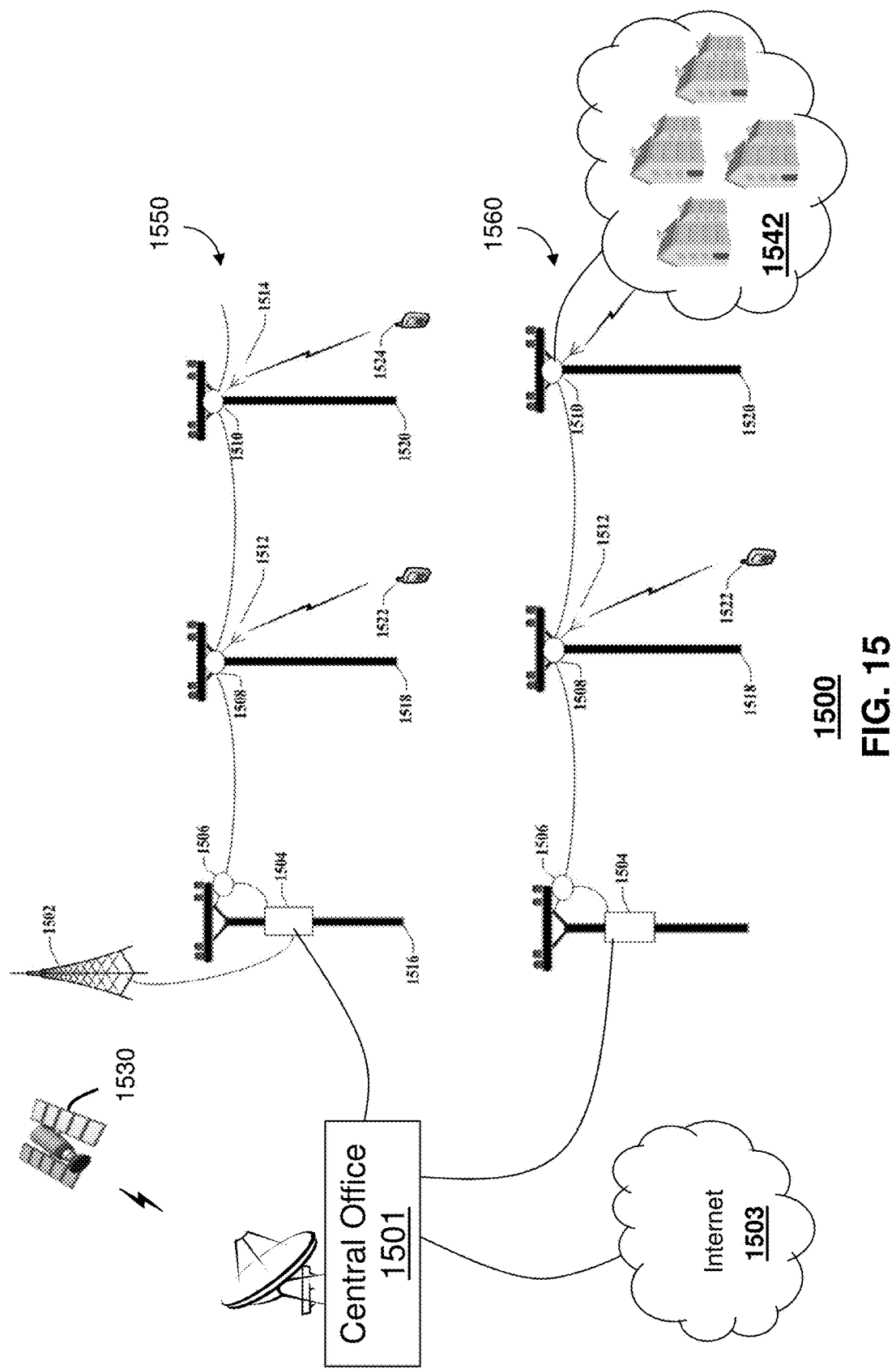

1650

1700

1900

1920

1940

1960

1980

2300

MAGNETIC COUPLING DEVICE AND METHODS FOR USE THEREWITH

FIELD OF THE DISCLOSURE

The subject disclosure relates to communications via microwave transmission in a communication network.

BACKGROUND

As smart phones and other portable devices increasingly become ubiquitous, and data usage increases, macrocell base station devices and existing wireless infrastructure in turn require higher bandwidth capability in order to address the increased demand. To provide additional mobile bandwidth, small cell deployment is being pursued, with microcells and picocells providing coverage for much smaller areas than traditional macrocells.

In addition, most homes and businesses have grown to rely on broadband data access for services such as voice, video and Internet browsing, etc. Broadband access networks include satellite, 4G or 5G wireless, power line communication, fiber, cable, and telephone networks.

BRIEF DESCRIPTION OF THE DRAWINGS

Reference will now be made to the accompanying drawings, which are not necessarily drawn to scale, and wherein:

FIG. 3 is a graphical diagram illustrating an example, non-limiting embodiment of an electromagnetic field distribution in accordance with various aspects described herein.

FIG. 4 is a graphical diagram illustrating an example, non-limiting embodiment of an electromagnetic field distribution in accordance with various aspects described herein.

FIG. 6 is a graphical diagram illustrating an example, non-limiting embodiment of an electromagnetic field distribution in accordance with various aspects described herein.

FIG. 15 is a block diagram illustrating an example, non-limiting embodiment of a guided wave communications system in accordance with various aspects described herein.

DETAILED DESCRIPTION

Figure 1:
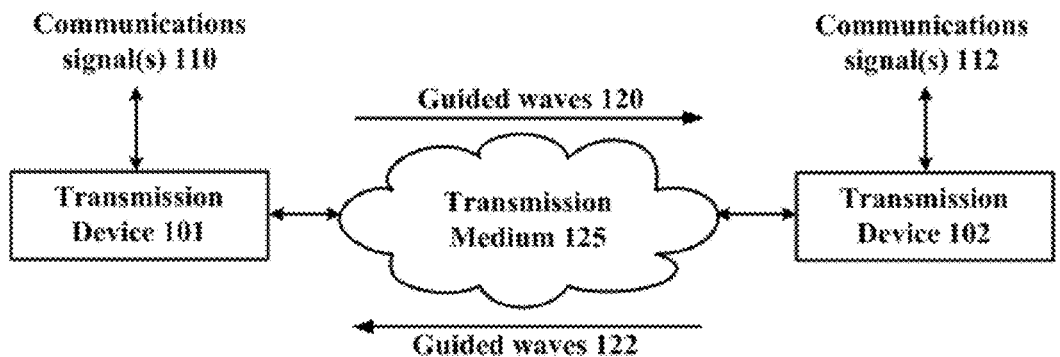
FIG. 1 is a block diagram illustrating an example, non-limiting embodiment of a guided wave communications system in accordance with various aspects described herein.

One or more embodiments are now described with reference to the drawings, wherein like reference numerals are used to refer to like elements throughout the drawings. In the following description, for purposes of explanation, numerous details are set forth in order to provide a thorough understanding of the various embodiments. It is evident, however, that the various embodiments can be practiced without these details (and without applying to any particular networked environment or standard).

In an embodiment, a guided wave communication system is presented for sending and receiving communication signals such as data or other signaling via guided electromagnetic waves. The guided electromagnetic waves include, for example, surface waves or other electromagnetic waves that are bound to or guided by a transmission medium. It will be appreciated that a variety of transmission media can be utilized with guided wave communications without departing from example embodiments. Examples of such transmission media can include one or more of the following, either alone or in one or more combinations: wires, whether insulated or not, and whether single-stranded or multi-stranded; conductors of other shapes or configurations including wire bundles, cables, rods, rails, pipes; non-conductors such as dielectric pipes, rods, rails, or other dielectric members; combinations of conductors and dielectric materials; or other guided wave transmission media.

The inducement of guided electromagnetic waves on a transmission medium can be independent of any electrical potential, charge or current that is injected or otherwise transmitted through the transmission medium as part of an electrical circuit. For example, in the case where the transmission medium is a wire, it is to be appreciated that while a small current in the wire may be formed in response to the propagation of the guided waves along the wire, this can be due to the propagation of the electromagnetic wave along the wire surface, and is not formed in response to electrical potential, charge or current that is injected into the wire as part of an electrical circuit. The electromagnetic waves traveling on the wire therefore do not require a circuit to propagate along the wire surface. The wire therefore is a single wire transmission line that is not part of a circuit. Also, in some embodiments, a wire is not necessary, and the electromagnetic waves can propagate along a single line transmission medium that is not a wire.

More generally, "guided electromagnetic waves" or "guided waves" as described by the subject disclosure are affected by the presence of a physical object that is at least a part of the transmission medium (e.g., a bare wire or other conductor, a dielectric, an insulated wire, a conduit or other hollow element, a bundle of insulated wires that is coated, covered or surrounded by a dielectric or insulator or other wire bundle, or another form of solid, liquid or otherwise non-gaseous transmission medium) so as to be at least partially bound to or guided by the physical object and so as to propagate along a transmission path of the physical object. Such a physical object can operate as at least a part of a transmission medium that guides, by way of an interface of the transmission medium (e.g., an outer surface, inner surface, an interior portion between the outer and the inner surfaces or other boundary between elements of the transmission medium), the propagation of guided electromagnetic waves, which in turn can carry energy, data and/or other signals along the transmission path from a sending device to a receiving device.

Unlike free space propagation of wireless signals such as unguided (or unbounded) electromagnetic waves that decrease in intensity inversely by the square of the distance traveled by the unguided electromagnetic waves, guided electromagnetic waves can propagate along a transmission medium with less loss in magnitude per unit distance than experienced by unguided electromagnetic waves.

Unlike electrical signals, guided electromagnetic waves can propagate from a sending device to a receiving device without requiring a separate electrical return path between the sending device and the receiving device. As a consequence, guided electromagnetic waves can propagate from a sending device to a receiving device along a transmission medium having no conductive components (e.g., a dielectric strip), or via a transmission medium having no more than a single conductor (e.g., a single bare wire or insulated wire). Even if a transmission medium includes one or more conductive components and the guided electromagnetic waves propagating along the transmission medium generate currents that flow in the one or more conductive components in a direction of the guided electromagnetic waves, such guided electromagnetic waves can propagate along the transmission medium from a sending device to a receiving device without requiring a flow of opposing currents on an electrical return path between the sending device and the receiving device.

In a non-limiting illustration, consider electrical systems that transmit and receive electrical signals between sending and receiving devices by way of conductive media. Such systems generally rely on electrically separate forward and return paths. For instance, consider a coaxial cable having a center conductor and a ground shield that are separated by an insulator. Typically, in an electrical system a first terminal of a sending (or receiving) device can be connected to the center conductor, and a second terminal of the sending (or receiving) device can be connected to the ground shield. If the sending device injects an electrical signal in the center conductor via the first terminal, the electrical signal will propagate along the center conductor causing forward currents in the center conductor, and return currents in the ground shield. The same conditions apply for a two terminal receiving device.

In contrast, consider a guided wave communication system such as described in the subject disclosure, which can utilize different embodiments of a transmission medium (including among others a coaxial cable) for transmitting and receiving guided electromagnetic waves without an electrical return path. In one embodiment, for example, the guided wave communication system of the subject disclosure can be configured to induce guided electromagnetic waves that propagate along an outer surface of a coaxial cable. Although the guided electromagnetic waves will cause forward currents on the ground shield, the guided electromagnetic waves do not require return currents to enable the guided electromagnetic waves to propagate along the outer surface of the coaxial cable. The same can be said of other transmission media used by a guided wave communication system for the transmission and reception of guided electromagnetic waves. For example, guided electromagnetic waves induced by the guided wave communication system on an outer surface of a bare wire, or an insulated wire can propagate along the bare wire or the insulated bare wire without an electrical return path.

Consequently, electrical systems that require two or more conductors for carrying forward and reverse currents on separate conductors to enable the propagation of electrical signals injected by a sending device are distinct from guided wave systems that induce guided electromagnetic waves on an interface of a transmission medium without the need of an electrical return path to enable the propagation of the guided electromagnetic waves along the interface of the transmission medium.

It is further noted that guided electromagnetic waves as described in the subject disclosure can have an electromagnetic field structure that lies primarily or substantially outside of a transmission medium so as to be bound to or guided by the transmission medium and so as to propagate non-trivial distances on or along an outer surface of the transmission medium. In other embodiments, guided electromagnetic waves can have an electromagnetic field structure that lies primarily or substantially inside a transmission medium so as to be bound to or guided by the transmission medium and so as to propagate non-trivial distances within the transmission medium. In other embodiments, guided electromagnetic waves can have an electromagnetic field structure that lies partially inside and partially outside a transmission medium so as to be bound to or guided by the transmission medium and so as to propagate non-trivial distances along the transmission medium. The desired electronic field structure in an embodiment may vary based upon a variety of factors, including the desired transmission distance, the characteristics of the transmission medium itself, and environmental conditions/characteristics outside of the transmission medium (e.g., presence of rain, fog, atmospheric conditions, etc.).

Various embodiments described herein relate to coupling devices, that can be referred to as "waveguide coupling devices", "waveguide couplers" or more simply as "couplers", "coupling devices" or "launchers" for launching and/or extracting guided electromagnetic waves to and from a transmission medium at millimeter-wave frequencies (e.g., 30 to 300 GHz), wherein the wavelength can be small compared to one or more dimensions of the coupling device and/or the transmission medium such as the circumference of a wire or other cross sectional dimension, or lower microwave frequencies such as 300 MHz to 30 GHz. Transmissions can be generated to propagate as waves guided by a coupling device, such as: a strip, arc or other length of dielectric material; a horn, monopole, rod, slot or other antenna; an array of antennas; a magnetic resonant cavity, or other resonant coupler; a coil, a strip line, a waveguide or other coupling device. In operation, the coupling device receives an electromagnetic wave from a transmitter or transmission medium. The electromagnetic field structure of the electromagnetic wave can be carried inside the coupling device, outside the coupling device or some combination thereof. When the coupling device is in close proximity to a transmission medium, at least a portion of an electromagnetic wave couples to or is bound to the transmission medium, and continues to propagate as guided electromagnetic waves. In a reciprocal fashion, a coupling device can extract guided waves from a transmission medium and transfer these electromagnetic waves to a receiver.

According to an example embodiment, a surface wave is a type of guided wave that is guided by a surface of a transmission medium, such as an exterior or outer surface of the wire, or another surface of the wire that is adjacent to or exposed to another type of medium having different properties (e.g., dielectric properties). Indeed, in an example embodiment, a surface of the wire that guides a surface wave can represent a transitional surface between two different types of media. For example, in the case of a bare or uninsulated wire, the surface of the wire can be the outer or exterior conductive surface of the bare or uninsulated wire that is exposed to air or free space. As another example, in the case of insulated wire, the surface of the wire can be the conductive portion of the wire that meets the insulator portion of the wire, or can otherwise be the insulator surface of the wire that is exposed to air or free space, or can otherwise be any material region between the insulator surface of the wire and the conductive portion of the wire that meets the insulator portion of the wire, depending upon the relative differences in the properties (e.g., dielectric properties) of the insulator, air, and/or the conductor and further dependent on the frequency and propagation mode or modes of the guided wave.

According to an example embodiment, the term "about" a wire or other transmission medium used in conjunction with a guided wave can include fundamental guided wave propagation modes such as a guided waves having a circular or substantially circular field distribution, a symmetrical electromagnetic field distribution (e.g., electric field, magnetic field, electromagnetic field, etc.) or other fundamental mode pattern at least partially around a wire or other transmission medium. In addition, when a guided wave propagates "about" a wire or other transmission medium, it can do so according to a guided wave propagation mode that includes not only the fundamental wave propagation modes (e.g., zero order modes), but additionally or alternatively non-fundamental wave propagation modes such as higher-order guided wave modes (e.g., $1^{st}$ order modes, $2^{nd}$ order modes, etc.), asymmetrical modes and/or other guided (e.g., surface) waves that have non-circular field distributions around a wire or other transmission medium. As used herein, the term "guided wave mode" refers to a guided wave propagation mode of a transmission medium, coupling device or other system component of a guided wave communication system.

For example, such non-circular field distributions can be unilateral or multi-lateral with one or more axial lobes characterized by relatively higher field strength and/or one or more nulls or null regions characterized by relatively low-field strength, zero-field strength or substantially zero-field strength. Further, the field distribution can otherwise vary as a function of azimuthal orientation around the wire such that one or more angular regions around the wire have an electric or magnetic field strength (or combination thereof) that is higher than one or more other angular regions of azimuthal orientation, according to an example embodiment. It will be appreciated that the relative orientations or positions of the guided wave higher order modes or asymmetrical modes can vary as the guided wave travels along the wire.

As used herein, the term "millimeter-wave" can refer to electromagnetic waves/signals that fall within the "millimeter-wave frequency band" of 30 GHz to 300 GHz. The term "microwave" can refer to electromagnetic waves/signals that fall within a "microwave frequency band" of 300 MHz to 300 GHz. The term "radio frequency" or "RF" can refer to electromagnetic waves/signals that fall within the "radio frequency band" of 10 kHz to 1 THz. It is appreciated that wireless signals, electrical signals, and guided electromagnetic waves as described in the subject disclosure can be configured to operate at any desirable frequency range, such as, for example, at frequencies within, above or below millimeter-wave and/or microwave frequency bands. In particular, when a coupling device or transmission medium includes a conductive element, the frequency of the guided electromagnetic waves that are carried by the coupling device and/or propagate along the transmission medium can be below the mean collision frequency of the electrons in the conductive element. Further, the frequency of the guided electromagnetic waves that are carried by the coupling device and/or propagate along the transmission medium can be a non-optical frequency, e.g. a radio frequency below the range of optical frequencies that begins at 1 THz.

As used herein, the term "antenna" can refer to a device that is part of a transmitting or receiving system to transmit/radiate or receive wireless signals.

In accordance with one or more embodiments, a coupling device includes a receiving portion that receives a RF signal conveying data from a transmitting device. A magnetic coupler magnetically couples the RF signal to a transmission medium as a guided electromagnetic wave that is bound by an outer surface of the transmission medium.

In accordance with one or more embodiments, a coupling device includes a receiving portion that receives an RF signal conveying data. A cavity resonator magnetically couples the RF signal to a wire as a guided electromagnetic wave that is bound by the wire.

In accordance with one or more embodiments, a method includes receiving a signal conveying data. The method further includes launching, via a cavity resonator, the signal on a wire as a guided electromagnetic wave that is bound by an outer surface of the wire.

Referring now to FIG. 1, a block diagram 100 illustrating an example, non-limiting embodiment of a guided wave communications system is shown. In operation, a transmission device 101 receives one or more communication signals 110 from a communication network or other communications device that includes data and generates guided waves 120 to convey the data via the transmission medium 125 to the transmission device 102. The transmission device 102 receives the guided waves 120 and converts them to communication signals 112 that include the data for transmission to a communications network or other communications device. The guided waves 120 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing via differing wave propagation modes and via other modulation and access strategies.

The communication network or networks can include a wireless communication network such as a mobile data network, a cellular voice and data network, a wireless local area network (e.g., WiFi or an 802.xx network), a satellite communications network, a personal area network or other wireless network. The communication network or networks can also include a wired communication network such as a telephone network, an Ethernet network, a local area network, a wide area network such as the Internet, a broadband access network, a cable network, a fiber optic network, or other wired network. The communication devices can include a network edge device, bridge device or home gateway, a set-top box, broadband modem, telephone adapter, access point, base station, or other fixed communication device, a mobile communication device such as an automotive gateway or automobile, laptop computer, tablet, smartphone, cellular telephone, or other communication device.

In an example embodiment, the guided wave communication system 100 can operate in a bi-directional fashion where transmission device 102 receives one or more communication signals 112 from a communication network or device that includes other data and generates guided waves 122 to convey the other data via the transmission medium 125 to the transmission device 101. In this mode of operation, the transmission device 101 receives the guided waves 122 and converts them to communication signals 110 that include the other data for transmission to a communications network or device. The guided waves 122 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing via differing wave propagation modes and via other modulation and access strategies.

The transmission medium 125 can include a cable having at least one inner portion surrounded by a dielectric material such as an insulator or other dielectric cover, coating or other dielectric material, the dielectric material having an outer surface and a corresponding circumference. In an example embodiment, the transmission medium 125 operates as a single-wire transmission line to guide the transmission of an electromagnetic wave. When the transmission medium 125 is implemented as a single wire transmission system, it can include a wire. The wire can be insulated or uninsulated, and single-stranded or multi-stranded (e.g., braided). In other embodiments, the transmission medium 125 can contain conductors of other shapes or configurations including wire bundles, cables, rods, rails, pipes. In addition, the transmission medium 125 can include non-conductors such as dielectric pipes, rods, rails, or other dielectric members; combinations of conductors and dielectric materials, conductors without dielectric materials or other guided wave transmission media. It should be noted that the transmission medium 125 can otherwise include any of the transmission media previously discussed.

Further, as previously discussed, the guided waves 120 and 122 can be contrasted with radio transmissions over free space/air or conventional propagation of electrical power or signals through the conductor of a wire via an electrical circuit. In addition to the propagation of guided waves 120 and 122, the transmission medium 125 may optionally contain one or more wires that propagate electrical power or other communication signals in a conventional manner as a part of one or more electrical circuits.

Figure 2:
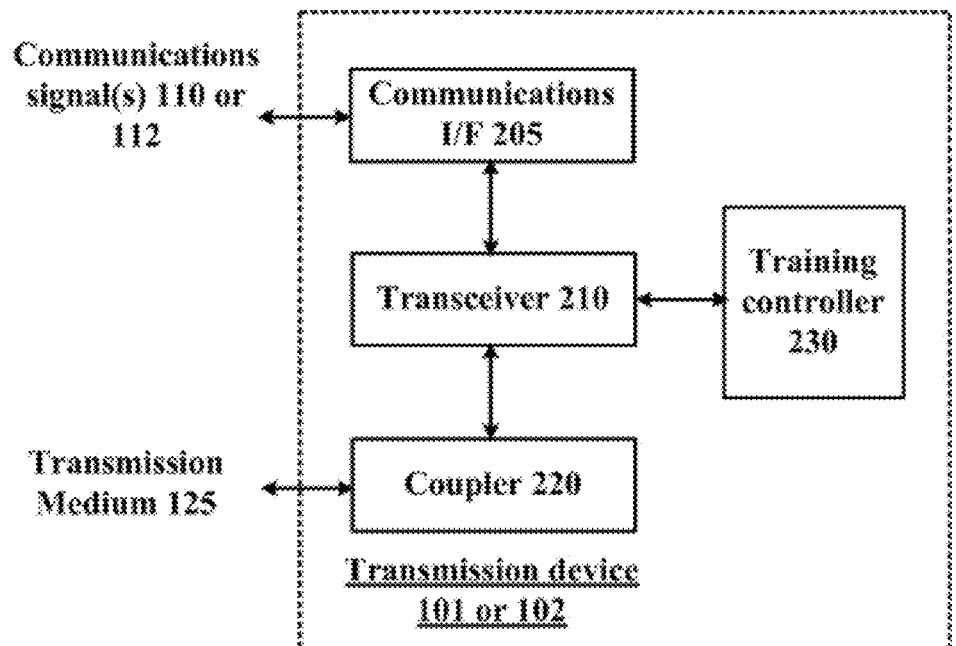
FIG. 2 is a block diagram illustrating an example, non-limiting embodiment of a transmission device in accordance with various aspects described herein.

Referring now to FIG. 2, a block diagram 200 illustrating an example, non-limiting embodiment of a transmission device is shown. The transmission device 101 or 102 includes a communications interface (I/F) 205, a transceiver 210 and a coupler 220.

In an example of operation, the communications interface 205 receives a communication signal 110 or 112 that includes data. In various embodiments, the communications interface 205 can include a wireless interface for receiving a wireless communication signal in accordance with a wireless standard protocol such as LTE or other cellular voice and data protocol, WiFi or an 802.11 protocol, WIMAX protocol, Ultra Wideband protocol, BLUETOOTH® protocol, ZIGBEE® protocol, a direct broadcast satellite (DBS) or other satellite communication protocol or other wireless protocol. In addition or in the alternative, the communications interface 205 includes a wired interface that operates in accordance with an Ethernet protocol, universal serial bus (USB) protocol, a data over cable service interface specification (DOCSIS) protocol, a digital subscriber line (DSL) protocol, a Firewire (IEEE 1394) protocol, or other wired protocol. In additional to standards-based protocols, the communications interface 205 can operate in conjunction with other wired or wireless protocol. In addition, the communications interface 205 can optionally operate in conjunction with a protocol stack that includes multiple protocol layers including a MAC protocol, transport protocol, application protocol, etc.

In an example of operation, the transceiver 210 generates an electromagnetic wave based on the communication signal 110 or 112 to convey the data. The electromagnetic wave has at least one carrier frequency and at least one corresponding wavelength. The carrier frequency can be within a millimeter-wave frequency band of 30 GHz-300 GHz, such as 60 GHz or a carrier frequency in the range of 30-40 GHz or a lower frequency band of 300 MHz-30 GHz in the microwave frequency range such as 26-30 GHz, 11 GHz, 6 GHz or 3 GHz, but it will be appreciated that other carrier frequencies are possible in other embodiments. In one mode of operation, the transceiver 210 merely upconverts the communications signal or signals 110 or 112 for transmission of the electromagnetic signal in the microwave or millimeter-wave band as a guided electromagnetic wave that is guided by or bound to the transmission medium 125. In another mode of operation, the communications interface 205 either converts the communication signal 110 or 112 to a baseband or near baseband signal or extracts the data from the communication signal 110 or 112 and the transceiver 210 modulates a high-frequency carrier with the data, the baseband or near baseband signal for transmission. It should be appreciated that the transceiver 210 can modulate the data received via the communication signal 110 or 112 to preserve one or more data communication protocols of the communication signal 110 or 112 either by encapsulation in the payload of a different protocol or by simple frequency shifting. In the alternative, the transceiver 210 can otherwise translate the data received via the communication signal 110 or 112 to a protocol that is different from the data communication protocol or protocols of the communication signal 110 or 112.

In an example of operation, the coupler 220 couples the electromagnetic wave to the transmission medium 125 as a guided electromagnetic wave to convey the communications signal or signals 110 or 112. While the prior description has focused on the operation of the transceiver 210 as a transmitter, the transceiver 210 can also operate to receive electromagnetic waves that convey other data from the single wire transmission medium via the coupler 220 and to generate communications signals 110 or 112, via communications interface 205 that includes the other data. Consider embodiments where an additional guided electromagnetic wave conveys other data that also propagates along the transmission medium 125. The coupler 220 can also couple this additional electromagnetic wave from the transmission medium 125 to the transceiver 210 for reception.

The transmission device 101 or 102 includes an optional training controller 230. In an example embodiment, the training controller 230 is implemented by a standalone processor or a processor that is shared with one or more other components of the transmission device 101 or 102. The training controller 230 selects the carrier frequencies, modulation schemes and/or guided wave modes for the guided electromagnetic waves based on feedback data received by the transceiver 210 from at least one remote transmission device coupled to receive the guided electromagnetic wave.

In an example embodiment, a guided electromagnetic wave transmitted by a remote transmission device 101 or 102 conveys data that also propagates along the transmission medium 125. The data from the remote transmission device 101 or 102 can be generated to include the feedback data. In operation, the coupler 220 also couples the guided electromagnetic wave from the transmission medium 125 and the transceiver receives the electromagnetic wave and processes the electromagnetic wave to extract the feedback data.

In an example embodiment, the training controller 230 operates based on the feedback data to evaluate a plurality of candidate frequencies, modulation schemes and/or transmission modes to select a carrier frequency, modulation scheme and/or transmission mode to enhance performance, such as throughput, signal strength, reduce propagation loss, etc.

Consider the following example: a transmission device 101 begins operation under control of the training controller 230 by sending a plurality of guided waves as test signals such as pilot waves or other test signals at a corresponding plurality of candidate frequencies and/or candidate modes directed to a remote transmission device 102 coupled to the transmission medium 125. The guided waves can include, in addition or in the alternative, test data. The test data can indicate the particular candidate frequency and/or guide-wave mode of the signal. In an embodiment, the training controller 230 at the remote transmission device 102 receives the test signals and/or test data from any of the guided waves that were properly received and determines the best candidate frequency and/or guided wave mode, a set of acceptable candidate frequencies and/or guided wave modes, or a rank ordering of candidate frequencies and/or guided wave modes. This selection of candidate frequenc(ies) or/and guided-mode(s) are generated by the training controller 230 based on one or more optimizing criteria such as received signal strength, bit error rate, packet error rate, signal to noise ratio, propagation loss, etc. The training controller 230 generates feedback data that indicates the selection of candidate frequenc(ies) or/and guided wave mode(s) and sends the feedback data to the transceiver 210 for transmission to the transmission device 101. The transmission device 101 and 102 can then communicate data with one another based on the selection of candidate frequenc(ies) or/and guided wave mode(s).

In other embodiments, the guided electromagnetic waves that contain the test signals and/or test data are reflected back, repeated back or otherwise looped back by the remote transmission device 102 to the transmission device 101 for reception and analysis by the training controller 230 of the transmission device 101 that initiated these waves. For example, the transmission device 101 can send a signal to the remote transmission device 102 to initiate a test mode where a physical reflector is switched on the line, a termination impedance is changed to cause reflections, a loop back mode is switched on to couple electromagnetic waves back to the source transmission device 102, and/or a repeater mode is enabled to amplify and retransmit the electromagnetic waves back to the source transmission device 102. The training controller 230 at the source transmission device 102 receives the test signals and/or test data from any of the guided waves that were properly received and determines selection of candidate frequenc(ies) or/and guided wave mode(s).

While the procedure above has been described in a start-up or initialization mode of operation, each transmission device 101 or 102 can send test signals, evaluate candidate frequencies or guided wave modes via non-test such as normal transmissions or otherwise evaluate candidate frequencies or guided wave modes at other times or continuously as well. In an example embodiment, the communication protocol between the transmission devices 101 and 102 can include an on-request or periodic test mode where either full testing or more limited testing of a subset of candidate frequencies and guided wave modes are tested and evaluated. In other modes of operation, the re-entry into such a test mode can be triggered by a degradation of performance due to a disturbance, weather conditions, etc. In an example embodiment, the receiver bandwidth of the transceiver 210 is either sufficiently wide or swept to receive all candidate frequencies or can be selectively adjusted by the training controller 230 to a training mode where the receiver bandwidth of the transceiver 210 is sufficiently wide or swept to receive all candidate frequencies.

Referring now to FIG. 3, a graphical diagram 300 illustrating an example, non-limiting embodiment of an electromagnetic field distribution is shown. In this embodiment, a transmission medium 125 in air includes an inner conductor 301 and an insulating jacket 302 of dielectric material, as shown in cross section. The diagram 300 includes different gray-scales that represent differing electromagnetic field strengths generated by the propagation of the guided wave having an asymmetrical and non-fundamental guided wave mode.

In particular, the electromagnetic field distribution corresponds to a modal "sweet spot" that enhances guided electromagnetic wave propagation along an insulated transmission medium and reduces end-to-end transmission loss. In this particular mode, electromagnetic waves are guided by the transmission medium 125 to propagate along an outer surface of the transmission medium—in this case, the outer surface of the insulating jacket 302. Electromagnetic waves are partially embedded in the insulator and partially radiating on the outer surface of the insulator. In this fashion, electromagnetic waves are "lightly" coupled to the insulator so as to enable electromagnetic wave propagation at long distances with low propagation loss.

As shown, the guided wave has a field structure that lies primarily or substantially outside of the transmission medium 125 that serves to guide the electromagnetic waves. The regions inside the conductor 301 have little or no field. Likewise regions inside the insulating jacket 302 have low field strength. The majority of the electromagnetic field strength is distributed in the lobes 304 at the outer surface of the insulating jacket 302 and in close proximity thereof. The presence of an asymmetric guided wave mode is shown by the high electromagnetic field strengths at the top and bottom of the outer surface of the insulating jacket 302 (in the orientation of the diagram)—as opposed to very small field strengths on the other sides of the insulating jacket 302.

The example shown corresponds to a 38 GHz electromagnetic wave guided by a wire with a diameter of 1.1 cm and a dielectric insulation of thickness of 0.36 cm. Because the electromagnetic wave is guided by the transmission medium 125 and the majority of the field strength is concentrated in the air outside of the insulating jacket 302 within a limited distance of the outer surface, the guided wave can propagate longitudinally down the transmission medium 125 with very low loss. In the example shown, this "limited distance" corresponds to a distance from the outer surface that is less than half the largest cross sectional dimension of the transmission medium 125. In this case, the largest cross sectional dimension of the wire corresponds to the overall diameter of 1.82 cm, however, this value can vary with the size and shape of the transmission medium 125. For example, should the transmission medium 125 be of a rectangular shape with a height of 0.3 cm and a width of 0.4 cm, the largest cross sectional dimension would be the diagonal of 0.5 cm and the corresponding limited distance would be 0.25 cm. The dimensions of the area containing the majority of the field strength also vary with the frequency, and in general, increase as carrier frequencies decrease.

It should also be noted that the components of a guided wave communication system, such as couplers and transmission media can have their own cut-off frequencies for each guided wave mode. The cut-off frequency generally sets forth the lowest frequency that a particular guided wave mode is designed to be supported by that particular component. In an example embodiment, the particular asymmetric mode of propagation shown is induced on the transmission medium 125 by an electromagnetic wave having a frequency that falls within a limited range (such as Fc to 2Fc) of the lower cut-off frequency Fc for this particular asymmetric mode. The lower cut-off frequency Fc is particular to the characteristics of transmission medium 125. For embodiments as shown that include an inner conductor 301 surrounded by an insulating jacket 302, this cutoff frequency can vary based on the dimensions and properties of the insulating jacket 302 and potentially the dimensions and properties of the inner conductor 301 and can be determined experimentally to have a desired mode pattern. It should be noted however, that similar effects can be found for a hollow dielectric or insulator without an inner conductor. In this case, the cutoff frequency can vary based on the dimensions and properties of the hollow dielectric or insulator.

At frequencies lower than the lower cut-off frequency, the asymmetric mode is difficult to induce in the transmission medium 125 and fails to propagate for all but trivial distances. As the frequency increases above the limited range of frequencies about the cut-off frequency, the asymmetric mode shifts more and more inward of the insulating jacket 302. At frequencies much larger than the cut-off frequency, the field strength is no longer concentrated outside of the insulating jacket, but primarily inside of the insulating jacket 302. While the transmission medium 125 provides strong guidance to the electromagnetic wave and propagation is still possible, ranges are more limited by increased losses due to propagation within the insulating jacket 302—as opposed to the surrounding air.

Referring now to FIG. 4, a graphical diagram 400 illustrating an example, non-limiting embodiment of an electromagnetic field distribution is shown. In particular, a cross section diagram 400, similar to FIG. 3 is shown with common reference numerals used to refer to similar elements. The example shown corresponds to a 60 GHz wave guided by a wire with a diameter of 1.1 cm and a dielectric insulation of thickness of 0.36 cm. Because the frequency of the guided wave is above the limited range of the cut-off frequency of this particular asymmetric mode, much of the field strength has shifted inward of the insulating jacket 302. In particular, the field strength is concentrated primarily inside of the insulating jacket 302. While the transmission medium 125 provides strong guidance to the electromagnetic wave and propagation is still possible, ranges are more limited when compared with the embodiment of FIG. 3, by increased losses due to propagation within the insulating jacket 302.

Figure 5A:
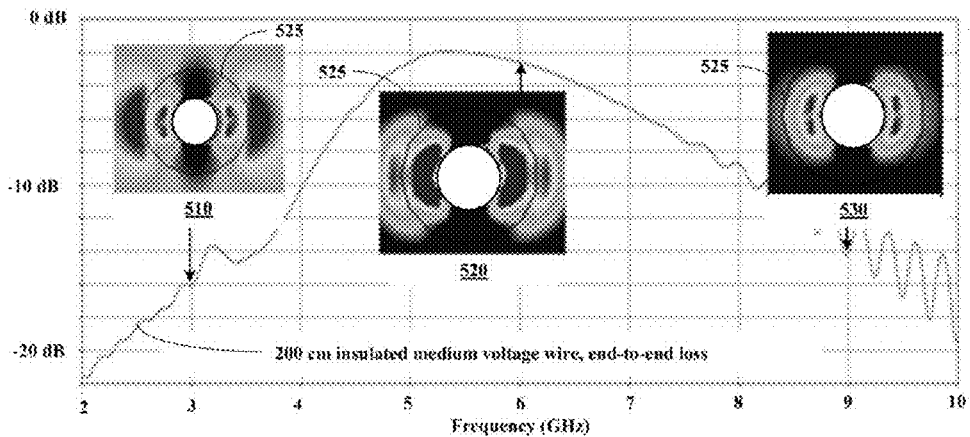
FIG. 5A is a graphical diagram illustrating an example, non-limiting embodiment of a frequency response in accordance with various aspects described herein.

Referring now to FIG. 5A, a graphical diagram illustrating an example, non-limiting embodiment of a frequency response is shown. In particular, diagram 500 presents a graph of end-to-end loss (in dB) as a function of frequency, overlaid with electromagnetic field distributions 510, 520 and 530 at three points for a 200 cm insulated medium voltage wire. The boundary between the insulator and the surrounding air is represented by reference numeral 525 in each electromagnetic field distribution.

As discussed in conjunction with FIG. 3, an example of a desired asymmetric mode of propagation shown is induced on the transmission medium 125 by an electromagnetic wave having a frequency that falls within a limited range (such as Fc to 2Fc) of the lower cut-off frequency Fc of the transmission medium for this particular asymmetric mode. In particular, the electromagnetic field distribution 520 at 6 GHz falls within this modal "sweet spot" that enhances electromagnetic wave propagation along an insulated transmission medium and reduces end-to-end transmission loss. In this particular mode, guided waves are partially embedded in the insulator and partially radiating on the outer surface of the insulator. In this fashion, the electromagnetic waves are "lightly" coupled to the insulator so as to enable guided electromagnetic wave propagation at long distances with low propagation loss.

At lower frequencies represented by the electromagnetic field distribution 510 at 3 GHz, the asymmetric mode radiates more heavily generating higher propagation losses. At higher frequencies represented by the electromagnetic field distribution 530 at 9 GHz, the asymmetric mode shifts more and more inward of the insulating jacket providing too much absorption, again generating higher propagation losses.

Figure 5B:
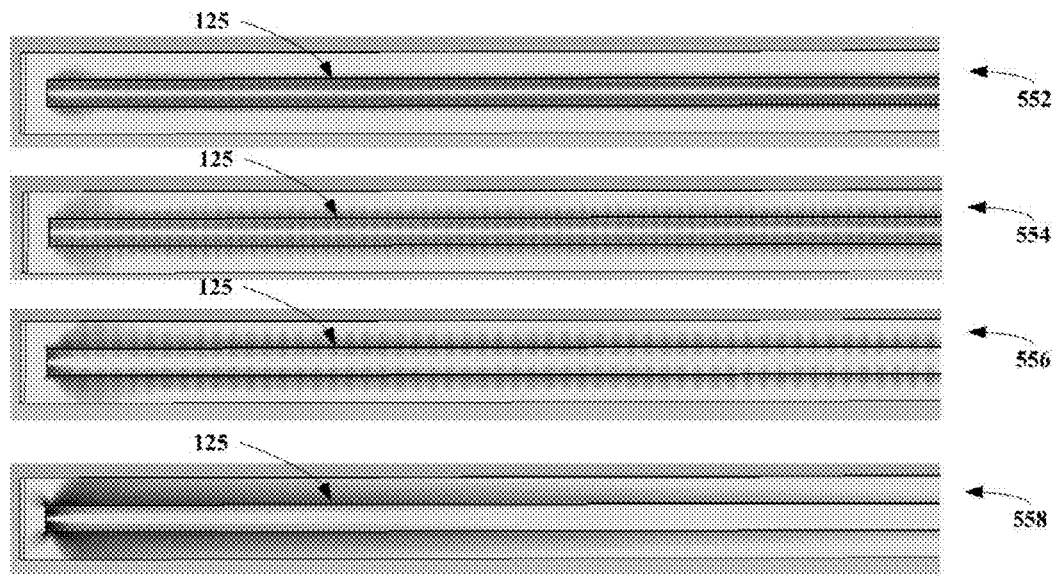
FIG. 5B is a graphical diagram illustrating example, non-limiting embodiments of a longitudinal cross-section of an insulated wire depicting fields of guided electromagnetic waves at various operating frequencies in accordance with various aspects described herein.

Referring now to FIG. 5B, a graphical diagram 550 illustrating example, non-limiting embodiments of a longitudinal cross-section of a transmission medium 125, such as an insulated wire, depicting fields of guided electromagnetic waves at various operating frequencies is shown. As shown in diagram 556, when the guided electromagnetic waves are at approximately the cutoff frequency ($f_c$) corresponding to the modal "sweet spot", the guided electromagnetic waves are loosely coupled to the insulated wire so that absorption is reduced, and the fields of the guided electromagnetic waves are bound sufficiently to reduce the amount radiated into the environment (e.g., air). Because absorption and radiation of the fields of the guided electromagnetic waves is low, propagation losses are consequently low, enabling the guided electromagnetic waves to propagate for longer distances.

As shown in diagram 554, propagation losses increase when an operating frequency of the guide electromagnetic waves increases above about two-times the cutoff frequency ($f_c$)—or as referred to, above the range of the "sweet spot". More of the field strength of the electromagnetic wave is driven inside the insulating layer, increasing propagation losses. At frequencies much higher than the cutoff frequency ($f_c$) the guided electromagnetic waves are strongly bound to the insulated wire as a result of the fields emitted by the guided electromagnetic waves being concentrated in the insulation layer of the wire, as shown in diagram 552. This in turn raises propagation losses further due to absorption of the guided electromagnetic waves by the insulation layer. Similarly, propagation losses increase when the operating frequency of the guided electromagnetic waves is substantially below the cutoff frequency ($f_c$), as shown in diagram 558. At frequencies much lower than the cutoff frequency ($f_c$) the guided electromagnetic waves are weakly (or nominally) bound to the insulated wire and thereby tend to radiate into the environment (e.g., air), which in turn, raises propagation losses due to radiation of the guided electromagnetic waves.

Referring now to FIG. 6, a graphical diagram 600 illustrating an example, non-limiting embodiment of an electromagnetic field distribution is shown. In this embodiment, a transmission medium 602 is a bare wire, as shown in cross section. The diagram 300 includes different gray-scales that represent differing electromagnetic field strengths generated by the propagation of a guided wave having a symmetrical and fundamental guided wave mode at a single carrier frequency.

In this particular mode, electromagnetic waves are guided by the transmission medium 602 to propagate along an outer surface of the transmission medium—in this case, the outer surface of the bare wire. Electromagnetic waves are "lightly" coupled to the wire so as to enable electromagnetic wave propagation at long distances with low propagation loss. As shown, the guided wave has a field structure that lies substantially outside of the transmission medium 602 that serves to guide the electromagnetic waves. The regions inside the conductor 625 have little or no field.

Figure 7:
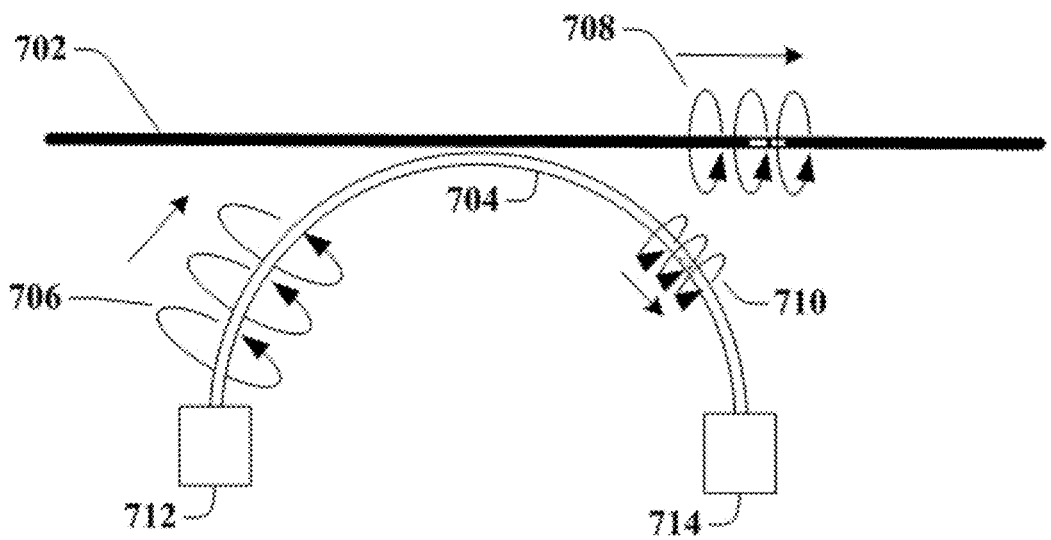
FIG. 7 is a block diagram illustrating an example, non-limiting embodiment of an arc coupler in accordance with various aspects described herein.

Referring now to FIG. 7, a block diagram 700 illustrating an example, non-limiting embodiment of an arc coupler is shown. In particular a coupling device is presented for use in a transmission device, such as transmission device 101 or 102 presented in conjunction with FIG. 1. The coupling device includes an arc coupler 704 coupled to a transmitter circuit 712 and termination or damper 714. The arc coupler 704 can be made of a dielectric material, or other low-loss insulator (e.g., TEFLON® {Polytetrafluoroethylene}, polyethylene, etc.), or made of a conducting (e.g., metallic, non-metallic, etc.) material, or any combination of the foregoing materials. As shown, the arc coupler 704 operates as a waveguide and has a wave 706 propagating as a guided wave about a waveguide surface of the arc coupler 704. In the embodiment shown, at least a portion of the arc coupler 704 can be placed near a wire 702 or other transmission medium, (such as transmission medium 125), in order to facilitate coupling between the arc coupler 704 and the wire 702 or other transmission medium, as described herein to launch the guided wave 708 on the wire. The arc coupler 704 can be placed such that a portion of the curved arc coupler 704 is tangential to, and parallel or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 706 travelling along the arc coupler 704 couples, at least in part, to the wire 702, and propagates as guided wave 708 around or about the wire surface of the wire 702 and longitudinally along the wire 702. The guided wave 708 can be characterized as a surface wave or other electromagnetic wave that is guided by or bound to the wire 702 or other transmission medium.

A portion of the wave 706 that does not couple to the wire 702 propagates as a wave 710 along the arc coupler 704. It will be appreciated that the arc coupler 704 can be configured and arranged in a variety of positions in relation to the wire 702 to achieve a desired level of coupling or non-coupling of the wave 706 to the wire 702. For example, the curvature and/or length of the arc coupler 704 that is parallel or substantially parallel, as well as its separation distance (which can include zero separation distance in an embodiment), to the wire 702 can be varied without departing from example embodiments. Likewise, the arrangement of arc coupler 704 in relation to the wire 702 may be varied based upon considerations of the respective intrinsic characteristics (e.g., thickness, composition, electromagnetic properties, etc.) of the wire 702 and the arc coupler 704, as well as the characteristics (e.g., frequency, energy level, etc.) of the waves 706 and 708.

The guided wave 708 stays parallel or substantially parallel to the wire 702, even as the wire 702 bends and flexes. Bends in the wire 702 can increase transmission losses, which are also dependent on wire diameters, frequency, and materials. If the dimensions of the arc coupler 704 are chosen for efficient power transfer, most of the power in the wave 706 is transferred to the wire 702, with little power remaining in wave 710. It will be appreciated that the guided wave 708 can still be multi-modal in nature (discussed herein), including having modes that are non-fundamental or asymmetric, while traveling along a path that is parallel or substantially parallel to the wire 702, with or without a fundamental transmission mode. In an embodiment, non-fundamental or asymmetric modes can be utilized to minimize transmission losses and/or obtain increased propagation distances.

It is noted that the term parallel is generally a geometric construct which often is not exactly achievable in real systems. Accordingly, the term parallel as utilized in the subject disclosure represents an approximation rather than an exact configuration when used to describe embodiments disclosed in the subject disclosure. In an embodiment, substantially parallel can include approximations that are within 30 degrees of true parallel in all dimensions.

In an embodiment, the wave 706 can exhibit one or more wave propagation modes. The arc coupler modes can be dependent on the shape and/or design of the coupler 704. The one or more arc coupler modes of wave 706 can generate, influence, or impact one or more wave propagation modes of the guided wave 708 propagating along wire 702. It should be particularly noted however that the guided wave modes present in the guided wave 706 may be the same or different from the guided wave modes of the guided wave 708. In this fashion, one or more guided wave modes of the guided wave 706 may not be transferred to the guided wave 708, and further one or more guided wave modes of guided wave 708 may not have been present in guided wave 706. It should also be noted that the cut-off frequency of the arc coupler 704 for a particular guided wave mode may be different than the cutoff frequency of the wire 702 or other transmission medium for that same mode. For example, while the wire 702 or other transmission medium may be operated slightly above its cutoff frequency for a particular guided wave mode, the arc coupler 704 may be operated well above its cut-off frequency for that same mode for low loss, slightly below its cut-off frequency for that same mode to, for example, induce greater coupling and power transfer, or some other point in relation to the arc coupler's cutoff frequency for that mode.

In an embodiment, the wave propagation modes on the wire 702 can be similar to the arc coupler modes since both waves 706 and 708 propagate about the outside of the arc coupler 704 and wire 702 respectively. In some embodiments, as the wave 706 couples to the wire 702, the modes can change form, or new modes can be created or generated, due to the coupling between the arc coupler 704 and the wire 702. For example, differences in size, material, and/or impedances of the arc coupler 704 and wire 702 may create additional modes not present in the arc coupler modes and/or suppress some of the arc coupler modes. The wave propagation modes can comprise the fundamental transverse electromagnetic mode (Quasi-TEM$_{00}$), where only small electric and/or magnetic fields extend in the direction of propagation, and the electric and magnetic fields extend radially outwards while the guided wave propagates along the wire. This guided wave mode can be donut shaped, where few of the electromagnetic fields exist within the arc coupler 704 or wire 702.

Waves 706 and 708 can comprise a fundamental TEM mode where the fields extend radially outwards, and also comprise other, non-fundamental (e.g., asymmetric, higher-level, etc.) modes. While particular wave propagation modes are discussed above, other wave propagation modes are likewise possible such as transverse electric (TE) and transverse magnetic (TM) modes, based on the frequencies employed, the design of the arc coupler 704, the dimensions and composition of the wire 702, as well as its surface characteristics, its insulation if present, the electromagnetic properties of the surrounding environment, etc. It should be noted that, depending on the frequency, the electrical and physical characteristics of the wire 702 and the particular wave propagation modes that are generated, guided wave 708 can travel along the conductive surface of an oxidized uninsulated wire, an unoxidized uninsulated wire, an insulated wire and/or along the insulating surface of an insulated wire.

In an embodiment, a diameter of the arc coupler 704 is smaller than the diameter of the wire 702. For the millimeter-band wavelength being used, the arc coupler 704 supports a single waveguide mode that makes up wave 706. This single waveguide mode can change as it couples to the wire 702 as guided wave 708. If the arc coupler 704 were larger, more than one waveguide mode can be supported, but these additional waveguide modes may not couple to the wire 702 as efficiently, and higher coupling losses can result. However, in some alternative embodiments, the diameter of the arc coupler 704 can be equal to or larger than the diameter of the wire 702, for example, where higher coupling losses are desirable or when used in conjunction with other techniques to otherwise reduce coupling losses (e.g., impedance matching with tapering, etc.).

In an embodiment, the wavelength of the waves 706 and 708 are comparable in size, or smaller than a circumference of the arc coupler 704 and the wire 702. In an example, if the wire 702 has a diameter of 0.5 cm, and a corresponding circumference of around 1.5 cm, the wavelength of the transmission is around 1.5 cm or less, corresponding to a frequency of 70 GHz or greater. In another embodiment, a suitable frequency of the transmission and the carrier-wave signal is in the range of 30-100 GHz, perhaps around 30-60 GHz, and around 38 GHz in one example. In an embodiment, when the circumference of the arc coupler 704 and wire 702 is comparable in size to, or greater, than a wavelength of the transmission, the waves 706 and 708 can exhibit multiple wave propagation modes including fundamental and/or non-fundamental (symmetric and/or asymmetric) modes that propagate over sufficient distances to support various communication systems described herein. The waves 706 and 708 can therefore comprise more than one type of electric and magnetic field configuration. In an embodiment, as the guided wave 708 propagates down the wire 702, the electrical and magnetic field configurations will remain the same from end to end of the wire 702. In other embodiments, as the guided wave 708 encounters interference (distortion or obstructions) or loses energy due to transmission losses or scattering, the electric and magnetic field configurations can change as the guided wave 708 propagates down wire 702.

In an embodiment, the arc coupler 704 can be composed of nylon, TEFLON® {Polytetrafluoroethylene}, polyethylene, a polyamide, or other plastics. In other embodiments, other dielectric materials are possible. The wire surface of wire 702 can be metallic with either a bare metallic surface, or can be insulated using plastic, dielectric, insulator or other coating, jacket or sheathing. In an embodiment, a dielectric or otherwise non-conducting/insulated waveguide can be paired with either a bare/metallic wire or insulated wire. In other embodiments, a metallic and/or conductive waveguide can be paired with a bare/metallic wire or insulated wire. In an embodiment, an oxidation layer on the bare metallic surface of the wire 702 (e.g., resulting from exposure of the bare metallic surface to oxygen/air) can also provide insulating or dielectric properties similar to those provided by some insulators or sheathings.

It is noted that the graphical representations of waves 706, 708 and 710 are presented merely to illustrate the principles that wave 706 induces or otherwise launches a guided wave 708 on a wire 702 that operates, for example, as a single wire transmission line. Wave 710 represents the portion of wave 706 that remains on the arc coupler 704 after the generation of guided wave 708. The actual electric and magnetic fields generated as a result of such wave propagation may vary depending on the frequencies employed, the particular wave propagation mode or modes, the design of the arc coupler 704, the dimensions and composition of the wire 702, as well as its surface characteristics, its optional insulation, the electromagnetic properties of the surrounding environment, etc.

It is noted that arc coupler 704 can include a termination circuit or damper 714 at the end of the arc coupler 704 that can absorb leftover radiation or energy from wave 710. The termination circuit or damper 714 can prevent and/or minimize the leftover radiation or energy from wave 710 reflecting back toward transmitter circuit 712. In an embodiment, the termination circuit or damper 714 can include termination resistors, and/or other components that perform impedance matching to attenuate reflection. In some embodiments, if the coupling efficiencies are high enough, and/or wave 710 is sufficiently small, it may not be necessary to use a termination circuit or damper 714. For the sake of simplicity, these transmitter 712 and termination circuits or dampers 714 may not be depicted in the other figures, but in those embodiments, transmitter and termination circuits or dampers may possibly be used.

Further, while a single arc coupler 704 is presented that generates a single guided wave 708, multiple arc couplers 704 placed at different points along the wire 702 and/or at different azimuthal orientations about the wire can be employed to generate and receive multiple guided waves 708 at the same or different frequencies, at the same or different phases, at the same or different wave propagation modes.

Figure 8:
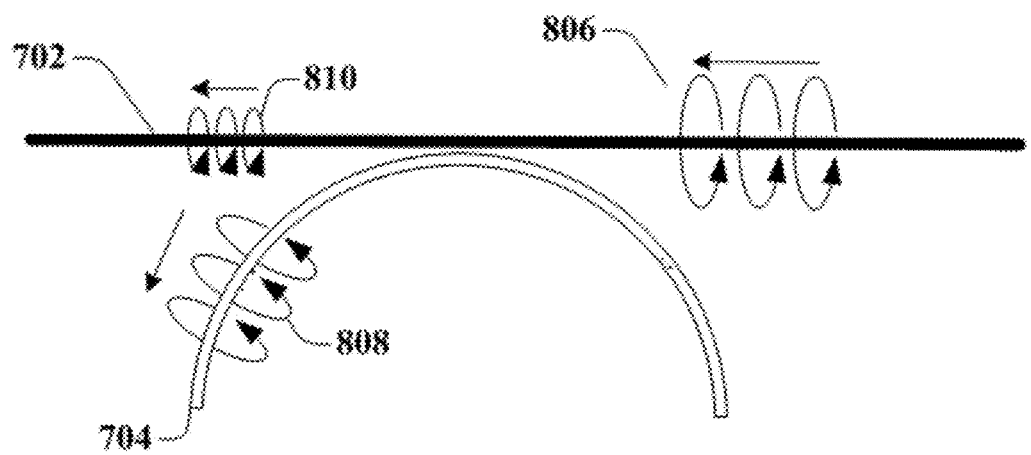
FIG. 8 is a block diagram illustrating an example, non-limiting embodiment of an arc coupler in accordance with various aspects described herein.

FIG. 8, a block diagram 800 illustrating an example, non-limiting embodiment of an arc coupler is shown. In the embodiment shown, at least a portion of the coupler 704 can be placed near a wire 702 or other transmission medium, (such as transmission medium 125), in order to facilitate coupling between the arc coupler 704 and the wire 702 or other transmission medium, to extract a portion of the guided wave 806 as a guided wave 808 as described herein. The arc coupler 704 can be placed such that a portion of the curved arc coupler 704 is tangential to, and parallel or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 806 travelling along the wire 702 couples, at least in part, to the arc coupler 704, and propagates as guided wave 808 along the arc coupler 704 to a receiving device (not expressly shown). A portion of the wave 806 that does not couple to the arc coupler propagates as wave 810 along the wire 702 or other transmission medium.

In an embodiment, the wave 806 can exhibit one or more wave propagation modes. The arc coupler modes can be dependent on the shape and/or design of the coupler 704. The one or more modes of guided wave 806 can generate, influence, or impact one or more guide-wave modes of the guided wave 808 propagating along the arc coupler 704. It should be particularly noted however that the guided wave modes present in the guided wave 806 may be the same or different from the guided wave modes of the guided wave 808. In this fashion, one or more guided wave modes of the guided wave 806 may not be transferred to the guided wave 808, and further one or more guided wave modes of guided wave 808 may not have been present in guided wave 806.

Figure 9A:
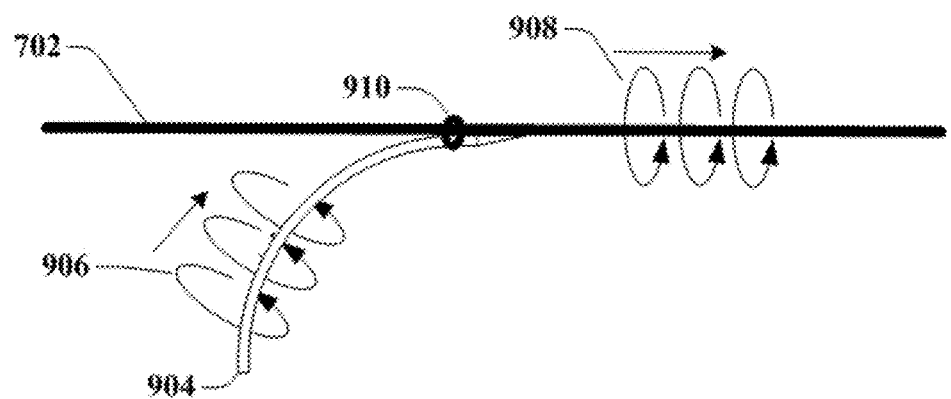
FIG. 9A is a block diagram illustrating an example, non-limiting embodiment of a stub coupler in accordance with various aspects described herein.

Referring now to FIG. 9A, a block diagram 900 illustrating an example, non-limiting embodiment of a stub coupler is shown. In particular a coupling device that includes stub coupler 904 is presented for use in a transmission device, such as transmission device 101 or 102 presented in conjunction with FIG. 1. The stub coupler 904 can be made of a dielectric material, or other low-loss insulator (e.g., TEFLON® {Polytetrafluoroethylene}, polyethylene and etc.), or made of a conducting (e.g., metallic, non-metallic, etc.) material, or any combination of the foregoing materials. As shown, the stub coupler 904 operates as a waveguide and has a wave 906 propagating as a guided wave about a waveguide surface of the stub coupler 904. In the embodiment shown, at least a portion of the stub coupler 904 can be placed near a wire 702 or other transmission medium, (such as transmission medium 125), in order to facilitate coupling between the stub coupler 904 and the wire 702 or other transmission medium, as described herein to launch the guided wave 908 on the wire.

In an embodiment, the stub coupler 904 is curved, and an end of the stub coupler 904 can be tied, fastened, or otherwise mechanically coupled to a wire 702. When the end of the stub coupler 904 is fastened to the wire 702, the end of the stub coupler 904 is parallel or substantially parallel to the wire 702. Alternatively, another portion of the dielectric waveguide beyond an end can be fastened or coupled to wire 702 such that the fastened or coupled portion is parallel or substantially parallel to the wire 702. The fastener 910 can be a nylon cable tie or other type of non-conducting/dielectric material that is either separate from the stub coupler 904 or constructed as an integrated component of the stub coupler 904. The stub coupler 904 can be adjacent to the wire 702 without surrounding the wire 702.

Like the arc coupler 704 described in conjunction with FIG. 7, when the stub coupler 904 is placed with the end parallel to the wire 702, the guided wave 906 travelling along the stub coupler 904 couples to the wire 702, and propagates as guided wave 908 about the wire surface of the wire 702. In an example embodiment, the guided wave 908 can be characterized as a surface wave or other electromagnetic wave.

It is noted that the graphical representations of waves 906 and 908 are presented merely to illustrate the principles that wave 906 induces or otherwise launches a guided wave 908 on a wire 702 that operates, for example, as a single wire transmission line. The actual electric and magnetic fields generated as a result of such wave propagation may vary depending on one or more of the shape and/or design of the coupler, the relative position of the dielectric waveguide to the wire, the frequencies employed, the design of the stub coupler 904, the dimensions and composition of the wire 702, as well as its surface characteristics, its optional insulation, the electromagnetic properties of the surrounding environment, etc.

In an embodiment, an end of stub coupler 904 can taper towards the wire 702 in order to increase coupling efficiencies. Indeed, the tapering of the end of the stub coupler 904 can provide impedance matching to the wire 702 and reduce reflections, according to an example embodiment of the subject disclosure. For example, an end of the stub coupler 904 can be gradually tapered in order to obtain a desired level of coupling between waves 906 and 908 as illustrated in FIG. 9A.

In an embodiment, the fastener 910 can be placed such that there is a short length of the stub coupler 904 between the fastener 910 and an end of the stub coupler 904. Maximum coupling efficiencies are realized in this embodiment when the length of the end of the stub coupler 904 that is beyond the fastener 910 is at least several wavelengths long for whatever frequency is being transmitted.

Figure 9B:
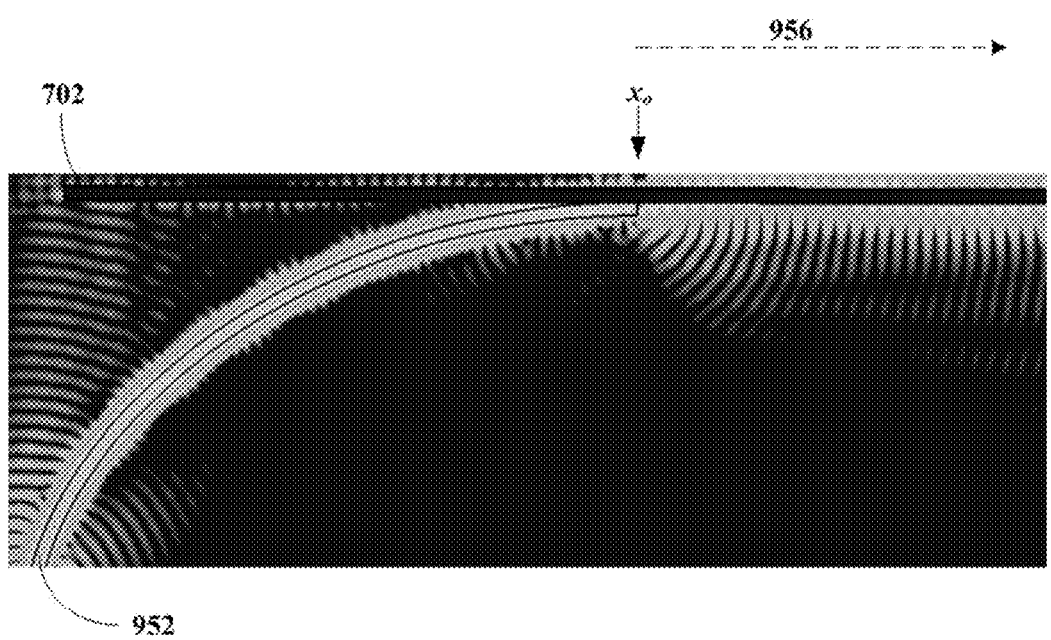
FIG. 9B is a diagram illustrating an example, non-limiting embodiment of an electromagnetic distribution in accordance with various aspects described herein.

Turning now to FIG. 9B, a diagram 950 illustrating an example, non-limiting embodiment of an electromagnetic distribution in accordance with various aspects described herein is shown. In particular, an electromagnetic distribution is presented in two dimensions for a transmission device that includes coupler 952, shown in an example stub coupler constructed of a dielectric material. The coupler 952 couples an electromagnetic wave for propagation as a guided wave along an outer surface of a wire 702 or other transmission medium.

The coupler 952 guides the electromagnetic wave to a junction at $x_0$ via a symmetrical guided wave mode. While some of the energy of the electromagnetic wave that propagates along the coupler 952 is outside of the coupler 952, the majority of the energy of this electromagnetic wave is contained within the coupler 952. The junction at $x_0$ couples the electromagnetic wave to the wire 702 or other transmission medium at an azimuthal angle corresponding to the bottom of the transmission medium. This coupling induces an electromagnetic wave that is guided to propagate along the outer surface of the wire 702 or other transmission medium via at least one guided wave mode in direction 956. The majority of the energy of the guided electromagnetic wave is outside or, but in close proximity to the outer surface of the wire 702 or other transmission medium. In the example shown, the junction at $x_0$ forms an electromagnetic wave that propagates via both a symmetrical mode and at least one asymmetrical surface mode, such as the first order mode presented in conjunction with FIG. 3, that skims the surface of the wire 702 or other transmission medium.

It is noted that the graphical representations of guided waves are presented merely to illustrate an example of guided wave coupling and propagation. The actual electric and magnetic fields generated as a result of such wave propagation may vary depending on the frequencies employed, the design and/or configuration of the coupler 952, the dimensions and composition of the wire 702 or other transmission medium, as well as its surface characteristics, its insulation if present, the electromagnetic properties of the surrounding environment, etc.

Figure 10A:
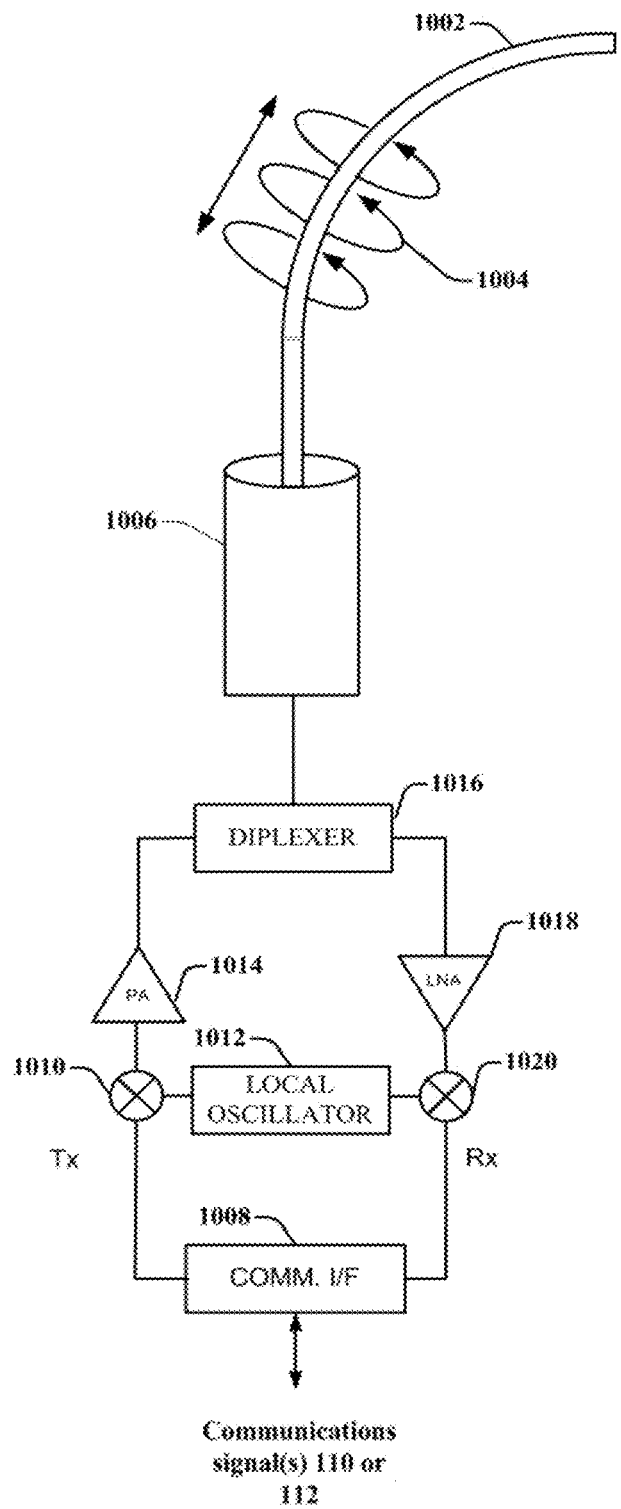
FIGS. 10A and 10B are block diagrams illustrating example, non-limiting embodiments of couplers and transceivers in accordance with various aspects described herein.

Turning now to FIG. 10A, illustrated is a block diagram 1000 of an example, non-limiting embodiment of a coupler and transceiver system in accordance with various aspects described herein. The system is an example of transmission device 101 or 102. In particular, the communication interface 1008 is an example of communications interface 205, the stub coupler 1002 is an example of coupler 220, and the transmitter/receiver device 1006, diplexer 1016, power amplifier 1014, low noise amplifier 1018, frequency mixers 1010 and 1020 and local oscillator 1012 collectively form an example of transceiver 210.

In operation, the transmitter/receiver device 1006 launches and receives waves (e.g., guided wave 1004 onto stub coupler 1002). The guided waves 1004 can be used to transport signals received from and sent to a host device, base station, mobile devices, a building or other device by way of a communications interface 1008. The communications interface 1008 can be an integral part of system 1000. Alternatively, the communications interface 1008 can be tethered to system 1000. The communications interface 1008 can comprise a wireless interface for interfacing to the host device, base station, mobile devices, a building or other device utilizing any of various wireless signaling protocols (e.g., LTE, WiFi, WiMAX, IEEE 802.xx, etc.) including an infrared protocol such as an infrared data association (IrDA) protocol or other line of sight optical protocol. The communications interface 1008 can also comprise a wired interface such as a fiber optic line, coaxial cable, twisted pair, category 5 (CAT-5) cable or other suitable wired or optical mediums for communicating with the host device, base station, mobile devices, a building or other device via a protocol such as an Ethernet protocol, universal serial bus (USB) protocol, a data over cable service interface specification (DOCSIS) protocol, a digital subscriber line (DSL) protocol, a Firewire (IEEE 1394) protocol, or other wired or optical protocol. For embodiments where system 1000 functions as a repeater, the communications interface 1008 may not be necessary.

The output signals (e.g., Tx) of the communications interface 1008 can be combined with a carrier wave (e.g., millimeter-wave carrier wave) generated by a local oscillator 1012 at frequency mixer 1010. Frequency mixer 1010 can use heterodyning techniques or other frequency shifting techniques to frequency shift the output signals from communications interface 1008. For example, signals sent to and from the communications interface 1008 can be modulated signals such as orthogonal frequency division multiplexed (OFDM) signals formatted in accordance with a Long-Term Evolution (LTE) wireless protocol or other wireless 3G, 4G, 5G or higher voice and data protocol, a ZIGBEE®, WIMAX, UltraWideband or IEEE 802.11 wireless protocol; a wired protocol such as an Ethernet protocol, universal serial bus (USB) protocol, a data over cable service interface specification (DOCSIS) protocol, a digital subscriber line (DSL) protocol, a Firewire (IEEE 1394) protocol or other wired or wireless protocol. In an example embodiment, this frequency conversion can be done in the analog domain, and as a result, the frequency shifting can be done without regard to the type of communications protocol used by a base station, mobile devices, or in-building devices. As new communications technologies are developed, the communications interface 1008 can be upgraded (e.g., updated with software, firmware, and/or hardware) or replaced and the frequency shifting and transmission apparatus can remain, simplifying upgrades. The carrier wave can then be sent to a power amplifier ("PA") 1014 and can be transmitted via the transmitter receiver device 1006 via the diplexer 1016.

Signals received from the transmitter/receiver device 1006 that are directed towards the communications interface 1008 can be separated from other signals via diplexer 1016. The received signal can then be sent to low noise amplifier ("LNA") 1018 for amplification. A frequency mixer 1020, with help from local oscillator 1012 can downshift the received signal (which is in the millimeter-wave band or around 38 GHz in some embodiments) to the native frequency. The communications interface 1008 can then receive the transmission at an input port (Rx).

In an embodiment, transmitter/receiver device 1006 can include a cylindrical or non-cylindrical metal (which, for example, can be hollow in an embodiment, but not necessarily drawn to scale) or other conducting or non-conducting waveguide and an end of the stub coupler 1002 can be placed in or in proximity to the waveguide or the transmitter/receiver device 1006 such that when the transmitter/receiver device 1006 generates a transmission, the guided wave couples to stub coupler 1002 and propagates as a guided wave 1004 about the waveguide surface of the stub coupler 1002. In some embodiments, the guided wave 1004 can propagate in part on the outer surface of the stub coupler 1002 and in part inside the stub coupler 1002. In other embodiments, the guided wave 1004 can propagate substantially or completely on the outer surface of the stub coupler 1002. In yet other embodiments, the guided wave 1004 can propagate substantially or completely inside the stub coupler 1002. In this latter embodiment, the guided wave 1004 can radiate at an end of the stub coupler 1002 (such as the tapered end shown in FIG. 4) for coupling to a transmission medium such as a wire 702 of FIG. 7. Similarly, if guided wave 1004 is incoming (coupled to the stub coupler 1002 from a wire 702), guided wave 1004 then enters the transmitter/receiver device 1006 and couples to the cylindrical waveguide or conducting waveguide. While transmitter/receiver device 1006 is shown to include a separate waveguide—an antenna, cavity resonator, klystron, magnetron, travelling wave tube, or other radiating element can be employed to induce a guided wave on the coupler 1002, with or without the separate waveguide.

In an embodiment, stub coupler 1002 can be wholly constructed of a dielectric material (or another suitable insulating material), without any metallic or otherwise conducting materials therein. Stub coupler 1002 can be composed of nylon, TEFLON® {Polytetrafluoroethylene}, polyethylene, a polyamide, other plastics, or other materials that are non-conducting and suitable for facilitating transmission of electromagnetic waves at least in part on an outer surface of such materials. In another embodiment, stub coupler 1002 can include a core that is conducting/metallic, and have an exterior dielectric surface. Similarly, a transmission medium that couples to the stub coupler 1002 for propagating electromagnetic waves induced by the stub coupler 1002 or for supplying electromagnetic waves to the stub coupler 1002 can, in addition to being a bare or insulated wire, be wholly constructed of a dielectric material (or another suitable insulating material), without any metallic or otherwise conducting materials therein.

It is noted that although FIG. 10A shows that the opening of transmitter receiver device 1006 is much wider than the stub coupler 1002, this is not to scale, and that in other embodiments the width of the stub coupler 1002 is comparable or slightly smaller than the opening of the hollow waveguide. It is also not shown, but in an embodiment, an end of the coupler 1002 that is inserted into the transmitter/receiver device 1006 tapers down in order to reduce reflection and increase coupling efficiencies.

Before coupling to the stub coupler 1002, the one or more waveguide modes of the guided wave generated by the transmitter/receiver device 1006 can couple to the stub coupler 1002 to induce one or more wave propagation modes of the guided wave 1004. The wave propagation modes of the guided wave 1004 can be different than the hollow metal waveguide modes due to the different characteristics of the hollow metal waveguide and the dielectric waveguide. For instance, wave propagation modes of the guided wave 1004 can comprise the fundamental transverse electromagnetic mode (Quasi-TEM$_{00}$), where only small electrical and/or magnetic fields extend in the direction of propagation, and the electric and magnetic fields extend radially outwards from the stub coupler 1002 while the guided waves propagate along the stub coupler 1002. The fundamental transverse electromagnetic mode wave propagation mode may or may not exist inside a waveguide that is hollow. Therefore, the hollow metal waveguide modes that are used by transmitter/receiver device 1006 are waveguide modes that can couple effectively and efficiently to wave propagation modes of stub coupler 1002.

Figure 10B:
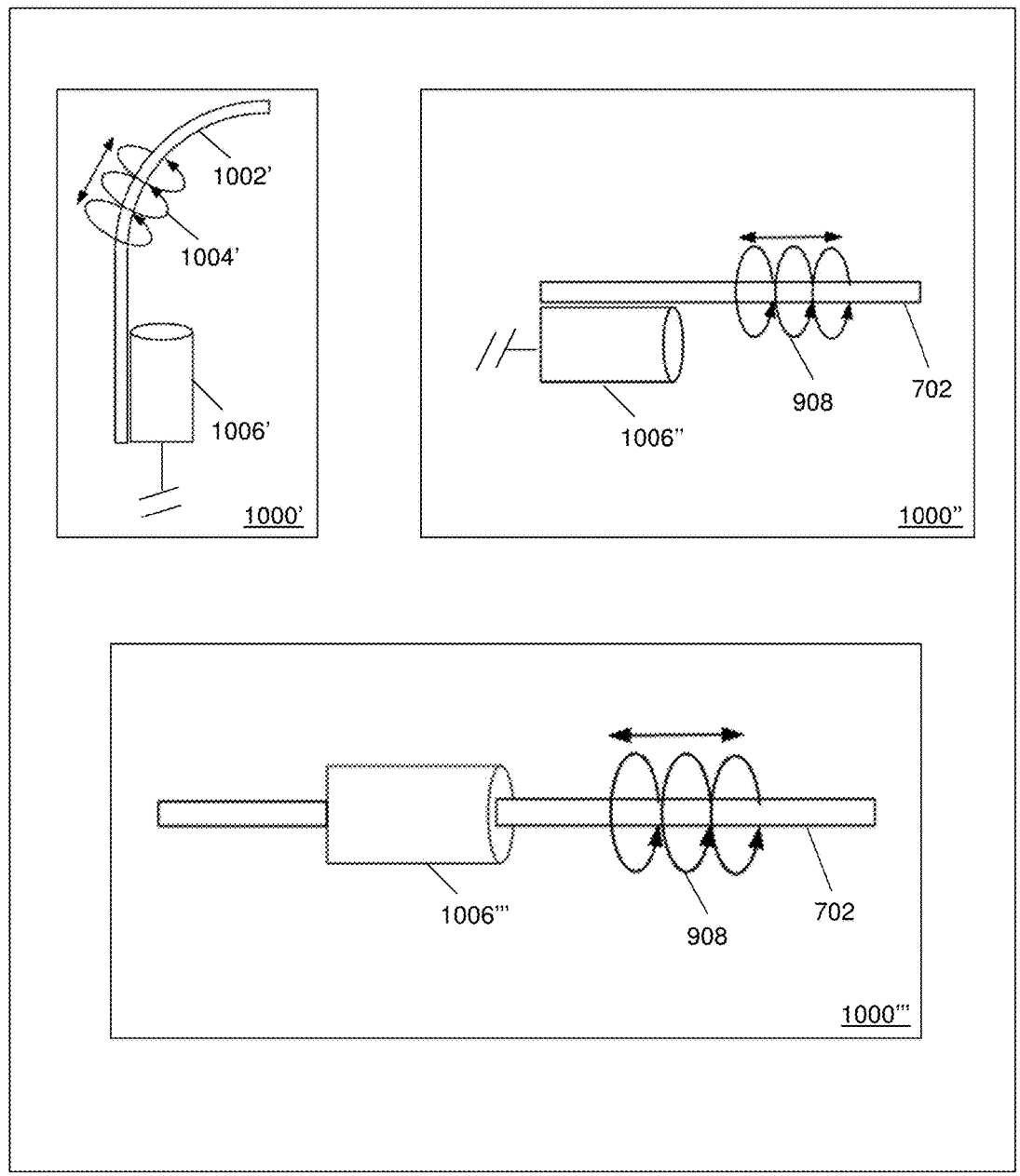

It will be appreciated that other constructs or combinations of the transmitter/receiver device 1006 and stub coupler 1002 are possible. For example, a stub coupler 1002' can be placed tangentially or in parallel (with or without a gap) with respect to an outer surface of the hollow metal waveguide of the transmitter/receiver device 1006' (corresponding circuitry not shown) as depicted by reference 1000' of FIG. 10B. In another embodiment, not shown by reference 1000', the stub coupler 1002' can be placed inside the hollow metal waveguide of the transmitter/receiver device 1006' without an axis of the stub coupler 1002' being coaxially aligned with an axis of the hollow metal waveguide of the transmitter/receiver device 1006'. In either of these embodiments, the guided wave generated by the transmitter/receiver device 1006' can couple to a surface of the stub coupler 1002' to induce one or more wave propagation modes of the guided wave 1004' on the stub coupler 1002' including a fundamental mode (e.g., a symmetric mode) and/or a non-fundamental mode (e.g., asymmetric mode).

In one embodiment, the guided wave 1004' can propagate in part on the outer surface of the stub coupler 1002' and in part inside the stub coupler 1002'. In another embodiment, the guided wave 1004' can propagate substantially or completely on the outer surface of the stub coupler 1002'. In yet other embodiments, the guided wave 1004' can propagate substantially or completely inside the stub coupler 1002'. In this latter embodiment, the guided wave 1004' can radiate at an end of the stub coupler 1002' (such as the tapered end shown in FIG. 9) for coupling to a transmission medium such as a wire 702 of FIG. 9.

It will be further appreciated that other constructs the transmitter/receiver device 1006 are possible. For example, a hollow metal waveguide of a transmitter/receiver device 1006" (corresponding circuitry not shown), depicted in FIG. 10B as reference 1000", can be placed tangentially or in parallel (with or without a gap) with respect to an outer surface of a transmission medium such as the wire 702 of FIG. 4 without the use of the stub coupler 1002. In this embodiment, the guided wave generated by the transmitter/receiver device 1006" can couple to a surface of the wire 702 to induce one or more wave propagation modes of a guided wave 908 on the wire 702 including a fundamental mode (e.g., a symmetric mode) and/or a non-fundamental mode (e.g., asymmetric mode). In another embodiment, the wire 702 can be positioned inside a hollow metal waveguide of a transmitter/receiver device 1006''' (corresponding circuitry not shown) so that an axis of the wire 702 is coaxially (or not coaxially) aligned with an axis of the hollow metal waveguide without the use of the stub coupler 1002—see FIG. 10B reference 1000'''. In this embodiment, the guided wave generated by the transmitter/receiver device 1006''' can couple to a surface of the wire 702 to induce one or more wave propagation modes of a guided wave 908 on the wire including a fundamental mode (e.g., a symmetric mode) and/or a non-fundamental mode (e.g., asymmetric mode).

In the embodiments of 1000" and 1000''', for a wire 702 having an insulated outer surface, the guided wave 908 can propagate in part on the outer surface of the insulator and in part inside the insulator. In embodiments, the guided wave 908 can propagate substantially or completely on the outer surface of the insulator, or substantially or completely inside the insulator. In the embodiments of 1000" and 1000''', for a wire 702 that is a bare conductor, the guided wave 908 can propagate in part on the outer surface of the conductor and in part inside the conductor. In another embodiment, the guided wave 908 can propagate substantially or completely on the outer surface of the conductor.

Figure 11:
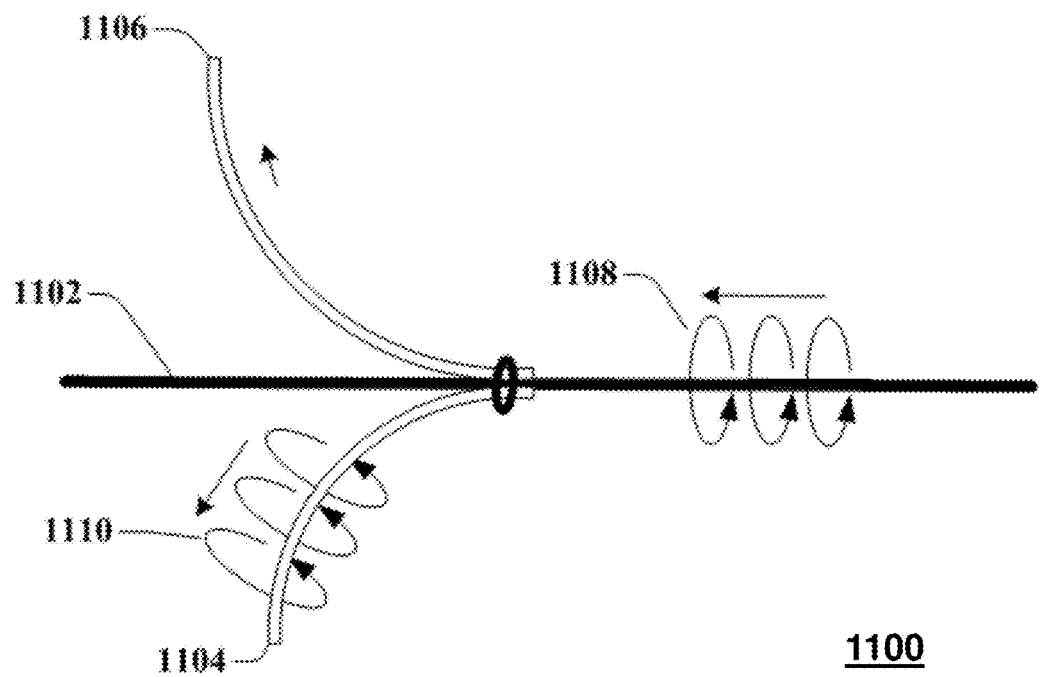
FIG. 11 is a block diagram illustrating an example, non-limiting embodiment of a dual stub coupler in accordance with various aspects described herein.

Referring now to FIG. 11, a block diagram 1100 illustrating an example, non-limiting embodiment of a dual stub coupler is shown. In particular, a dual coupler design is presented for use in a transmission device, such as transmission device 101 or 102 presented in conjunction with FIG. 1. In an embodiment, two or more couplers (such as the stub couplers 1104 and 1106) can be positioned around a wire 1102 in order to receive guided wave 1108. In an embodiment, one coupler is enough to receive the guided wave 1108. In that case, guided wave 1108 couples to coupler 1104 and propagates as guided wave 1110. If the field structure of the guided wave 1108 oscillates or undulates around the wire 1102 due to the particular guided wave mode(s) or various outside factors, then coupler 1106 can be placed such that guided wave 1108 couples to coupler 1106. In some embodiments, four or more couplers can be placed around a portion of the wire 1102, e.g., at 90 degrees or another spacing with respect to each other, in order to receive guided waves that may oscillate or rotate around the wire 1102, that have been induced at different azimuthal orientations or that have non-fundamental or higher order modes that, for example, have lobes and/or nulls or other asymmetries that are orientation dependent. However, it will be appreciated that there may be less than or more than four couplers placed around a portion of the wire 1102 without departing from example embodiments.

It should be noted that while couplers 1106 and 1104 are illustrated as stub couplers, any other of the coupler designs described herein including arc couplers, antenna or horn couplers, magnetic couplers, etc., could likewise be used. It will also be appreciated that while some example embodiments have presented a plurality of couplers around at least a portion of a wire 1102, this plurality of couplers can also be considered as part of a single coupler system having multiple coupler subcomponents. For example, two or more couplers can be manufactured as single system that can be installed around a wire in a single installation such that the couplers are either pre-positioned or adjustable relative to each other (either manually or automatically with a controllable mechanism such as a motor or other actuator) in accordance with the single system.

Receivers coupled to couplers 1106 and 1104 can use diversity combining to combine signals received from both couplers 1106 and 1104 in order to maximize the signal quality. In other embodiments, if one or the other of the couplers 1104 and 1106 receive a transmission that is above a predetermined threshold, receivers can use selection diversity when deciding which signal to use. Further, while reception by a plurality of couplers 1106 and 1104 is illustrated, transmission by couplers 1106 and 1104 in the same configuration can likewise take place. In particular, a wide range of multi-input multi-output (MIMO) transmission and reception techniques can be employed for transmissions where a transmission device, such as transmission device 101 or 102 presented in conjunction with FIG. 1 includes multiple transceivers and multiple couplers.

It is noted that the graphical representations of waves 1108 and 1110 are presented merely to illustrate the principles that guided wave 1108 induces or otherwise launches a wave 1110 on a coupler 1104. The actual electric and magnetic fields generated as a result of such wave propagation may vary depending on the frequencies employed, the design of the coupler 1104, the dimensions and composition of the wire 1102, as well as its surface characteristics, its insulation if any, the electromagnetic properties of the surrounding environment, etc.

Figure 12:
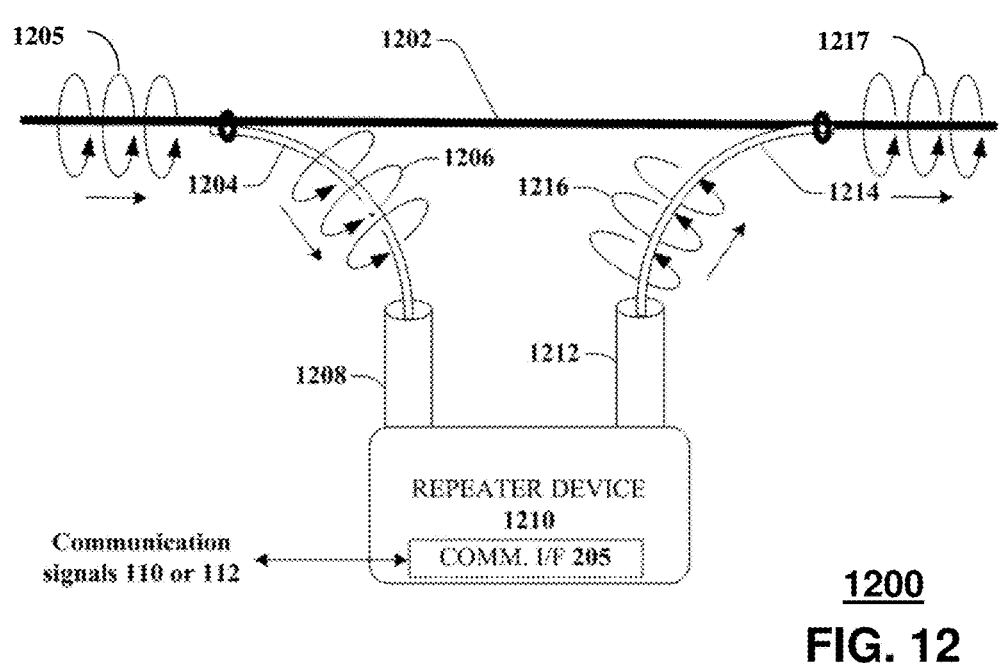
FIG. 12 is a block diagram illustrating an example, non-limiting embodiment of a repeater system in accordance with various aspects described herein.

Referring now to FIG. 12, a block diagram 1200 illustrating an example, non-limiting embodiment of a repeater system is shown. In particular, a repeater device 1210 is presented for use in a transmission device, such as transmission device 101 or 102 presented in conjunction with FIG. 1. In this system, two couplers 1204 and 1214 can be placed near a wire 1202 or other transmission medium such that guided waves 1205 propagating along the wire 1202 are extracted by coupler 1204 as wave 1206 (e.g. as a guided wave), and then are boosted or repeated by repeater device 1210 and launched as a wave 1216 (e.g. as a guided wave) onto coupler 1214. The wave 1216 can then be launched on the wire 1202 and continue to propagate along the wire 1202 as a guided wave 1217. In an embodiment, the repeater device 1210 can receive at least a portion of the power utilized for boosting or repeating through magnetic coupling with the wire 1202, for example, when the wire 1202 is a power line or otherwise contains a power-carrying conductor. It should be noted that while couplers 1204 and 1214 are illustrated as stub couplers, any other of the coupler designs described herein including arc couplers, antenna or horn couplers, magnetic couplers, or the like, could likewise be used.

In some embodiments, repeater device 1210 can repeat the transmission associated with wave 1206, and in other embodiments, repeater device 1210 can include a communications interface 205 that extracts data or other signals from the wave 1206 for supplying such data or signals to another network and/or one or more other devices as communication signals 110 or 112 and/or receiving communication signals 110 or 112 from another network and/or one or more other devices and launch guided wave 1216 having embedded therein the received communication signals 110 or 112. In a repeater configuration, receiver waveguide 1208 can receive the wave 1206 from the coupler 1204 and transmitter waveguide 1212 can launch guided wave 1216 onto coupler 1214 as guided wave 1217. Between receiver waveguide 1208 and transmitter waveguide 1212, the signal embedded in guided wave 1206 and/or the guided wave 1216 itself can be amplified to correct for signal loss and other inefficiencies associated with guided wave communications or the signal can be received and processed to extract the data contained therein and regenerated for transmission. In an embodiment, the receiver waveguide 1208 can be configured to extract data from the signal, process the data to correct for data errors utilizing for example error correcting codes, and regenerate an updated signal with the corrected data. The transmitter waveguide 1212 can then transmit guided wave 1216 with the updated signal embedded therein. In an embodiment, a signal embedded in guided wave 1206 can be extracted from the transmission and processed for communication with another network and/or one or more other devices via communications interface 205 as communication signals 110 or 112. Similarly, communication signals 110 or 112 received by the communications interface 205 can be inserted into a transmission of guided wave 1216 that is generated and launched onto coupler 1214 by transmitter waveguide 1212.

It is noted that although FIG. 12 shows guided wave transmissions 1206 and 1216 entering from the left and exiting to the right respectively, this is merely a simplification and is not intended to be limiting. In other embodiments, receiver waveguide 1208 and transmitter waveguide 1212 can also function as transmitters and receivers respectively, allowing the repeater device 1210 to be bi-directional.

In an embodiment, repeater device 1210 can be placed at locations where there are discontinuities or obstacles on the wire 1202 or other transmission medium. In the case where the wire 1202 is a power line, these obstacles can include transformers, connections, utility poles, and other such power line devices. The repeater device 1210 can help the guided (e.g., surface) waves jump over these obstacles on the line and boost the transmission power at the same time. In other embodiments, a coupler can be used to jump over the obstacle without the use of a repeater device. In that embodiment, both ends of the coupler can be tied or fastened to the wire, thus providing a path for the guided wave to travel without being blocked by the obstacle.

Figure 13:
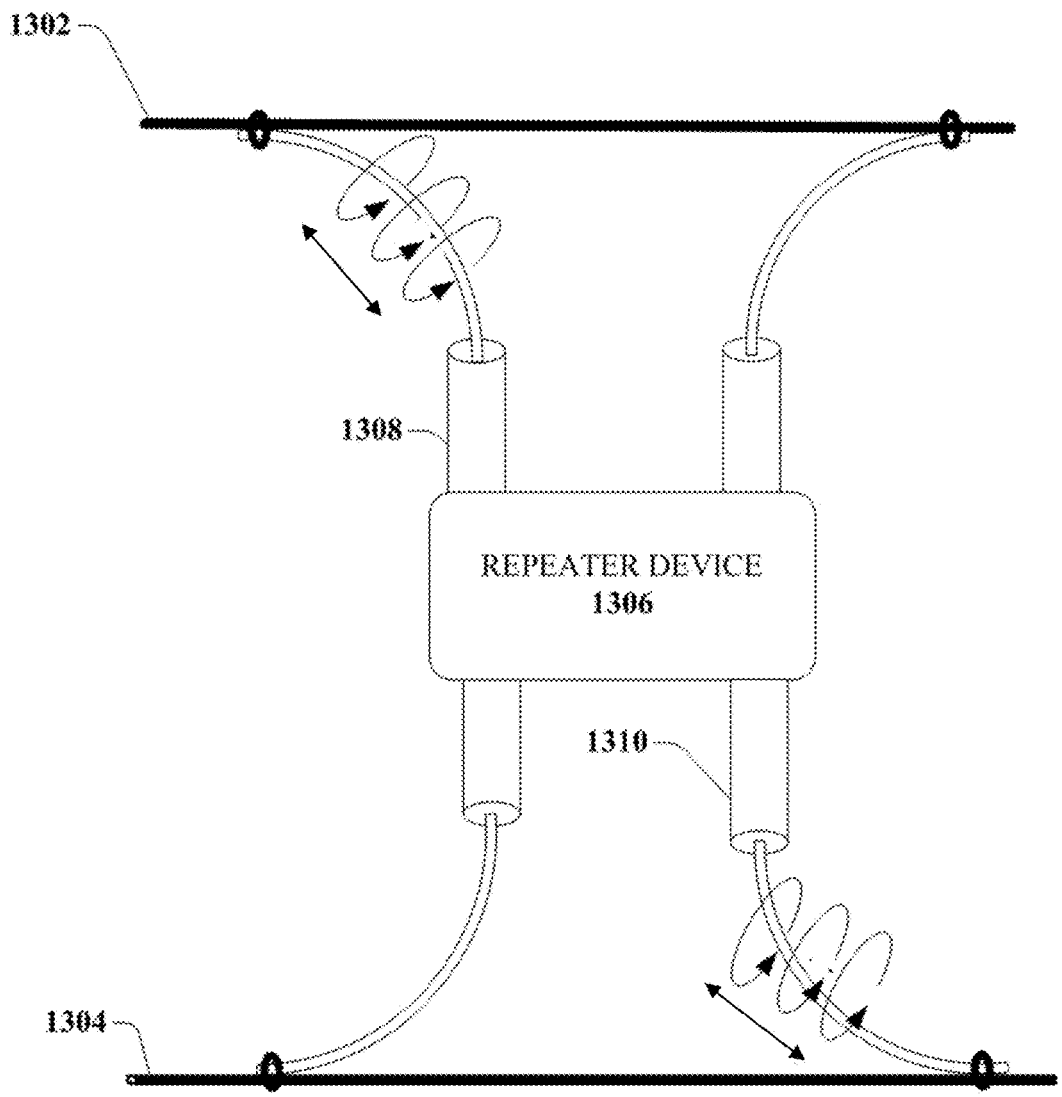
FIG. 13 illustrates a block diagram illustrating an example, non-limiting embodiment of a bidirectional repeater in accordance with various aspects described herein.

Turning now to FIG. 13, illustrated is a block diagram 1300 of an example, non-limiting embodiment of a bidirectional repeater in accordance with various aspects described herein. In particular, a bidirectional repeater device 1306 is presented for use in a transmission device, such as transmission device 101 or 102 presented in conjunction with FIG. 1. It should be noted that while the couplers are illustrated as stub couplers, any other of the coupler designs described herein including arc couplers, antenna or horn couplers, magnetic couplers, or the like, could likewise be used. The bidirectional repeater 1306 can employ diversity paths in the case of when two or more wires or other transmission media are present. Since guided wave transmissions have different transmission efficiencies and coupling efficiencies for transmission medium of different types such as insulated wires, un-insulated wires or other types of transmission media and further, if exposed to the elements, can be affected by weather, and other atmospheric conditions, it can be advantageous to selectively transmit on different transmission media at certain times. In various embodiments, the various transmission media can be designated as a primary, secondary, tertiary, etc. whether or not such designation indicates a preference of one transmission medium over another.

In the embodiment shown, the transmission media include an insulated or uninsulated wire 1302 and an insulated or uninsulated wire 1304 (referred to herein as wires 1302 and 1304, respectively). The repeater device 1306 uses a receiver coupler 1308 to receive a guided wave traveling along wire 1302 and repeats the transmission using transmitter waveguide 1310 as a guided wave along wire 1304. In other embodiments, repeater device 1306 can switch from the wire 1304 to the wire 1302, or can repeat the transmissions along the same paths. Repeater device 1306 can include sensors, or be in communication with sensors (or a network management system 1601 depicted in FIG. 16A) that indicate conditions that can affect the transmission. Based on the feedback received from the sensors, the repeater device 1306 can make the determination about whether to keep the transmission along the same wire, or transfer the transmission to the other wire.

Figure 14:
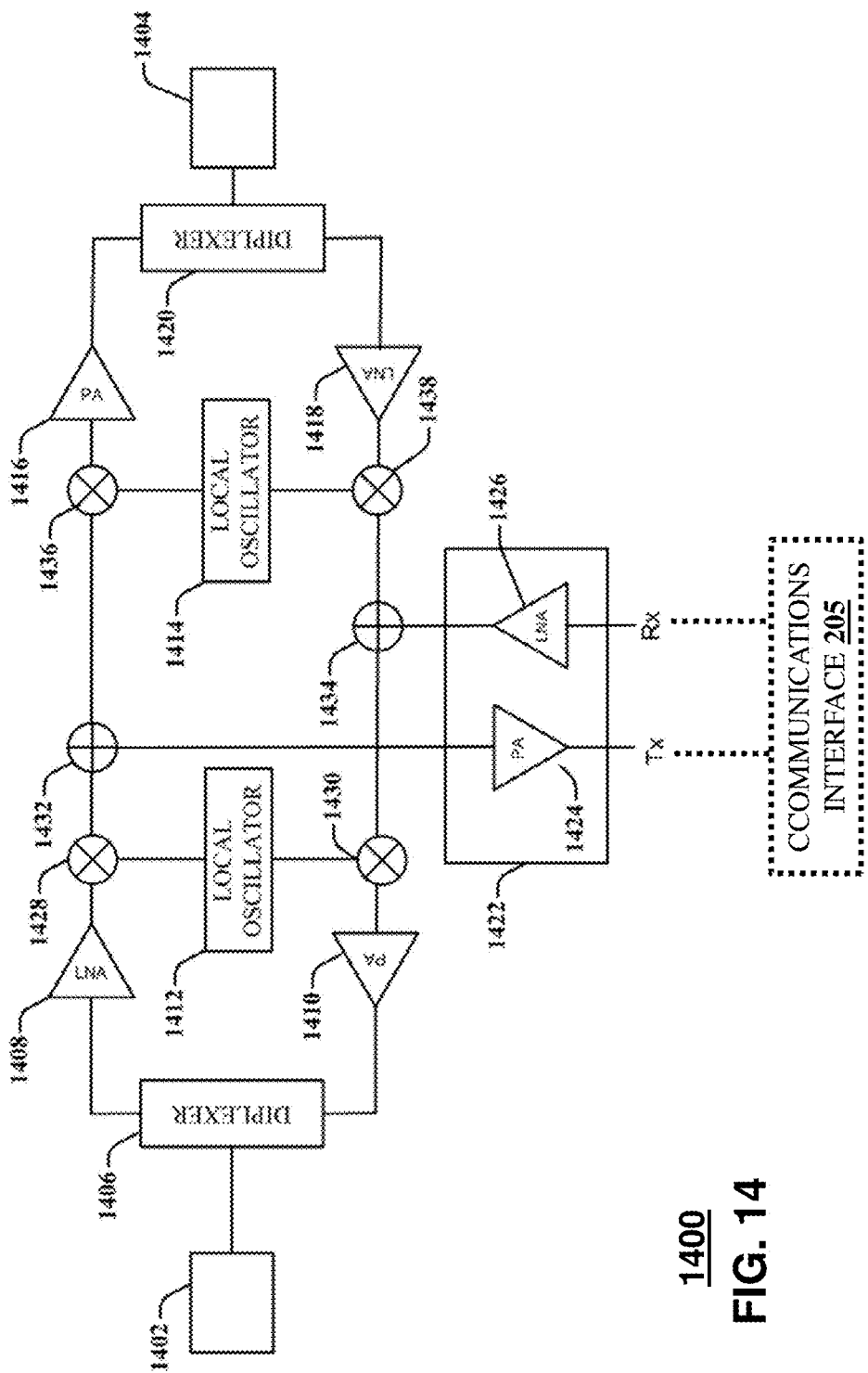
FIG. 14 is a block diagram illustrating an example, non-limiting embodiment of a waveguide system in accordance with various aspects described herein.

Turning now to FIG. 14, illustrated is a block diagram 1400 illustrating an example, non-limiting embodiment of a bidirectional repeater system. In particular, a bidirectional repeater system is presented for use in a transmission device, such as transmission device 101 or 102 presented in conjunction with FIG. 1. The bidirectional repeater system includes waveguide coupling devices 1402 and 1404 that receive and transmit transmissions from other coupling devices located in a distributed antenna system or backhaul system.

In various embodiments, waveguide coupling device 1402 can receive a transmission from another waveguide coupling device, wherein the transmission has a plurality of subcarriers. Diplexer 1406 can separate the transmission from other transmissions, and direct the transmission to low-noise amplifier ("LNA") 1408. A frequency mixer 1428, with help from a local oscillator 1412, can downshift the transmission (which is in the millimeter-wave band or around 38 GHz in some embodiments) to a lower frequency, such as a cellular band (~1.9 GHz) for a distributed antenna system, a native frequency, or other frequency for a backhaul system. An extractor (or demultiplexer) 1432 can extract the signal on a subcarrier and direct the signal to an output component 1422 for optional amplification, buffering or isolation by power amplifier 1424 for coupling to communications interface 205. The communications interface 205 can further process the signals received from the power amplifier 1424 or otherwise transmit such signals over a wireless or wired interface to other devices such as a base station, mobile devices, a building, etc. For the signals that are not being extracted at this location, extractor 1432 can redirect them to another frequency mixer 1436, where the signals are used to modulate a carrier wave generated by local oscillator 1414. The carrier wave, with its subcarriers, is directed to a power amplifier ("PA") 1416 and is retransmitted by waveguide coupling device 1404 to another system, via diplexer 1420.

An LNA 1426 can be used to amplify, buffer or isolate signals that are received by the communication interface 205 and then send the signal to a multiplexer 1434 which merges the signal with signals that have been received from waveguide coupling device 1404. The signals received from coupling device 1404 have been split by diplexer 1420, and then passed through LNA 1418, and downshifted in frequency by frequency mixer 1438. When the signals are combined by multiplexer 1434, they are upshifted in frequency by frequency mixer 1430, and then boosted by PA 1410, and transmitted to another system by waveguide coupling device 1402. In an embodiment bidirectional repeater system can be merely a repeater without the output device 1422. In this embodiment, the multiplexer 1434 would not be utilized and signals from LNA 1418 would be directed to mixer 1430 as previously described. It will be appreciated that in some embodiments, the bidirectional repeater system could also be implemented using two distinct and separate unidirectional repeaters. In an alternative embodiment, a bidirectional repeater system could also be a booster or otherwise perform retransmissions without downshifting and upshifting. Indeed in example embodiment, the retransmissions can be based upon receiving a signal or guided wave and performing some signal or guided wave processing or reshaping, filtering, and/or amplification, prior to retransmission of the signal or guided wave.

Referring now to FIG. 15, a block diagram 1500 illustrating an example, non-limiting embodiment of a guided wave communications system is shown. This diagram depicts an exemplary environment in which a guided wave communication system, such as the guided wave communication system presented in conjunction with FIG. 1, can be used.

To provide network connectivity to additional base station devices, a backhaul network that links the communication cells (e.g., microcells and macrocells) to network devices of a core network correspondingly expands. Similarly, to provide network connectivity to a distributed antenna system, an extended communication system that links base station devices and their distributed antennas is desirable. A guided wave communication system 1500 such as shown in FIG. 15 can be provided to enable alternative, increased or additional network connectivity and a waveguide coupling system can be provided to transmit and/or receive guided wave (e.g., surface wave) communications on a transmission medium such as a wire that operates as a single-wire transmission line (e.g., a utility line), and that can be used as a waveguide and/or that otherwise operates to guide the transmission of an electromagnetic wave.

The guided wave communication system 1500 can comprise a first instance of a distribution system 1550 that includes one or more base station devices (e.g., base station device 1504) that are communicably coupled to a central office 1501 and/or a macrocell site 1502. Base station device 1504 can be connected by a wired (e.g., fiber and/or cable), or by a wireless (e.g., microwave wireless) connection to the macrocell site 1502 and the central office 1501. A second instance of the distribution system 1560 can be used to provide wireless voice and data services to mobile device 1522 and to residential and/or commercial establishments 1542 (herein referred to as establishments 1542). System 1500 can have additional instances of the distribution systems 1550 and 1560 for providing voice and/or data services to mobile devices 1522-1524 and establishments 1542 as shown in FIG. 15.

Macrocells such as macrocell site 1502 can have dedicated connections to a mobile network and base station device 1504 or can share and/or otherwise use another connection. Central office 1501 can be used to distribute media content and/or provide internet service provider (ISP) services to mobile devices 1522-1524 and establishments 1542. The central office 1501 can receive media content from a constellation of satellites 1530 (one of which is shown in FIG. 15) or other sources of content, and distribute such content to mobile devices 1522-1524 and establishments 1542 via the first and second instances of the distribution system 1550 and 1560. The central office 1501 can also be communicatively coupled to the Internet 1503 for providing internet data services to mobile devices 1522-1524 and establishments 1542.

Base station device 1504 can be mounted on, or attached to, utility pole 1516. In other embodiments, base station device 1504 can be near transformers and/or other locations situated nearby a power line. Base station device 1504 can facilitate connectivity to a mobile network for mobile devices 1522 and 1524. Antennas 1512 and 1514, mounted on or near utility poles 1518 and 1520, respectively, can receive signals from base station device 1504 and transmit those signals to mobile devices 1522 and 1524 over a much wider area than if the antennas 1512 and 1514 were located at or near base station device 1504.

It is noted that FIG. 15 displays three utility poles, in each instance of the distribution systems 1550 and 1560, with one base station device, for purposes of simplicity. In other embodiments, utility pole 1516 can have more base station devices, and more utility poles with distributed antennas and/or tethered connections to establishments 1542.

A transmission device 1506, such as transmission device 101 or 102 presented in conjunction with FIG. 1, can transmit a signal from base station device 1504 to antennas 1512 and 1514 via utility or power line(s) that connect the utility poles 1516, 1518, and 1520. To transmit the signal, radio source and/or transmission device 1506 upconverts the signal (e.g., via frequency mixing) from base station device 1504 or otherwise converts the signal from the base station device 1504 to a microwave band signal and the transmission device 1506 launches a microwave band wave that propagates as a guided wave traveling along the utility line or other wire as described in previous embodiments. At utility pole 1518, another transmission device 1508 receives the guided wave (and optionally can amplify it as needed or desired or operate as a repeater to receive it and regenerate it) and sends it forward as a guided wave on the utility line or other wire. The transmission device 1508 can also extract a signal from the microwave band guided wave and shift it down in frequency or otherwise convert it to its original cellular band frequency (e.g., 1.9 GHz or other defined cellular frequency) or another cellular (or non-cellular) band frequency. An antenna 1512 can wireless transmit the downshifted signal to mobile device 1522. The process can be repeated by transmission device 1510, antenna 1514 and mobile device 1524, as necessary or desirable.

Transmissions from mobile devices 1522 and 1524 can also be received by antennas 1512 and 1514 respectively. The transmission devices 1508 and 1510 can upshift or otherwise convert the cellular band signals to microwave band and transmit the signals as guided wave (e.g., surface wave or other electromagnetic wave) transmissions over the power line(s) to base station device 1504.

Media content received by the central office 1501 can be supplied to the second instance of the distribution system 1560 via the base station device 1504 for distribution to mobile devices 1522 and establishments 1542. The transmission device 1510 can be tethered to the establishments 1542 by one or more wired connections or a wireless interface. The one or more wired connections may include without limitation, a power line, a coaxial cable, a fiber cable, a twisted pair cable, a guided wave transmission medium or other suitable wired mediums for distribution of media content and/or for providing internet services. In an example embodiment, the wired connections from the transmission device 1510 can be communicatively coupled to one or more very high bit rate digital subscriber line (VDSL) modems located at one or more corresponding service area interfaces (SAIs—not shown) or pedestals, each SAI or pedestal providing services to a portion of the establishments 1542. The VDSL modems can be used to selectively distribute media content and/or provide internet services to gateways (not shown) located in the establishments 1542. The SAIs or pedestals can also be communicatively coupled to the establishments 1542 over a wired medium such as a power line, a coaxial cable, a fiber cable, a twisted pair cable, a guided wave transmission medium or other suitable wired mediums. In other example embodiments, the transmission device 1510 can be communicatively coupled directly to establishments 1542 without intermediate interfaces such as the SAIs or pedestals.

In another example embodiment, system 1500 can employ diversity paths, where two or more utility lines or other wires are strung between the utility poles 1516, 1518, and 1520 (e.g., for example, two or more wires between poles 1516 and 1520) and redundant transmissions from base station/macrocell site 1502 are transmitted as guided waves down the surface of the utility lines or other wires. The utility lines or other wires can be either insulated or uninsulated, and depending on the environmental conditions that cause transmission losses, the coupling devices can selectively receive signals from the insulated or uninsulated utility lines or other wires. The selection can be based on measurements of the signal-to-noise ratio of the wires, or based on determined weather/environmental conditions (e.g., moisture detectors, weather forecasts, etc.). The use of diversity paths with system 1500 can enable alternate routing capabilities, load balancing, increased load handling, concurrent bi-directional or synchronous communications, spread spectrum communications, etc.

It is noted that the use of the transmission devices 1506, 1508, and 1510 in FIG. 15 are by way of example only, and that in other embodiments, other uses are possible. For instance, transmission devices can be used in a backhaul communication system, providing network connectivity to base station devices. Transmission devices 1506, 1508, and 1510 can be used in many circumstances where it is desirable to transmit guided wave communications over a wire, whether insulated or not insulated. Transmission devices 1506, 1508, and 1510 are improvements over other coupling devices due to no contact or limited physical and/or electrical contact with the wires that may carry high voltages. The transmission device can be located away from the wire (e.g., spaced apart from the wire) and/or located on the wire so long as it is not electrically in contact with the wire, as the dielectric acts as an insulator, allowing for cheap, easy, and/or less complex installation. However, as previously noted conducting or non-dielectric couplers can be employed, for example in configurations where the wires correspond to a telephone network, cable television network, broadband data service, fiber optic communications system or other network employing low voltages or having insulated transmission lines.

It is further noted, that while base station device 1504 and macrocell site 1502 are illustrated in an embodiment, other network configurations are likewise possible. For example, devices such as access points or other wireless gateways can be employed in a similar fashion to extend the reach of other networks such as a wireless local area network, a wireless personal area network or other wireless network that operates in accordance with a communication protocol such as a 802.11 protocol, WIMAX protocol, UltraWideband protocol, BLUETOOTH® protocol, ZIGBEE® protocol or other wireless protocol.

Figure 16A:
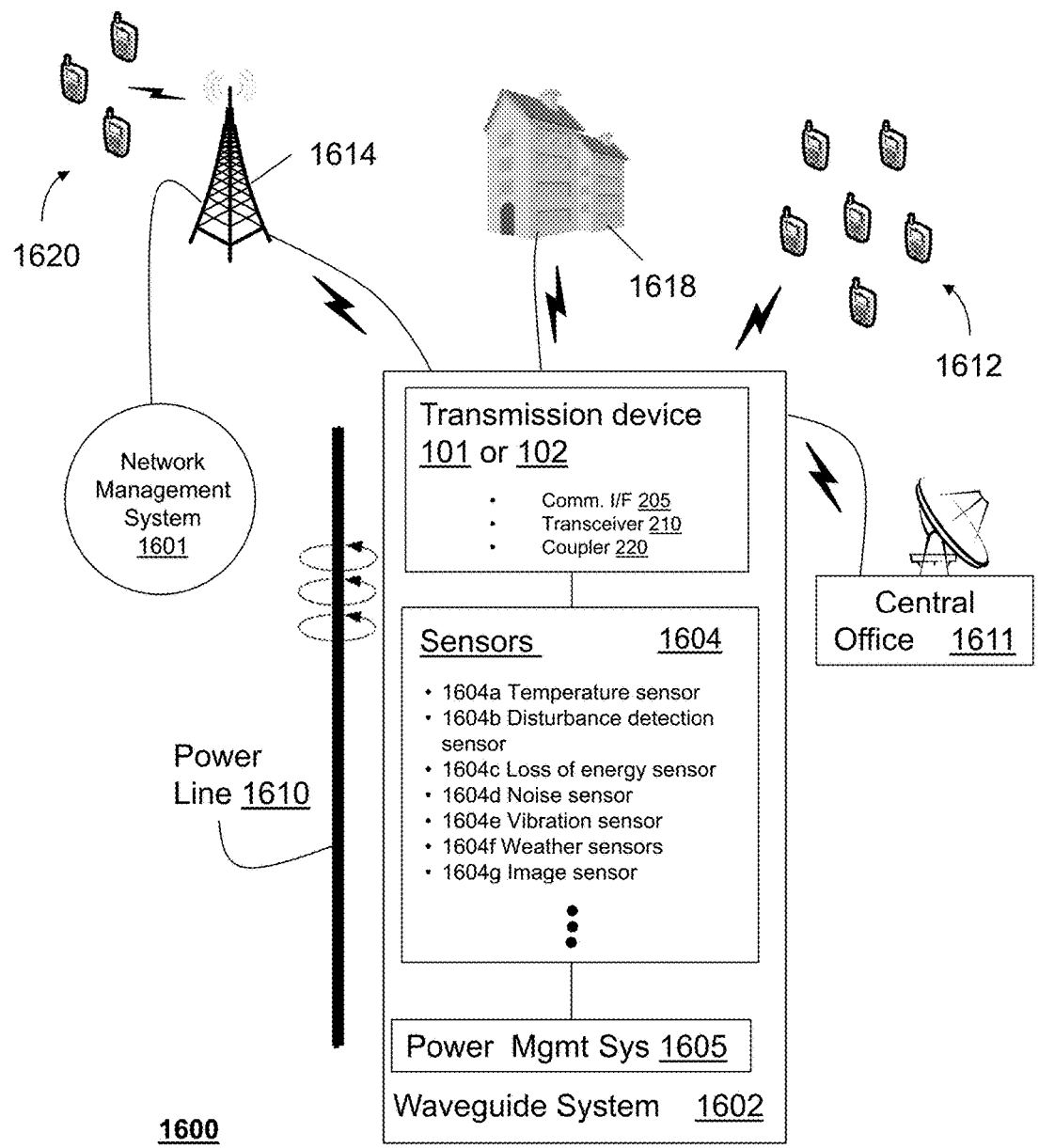
FIGS. 16A & 16B are block diagrams illustrating an example, non-limiting embodiment of a system for managing a power grid communication system in accordance with various aspects described herein.
Figure 16B:
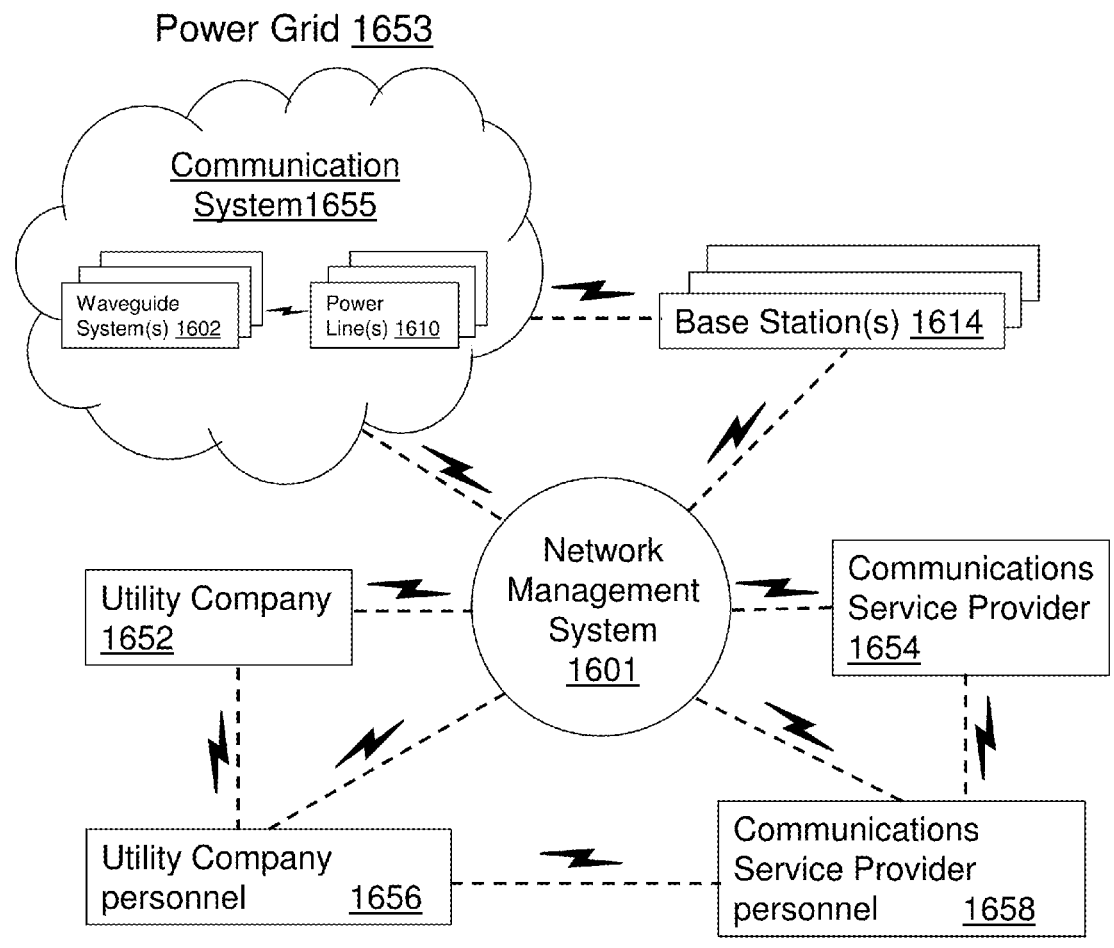

Referring now to FIGS. 16A & 16B, block diagrams illustrating an example, non-limiting embodiment of a system for managing a power grid communication system are shown. Considering FIG. 16A, a waveguide system 1602 is presented for use in a guided wave communications system, such as the system presented in conjunction with FIG. 15. The waveguide system 1602 can comprise sensors 1604, a power management system 1605, a transmission device 101 or 102 that includes at least one communication interface 205, transceiver 210 and coupler 220.

The waveguide system 1602 can be coupled to a power line 1610 for facilitating guided wave communications in accordance with embodiments described in the subject disclosure. In an example embodiment, the transmission device 101 or 102 includes coupler 220 for inducing electromagnetic waves on a surface of the power line 1610 that longitudinally propagate along the surface of the power line 1610 as described in the subject disclosure. The transmission device 101 or 102 can also serve as a repeater for retransmitting electromagnetic waves on the same power line 1610 or for routing electromagnetic waves between power lines 1610 as shown in FIGS. 12-13.

The transmission device 101 or 102 includes transceiver 210 configured to, for example, up-convert a signal operating at an original frequency range to electromagnetic waves operating at, exhibiting, or associated with a carrier frequency that propagate along a coupler to induce corresponding guided electromagnetic waves that propagate along a surface of the power line 1610. A carrier frequency can be represented by a center frequency having upper and lower cutoff frequencies that define the bandwidth of the electromagnetic waves. The power line 1610 can be a wire (e.g., single stranded or multi-stranded) having a conducting surface or insulated surface. The transceiver 210 can also receive signals from the coupler 220 and down-convert the electromagnetic waves operating at a carrier frequency to signals at their original frequency.

Signals received by the communications interface 205 of transmission device 101 or 102 for up-conversion can include without limitation signals supplied by a central office 1611 over a wired or wireless interface of the communications interface 205, a base station 1614 over a wired or wireless interface of the communications interface 205, wireless signals transmitted by mobile devices 1620 to the base station 1614 for delivery over the wired or wireless interface of the communications interface 205, signals supplied by in-building communication devices 1618 over the wired or wireless interface of the communications interface 205, and/or wireless signals supplied to the communications interface 205 by mobile devices 1612 roaming in a wireless communication range of the communications interface 205. In embodiments where the waveguide system 1602 functions as a repeater, such as shown in FIGS. 12-13, the communications interface 205 may or may not be included in the waveguide system 1602.

The electromagnetic waves propagating along the surface of the power line 1610 can be modulated and formatted to include packets or frames of data that include a data payload and further include networking information (such as header information for identifying one or more destination waveguide systems 1602). The networking information may be provided by the waveguide system 1602 or an originating device such as the central office 1611, the base station 1614, mobile devices 1620, or in-building devices 1618, or a combination thereof. Additionally, the modulated electromagnetic waves can include error correction data for mitigating signal disturbances. The networking information and error correction data can be used by a destination waveguide system 1602 for detecting transmissions directed to it, and for down-converting and processing with error correction data transmissions that include voice and/or data signals directed to recipient communication devices communicatively coupled to the destination waveguide system 1602.

Referring now to the sensors 1604 of the waveguide system 1602, the sensors 1604 can comprise one or more of a temperature sensor 1604a, a disturbance detection sensor 1604b, a loss of energy sensor 1604c, a noise sensor 1604d, a vibration sensor 1604e, an environmental (e.g., weather) sensor 1604f, and/or an image sensor 1604g. The temperature sensor 1604a can be used to measure ambient temperature, a temperature of the transmission device 101 or 102, a temperature of the power line 1610, temperature differentials (e.g., compared to a setpoint or baseline, between transmission device 101 or 102 and 1610, etc.), or any combination thereof. In one embodiment, temperature metrics can be collected and reported periodically to a network management system 1601 by way of the base station 1614.

The disturbance detection sensor 1604b can perform measurements on the power line 1610 to detect disturbances such as signal reflections, which may indicate a presence of a downstream disturbance that may impede the propagation of electromagnetic waves on the power line 1610. A signal reflection can represent a distortion resulting from, for example, an electromagnetic wave transmitted on the power line 1610 by the transmission device 101 or 102 that reflects in whole or in part back to the transmission device 101 or 102 from a disturbance in the power line 1610 located downstream from the transmission device 101 or 102.

Signal reflections can be caused by obstructions on the power line 1610. For example, a tree limb may cause electromagnetic wave reflections when the tree limb is lying on the power line 1610, or is in close proximity to the power line 1610 which may cause a corona discharge. Other obstructions that can cause electromagnetic wave reflections can include without limitation an object that has been entangled on the power line 1610 (e.g., clothing, a shoe wrapped around a power line 1610 with a shoe string, etc.), a corroded build-up on the power line 1610 or an ice build-up. Power grid components may also impede or obstruct with the propagation of electromagnetic waves on the surface of power lines 1610. Illustrations of power grid components that may cause signal reflections include without limitation a transformer and a joint for connecting spliced power lines. A sharp angle on the power line 1610 may also cause electromagnetic wave reflections.

The disturbance detection sensor 1604b can comprise a circuit to compare magnitudes of electromagnetic wave reflections to magnitudes of original electromagnetic waves transmitted by the transmission device 101 or 102 to determine how much a downstream disturbance in the power line 1610 attenuates transmissions. The disturbance detection sensor 1604b can further comprise a spectral analyzer circuit for performing spectral analysis on the reflected waves. The spectral data generated by the spectral analyzer circuit can be compared with spectral profiles via pattern recognition, an expert system, curve fitting, matched filtering or other artificial intelligence, classification or comparison technique to identify a type of disturbance based on, for example, the spectral profile that most closely matches the spectral data. The spectral profiles can be stored in a memory of the disturbance detection sensor 1604b or may be remotely accessible by the disturbance detection sensor 1604b. The profiles can comprise spectral data that models different disturbances that may be encountered on power lines 1610 to enable the disturbance detection sensor 1604b to identify disturbances locally. An identification of the disturbance if known can be reported to the network management system 1601 by way of the base station 1614. The disturbance detection sensor 1604b can also utilize the transmission device 101 or 102 to transmit electromagnetic waves as test signals to determine a roundtrip time for an electromagnetic wave reflection. The round trip time measured by the disturbance detection sensor 1604b can be used to calculate a distance traveled by the electromagnetic wave up to a point where the reflection takes place, which enables the disturbance detection sensor 1604b to calculate a distance from the transmission device 101 or 102 to the downstream disturbance on the power line 1610.

The distance calculated can be reported to the network management system 1601 by way of the base station 1614. In one embodiment, the location of the waveguide system 1602 on the power line 1610 may be known to the network management system 1601, which the network management system 1601 can use to determine a location of the disturbance on the power line 1610 based on a known topology of the power grid. In another embodiment, the waveguide system 1602 can provide its location to the network management system 1601 to assist in the determination of the location of the disturbance on the power line 1610. The location of the waveguide system 1602 can be obtained by the waveguide system 1602 from a pre-programmed location of the waveguide system 1602 stored in a memory of the waveguide system 1602, or the waveguide system 1602 can determine its location using a GPS receiver (not shown) included in the waveguide system 1602.

The power management system 1605 provides energy to the aforementioned components of the waveguide system 1602. The power management system 1605 can receive energy from solar cells, or from a transformer (not shown) coupled to the power line 1610, or by inductive coupling to the power line 1610 or another nearby power line. The power management system 1605 can also include a backup battery and/or a super capacitor or other capacitor circuit for providing the waveguide system 1602 with temporary power. The loss of energy sensor 1604c can be used to detect when the waveguide system 1602 has a loss of power condition and/or the occurrence of some other malfunction. For example, the loss of energy sensor 1604c can detect when there is a loss of power due to defective solar cells, an obstruction on the solar cells that causes them to malfunction, loss of power on the power line 1610, and/or when the backup power system malfunctions due to expiration of a backup battery, or a detectable defect in a super capacitor. When a malfunction and/or loss of power occurs, the loss of energy sensor 1604c can notify the network management system 1601 by way of the base station 1614.

The noise sensor 1604d can be used to measure noise on the power line 1610 that may adversely affect transmission of electromagnetic waves on the power line 1610. The noise sensor 1604d can sense unexpected electromagnetic interference, noise bursts, or other sources of disturbances that may interrupt reception of modulated electromagnetic waves on a surface of a power line 1610. A noise burst can be caused by, for example, a corona discharge, or other source of noise. The noise sensor 1604d can compare the measured noise to a noise profile obtained by the waveguide system 1602 from an internal database of noise profiles or from a remotely located database that stores noise profiles via pattern recognition, an expert system, curve fitting, matched filtering or other artificial intelligence, classification or comparison technique. From the comparison, the noise sensor 1604d may identify a noise source (e.g., corona discharge or otherwise) based on, for example, the noise profile that provides the closest match to the measured noise. The noise sensor 1604d can also detect how noise affects transmissions by measuring transmission metrics such as bit error rate, packet loss rate, jitter, packet retransmission requests, etc. The noise sensor 1604d can report to the network management system 1601 by way of the base station 1614 the identity of noise sources, their time of occurrence, and transmission metrics, among other things.

The vibration sensor 1604e can include accelerometers and/or gyroscopes to detect 2D or 3D vibrations on the power line 1610. The vibrations can be compared to vibration profiles that can be stored locally in the waveguide system 1602, or obtained by the waveguide system 1602 from a remote database via pattern recognition, an expert system, curve fitting, matched filtering or other artificial intelligence, classification or comparison technique. Vibration profiles can be used, for example, to distinguish fallen trees from wind gusts based on, for example, the vibration profile that provides the closest match to the measured vibrations. The results of this analysis can be reported by the vibration sensor 1604e to the network management system 1601 by way of the base station 1614.

The environmental sensor 1604f can include a barometer for measuring atmospheric pressure, ambient temperature (which can be provided by the temperature sensor 1604a), wind speed, humidity, wind direction, and rainfall, among other things. The environmental sensor 1604f can collect raw information and process this information by comparing it to environmental profiles that can be obtained from a memory of the waveguide system 1602 or a remote database to predict weather conditions before they arise via pattern recognition, an expert system, knowledge-based system or other artificial intelligence, classification or other weather modeling and prediction technique. The environmental sensor 1604f can report raw data as well as its analysis to the network management system 1601.

The image sensor 1604g can be a digital camera (e.g., a charged coupled device or CCD imager, infrared camera, etc.) for capturing images in a vicinity of the waveguide system 1602. The image sensor 1604g can include an electromechanical mechanism to control movement (e.g., actual position or focal points/zooms) of the camera for inspecting the power line 1610 from multiple perspectives (e.g., top surface, bottom surface, left surface, right surface and so on). Alternatively, the image sensor 1604g can be designed such that no electromechanical mechanism is needed in order to obtain the multiple perspectives. The collection and retrieval of imaging data generated by the image sensor 1604g can be controlled by the network management system 1601, or can be autonomously collected and reported by the image sensor 1604g to the network management system 1601.

Other sensors that may be suitable for collecting telemetry information associated with the waveguide system 1602 and/or the power lines 1610 for purposes of detecting, predicting and/or mitigating disturbances that can impede the propagation of electromagnetic wave transmissions on power lines 1610 (or any other form of a transmission medium of electromagnetic waves) may be utilized by the waveguide system 1602.

Referring now to FIG. 16B, block diagram 1650 illustrates an example, non-limiting embodiment of a system for managing a power grid 1653 and a communication system 1655 embedded therein or associated therewith in accordance with various aspects described herein. The communication system 1655 comprises a plurality of waveguide systems 1602 coupled to power lines 1610 of the power grid 1653. At least a portion of the waveguide systems 1602 used in the communication system 1655 can be in direct communication with a base station 1614 and/or the network management system 1601. Waveguide systems 1602 not directly connected to a base station 1614 or the network management system 1601 can engage in communication sessions with either a base station 1614 or the network management system 1601 by way of other downstream waveguide systems 1602 connected to a base station 1614 or the network management system 1601.

The network management system 1601 can be communicatively coupled to equipment of a utility company 1652 and equipment of a communications service provider 1654 for providing each entity, status information associated with the power grid 1653 and the communication system 1655, respectively. The network management system 1601, the equipment of the utility company 1652, and the communications service provider 1654 can access communication devices utilized by utility company personnel 1656 and/or communication devices utilized by communications service provider personnel 1658 for purposes of providing status information and/or for directing such personnel in the management of the power grid 1653 and/or communication system 1655.

Figure 17A:
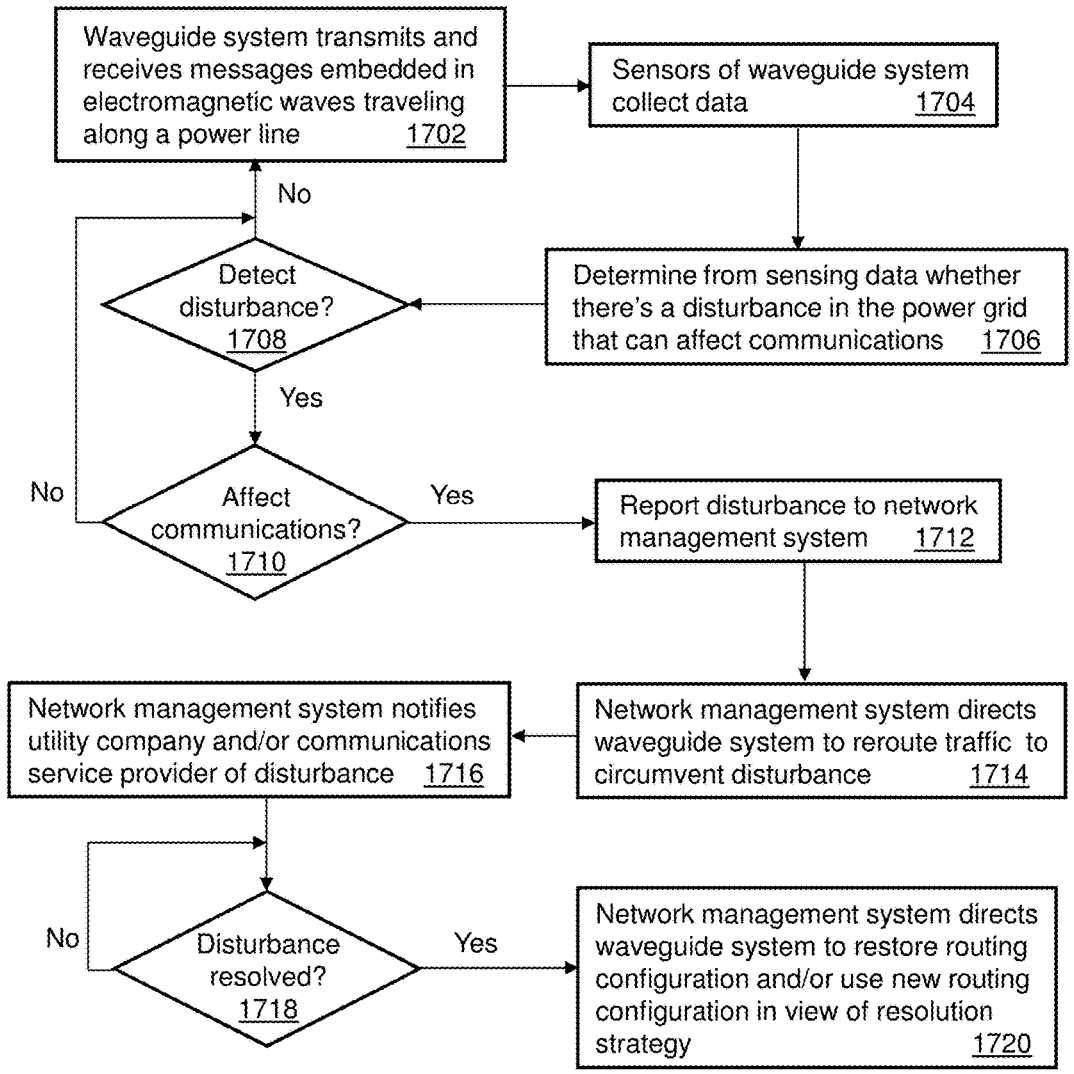
FIG. 17A illustrates a flow diagram of an example, non-limiting embodiment of a method for detecting and mitigating disturbances occurring in a communication network of the system of FIGS. 16A and 16B.

FIG. 17A illustrates a flow diagram of an example, non-limiting embodiment of a method 1700 for detecting and mitigating disturbances occurring in a communication network of the systems of FIGS. 16A & 16B. Method 1700 can begin with step 1702 where a waveguide system 1602 transmits and receives messages embedded in, or forming part of, modulated electromagnetic waves or another type of electromagnetic waves traveling along a surface of a power line 1610. The messages can be voice messages, streaming video, and/or other data/information exchanged between communication devices communicatively coupled to the communication system 1655. At step 1704 the sensors 1604 of the waveguide system 1602 can collect sensing data. In an embodiment, the sensing data can be collected in step 1704 prior to, during, or after the transmission and/or receipt of messages in step 1702. At step 1706 the waveguide system 1602 (or the sensors 1604 themselves) can determine from the sensing data an actual or predicted occurrence of a disturbance in the communication system 1655 that can affect communications originating from (e.g., transmitted by) or received by the waveguide system 1602. The waveguide system 1602 (or the sensors 1604) can process temperature data, signal reflection data, loss of energy data, noise data, vibration data, environmental data, or any combination thereof to make this determination. The waveguide system 1602 (or the sensors 1604) may also detect, identify, estimate, or predict the source of the disturbance and/or its location in the communication system 1655. If a disturbance is neither detected/identified nor predicted/estimated at step 1708, the waveguide system 1602 can proceed to step 1702 where it continues to transmit and receive messages embedded in, or forming part of, modulated electromagnetic waves traveling along a surface of the power line 1610.

If at step 1708 a disturbance is detected/identified or predicted/estimated to occur, the waveguide system 1602 proceeds to step 1710 to determine if the disturbance adversely affects (or alternatively, is likely to adversely affect or the extent to which it may adversely affect) transmission or reception of messages in the communication system 1655. In one embodiment, a duration threshold and a frequency of occurrence threshold can be used at step 1710 to determine when a disturbance adversely affects communications in the communication system 1655. For illustration purposes only, assume a duration threshold is set to 500 ms, while a frequency of occurrence threshold is set to 5 disturbances occurring in an observation period of 10 sec. Thus, a disturbance having a duration greater than 500 ms will trigger the duration threshold. Additionally, any disturbance occurring more than 5 times in a 10 sec time interval will trigger the frequency of occurrence threshold.

In one embodiment, a disturbance may be considered to adversely affect signal integrity in the communication systems 1655 when the duration threshold alone is exceeded. In another embodiment, a disturbance may be considered as adversely affecting signal integrity in the communication systems 1655 when both the duration threshold and the frequency of occurrence threshold are exceeded. The latter embodiment is thus more conservative than the former embodiment for classifying disturbances that adversely affect signal integrity in the communication system 1655. It will be appreciated that many other algorithms and associated parameters and thresholds can be utilized for step 1710 in accordance with example embodiments.

Referring back to method 1700, if at step 1710 the disturbance detected at step 1708 does not meet the condition for adversely affected communications (e.g., neither exceeds the duration threshold nor the frequency of occurrence threshold), the waveguide system 1602 may proceed to step 1702 and continue processing messages. For instance, if the disturbance detected in step 1708 has a duration of 1 msec with a single occurrence in a 10 sec time period, then neither threshold will be exceeded. Consequently, such a disturbance may be considered as having a nominal effect on signal integrity in the communication system 1655 and thus would not be flagged as a disturbance requiring mitigation. Although not flagged, the occurrence of the disturbance, its time of occurrence, its frequency of occurrence, spectral data, and/or other useful information, may be reported to the network management system 1601 as telemetry data for monitoring purposes.

Referring back to step 1710, if on the other hand the disturbance satisfies the condition for adversely affected communications (e.g., exceeds either or both thresholds), the waveguide system 1602 can proceed to step 1712 and report the incident to the network management system 1601. The report can include raw sensing data collected by the sensors 1604, a description of the disturbance if known by the waveguide system 1602, a time of occurrence of the disturbance, a frequency of occurrence of the disturbance, a location associated with the disturbance, parameters readings such as bit error rate, packet loss rate, retransmission requests, jitter, latency and so on. If the disturbance is based on a prediction by one or more sensors of the waveguide system 1602, the report can include a type of disturbance expected, and if predictable, an expected time occurrence of the disturbance, and an expected frequency of occurrence of the predicted disturbance when the prediction is based on historical sensing data collected by the sensors 1604 of the waveguide system 1602.

At step 1714, the network management system 1601 can determine a mitigation, circumvention, or correction technique, which may include directing the waveguide system 1602 to reroute traffic to circumvent the disturbance if the location of the disturbance can be determined. In one embodiment, the waveguide coupling device 1402 detecting the disturbance may direct a repeater such as the one shown in FIGS. 13-14 to connect the waveguide system 1602 from a primary power line affected by the disturbance to a secondary power line to enable the waveguide system 1602 to reroute traffic to a different transmission medium and avoid the disturbance. In an embodiment where the waveguide system 1602 is configured as a repeater the waveguide system 1602 can itself perform the rerouting of traffic from the primary power line to the secondary power line. It is further noted that for bidirectional communications (e.g., full or half-duplex communications), the repeater can be configured to reroute traffic from the secondary power line back to the primary power line for processing by the waveguide system 1602.

In another embodiment, the waveguide system 1602 can redirect traffic by instructing a first repeater situated upstream of the disturbance and a second repeater situated downstream of the disturbance to redirect traffic from a primary power line temporarily to a secondary power line and back to the primary power line in a manner that avoids the disturbance. It is further noted that for bidirectional communications (e.g., full or half-duplex communications), repeaters can be configured to reroute traffic from the secondary power line back to the primary power line.

To avoid interrupting existing communication sessions occurring on a secondary power line, the network management system 1601 may direct the waveguide system 1602 to instruct repeater(s) to utilize unused time slot(s) and/or frequency band(s) of the secondary power line for redirecting data and/or voice traffic away from the primary power line to circumvent the disturbance.

At step 1716, while traffic is being rerouted to avoid the disturbance, the network management system 1601 can notify equipment of the utility company 1652 and/or equipment of the communications service provider 1654, which in turn may notify personnel of the utility company 1656 and/or personnel of the communications service provider 1658 of the detected disturbance and its location if known. Field personnel from either party can attend to resolving the disturbance at a determined location of the disturbance. Once the disturbance is removed or otherwise mitigated by personnel of the utility company and/or personnel of the communications service provider, such personnel can notify their respective companies and/or the network management system 1601 utilizing field equipment (e.g., a laptop computer, smartphone, etc.) communicatively coupled to network management system 1601, and/or equipment of the utility company and/or the communications service provider. The notification can include a description of how the disturbance was mitigated and any changes to the power lines 1610 that may change a topology of the communication system 1655.

Once the disturbance has been resolved (as determined in decision 1718), the network management system 1601 can direct the waveguide system 1602 at step 1720 to restore the previous routing configuration used by the waveguide system 1602 or route traffic according to a new routing configuration if the restoration strategy used to mitigate the disturbance resulted in a new network topology of the communication system 1655. In another embodiment, the waveguide system 1602 can be configured to monitor mitigation of the disturbance by transmitting test signals on the power line 1610 to determine when the disturbance has been removed. Once the waveguide system 1602 detects an absence of the disturbance it can autonomously restore its routing configuration without assistance by the network management system 1601 if it determines the network topology of the communication system 1655 has not changed, or it can utilize a new routing configuration that adapts to a detected new network topology.

Figure 17B:
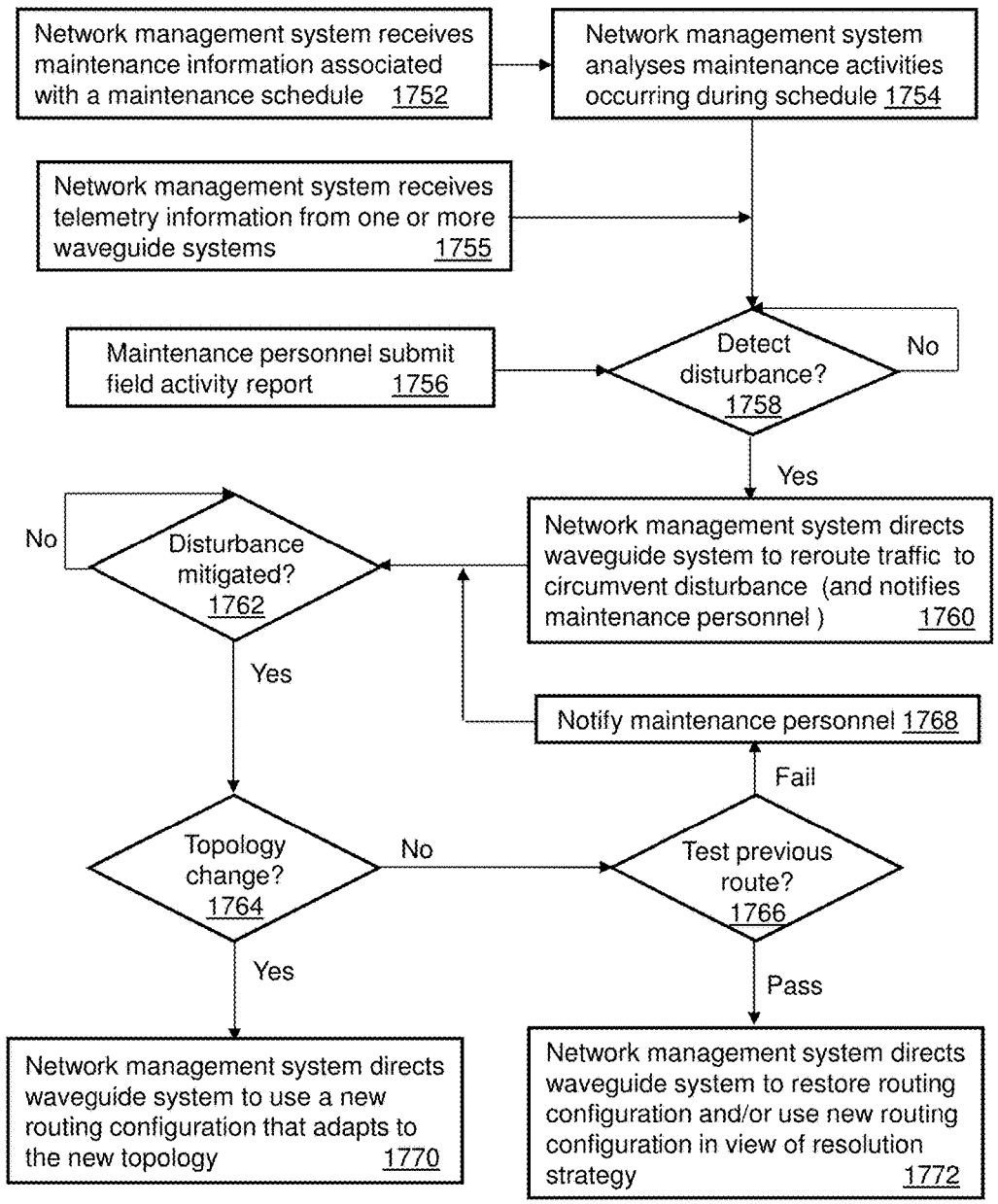
FIG. 17B illustrates a flow diagram of an example, non-limiting embodiment of a method for detecting and mitigating disturbances occurring in a communication network of the system of FIGS. 16A and 16B.

FIG. 17B illustrates a flow diagram of an example, non-limiting embodiment of a method 1750 for detecting and mitigating disturbances occurring in a communication network of the system of FIGS. 16A and 16B. In one embodiment, method 1750 can begin with step 1752 where a network management system 1601 receives from equipment of the utility company 1652 or equipment of the communications service provider 1654 maintenance information associated with a maintenance schedule. The network management system 1601 can at step 1754 identify from the maintenance information, maintenance activities to be performed during the maintenance schedule. From these activities, the network management system 1601 can detect a disturbance resulting from the maintenance (e.g., scheduled replacement of a power line 1610, scheduled replacement of a waveguide system 1602 on the power line 1610, scheduled reconfiguration of power lines 1610 in the power grid 1653, etc.).

In another embodiment, the network management system 1601 can receive at step 1755 telemetry information from one or more waveguide systems 1602. The telemetry information can include among other things an identity of each waveguide system 1602 submitting the telemetry information, measurements taken by sensors 1604 of each waveguide system 1602, information relating to predicted, estimated, or actual disturbances detected by the sensors 1604 of each waveguide system 1602, location information associated with each waveguide system 1602, an estimated location of a detected disturbance, an identification of the disturbance, and so on. The network management system 1601 can determine from the telemetry information a type of disturbance that may be adverse to operations of the waveguide, transmission of the electromagnetic waves along the wire surface, or both. The network management system 1601 can also use telemetry information from multiple waveguide systems 1602 to isolate and identify the disturbance. Additionally, the network management system 1601 can request telemetry information from waveguide systems 1602 in a vicinity of an affected waveguide system 1602 to triangulate a location of the disturbance and/or validate an identification of the disturbance by receiving similar telemetry information from other waveguide systems 1602.

In yet another embodiment, the network management system 1601 can receive at step 1756 an unscheduled activity report from maintenance field personnel. Unscheduled maintenance may occur as result of field calls that are unplanned or as a result of unexpected field issues discovered during field calls or scheduled maintenance activities. The activity report can identify changes to a topology configuration of the power grid 1653 resulting from field personnel addressing discovered issues in the communication system 1655 and/or power grid 1653, changes to one or more waveguide systems 1602 (such as replacement or repair thereof), mitigation of disturbances performed if any, and so on.

At step 1758, the network management system 1601 can determine from reports received according to steps 1752 through 1756 if a disturbance will occur based on a maintenance schedule, or if a disturbance has occurred or is predicted to occur based on telemetry data, or if a disturbance has occurred due to an unplanned maintenance identified in a field activity report. From any of these reports, the network management system 1601 can determine whether a detected or predicted disturbance requires rerouting of traffic by the affected waveguide systems 1602 or other waveguide systems 1602 of the communication system 1655.

When a disturbance is detected or predicted at step 1758, the network management system 1601 can proceed to step 1760 where it can direct one or more waveguide systems 1602 to reroute traffic to circumvent the disturbance. When the disturbance is permanent due to a permanent topology change of the power grid 1653, the network management system 1601 can proceed to step 1770 and skip steps 1762, 1764, 1766, and 1772. At step 1770, the network management system 1601 can direct one or more waveguide systems 1602 to use a new routing configuration that adapts to the new topology. However, when the disturbance has been detected from telemetry information supplied by one or more waveguide systems 1602, the network management system 1601 can notify maintenance personnel of the utility company 1656 or the communications service provider 1658 of a location of the disturbance, a type of disturbance if known, and related information that may be helpful to such personnel to mitigate the disturbance. When a disturbance is expected due to maintenance activities, the network management system 1601 can direct one or more waveguide systems 1602 to reconfigure traffic routes at a given schedule (consistent with the maintenance schedule) to avoid disturbances caused by the maintenance activities during the maintenance schedule.

Returning back to step 1760 and upon its completion, the process can continue with step 1762. At step 1762, the network management system 1601 can monitor when the disturbance(s) have been mitigated by field personnel. Mitigation of a disturbance can be detected at step 1762 by analyzing field reports submitted to the network management system 1601 by field personnel over a communications network (e.g., cellular communication system) utilizing field equipment (e.g., a laptop computer or handheld computer/device). If field personnel have reported that a disturbance has been mitigated, the network management system 1601 can proceed to step 1764 to determine from the field report whether a topology change was required to mitigate the disturbance. A topology change can include rerouting a power line 1610, reconfiguring a waveguide system 1602 to utilize a different power line 1610, otherwise utilizing an alternative link to bypass the disturbance and so on. If a topology change has taken place, the network management system 1601 can direct at step 1770 one or more waveguide systems 1602 to use a new routing configuration that adapts to the new topology.

If, however, a topology change has not been reported by field personnel, the network management system 1601 can proceed to step 1766 where it can direct one or more waveguide systems 1602 to send test signals to test a routing configuration that had been used prior to the detected disturbance(s). Test signals can be sent to affected waveguide systems 1602 in a vicinity of the disturbance. The test signals can be used to determine if signal disturbances (e.g., electromagnetic wave reflections) are detected by any of the waveguide systems 1602. If the test signals confirm that a prior routing configuration is no longer subject to previously detected disturbance(s), then the network management system 1601 can at step 1772 direct the affected waveguide systems 1602 to restore a previous routing configuration. If, however, test signals analyzed by one or more waveguide coupling device 1402 and reported to the network management system 1601 indicate that the disturbance(s) or new disturbance(s) are present, then the network management system 1601 will proceed to step 1768 and report this information to field personnel to further address field issues. The network management system 1601 can in this situation continue to monitor mitigation of the disturbance(s) at step 1762.

In the aforementioned embodiments, the waveguide systems 1602 can be configured to be self-adapting to changes in the power grid 1653 and/or to mitigation of disturbances. That is, one or more affected waveguide systems 1602 can be configured to self-monitor mitigation of disturbances and reconfigure traffic routes without requiring instructions to be sent to them by the network management system 1601. In this embodiment, the one or more waveguide systems 1602 that are self-configurable can inform the network management system 1601 of its routing choices so that the network management system 1601 can maintain a macro-level view of the communication topology of the communication system 1655.

While for purposes of simplicity of explanation, the respective processes are shown and described as a series of blocks in FIGS. 17A and 17B, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 18A:
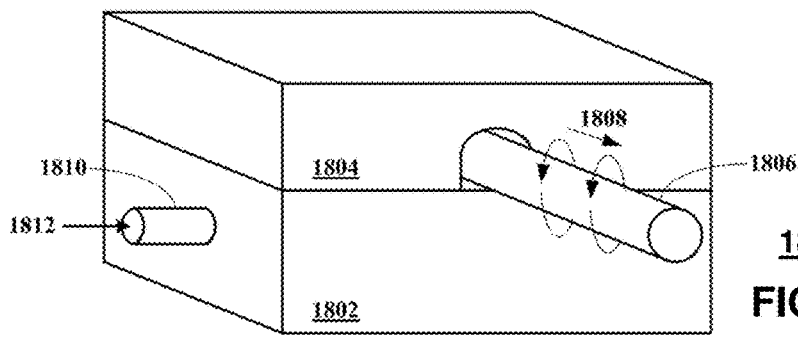
FIGS. 18A and 18B are block diagrams of example, non-limiting embodiments of a coupling device in accordance with various aspects described herein.
Figure 18B:
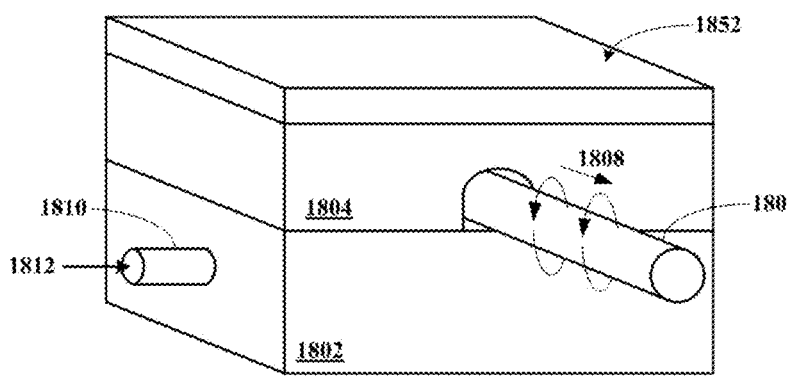

Turning now to FIGS. 18A and 18B, block diagrams 1800 and 1850 of example, non-limiting embodiments of a coupling device in accordance with various aspects described herein, are shown. Considering FIG. 18A, a coupling device is shown that includes a receiving portion 1810 that receives an RF signal 1812 conveying first data from a transmitting device. A magnetic coupler 1802 magnetically couples the RF signal 1812 to a transmission medium 1806 as a guided electromagnetic wave 1808 that is bound by an outer surface of the transmission medium 1806 to propagate longitudinally along the transmission medium 1806. While the transmission medium 1806 is shown only on one side of the magnetic coupler 1802, it should be noted that the transmission medium 1806 can traverse two sides of the magnetic coupler 1802. While not specifically shown, in this case, a guided wave, similar to guided electromagnetic wave 1808, can be launched in the opposite direction on the transmission medium 1806 from the other side of the magnetic coupler 1802.

In an embodiment, the transmission medium 1806 is a wire, such as an insulated wire or cable or an uninsulated wire. However, transmission medium 1806 can include any of the transmission media 125 previously described.

In the embodiment shown, the magnetic coupler 1802 includes a rectangular cavity resonator that launches the guided electromagnetic wave 1808. The cavity resonator can resonate at different frequencies and generate electric and magnetic fields in accordance with different modes. In particular, the receiving portion 1810 can include a coaxial connector and an antenna within the cavity resonator (not specifically shown) that radiates the RF signal 1812 within the cavity resonator. In the alternative the receiving portion can include a waveguide, such as a hollow waveguide or dielectric waveguide that guides the RF signal 1812 as a guided electromagnetic wave into the interior of the cavity resonator. While the receiving portion is shown as having a cylindrical shape, other shapes are likewise possible, particularly in the circumstances when the receiving portion 1810 is implemented as a waveguide.

Following along with the examples presented above, the cavity resonator responds to the RF signal 1812 by generating an H-field (magnetic field), via for example standing waves at or near the resonant frequency, that induce the guided electromagnetic wave 1808 on the transmission medium 1806 via magnetic coupling. In a particular embodiment, the cavity resonator is constructed from a section of a rectangular waveguide that has a cut-off frequency that is slightly above the carrier frequency of the RF signal 1812 or otherwise above some or all of the range of frequencies present in the RF signal 1812. Consider an example where the carrier frequency of the RF signal 1812 is 3 GHz. The cutoff frequency, corresponding to the desired mode, may be in the range of 3.01 GHz to 3.5 GHz—causing the cavity resonator to operate slightly below cutoff for the desired electromagnetic mode.

While the disclosure above has focused on the operation of a magnetic coupling device as a transmitter for launching a guided wave 1808 on a transmission medium 1806, the same coupler design can be used as a receiver for extracting a guided wave from the transmission medium 1806 that, for example, was sent by a remote transmission device. In this mode of operation, the magnetic coupler 1802 magnetically decouples a portion of a guided electromagnetic wave 1808, conveying first data from a transmitting device, that is bound by an outer surface of the transmission medium 1806 and propagating longitudinally along the transmission medium 1806, into an electromagnetic wave. The receiving portion 1810 receives the electromagnetic wave and provides it to a device such as a receiver or transceiver.

Further, while the description above has focused on the operation of the magnetic coupler as having a cut-off frequency that is above the carrier frequency of the RF signal 1812, in other designs the magnetic coupler can be operated at a cut-off frequency that is at or below the carrier frequency of the RF signal 1812, depending on the guided wave mode or modes in use, the characteristics of the magnetic coupler 1802 and transmission medium 1806, whether the coupling device is used for transmission or reception or both, and/or other factors.

While the magnetic coupler has been described and shown as a rectangular cavity resonator, other configurations of cavity resonators, such as a cylindrical cavity resonator or cavity resonator of another shape can also be employed. In addition or in the alternative, the magnetic coupler can include an inductive resonator such as a helical coil resonator or other inductive resonator, capacitive resonator or other magnetic coupling device.

In the embodiment shown, the coupling device includes a cap 1804 (or lid/cover) that covers the magnetic coupler 1802 and a portion of the transmission medium 1806. As shown, the cap 1804 includes a slot for securing the transmission medium 1806 to the magnetic coupler 1802. The cap 1804 can be constructed of a dielectric material such as TEFLON® {Polytetrafluoroethylene} or other dielectric. In the alternative, some or all of the cap 1804 can be constructed of a lossy material to reduce emissions from the magnetic coupler 1802. While the cap 1804 is shown as having a rectangular shape, other shapes are possible, particularly in circumstances where the magnetic coupler 1802 is of a different shape or includes a mounting flange of a different shape.

Considering FIG. 18B, a coupling device is shown which includes many similar features described in conjunction with FIG. 18A that are referred to by common reference numerals. In addition, the coupling device further includes a reflective plate 1852 that operates alone or in combination with the cap 1804 to reduce emissions from the magnetic coupler 1802. The reflective plate 1852 can be constructed of metal or other conductive material. While the reflective plate 1852 is shown as having a rectangular shape, other shapes are possible, particularly in circumstances where the magnetic coupler 1802 is of a different shape or includes a mounting flange of a different shape and/or the cap 1804 is of a different shape.

Figure 18C:
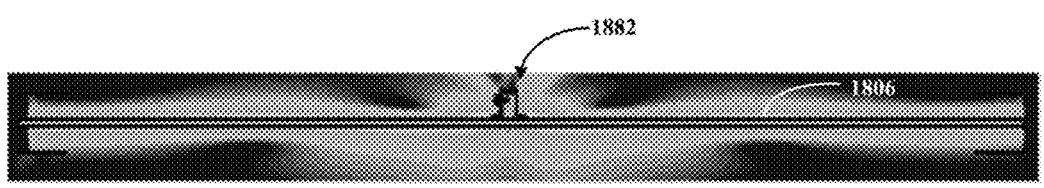
FIG. 18C, is a graphical diagram of an example, non-limiting embodiment of a electromagnetic field distribution in accordance with various aspects described herein

Turning now to FIG. 18C, a graphical diagram 1880 of an example, non-limiting embodiment of an electromagnetic field distribution in accordance with various aspects described herein, is shown. In particular, an electromagnetic distribution is presented in two dimensions for a transmission device that includes coupling device 1882, that includes a magnetic coupler 1802 or other magnetic coupling device. The coupling device 1882 couples an electromagnetic wave to transmission medium 1806 for propagation as a guided wave along an outer surface of the transmission medium 1806.

The coupling device 1882 forms a guided electromagnetic wave that propagates via a symmetrical mode and/or at least one asymmetrical mode that is bound to and/or otherwise guided by the surface of the transmission medium 1806. It is noted that the graphical representations of guided waves are presented merely to illustrate an example of guided wave coupling and propagation. The actual electric and magnetic fields generated as a result of such wave propagation may vary depending on the frequencies employed, the design and/or configuration of the coupling device 1882, the dimensions and composition of the transmission medium 1806, as well as its surface characteristics and the electromagnetic properties of the surrounding environment, etc.

Turning now to FIGS. 19A, 19B, 19C, 19D and 19E, pictorial diagrams 1900, 1920, 1940, 1960 and 1980 are shown, corresponding to example, non-limiting embodiments of coupling device components in accordance with various aspects described herein.

Figure 19A:
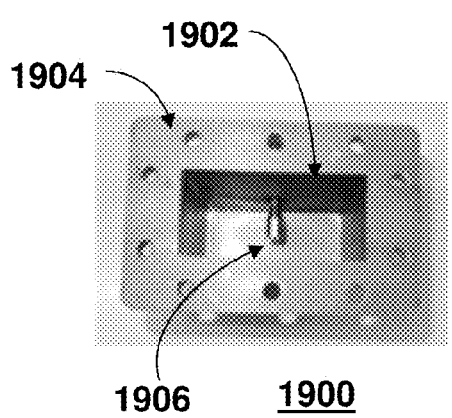
FIGS. 19A, 19B, 19C, 19D and 19E are pictorial diagrams of example, non-limiting embodiments of coupling device components in accordance with various aspects described herein.

Considering FIG. 19A, a rectangular cavity resonator 1902 is shown that includes a stub antenna 1906 for radiating an electromagnetic field in the cavity. The cavity resonator also includes a rectangular mounting flange 1904 that includes ten mounting holes for attaching a cap and/or reflective plate, etc.

Figure 19B:
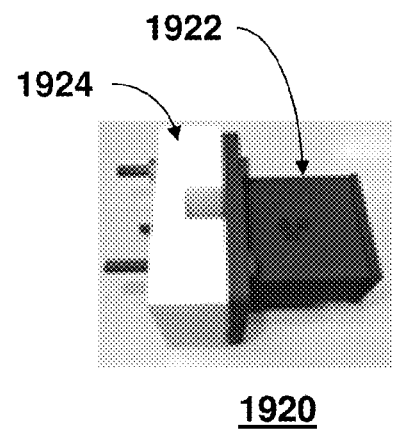

Considering FIG. 19B, a coupling device is shown that includes a rectangular cavity resonator 1922, and a TEFLON® {Polytetrafluoroethylene} cap 1924 that includes a slot that runs all the way through the cap 1924 for holding a transmission medium 125, such as an insulated or bare wire. As shown, the cap 1924 is secured to the rectangular cavity resonator 1922 via mounting bolts.

Figure 19C:
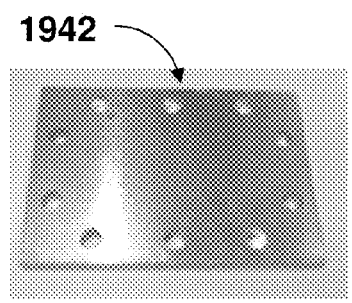

Considering FIG. 19C, a reflective plate 1942 is shown for use, for example, in conjunction with a rectangular cavity resonator 1922 and TEFLON® {Polytetrafluoroethylene} cap 1924. The reflective plate 1942 is constructed of metal, such as an aluminum alloy or other conductive metal to reduce unwanted emissions from the magnetic coupler and improve coupling to the transmission medium 1806. As shown the, reflective plate 1942 includes ten mounting holes that mate with similar mounting holes in the rectangular cavity resonator 1922 and Teflon cap 1924.

Figure 19D:
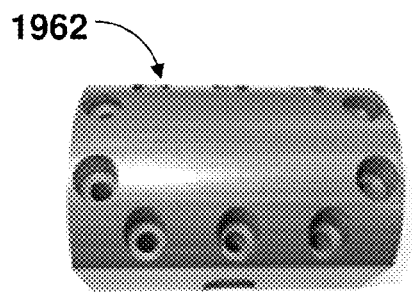

Considering FIG. 19D, a lossy cap 1962 is shown that includes a slot that runs all the way through the cap 1962 for holding a transmission medium 125 such as an insulated or bare wire. As shown, the cap 1962 includes ten mounting holes that mate with similar mounting holes in a cavity resonator such as the rectangular cavity resonator 1922. The lossy cap 1962 can comprise a carbon infused plastic, an Eccosorb material or layer or other high loss or microwave absorbing material.

Figure 19E:
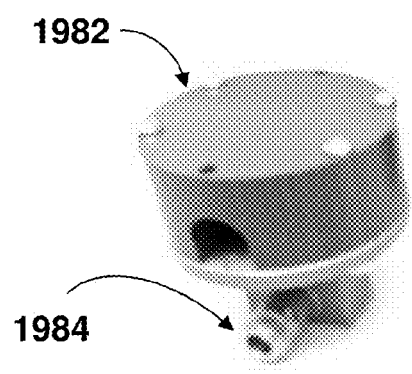

Considering FIG. 19E, a coupling device is shown that includes a rectangular cavity resonator having a coaxial interface port 1984 for receiving and transmitting and circular mounting flange that couples to a cylindrical cap 1982 that includes a slot that runs all the way through the cap 1982 for holding a transmission medium 125, such as an insulated or bare wire. As shown, the cap 1982 is secured to the rectangular cavity resonator 1922 via mounting bolts.

Figure 20:
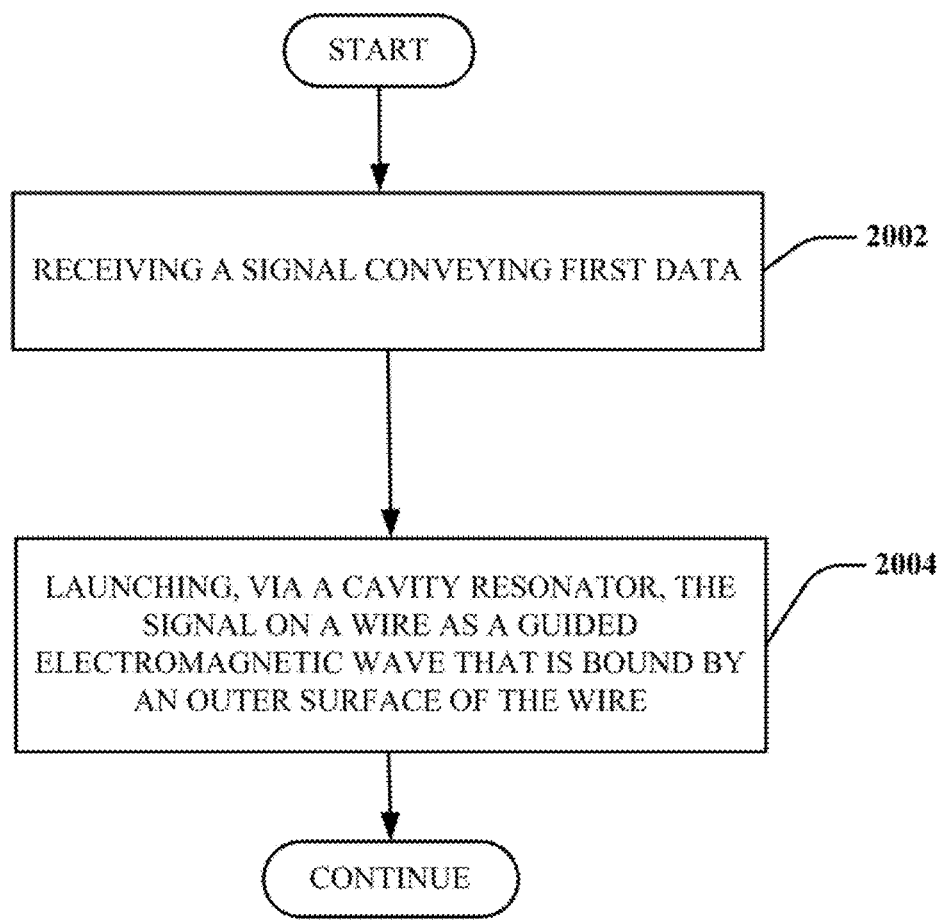
FIG. 20 illustrates a flow diagram of an example, non-limiting embodiment of a method.

Turning now to FIG. 20, a flow diagram of an example, non-limiting embodiment of a method, is shown. In particular, a method is presented for use with one or more functions and features presented in conjunction with FIGS. 1-19. Step 2002 includes receiving a first electromagnetic wave conveying first data. Step 2004 includes launching, via a cavity resonator, the first electromagnetic wave on a wire as a guided electromagnetic wave that is bound by an outer surface of the wire. In an embodiment, the first electromagnetic wave has a carrier frequency and the cavity resonator has a cut-off frequency that is above the carrier frequency.

While for purposes of simplicity of explanation, the respective processes are shown and described as a series of blocks in FIG. 20, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 21:
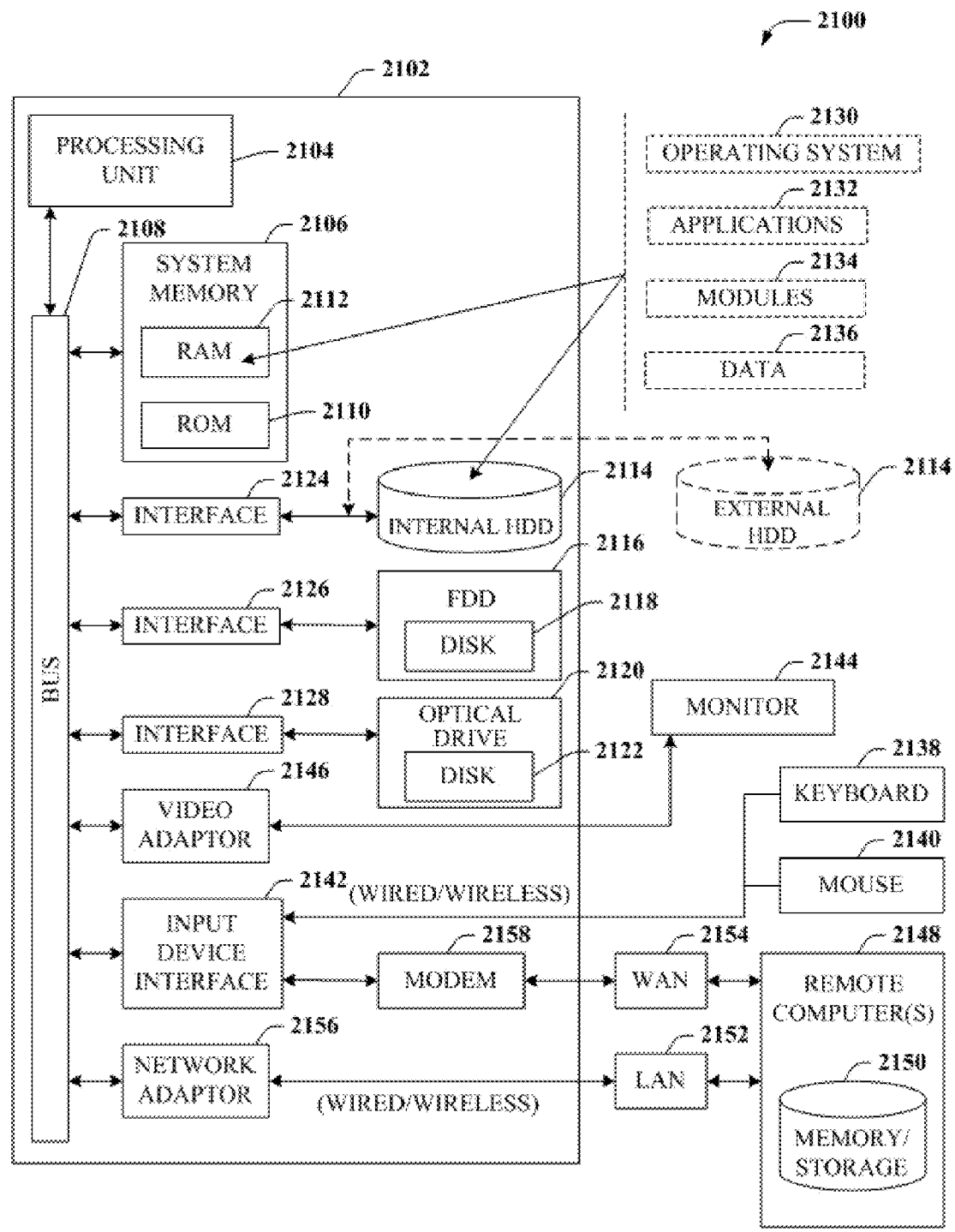
FIG. 21 is a block diagram of an example, non-limiting embodiment of a computing environment in accordance with various aspects described herein.

Referring now to FIG. 21, there is illustrated a block diagram of a computing environment in accordance with various aspects described herein. In order to provide additional context for various embodiments of the embodiments described herein, FIG. 21 and the following discussion are intended to provide a brief, general description of a suitable computing environment 2100 in which the various embodiments of the subject disclosure can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes processor as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 21, the example environment 2100 for transmitting and receiving signals via or forming at least part of a base station (e.g., base station devices 1504, macrocell site 1502, or base stations 1614) or central office (e.g., central office 1501 or 1611). At least a portion of the example environment 2100 can also be used for transmission devices 101 or 102. The example environment can comprise a computer 2102, the computer 2102 comprising a processing unit 2104, a system memory 2106 and a system bus 2108. The system bus 2108 couples system components including, but not limited to, the system memory 2106 to the processing unit 2104. The processing unit 2104 can be any of various commercially available processors. Dual microprocessors and other multiprocessor architectures can also be employed as the processing unit 2104.

The system bus 2108 can be any of several types of bus structure that can further interconnect to a memory bus (with or without a memory controller), a peripheral bus, and a local bus using any of a variety of commercially available bus architectures. The system memory 2106 comprises ROM 2110 and RAM 2112. A basic input/output system (BIOS) can be stored in a non-volatile memory such as ROM, erasable programmable read only memory (EPROM), EEPROM, which BIOS contains the basic routines that help to transfer information between elements within the computer 2102, such as during startup. The RAM 2112 can also comprise a high-speed RAM such as static RAM for caching data.

The computer 2102 further comprises an internal hard disk drive (HDD) 2114 (e.g., EIDE, SATA), which internal hard disk drive 2114 can also be configured for external use in a suitable chassis (not shown), a magnetic floppy disk drive (FDD) 2116, (e.g., to read from or write to a removable diskette 2118) and an optical disk drive 2120, (e.g., reading a CD-ROM disk 2122 or, to read from or write to other high capacity optical media such as the DVD). The hard disk drive 2114, magnetic disk drive 2116 and optical disk drive 2120 can be connected to the system bus 2108 by a hard disk drive interface 2124, a magnetic disk drive interface 2126 and an optical drive interface 2128, respectively. The interface 2124 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2102, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 2112, comprising an operating system 2130, one or more application programs 2132, other program modules 2134 and program data 2136. All or portions of the operating system, applications, modules, and/or data can also be cached in the RAM 2112. The systems and methods described herein can be implemented utilizing various commercially available operating systems or combinations of operating systems. Examples of application programs 2132 that can be implemented and otherwise executed by processing unit 2104 include the diversity selection determining performed by transmission device 101 or 102.

A user can enter commands and information into the computer 2102 through one or more wired/wireless input devices, e.g., a keyboard 2138 and a pointing device, such as a mouse 2140. Other input devices (not shown) can comprise a microphone, an infrared (IR) remote control, a joystick, a game pad, a stylus pen, touch screen or the like. These and other input devices are often connected to the processing unit 2104 through an input device interface 2142 that can be coupled to the system bus 2108, but can be connected by other interfaces, such as a parallel port, an IEEE 1394 serial port, a game port, a universal serial bus (USB) port, an IR interface, etc.

A monitor 2144 or other type of display device can be also connected to the system bus 2108 via an interface, such as a video adapter 2146. It will also be appreciated that in alternative embodiments, a monitor 2144 can also be any display device (e.g., another computer having a display, a smart phone, a tablet computer, etc.) for receiving display information associated with computer 2102 via any communication means, including via the Internet and cloud-based networks. In addition to the monitor 2144, a computer typically comprises other peripheral output devices (not shown), such as speakers, printers, etc.

The computer 2102 can operate in a networked environment using logical connections via wired and/or wireless communications to one or more remote computers, such as a remote computer(s) 2148. The remote computer(s) 2148 can be a workstation, a server computer, a router, a personal computer, portable computer, microprocessor-based entertainment appliance, a peer device or other common network node, and typically comprises many or all of the elements described relative to the computer 2102, although, for purposes of brevity, only a memory/storage device 2150 is illustrated. The logical connections depicted comprise wired/wireless connectivity to a local area network (LAN) 2152 and/or larger networks, e.g., a wide area network (WAN) 2154. Such LAN and WAN networking environments are commonplace in offices and companies, and facilitate enterprise-wide computer networks, such as intranets, all of which can connect to a global communications network, e.g., the Internet.

When used in a LAN networking environment, the computer 2102 can be connected to the local network 2152 through a wired and/or wireless communication network interface or adapter 2156. The adapter 2156 can facilitate wired or wireless communication to the LAN 2152, which can also comprise a wireless AP disposed thereon for communicating with the wireless adapter 2156.

When used in a WAN networking environment, the computer 2102 can comprise a modem 2158 or can be connected to a communications server on the WAN 2154 or has other means for establishing communications over the WAN 2154, such as by way of the Internet. The modem 2158, which can be internal or external and a wired or wireless device, can be connected to the system bus 2108 via the input device interface 2142. In a networked environment, program modules depicted relative to the computer 2102 or portions thereof, can be stored in the remote memory/storage device 2150. It will be appreciated that the network connections shown are example and other means of establishing a communications link between the computers can be used.

The computer 2102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 22:
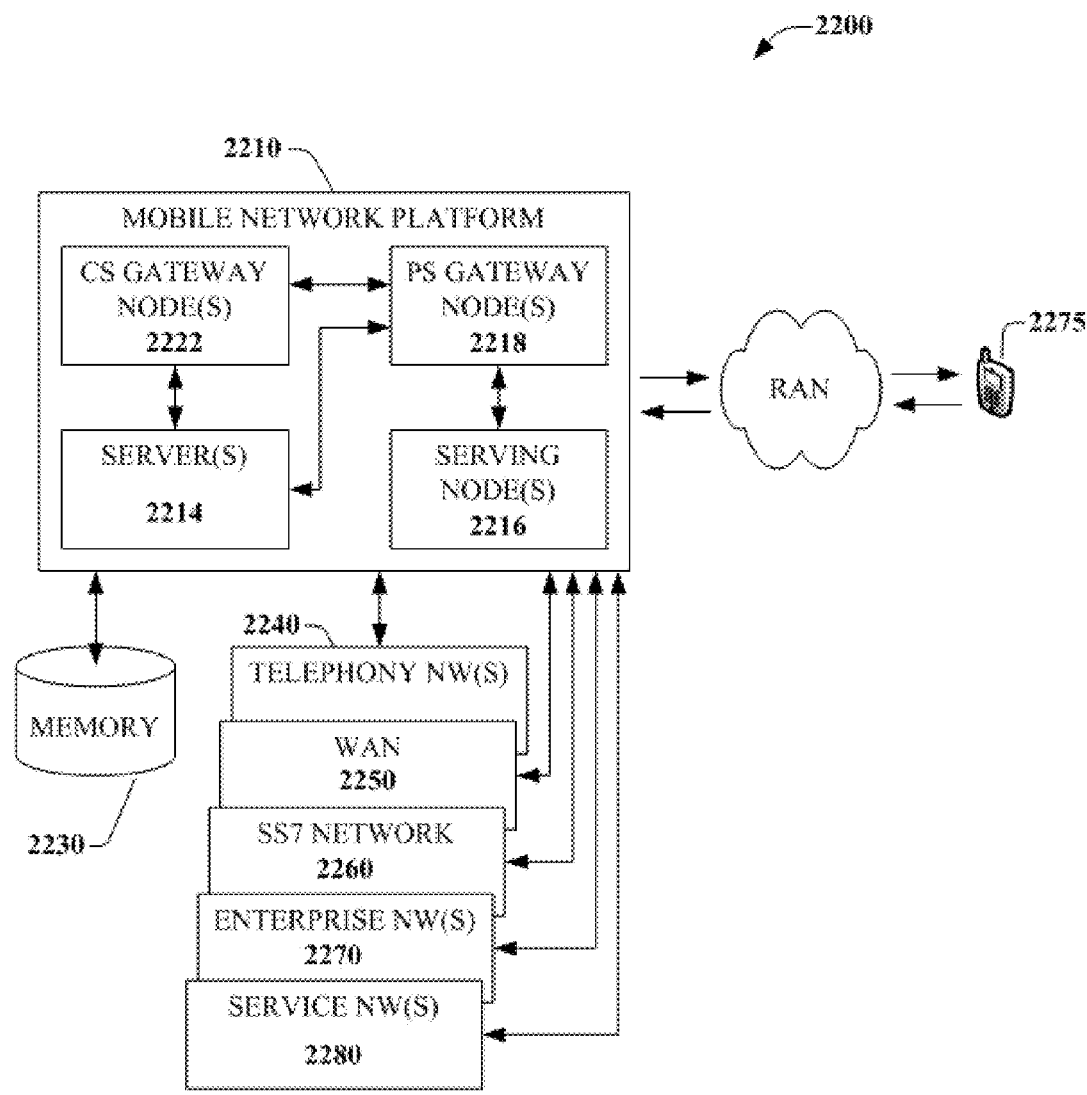
FIG. 22 is a block diagram of an example, non-limiting embodiment of a mobile network platform in accordance with various aspects described herein.

FIG. 22 presents an example embodiment 2200 of a mobile network platform 2210 that can implement and exploit one or more aspects of the disclosed subject matter described herein. In one or more embodiments, the mobile network platform 2210 can generate and receive signals transmitted and received by base stations (e.g., base station devices 1504, macrocell site 1502, or base stations 1614), central office (e.g., central office 1501 or 1611), or transmission device 101 or 102 associated with the disclosed subject matter. Generally, wireless network platform 2210 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, wireless network platform 2210 can be included in telecommunications carrier networks, and can be considered carrier-side components as discussed elsewhere herein. Mobile network platform 2210 comprises CS gateway node(s) 2222 which can interface CS traffic received from legacy networks like telephony network(s) 2240 (e.g., public switched telephone network (PSTN), or public land mobile network (PLMN)) or a signaling system #7 (SS7) network 2270. Circuit switched gateway node(s) 2222 can authorize and authenticate traffic (e.g., voice) arising from such networks. Additionally, CS gateway node(s) 2222 can access mobility, or roaming, data generated through SS7 network 2270; for instance, mobility data stored in a visited location register (VLR), which can reside in memory 2230. Moreover, CS gateway node(s) 2222 interfaces CS-based traffic and signaling and PS gateway node(s) 2218. As an example, in a 3GPP UMTS network, CS gateway node(s) 2222 can be realized at least in part in gateway GPRS support node(s) (GGSN). It should be appreciated that functionality and specific operation of CS gateway node(s) 2222, PS gateway node(s) 2218, and serving node(s) 2216, is provided and dictated by radio technology(ies) utilized by mobile network platform 2210 for telecommunication.

In addition to receiving and processing CS-switched traffic and signaling, PS gateway node(s) 2218 can authorize and authenticate PS-based data sessions with served mobile devices. Data sessions can comprise traffic, or content(s), exchanged with networks external to the wireless network platform 2210, like wide area network(s) (WANs) 2250, enterprise network(s) 2270, and service network(s) 2280, which can be embodied in local area network(s) (LANs), can also be interfaced with mobile network platform 2210 through PS gateway node(s) 2218. It is to be noted that WANs 2250 and enterprise network(s) 2260 can embody, at least in part, a service network(s) like IP multimedia subsystem (IMS). Based on radio technology layer(s) available in technology resource(s) 2217, packet-switched gateway node(s) 2218 can generate packet data protocol contexts when a data session is established; other data structures that facilitate routing of packetized data also can be generated. To that end, in an aspect, PS gateway node(s) 2218 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 2200, wireless network platform 2210 also comprises serving node(s) 2216 that, based upon available radio technology layer(s) within technology resource(s) 2217, convey the various packetized flows of data streams received through PS gateway node(s) 2218. It is to be noted that for technology resource(s) 2217 that rely primarily on CS communication, server node(s) can deliver traffic without reliance on PS gateway node(s) 2218; for example, server node(s) can embody at least in part a mobile switching center. As an example, in a 3GPP UMTS network, serving node(s) 2216 can be embodied in serving GPRS support node(s) (SGSN).

For radio technologies that exploit packetized communication, server(s) 2214 in wireless network platform 2210 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by wireless network platform 2210. Data streams (e.g., content(s) that are part of a voice call or data session) can be conveyed to PS gateway node(s) 2218 for authorization/authentication and initiation of a data session, and to serving node(s) 2216 for communication thereafter. In addition to application server, server(s) 2214 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through wireless network platform 2210 to ensure network's operation and data integrity in addition to authorization and authentication procedures that CS gateway node(s) 2222 and PS gateway node(s) 2218 can enact. Moreover, provisioning server(s) can provision services from external network(s) like networks operated by a disparate service provider; for instance, WAN 2250 or Global Positioning System (GPS) network(s) (not shown). Provisioning server(s) can also provision coverage through networks associated to wireless network platform 2210 (e.g., deployed and operated by the same service provider), such as the distributed antennas networks shown in FIG. 1(s) that enhance wireless service coverage by providing more network coverage. Repeater devices such as those shown in FIGS. 7, 8, and 9 also improve network coverage in order to enhance subscriber service experience by way of UE 2275.

It is to be noted that server(s) 2214 can comprise one or more processors configured to confer at least in part the functionality of macro network platform 2210. To that end, the one or more processor can execute code instructions stored in memory 2230, for example. It is should be appreciated that server(s) 2214 can comprise a content manager 2215, which operates in substantially the same manner as described hereinbefore.

In example embodiment 2200, memory 2230 can store information related to operation of wireless network platform 2210. Other operational information can comprise provisioning information of mobile devices served through wireless platform network 2210, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 2230 can also store information from at least one of telephony network(s) 2240, WAN 2250, enterprise network(s) 2270, or SS7 network 2260. In an aspect, memory 2230 can be, for example, accessed as part of a data store component or as a remotely connected memory store.

In order to provide a context for the various aspects of the disclosed subject matter, FIG. 22, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 23:
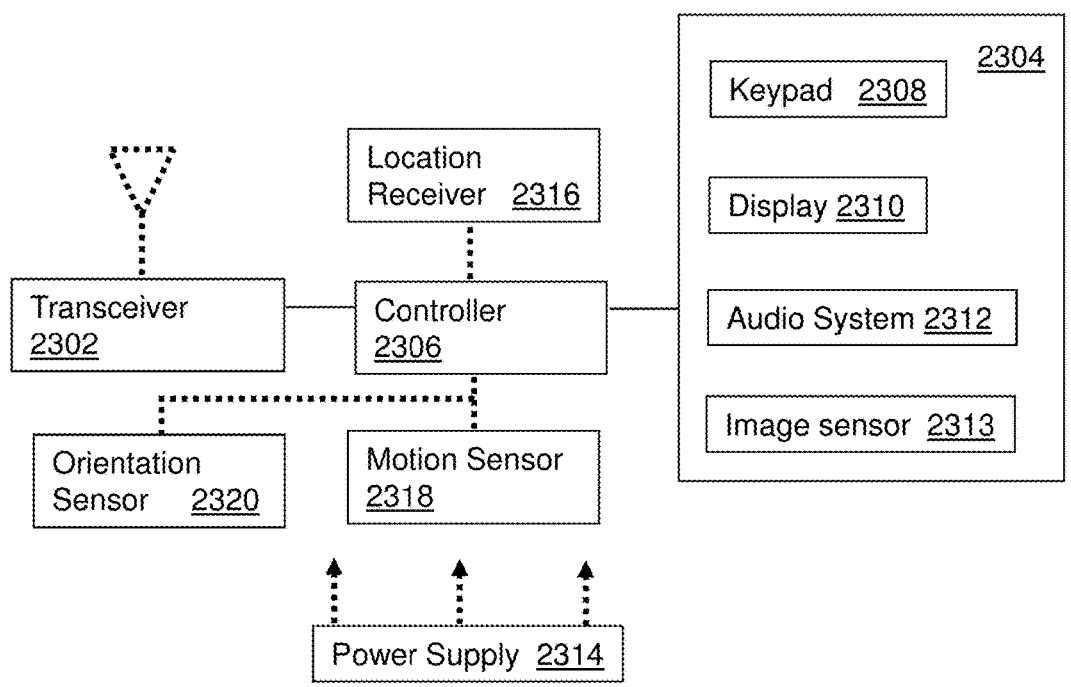
FIG. 23 is a block diagram of an example, non-limiting embodiment of a communication device in accordance with various aspects described herein.

FIG. 23 depicts an illustrative embodiment of a communication device 2300. The communication device 2300 can serve as an illustrative embodiment of devices such as mobile devices and in-building devices referred to by the subject disclosure (e.g., in FIGS. 15, 16A and 16B).

The communication device 2300 can comprise a wireline and/or wireless transceiver 2302 (herein transceiver 2302), a user interface (UI) 2304, a power supply 2314, a location receiver 2316, a motion sensor 2318, an orientation sensor 2320, and a controller 2306 for managing operations thereof. The transceiver 2302 can support short-range or long-range wireless access technologies such as BLUETOOTH®, ZIGBEE®, WiFi, DECT, or cellular communication technologies, just to mention a few (BLUETOOTH® and ZIGBEE® are trademarks registered by the BLUETOOTH® Special Interest Group and the ZIGBEE® Alliance, respectively). Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 2302 can also be adapted to support circuit-switched wireline access technologies (such as PSTN), packet-switched wireline access technologies (such as TCP/IP, VoIP, etc.), and combinations thereof.

The UI 2304 can include a depressible or touch-sensitive keypad 2308 with a navigation mechanism such as a roller ball, a joystick, a mouse, or a navigation disk for manipulating operations of the communication device 2300. The keypad 2308 can be an integral part of a housing assembly of the communication device 2300 or an independent device operably coupled thereto by a tethered wireline interface (such as a USB cable) or a wireless interface supporting for example BLUETOOTH®. The keypad 2308 can represent a numeric keypad commonly used by phones, and/or a QWERTY keypad with alphanumeric keys. The UI 2304 can further include a display 2310 such as monochrome or color LCD (Liquid Crystal Display), OLED (Organic Light Emitting Diode) or other suitable display technology for conveying images to an end user of the communication device 2300. In an embodiment where the display 2310 is touch-sensitive, a portion or all of the keypad 2308 can be presented by way of the display 2310 with navigation features.

The display 2310 can use touch screen technology to also serve as a user interface for detecting user input. As a touch screen display, the communication device 2300 can be adapted to present a user interface having graphical user interface (GUI) elements that can be selected by a user with a touch of a finger. The touch screen display 2310 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 2310 can be an integral part of the housing assembly of the communication device 2300 or an independent device communicatively coupled thereto by a tethered wireline interface (such as a cable) or a wireless interface.

The UI 2304 can also include an audio system 2312 that utilizes audio technology for conveying low volume audio (such as audio heard in proximity of a human ear) and high volume audio (such as speakerphone for hands free operation). The audio system 2312 can further include a microphone for receiving audible signals of an end user. The audio system 2312 can also be used for voice recognition applications. The UI 2304 can further include an image sensor 2313 such as a charged coupled device (CCD) camera for capturing still or moving images.

The power supply 2314 can utilize common power management technologies such as replaceable and rechargeable batteries, supply regulation technologies, and/or charging system technologies for supplying energy to the components of the communication device 2300 to facilitate long-range or short-range portable communications. Alternatively, or in combination, the charging system can utilize external power sources such as DC power supplied over a physical interface such as a USB port or other suitable tethering technologies.

The location receiver 2316 can utilize location technology such as a global positioning system (GPS) receiver capable of assisted GPS for identifying a location of the communication device 2300 based on signals generated by a constellation of GPS satellites, which can be used for facilitating location services such as navigation. The motion sensor 2318 can utilize motion sensing technology such as an accelerometer, a gyroscope, or other suitable motion sensing technology to detect motion of the communication device 2300 in three-dimensional space. The orientation sensor 2320 can utilize orientation sensing technology such as a magnetometer to detect the orientation of the communication device 2300 (north, south, west, and east, as well as combined orientations in degrees, minutes, or other suitable orientation metrics).

The communication device 2300 can use the transceiver 2302 to also determine a proximity to a cellular, WiFi, BLUETOOTH®, or other wireless access points by sensing techniques such as utilizing a received signal strength indicator (RSSI) and/or signal time of arrival (TOA) or time of flight (TOF) measurements. The controller 2306 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 2300.

Other components not shown in FIG. 23 can be used in one or more embodiments of the subject disclosure. For instance, the communication device 2300 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. For example, artificial intelligence can be used in optional training controller 230 evaluate and select candidate frequencies, modulation schemes, MIMO modes, and/or guided wave modes in order to maximize transfer efficiency. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of the each cell site of the acquired network. A classifier is a function that maps an input attribute vector, $x=(x1, x2, x3, x4, \ldots, xn)$, to a confidence that the input belongs to a class, that is, $f(x)=$confidence (class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A coupling device comprising:
    a receiving portion that receives a radio frequency signal conveying data from a transmitting device; and
    an electromagnetic coupler, that electromagnetically couples the radio frequency signal to a transmission medium as a guided electromagnetic wave that is bound by an outer surface of the transmission medium, wherein the electromagnetic coupler comprises a cavity resonator that responds to the radio frequency signal by generating a magnetic field that induces the guided electromagnetic wave on the transmission medium via electromagnetic coupling and wherein the cavity resonator operates below a cut-off frequency of a desired guided wave mode.

2. The coupling device of claim 1 wherein the transmission medium comprises a wire.

3. The coupling device of claim 1 wherein the receiving portion includes a waveguide that guides the radio frequency signal to the electromagnetic coupler.

4. The coupling device of claim 1 wherein the coupling device further comprises a cap that covers the cavity resonator and a portion of the transmission medium.

5. The coupling device of claim 4 wherein the cap comprises a reflective plate to reduce unwanted emissions from the cavity resonator.

6. The coupling device of claim 4 wherein the cap comprises a lossy material to reduce unwanted emissions from the cavity resonator.

7. The coupling device of claim 1 wherein the receiving portion includes a coaxial connector and the coupling device further comprises an antenna that radiates the radio frequency signal within the cavity resonator.

8. A coupling device comprising:
    a receiving portion that facilitates receiving a radio frequency signal conveying data; and
    a cavity resonator, adapted to electromagnetically couple the radio frequency signal to a wire as a guided electromagnetic wave that is bound by the wire, wherein the cavity resonator responds to the radio frequency signal by generating a magnetic field that induces the guided electromagnetic wave on the wire via electromagnetic coupling and wherein the cavity resonator operates below a cut-off frequency of a desired guided wave mode.

9. The coupling device of claim 8 wherein the receiving portion includes a coaxial connector and the coupling device further comprises an antenna that radiates the radio frequency signal within the cavity resonator.

10. The coupling device of claim 8 wherein the receiving portion includes a waveguide that guides the radio frequency signal to the cavity resonator.

11. The coupling device of claim 8 wherein the guided electromagnetic wave is bound by an outer surface of the wire to propagate longitudinally along the wire.

12. The coupling device of claim 8 wherein the coupling device further comprises a cap that covers the cavity resonator and a portion of the wire.

13. The coupling device of claim 12 wherein the cap comprises a reflective plate to reduce unwanted emissions from the cavity resonator.

14. The coupling device of claim 12 wherein the cap comprises a lossy material to reduce unwanted emissions from the cavity resonator.

15. A method comprising:
    receiving, via a receiving portion, a signal; and
    launching, via a cavity resonator, the signal on a transmission medium as a guided electromagnetic wave that is bound by an outer surface of the transmission medium, wherein the cavity resonator responds to the signal by generating a magnetic field that induces the guided electromagnetic wave on the transmission medium via electromagnetic coupling and wherein the cavity resonator operates below a cut-off frequency of a desired guided wave mode.

16. The method of claim 15 wherein the signal comprises an electrical signal that is supplied to an antenna associated with the cavity resonator, wherein the antenna radiates the signal within the cavity resonator to induce the guided electromagnetic wave on the outer surface of the transmission medium.

* * * * *